US012422751B2

(12) United States Patent
Hatakeyama et al.

(10) Patent No.: US 12,422,751 B2
(45) Date of Patent: Sep. 23, 2025

(54) POSITIVE RESIST COMPOSITION AND PATTERN FORMING PROCESS

(71) Applicant: Shin-Etsu Chemical Co., Ltd., Tokyo (JP)

(72) Inventors: Jun Hatakeyama, Joetsu (JP); Masahiro Fukushima, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 673 days.

(21) Appl. No.: 17/736,267

(22) Filed: May 4, 2022

(65) Prior Publication Data

US 2023/0029535 A1 Feb. 2, 2023

(30) Foreign Application Priority Data

May 28, 2021 (JP) ................................ 2021-090241

(51) Int. Cl.

| | |
|---|---|
| ***G03F 7/039*** | (2006.01) |
| ***C08F 212/14*** | (2006.01) |
| ***C08F 220/18*** | (2006.01) |
| ***C08F 220/22*** | (2006.01) |
| ***C08F 220/28*** | (2006.01) |
| ***C08F 220/36*** | (2006.01) |

(52) U.S. Cl.

CPC ............ *G03F 7/039* (2013.01); *C08F 212/24* (2020.02); *C08F 220/1805* (2020.02); *C08F 220/1806* (2020.02); *C08F 220/1808* (2020.02); *C08F 220/22* (2013.01); *C08F 220/281* (2020.02); *C08F 220/36* (2013.01)

(58) Field of Classification Search

CPC ................ G03F 7/039; C08F 220/1806; C08F 220/1805; C08F 220/281; C08F 212/24; C08F 220/1808; C08F 220/22; C08F 220/36

See application file for complete search history.

(56) References Cited

U.S. PATENT DOCUMENTS

| | | | |
|---|---|---|---|
| 7,482,108 B2 | 1/2009 | Matsumaru et al. | |
| 7,932,016 B2 | 4/2011 | Winkle et al. | |
| 8,426,108 B2 | 4/2013 | Masunaga et al. | |
| 8,470,511 B2 | 6/2013 | Masunaga et al. | |
| 9,360,760 B2 | 6/2016 | Hatakeyama et al. | |
| 9,482,949 B2 * | 11/2016 | Hatakeyama | G03F 7/0045 |
| 9,594,303 B2 | 3/2017 | Osaki et al. | |
| 9,696,625 B2 | 7/2017 | Hirano et al. | |
| 10,012,902 B2 | 7/2018 | Hatakeyama et al. | |
| 11,709,427 B2 * | 7/2023 | Hatakeyama | C08F 220/1806 430/270.1 |
| 2007/0231708 A1 | 10/2007 | Matsumaru et al. | |
| 2008/0292577 A1 | 11/2008 | Mougin et al. | |
| 2009/0197197 A1 | 8/2009 | Shimizu et al. | |
| 2014/0242521 A1 | 8/2014 | Ongayi et al. | |
| 2016/0103393 A1 | 4/2016 | Park et al. | |
| 2020/0192221 A1 | 6/2020 | Hatakeyama | |

FOREIGN PATENT DOCUMENTS

| | | | |
|---|---|---|---|
| JP | 2001114832 | A | 4/2001 |
| JP | 2006-45311 | A | 2/2006 |
| JP | 2006-178317 | A | 7/2006 |
| JP | 2008-133312 | A | 6/2008 |
| JP | 2009-181062 | A | 8/2009 |
| JP | 2011-39266 | A | 2/2011 |
| JP | 2015025879 | A | 2/2015 |
| JP | 2015-138236 | A | 7/2015 |
| JP | 2016-147975 | A | 8/2016 |
| KR | 10-2014-0106433 | A | 9/2014 |
| WO | 2010024412 | A1 | 3/2010 |
| WO | 2010116063 | A1 | 10/2010 |
| WO | 2016098809 | A1 | 6/2016 |

OTHER PUBLICATIONS

Kishikawa et al., "Assessment of trade-off between resist resolution and sensitivity for optimization of hyper-NA Immersion lithography", SPIE, 2007, vol. 6520, pp. 65203L-1-65203L-9, cited in Specification (9 pages).

Elladiou, M., "Degradable Polymers Containing Labile Pyridinylalkyl Ester Groups in the Monomer Unit, Cross- linker, Initiator or Inimer", University of Cyprus, Faculty of Pure and Applied Sciences, 2017, cited in TW Office Action dated Dec. 3, 2021. (222 pages).

Office Action dated Dec. 3, 2021, issued in counterpart TW Application No. 110103613. (7 pages).

Office Action dated Jan. 10, 2023, issued in counterpart KR application No. 10-2021-0015784 with English translation. (14 pages).

Nakano et al., Synthesis and Chiral Recognition Ability of a Cross-Linked Polymer Gel Prepared by a Molecular Imprint Method Using Chiral Helical Polymers as Templates, Macromolecules, 34, 2405-2407 (2001). (Year: 2001); Non-Final Office Action dated Sep. 16, 2022, issued in U.S. Appl. No. 17/137,672.

Cui et al., Helical Polymers as Templates, Macromolecular Chemistry and Physics 203, 2432-2437 (2002). (Year: 2002); Non-Final Office Action dated Sep. 16, 2022, issued in U.S. Appl. No. 17/137,672.

Machine translation of WO 2016/098809 (no date); Non-Final Office Action dated Sep. 16, 2022, issued in U.S. Appl. No. 17/137,672.

Non-Final Office Action dated Sep. 16, 2022, issued in U.S. Appl. No. 17/137,672 (14 pages).

* cited by examiner

*Primary Examiner* — Mark F. Huff
*Assistant Examiner* — Christine Curiac
(74) *Attorney, Agent, or Firm* — WHDA, LLP

(57) ABSTRACT

A positive resist composition is provided comprising a base polymer comprising repeat units having a carboxy group whose hydrogen is substituted by a nitrobenzene ring-containing tertiary hydrocarbyl group. The resist composition has a high sensitivity and resolution and forms a pattern of good profile with reduced edge roughness and size variation after exposure.

12 Claims, No Drawings

POSITIVE RESIST COMPOSITION AND PATTERN FORMING PROCESS

CROSS-REFERENCE TO RELATED APPLICATION

This non-provisional application claims priority under 35 U.S.C. § 119(a) on Patent Application No. 2021-090241 filed in Japan on May 28, 2021, the entire contents of which are hereby incorporated by reference.

TECHNICAL FIELD

This invention relates to a positive resist composition and a pattern forming process.

BACKGROUND ART

To meet the demand for higher integration density and operating speed of LSIs, the effort to reduce the pattern vile is in rapid progress. As the use of 5G high-speed communications and artificial intelligence (AI) is widely spreading, high-performance devices are needed for their processing. As the advanced miniaturization technology, manufacturing of microelectronic devices at the 5-nm node by the lithography using EUV of wavelength 13.5 nm has been implemented in a mass scale. Studies are made on the application of EUV lithography to 3-nm node devices of the next generation and 2-nm node devices of the next-but-one generation.

As the feature size reduces, image blurs due to acid diffusion become a problem. To insure resolution for fine patterns with a size of 45 nm et seq., not only an improvement in dissolution contrast is important as previously reported, but the control of acid diffusion is also important as reported in Non-Patent Document 1. Since chemically amplified resist compositions are designed such that sensitivity and contrast are enhanced by acid diffusion, an attempt to minimize acid diffusion by reducing the temperature and/or time of post-exposure bake (PEB) fails, resulting in drastic reductions of sensitivity and contrast.

A triangular tradeoff relationship among sensitivity, resolution, and edge roughness (LER or LWR) has been pointed out. Specifically, a resolution improvement requires to suppress acid diffusion whereas a short acid diffusion distance leads to a decline of sensitivity.

The addition of an acid generator capable of generating a bulky acid is an effective means for suppressing acid diffusion. It was then proposed to incorporate repeat units derived from an opium salt having a polymerizable unsaturated bond in a polymer. Since this polymer functions as an acid generator, it is referred to as polymer-bound acid generator. Patent Document 1 discloses a sulfonium or iodonium salt having a polymerizable unsaturated bond, capable of generating a specific sulfonic acid. Patent Document 2 discloses a sulfonium salt having a sulfonic acid directly attached to the backbone.

Patent Documents 3 and 4 describe a resist material comprising a polymer comprising repeat units having an alicyclic group to which a nitro group or nitric ester group is bonded and repeat units having an acid labile group. The nitro group or nitric ester group is effective for suppressing acid diffusion, but the suppression of acid diffusion invites a lowering of dissolution contrast as mentioned above. It is desired to have a resist material meeting controlled acid diffusion and a high contrast.

CITATION LIST

Patent Document 1: JP-A 2006-045311 (U.S. Pat. No. 7,482,108)
Patent Document 2: JP-A 2006-178317
Patent Document 3: JP-A 2016-147975
Patent Document 4: JP-A 2015-138236 (U.S. Pat. No. 9,482,949)
Non-Patent Document 1: SPIE Vol. 6520 65203L-1 (2007)

DISCLOSURE OF INVENTION

An object of the invention is to provide a positive resist composition which exhibits a high sensitivity and resolution surpassing prior art positive resist compositions, and forms a pattern of good profile with reduced edge roughness and size variation after exposure, and a pattern forming process using the same.

Studies in search for the currently desired positive resist composition having a high resolution, reduced edge roughness and reduced size variation reveal that the acid diffusion distance must be minimized. There arise problems like drops of sensitivity and dissolution contrast, which aggravate the resolution of two-dimensional patterns such as hole patterns. Quite unexpectedly, the inventor has found that a base polymer comprising repeat units having a carboxy group whose hydrogen is substituted by a nitrobenzene ring-containing tertiary hydrocarbyl group makes it possible to enhance the dissolution contrast and at the same time, to minimize the acid diffusion distance. Better results are obtained particularly when the base polymer is used in chemically amplified positive resist compositions.

When repeat units having a carboxy group or phenolic hydroxy group whose hydrogen is substituted by an acid labile group are introduced into the base polymer for further enhancing the dissolution contrast, there is obtained a positive resist composition which has a high sensitivity, an outstandingly increased contrast of alkaline dissolution rate before and after exposure, a remarkable acid diffusion-controlling effect, and a high resolution, and forms a pattern of satisfactory profile with reduced edge roughness and improved CDU. The resist composition is suited as a micropatterning material for the fabrication of VLSIs and photomasks.

In one aspect, the invention provides a positive resist composition comprising a base polymer comprising repeat units having a carboxy group whose hydrogen is substituted by a nitrobenzene ring-containing tertiary hydrocarbyl group.

In a preferred embodiment, the repeat units have the formula (a).

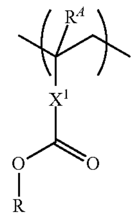

(a)

Herein $R^A$ is hydrogen or methyl. $X^1$ is a single bond, phenylene, naphthylene, or a $C_1$-$C_{12}$ linking group containing at least one moiety selected from an ester bond, ether bond and lactone ring. R is a group having the formula (a1).

(a1)

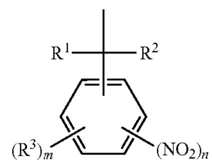

Herein $R^1$ and $R^2$ are each independently a $C_1$-$C_6$ aliphatic hydrocarbyl group which may contain a heteroatom, $R^1$ and $R^2$ may bond together to form a ring with the carbon atom to which they are attached, $R^3$ is hydrogen, halogen, a $C_1$-$C_6$ alkyl group, $C_1$-$C_6$ alkoxy group or $C_1$-$C_6$ acyloxy group, m is an integer of 1 to 4, n is 1 or 2, and the broken line designates a valence bond.

In a preferred embodiment, the base polymer further comprises repeat units of at least one type selected from repeat units having a carboxy group whose hydrogen is substituted by an acid labile group other than the nitrobenzene ring-containing tertiary hydrocarbyl group, and repeat units having a phenolic hydroxy group whose hydrogen is substituted by an acid labile group.

Preferably, the repeat units having a carboxy group whose hydrogen is substituted by an acid labile group other than the nitrobenzene ring-containing tertiary hydrocarbyl group have the formula (b1), and the repeat units having a phenolic hydroxy group whose hydrogen is substituted by an acid labile group have the formula (b2).

(b1)

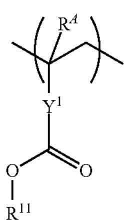

(b2)

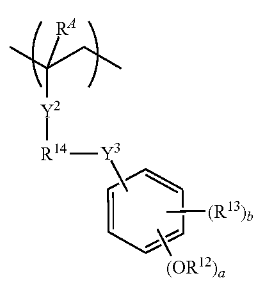

Herein $R^A$ is each independently hydrogen or methyl. $Y^1$ is a single bond, phenylene group, naphthylene group, or a $C_1$-$C_{12}$ linking group containing at least one moiety selected from an ester bond, ether bond and lactone ring. $Y^2$ is a single bond, ester bond or amide bond. $Y^3$ is a single bond, ether bond or ester bond. $R^{11}$ is an acid labile group other than the nitrobenzene ring-containing tertiary hydrocarbyl group. $R^{12}$ is an acid labile group. $R^{13}$ is fluorine, trifluoromethyl, cyano or a $C_1$-$C_6$ saturated hydrocarbyl group. $R^{14}$ is a single bond or a $C_1$-$C_6$ alkanediyl group in which some constituent —$CH_2$— may be replaced by an ether bond or ester bond, a is 1 or 2, b is an integer of 0 to 4, and the sum of a+b is from 1 to 5.

In a preferred embodiment, the base polymer further comprises repeat units having an adhesive group which is selected from among hydroxy, carboxy, lactone ring, carbonate bond, thiocarbonate bond, carbonyl, cyclic acetal, ether bond, ester bond sulfonic ester bond, cyan, amide bond, —O—C(=O)—S—, and —O—C(=O)—NH—.

In a preferred embodiment, the base polymer further comprises repeat units of at least one type selected from repeat units having the formulae (D1) to (d3).

(d1)

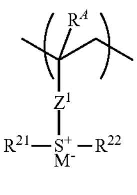

(d2)

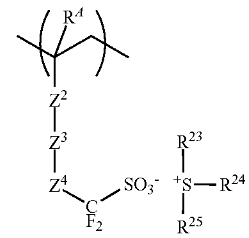

(d3)

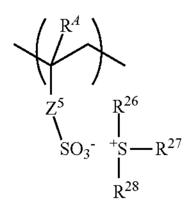

Herein $R^A$ is each independently hydrogen or methyl. $Z^1$ is a single bond, a $C_1$-$C_6$ aliphatic hydrocarbylene group, phenylene, naphthylene, or a $C_7$-$C_1$s group obtained by combining the foregoing, or —O—$Z^{11}$—, —C(=O)—O—$Z^{11}$— or —C(=O)—NH—$Z^{11}$—, wherein $Z^{11}$ is a $C_1$-$C_6$ aliphatic hydrocarbylene group, phenylene, naphthylene, or a $C_7$-$C_{18}$ group obtained by combining the foregoing which may contain a carbonyl moiety, ester bond, ether bond or hydroxy moiety. $Z^2$ is a single bond or ester bond. $Z^3$ is a single bond, —$Z^{31}$—C(=O)—O—, —$Z^{31}$—O— or —$Z^{31}$—O—C(=O)—, wherein $Z^{31}$ is a $C_1$-$C_{12}$ aliphatic hydrocarbylene group, phenylene group, or a $C_7$-$C_{18}$ group obtained by combining the foregoing, which may contain a carbonyl moiety, ester bond, ether bond, iodine or bromine. $Z^4$ is a methylene, 2,2,2-trifluoro-1,1-ethanediyl or carbonyl group. $Z^5$ is a single bond, methylene, ethylene, phenylene, fluorinated phenylene, trifluoromethyl-substituted phenylene, —C(O)—O—$Z^{51}$— or —C(=O)—NH—$Z^{51}$—, wherein $Z^{31}$ is a $C_1$-$C_6$ aliphatic hydrocarbylene group, phenylene, fluorinated phenylene, or trifluoromethyl-substituted phenylene group, which may contain a carbonyl moiety, ester bond ether bond or hydroxy moiety. $R^{21}$ to $R^{28}$ are each independently halogen or a $C_1$-$C_{20}$ hydrocarbyl group which may contain a heteroatom, $R^{23}$ and $R^{24}$, or $R^{26}$ and $R^{22}$ may bond together to form a ring with the sulfur atom to which they are attached. $M^-$ is a non-nucleophilic counter ion.

The positive resist composition may further comprise an acid generator, an organic solvent, a quencher, and/or a surfactant.

In another aspect, the invention provides a pattern forming process comprising the steps of applying the positive resist composition defined above onto a substrate to form a resist film thereon, exposing the resist film to high-energy radiation, and developing the exposed resist film in a developer.

Typically, the high-energy radiation is i-line, ArF excimer laser, KrF excimer laser. EB, or EUV of wavelength 3 to 15 μm.

Advantageous Effects of Invention

The positive resist composition has a remarkable acid diffusion-suppressing effect, a high sensitivity, and a high resolution, and forms a pattern of good profile with improved edge roughness and size variation after exposure and development. By virtue of these properties, the resist composition is fully useful in commercial application and best suited as a micropatterning material for photomasks by EB lithography or for VLSIs by EB or EUV lithography. The resist composition may be used not only in the lithography for forming semiconductor circuits, but also in the formation of mask circuit patterns, micromachines, and thin-film magnetic head circuits.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In chemical formulae, the broken line designates a valence bond; Me stands for methyl, and Ac for acetyl. As used herein, the term "fluorinated" refers to a fluorine-substituted or fluorine-containing compound or group. The terms "group" and "moiety" are interchangeable.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity Positive Resist Composition Base Polymer One embodiment of the invention is a positive resist composition comprising a base polymer comprising repeat units having a carboxy group whose hydrogen is substituted by a nitrobenzene ring-containing tertiary hydrocarbyl group. The repeat unit is also referred to as repeat unit (a), hereinafter. Since the nitrobenzene ring-containing tertiary hydrocarbyl group is fully effective for suppressing acid diffusion, a resist film having a high dissolution contrast is obtained using a base polymer comprising repeat units (a). Notably, the "tertiary hydrocarbyl group" is a group obtained by eliminating hydrogen from the tertiary carbon in a tertiary hydrocarbon.

Preferably, the repeat units (a) have the formula (a).

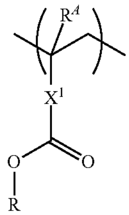

(a)

In formula (a), $R^A$ is hydrogen or methyl. $X^1$ is a single bond, phenylene group, naphthylene group, or a $C_1$-$C_{12}$ linking group containing at least one moiety selected from an ester bond, ether bond and lactone ring.

In formula (a), R is a nitrobenzene ring-containing tertiary hydrocarbyl group having the formula (a1).

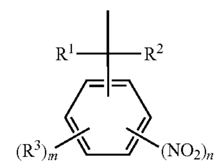

(a1)

In formula (a1), $R^1$ and $R^2$ are each independently a $C_1$-$C_6$ aliphatic hydrocarbyl group which may contain a heteroatom. $R^1$ and $R^2$ may bond together to form a ring with the carbon atom to which they are attached. $R^3$ is hydrogen, halogen, a $C_1$-$C_6$ alkyl group, $C_1$-$C_6$ alkoxy group or $C_1$-$C_6$ acyloxy group. The subscript m is an integer of 1 to 4, and n is 1 or 2.

The $C_1$-$C_6$ aliphatic hydrocarbyl group represented by $R^1$ and $R^2$ may be saturated or unsaturated and straight, branched or cyclic. Examples thereof include alkyl groups such as methyl, ethyl, propyl, isopropyl, n-butyl, isobutyl, sec-butyl, tert-butyl, n-pentyl, neopentyl, and n-hexyl; cycloalkyl groups such as cyclopropyl, cyclobutyl, cyclopentyl and cyclohexyl; alkenyl groups such as vinyl, 1-propenyl, 2-propenyl, butenyl and hexenyl; cycloalkenyl groups such as cyclohexenyl; alkynyl groups such as ethynyl and butynyl; and combinations thereof. $R^1$ and $R^2$ are preferably selected from methyl, ethyl, isopropyl, test-butyl, cyclopentyl, cyclohexyl, vinyl, and ethynyl.

Suitable halogen atoms represented by $R^3$ include fluorine, chlorine, bromine and iodine.

Examples of the $C_1$-$C_6$ alkyl group and alkyl moiety in the $C_1$-$C_6$ alkoxy group and $C_1$-$C_6$ acyloxy group, represented by $R^3$, include methyl, ethyl, propyl, isopropyl, n-butyl, isobutyl, sec-butyl, tert-butyl, n-pentyl and tert-pentyl.

Examples of the group having formula (a1) are shown below, but not limited thereto.

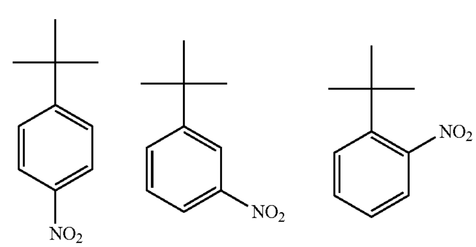

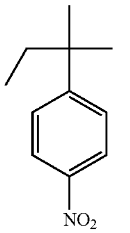
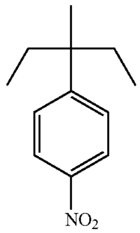
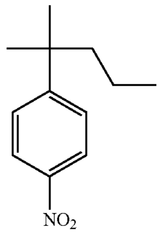
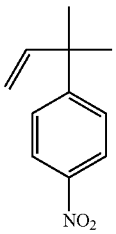
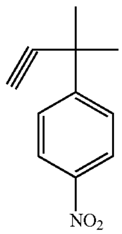
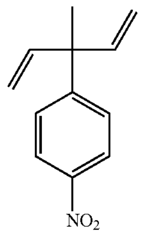
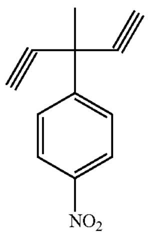
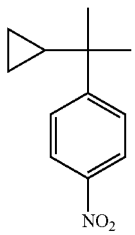
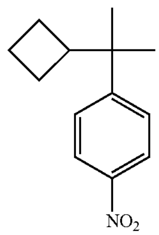
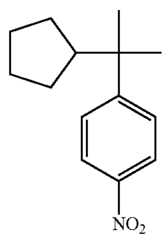
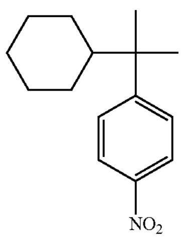
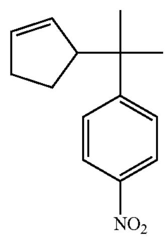
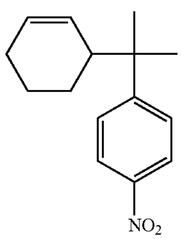
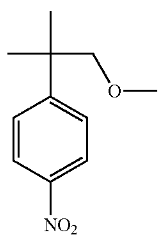
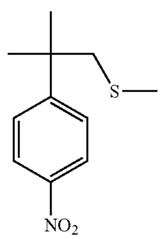
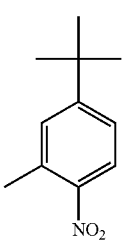
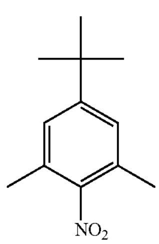
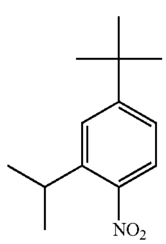
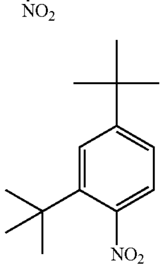
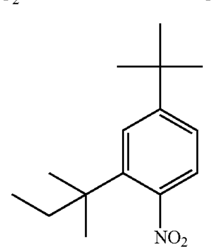
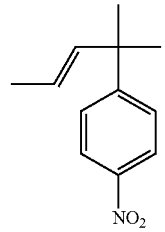
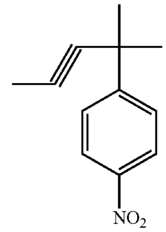
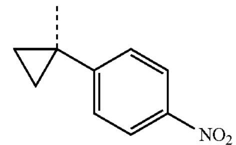
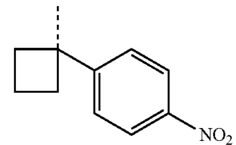
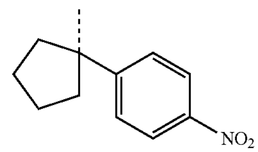
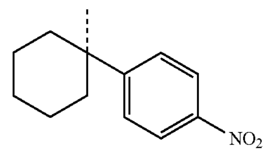
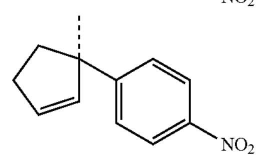
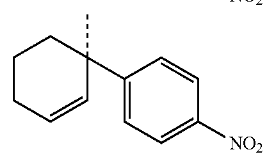
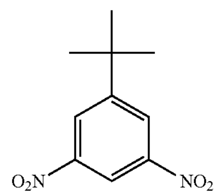
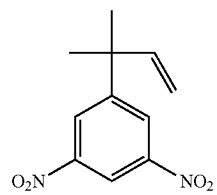
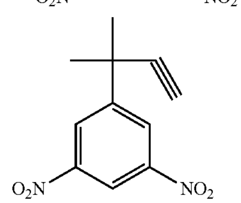
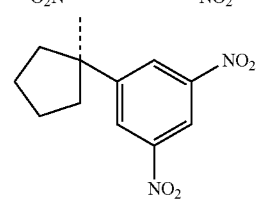
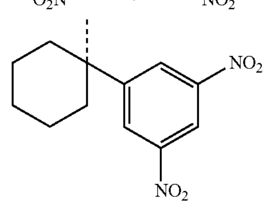
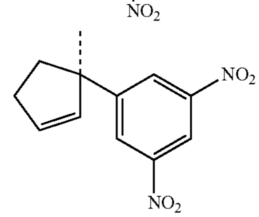
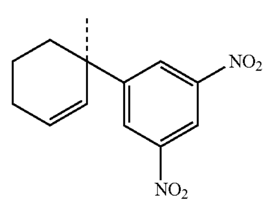
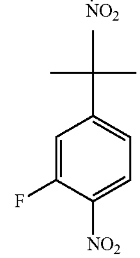
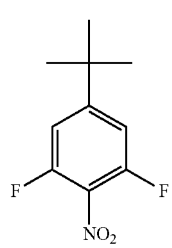
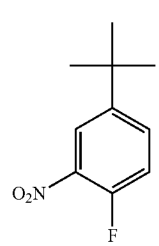
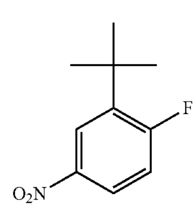

-continued
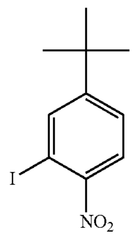
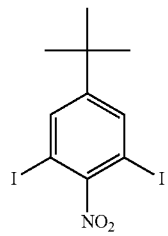
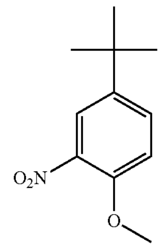
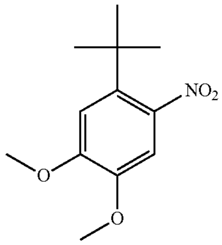
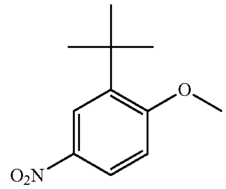
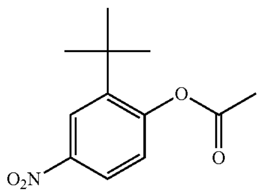
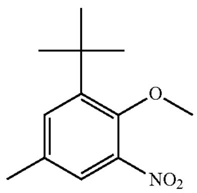
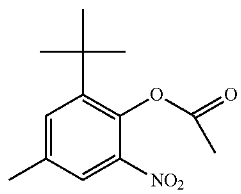
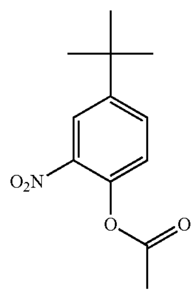
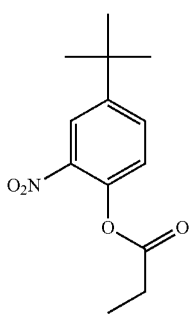
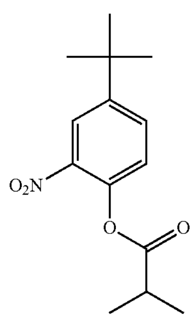
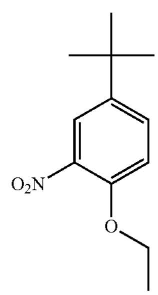
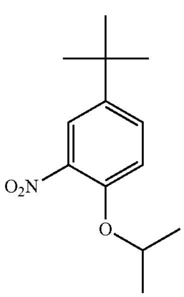
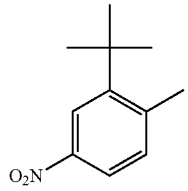
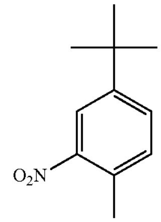
-continued
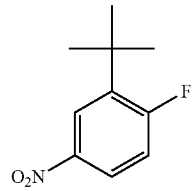
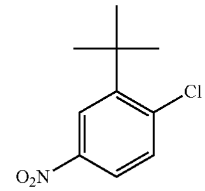
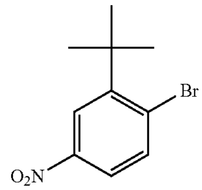
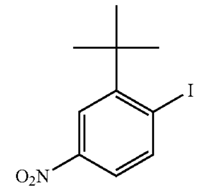
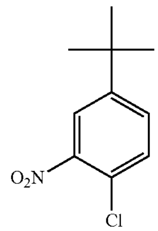
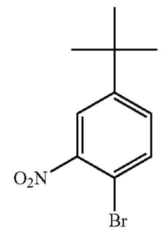
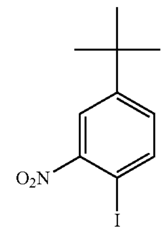
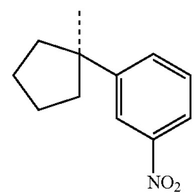
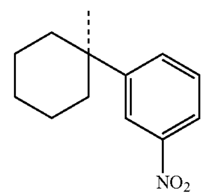
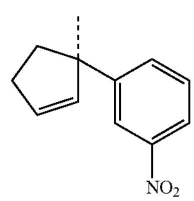
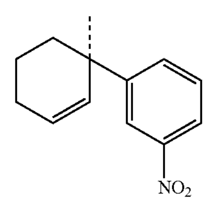
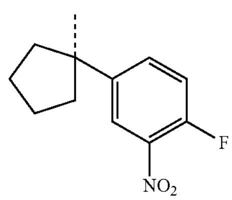
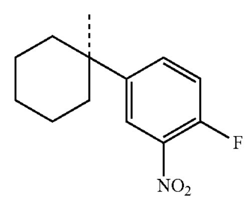
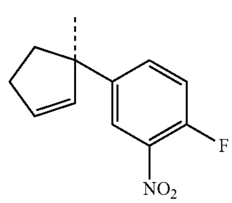
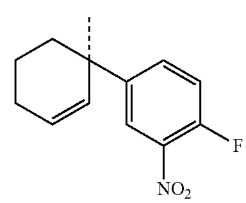
Examples of the monomer from which repeat units having formula (a) are derived are shown below, but not limited thereto. $R^A$ and R are as defined above.

-continued
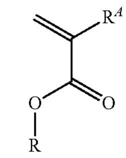
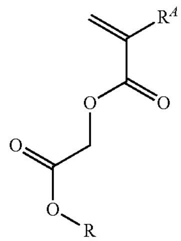
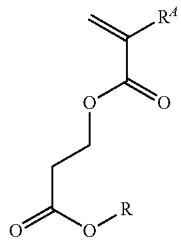
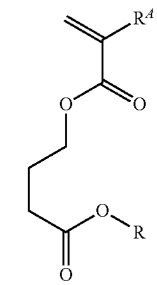
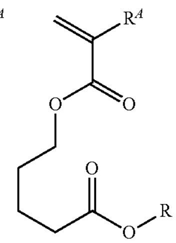
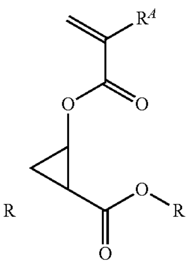
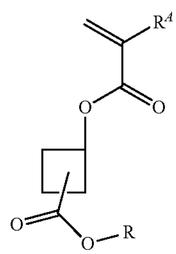
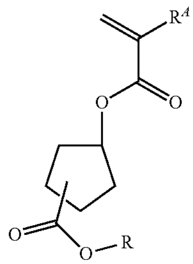
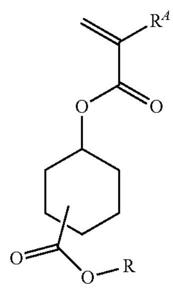
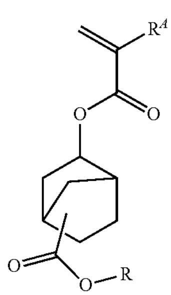
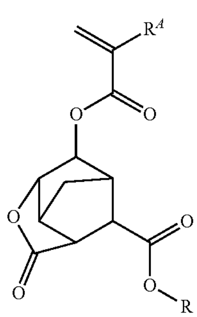
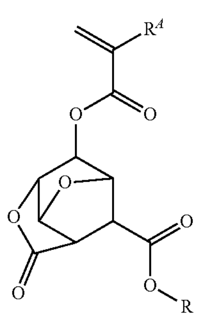
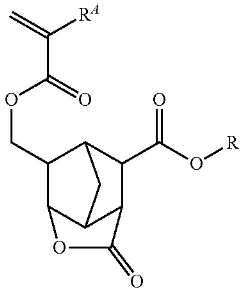
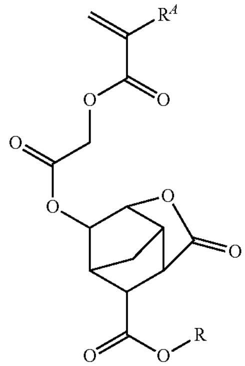
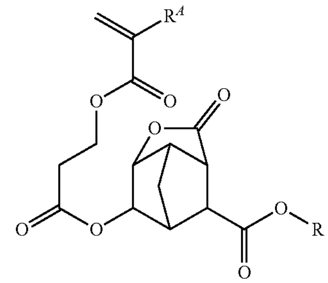
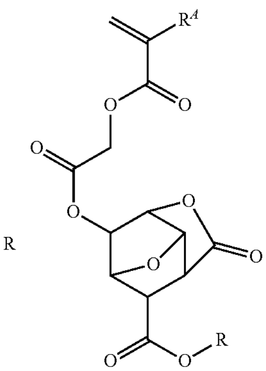
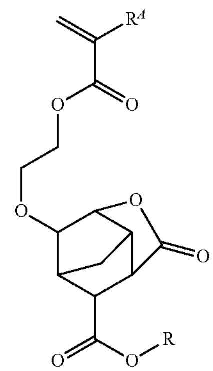
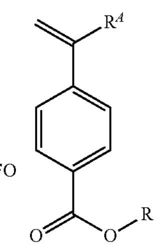
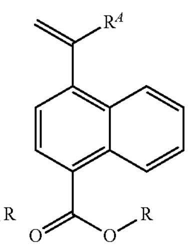
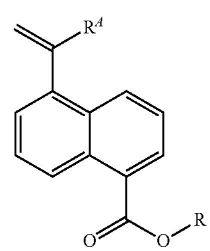
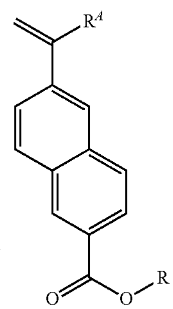
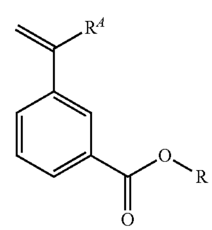
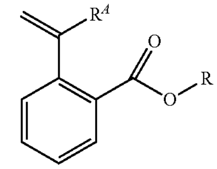
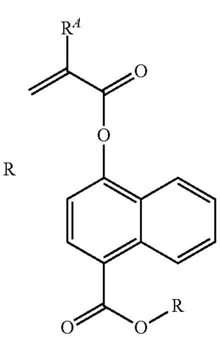

-continued

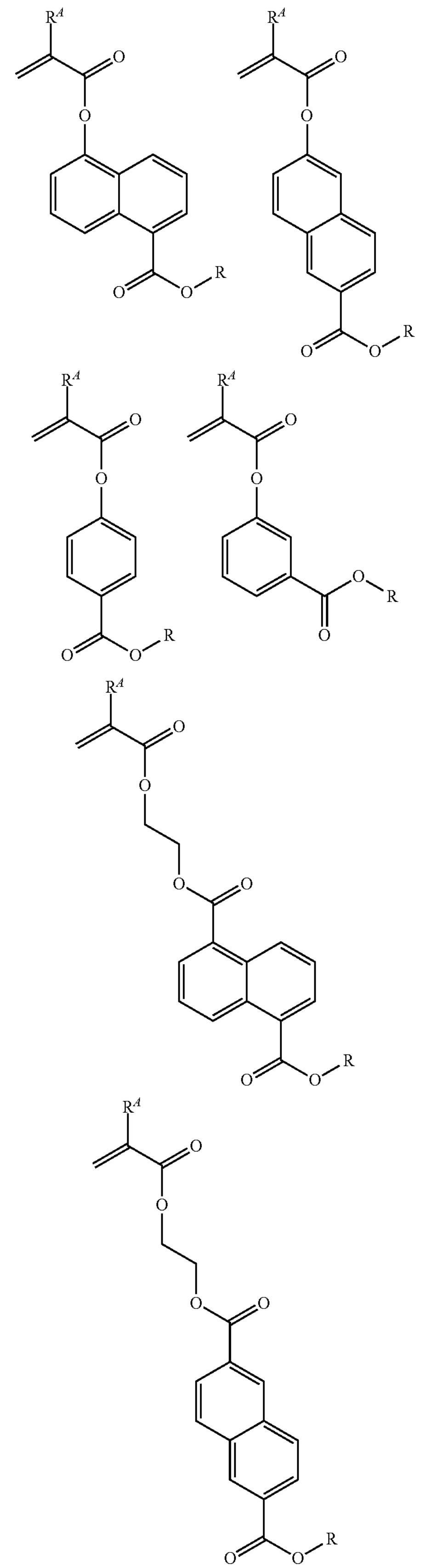

The repeat unit (a) functions as a quencher due to the inclusion of nitrogen atom. That is, the base polymer is a quencher-bound polymer. The quencher-bound polymer has the advantages of a remarkable acid diffusion-suppressing effect and improved resolution. In addition, the repeat unit (a) is an acid labile group unit because it has a tertiary ester structure. In contrast to the ordinary acid labile group unit that relies on an acid-catalyzed polarity switch, the repeat unit (a) has not only the polarity switch function, but also the acid diffusion-suppressing function. This enables to enhance dissolution contrast while suppressing acid diffusion.

For the purpose of enhancing dissolution contrast, the base polymer may further comprise repeat units having a carboxy group whose hydrogen is substituted by an acid labile group other than the nitrobenzene ring-containing tertiary hydrocarbyl group (also referred to as units (b1), hereinafter), and/or repeat units having a phenolic hydroxy group whose hydrogen is substituted by an acid labile group (also referred to as units (b2), hereinafter).

Typically, the repeat units (b1) and (b2) have the formulae (b1) and (b2), respectively.

(b1)

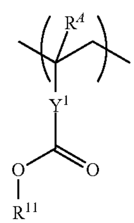

(b2)

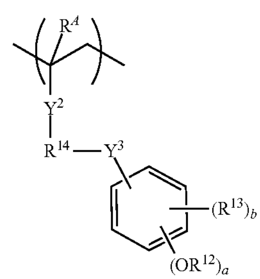

In formulae (b1) and (b2), $R^A$ is each independently hydrogen or methyl. $Y^1$ is a single bond, phenylene group, naphthylene group, or a $C_1$-$C_{12}$ linking group containing at least one moiety selected from an ester bond, ether bond and lactone ring. $Y^2$ is a single bond, ester bond or amide bond. $Y^3$ is a single bond, ether bond or ester bond $R^{11}$ is an acid labile group other than the nitrobenzene ring-containing tertiary hydrocarbyl group. $R^{12}$ is an acid labile group. $R^{13}$ is fluorine, trifluoromethyl, cyano or a $C_1$-$C_6$ saturated hydrocarbyl group. $R^{14}$ is a single bond or a $C_1$-$C_6$ alkanediyl group in which some constituent —$CH_2$— may be replaced by an ether bond or ester bond. The subscript “a” is 1 or 2, “b” is an integer of 0 to 4, and the sum of a+b is from 1 to 5.

Examples of the monomer from which the repeat unit (b1) is derived are shown below, but not limited thereto. $R^A$ and $R^{11}$ are as defined above.

-continued
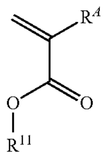
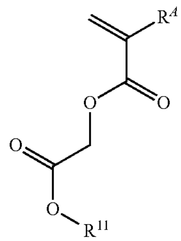
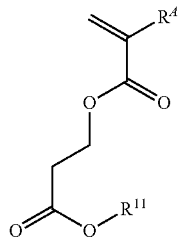
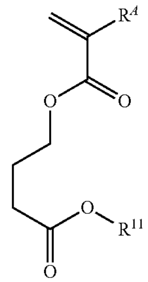
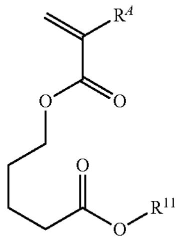
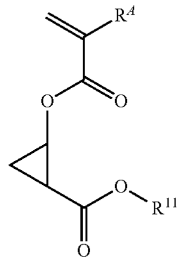
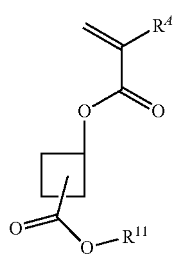
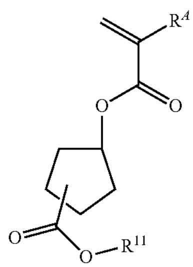
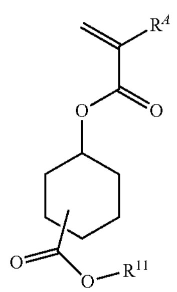
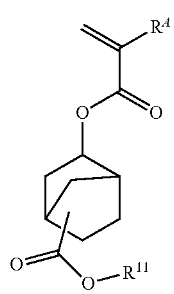
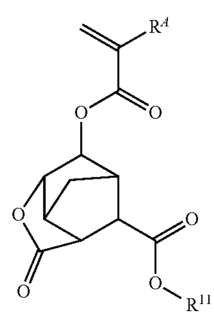
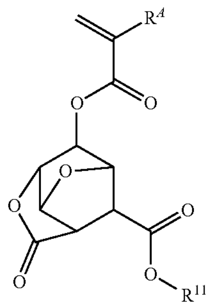
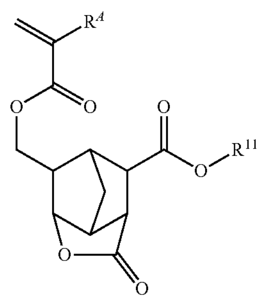
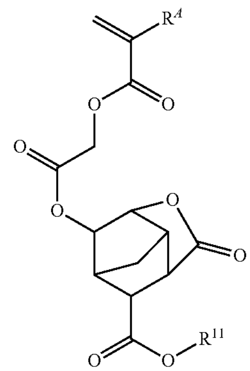
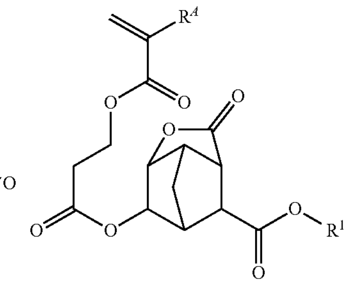
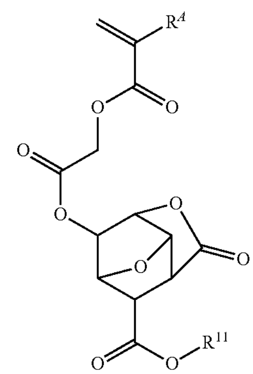
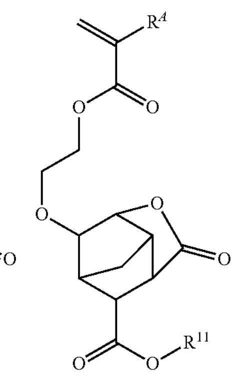
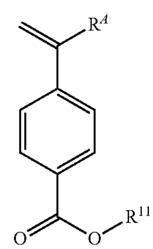
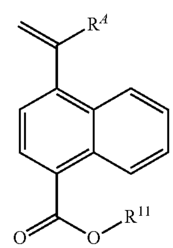
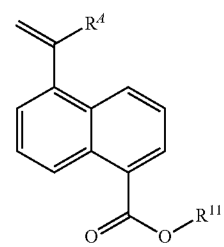
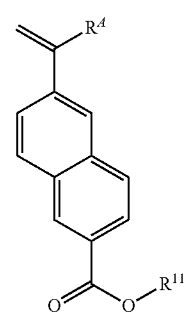
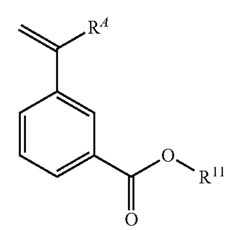
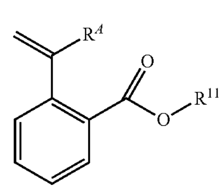
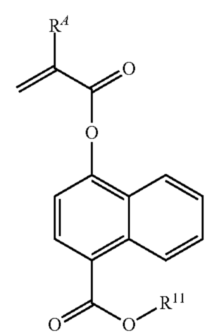

-continued
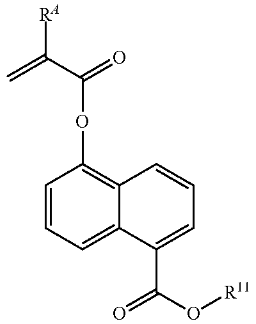
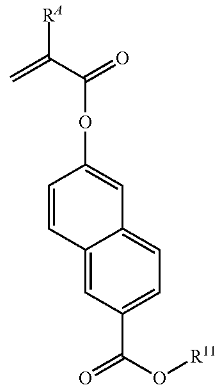
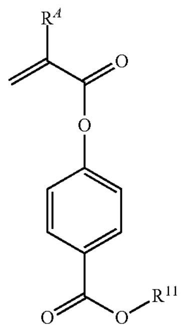
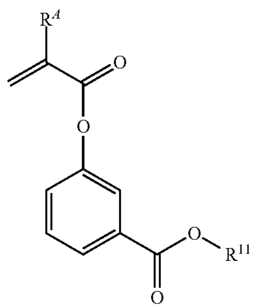
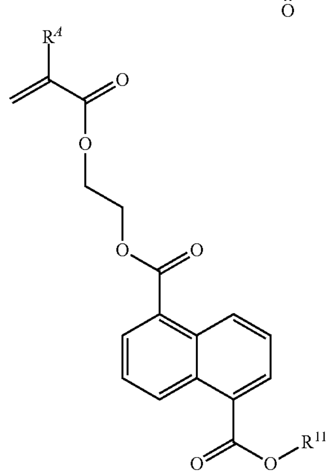
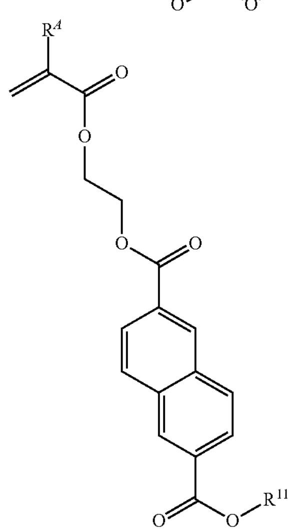
Examples of the monomer from which the repeat unit (b2) is derived are shown below, but not limited thereto. $R^A$ and $R^{12}$ are as defined above.
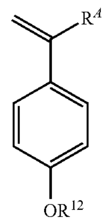
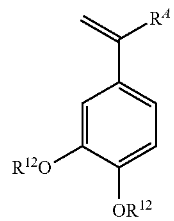
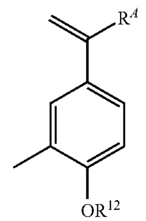
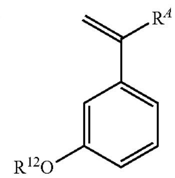
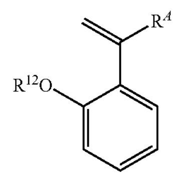
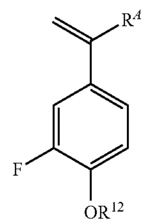
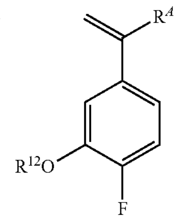
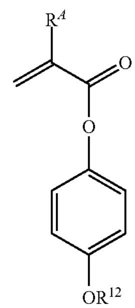
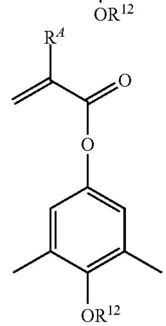
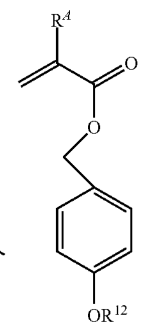
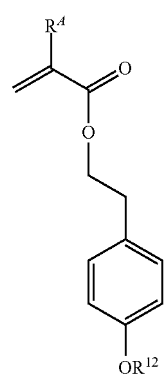
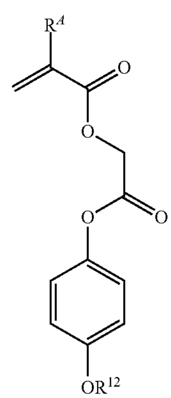
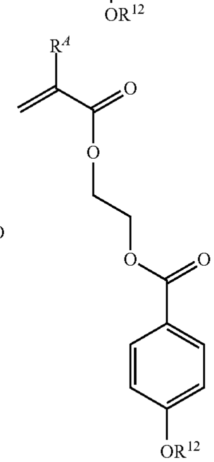
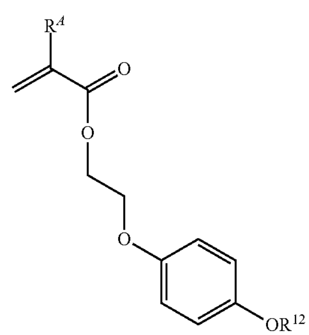
The acid labile groups represented by $R^{11}$ and $R^{12}$ may be selected from a variety of such groups, for example, groups of the following formulae (AL-1) to (AL-3).

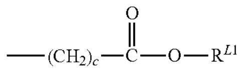

(AL-1)

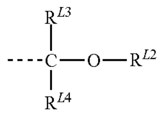

(AL-2)

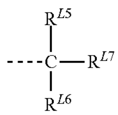

(AL-3)

In formula (AL-1), c is an integer of 0 to 6. $R^{L1}$ is a $C_4$-$C_{20}$, preferably $C_4$-$C_{15}$ tertiary hydrocarbyl group, a trihydrocarbylsilyl group in which each hydrocarbyl moiety is a $C_1$-$C_6$ saturated one, a $C_4$-$C_{20}$ saturated hydrocarbyl group containing a carbonyl moiety, ether bond or ester bond, or a group of formula (AL-3). Notably, the tertiary hydrocarbyl group is a group obtained by eliminating hydrogen from the tertiary carbon in a tertiary hydrocarbon.

The tertiary hydrocarbyl group $R^{L1}$ may be saturated or unsaturated and branched or cyclic. Examples thereof include tert-butyl, tert-pentyl, 1,1-diethylpropyl, 1-ethylcyclopentyl, 1-butylcyclopentyl, 1-ethylcyclohexyl 1,1-butylcyclohexyl, 1-ethyl-2-cyclopentenyl, 1-ethyl-2-cyclohexenyl, and 2-methyl-2-adamantyl. Examples of the trihydrocarbylsilyl group include trimethylsilyl, triethylsilyl, and dimethyl-tert-butylsilyl. The saturated hydrocarbyl group containing a carbonyl moiety, ether bond or ester bond may be straight, branched or cyclic, preferably cyclic and examples thereof include 3-oxocyclohexyl, 4-methyl-2-oxooxan-4-yl, 5-methyl-2-oxooxolan-5-yl, 2-tetrahydropyranyl, and 2-tetrahydrofuranyl.

Examples of the acid labile group having formula (AL-1) include tert-butoxycarbonyl, tert-butoxycarbonylmethyl, tert-pentyloxycarbonyl, tert-pentyloxycarbonylmethyl, 1,1-diethylpropyloxycarbonyl, 1,1-diethylpropyloxycarbonylmethyl, 1-ethylcyclopentyloxycalbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Other examples of the acid labile group having formula (AL-1) include groups having the formulae (AL-1)-1 to (AL-1)-10.

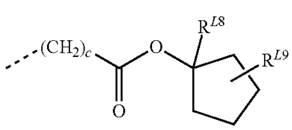

(AL-1)-1

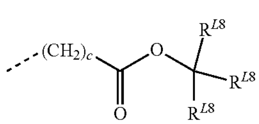

(AL-1)-2

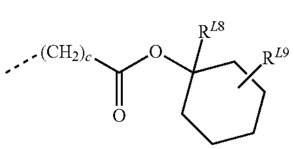

(AL-1)-3

-continued

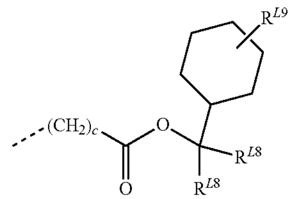

(AL-1)-4

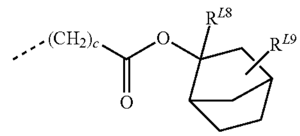

(AL-1)-5

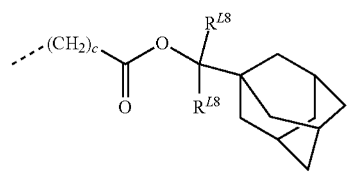

(AL-1)-6

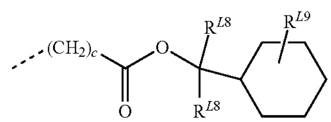

(AL-1)-7

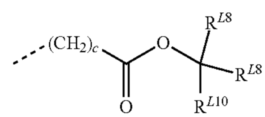

(AL-1)-8

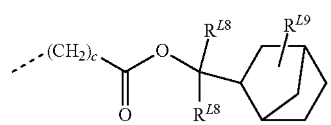

(AL-1)-9

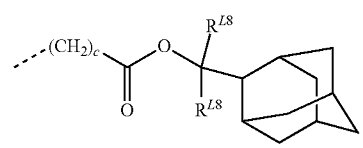

(AL-1)-10

In formulae (AL-1)-1 to (AL-1)-10, c is as defined above. $R^{L8}$ is each independently a $C_1$-$C_{10}$ saturated hydrocarbyl group or $C_6$-$C_{20}$ aryl group. $R^{L9}$ is hydrogen or a $C_1$-$C_{10}$ saturated hydrocarbyl group. $R^{L10}$ is a $C_2$-$C_{10}$ saturated hydrocarbyl group or $C_6$-$C_{20}$ aryl group. The saturated hydrocarbyl group may be straight, branched or cyclic.

In formula (AL-2), $R^{L2}$ and $R^{L3}$ are each independently hydrogen or a $C_1$-$C_{18}$, preferably $C_1$-$C_{10}$ saturated hydrocarbyl group. The saturated hydrocarbyl group may be straight, branched or cyclic and examples thereof include methyl, ethyl, n-propyl, isopropyl, n-butyl, isobutyl, sec-butyl, tert-butyl, cyclopentyl, cyclohexyl, 2-ethylhexyl and n-octyl.

$R^{L4}$ is a $C_1$-$C_{18}$, preferably $C_1$-$C_{10}$ hydrocarbyl group which may contain a heteroatom. The hydrocarbyl group may be saturated or unsaturated and straight, branched or cyclic. Typical are $C_1$-$C_1$s saturated hydrocarbyl groups, in which some hydrogen may be substituted by hydroxy, alkoxy, oxo, amino or alkylamino. Examples of the substituted saturated hydrocarbyl group are shown below.

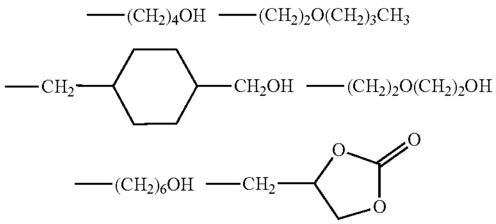

A pair of $R^{L2}$ and $R^{L3}$, $R^{L2}$ and $R^{L4}$, or $R^{L3}$ and $R^{L4}$ may bond together to form a ring with the carbon atom or carbon and oxygen atoms to which they are attached. $R^{L2}$ and $R^{L3}$, $R^{L2}$ and $R^{L4}$, or $R^{L3}$ and $R^{L4}$ that form a ring are each independently a $C_1$-$C_{18}$, preferably $C_1$-$C_{10}$ alkanediyl group. The ring thus formed is preferably of 3 to 10, more preferably 4 to 10 carbon atoms.

Of the acid labile groups having formula (AL-2), suitable straight or branched groups include those having formulae (AL-2)-1 to (AL-2)-69, but are not limited thereto.

(AL-2)-1

$$\text{----}CH_2—O—CH_3$$

(AL-2)-2

$$\text{----}CH_2—O—CH_2—CH_3$$

(AL-2)-3

$$\text{----}CH_2—O—(CH_2)_2—CH_3$$

(AL-2)-4

$$\text{----}CH_2—O—(CH_2)_3—CH_3$$

(AL-2)-5

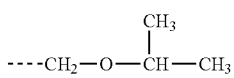

(AL-2)-6

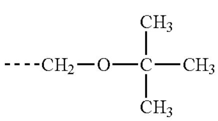

(AL-2)-7

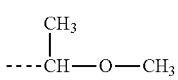

(AL-2)-8

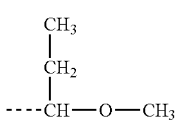

(AL-2)-9

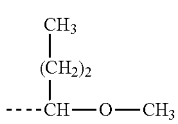

(AL-2)-10

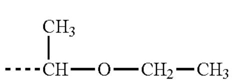

(AL-2)-11

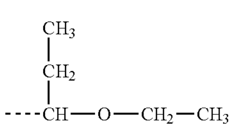

(AL-2)-12

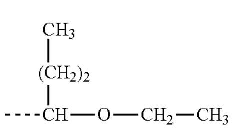

-continued (AL-2)-13

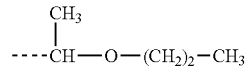

(AL-2)-14

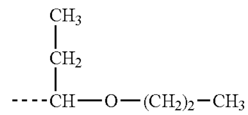

(AL-2)-15

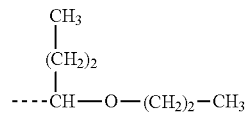

(AL-2)-16

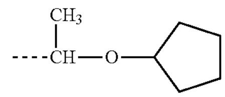

(AL-2)-17

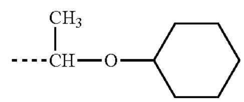

(AL-2)-18

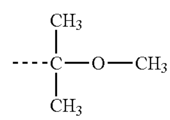

(AL-2)-19

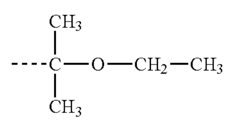

(AL-2)-20

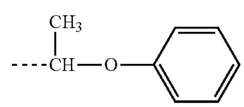

(AL-2)-21

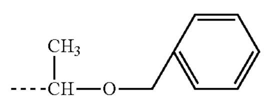

(AL-2)-22

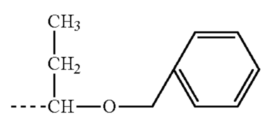

(AL-2)-23

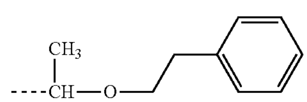

(AL-2)-24

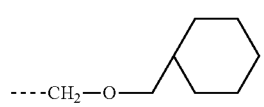

(AL-2)-25

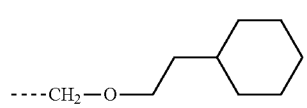

(AL-2)-26

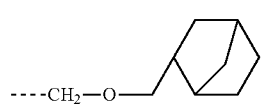

-continued
(AL-2)-27
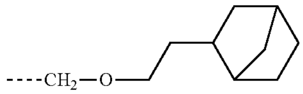
(AL-2)-28
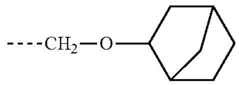
(AL-2)-29
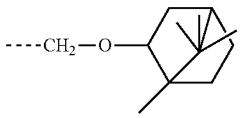
(AL-2)-30
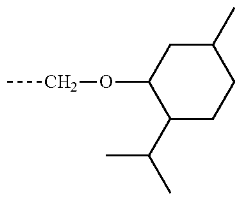
(AL-2)-31
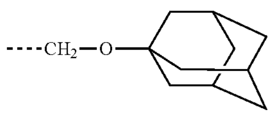
(AL-2)-32
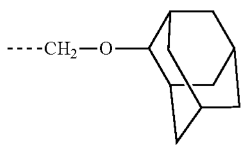
(AL-2)-33
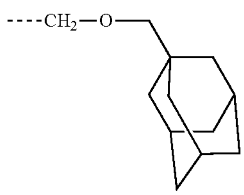
(AL-2)-34
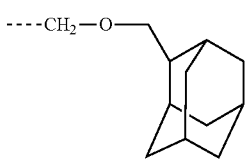
(AL-2)-35
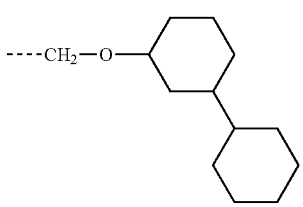
(AL-2)-36
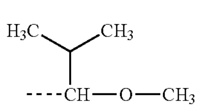
(AL-2)-37
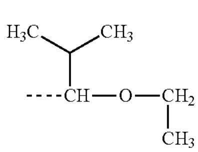
-continued
(AL-2)-38
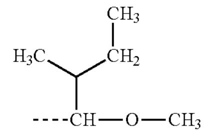
(AL-2)-39
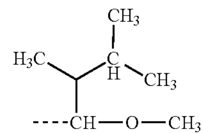
(AL-2)-40
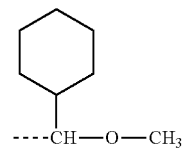
(AL-2)-41
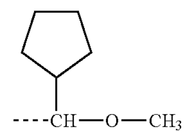
(AL-2)-42
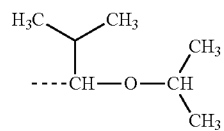
(AL-2)-43
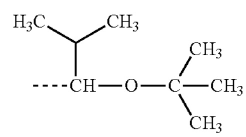
(AL-2)-44
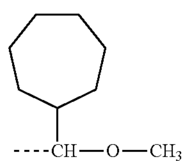
(AL-2)-45
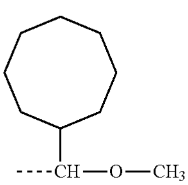
(AL-2)-46
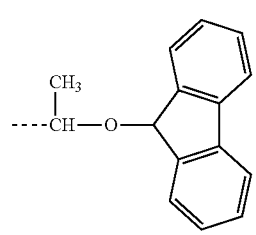

-continued
(AL-2)-47
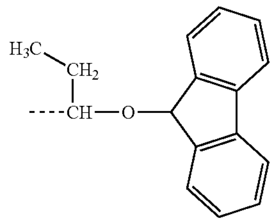
(AL-2)-48
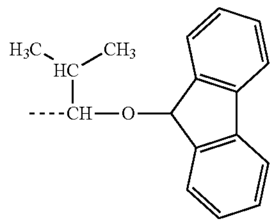
(AL-2)-49
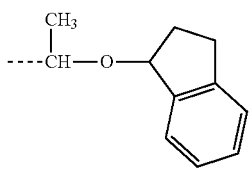
(AL-2)-50
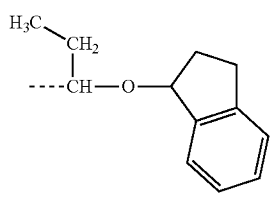
(AL-2)-51
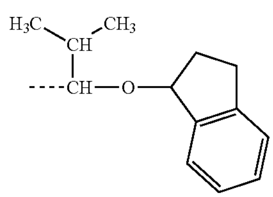
(AL-2)-52
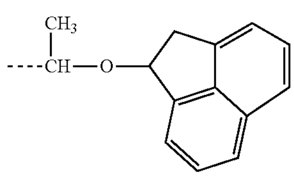
(AL-2)-53
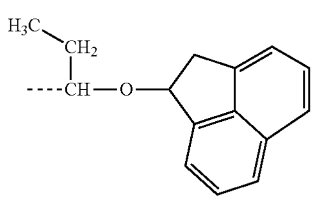
(AL-2)-54
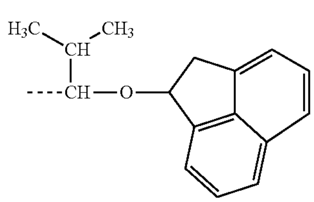
-continued
(AL-2)-55
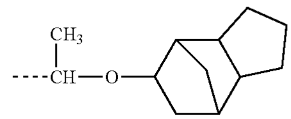
(AL-2)-56
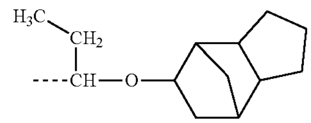
(AL-2)-57
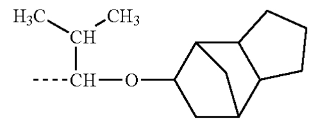
(AL-2)-58
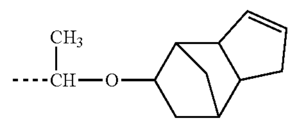
(AL-2)-59
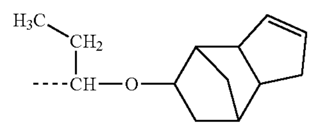
(AL-2)-60
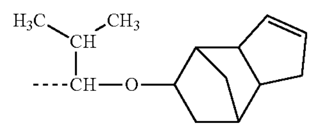
(AL-2)-61
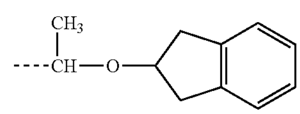
(AL-2)-62
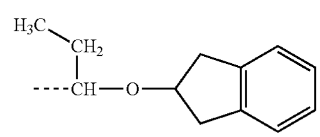
(AL-2)-63
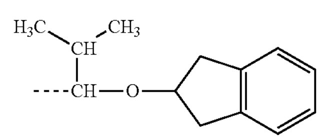
(AL-2)-64
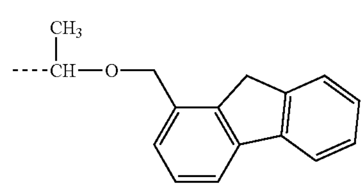
(AL-2)-65
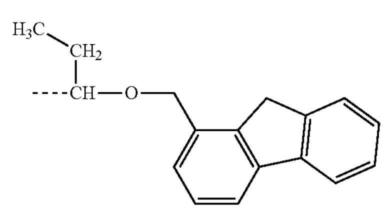

-continued (AL-2)-66

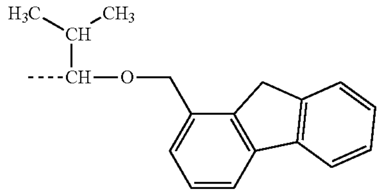

(AL-2)-67

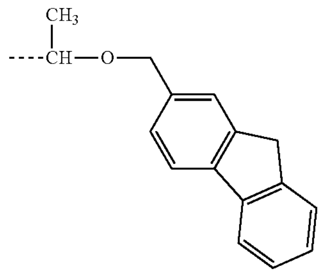

(AL-2)-68)

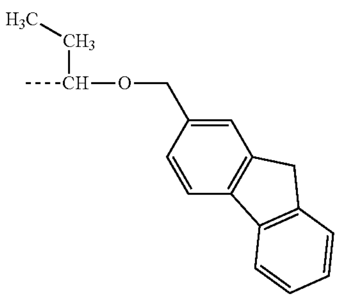

(AL-2)-69

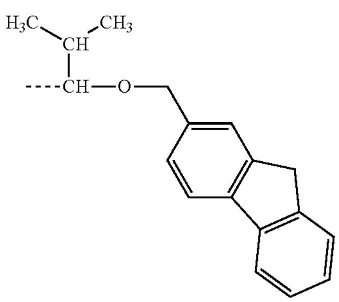

Of the acid labile groups having formula (AL-2), suitable cyclic groups include tetrahydrofuran-2-yl, 2-methyltetrahydrofuran-2 yl, tetrahydropyran-2-yl, and 2-methyltetrahydropyran-2-yl.

Also included are acid labile groups having the following formulae (AL-2a) and (AL-2b). The base polymer may be crosslinked within the molecule or between molecules with these acid labile groups.

(AL-2a)

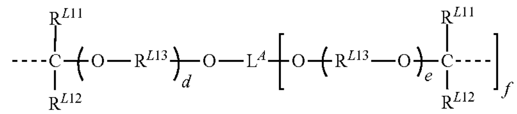

(AL-2b)

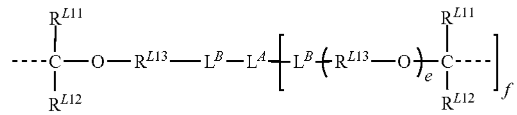

In formulae (AL-2a) and (AL-2b), $R^{L11}$ and $R^{L12}$ are each independently hydrogen or a $C_1$-$C_8$ saturated hydrocarbyl group which may be straight, branched or cyclic. Also, $R^{L11}$ and $R^{L12}$ may bond together to form a ring with the carbon atom to which they are attached, and in this case. $R^{L11}$ and $R^{L12}$ are each independently a $C_1$-$C_8$ alkanediyl group. $R^{L13}$ is each independently a $C_1$-$C_{10}$ saturated hydrocarbylene group which may be straight, branched or cyclic. The subscripts d and e are each independently an integer of 0 to 10, preferably 0 to 5, and f is an integer of 1 to 7, preferably 1 to 3.

In formulae (AL-2a) and (AL-2b), $L^A$ is a (f+1)-valent $C_1$-$C_{50}$ aliphatic saturated hydrocarbon group, (f+1)-valent $C_3$-$C_{50}$ alicyclic saturated hydrocarbon group, (f+1)-valent $C_6$-$C_{50}$ aromatic hydrocarbon group or (f+1)-valent $C_3$-$C_{50}$ heterocyclic group. In these groups, some constituent —$CH_2$— may be replaced by a heteroatom-containing moiety, or some hydrogen may be substituted by a hydroxy, carboxy, acyl moiety or fluorine. $L^A$ is preferably a $C_1$-$C_{20}$ saturated hydrocarbylene, saturated hydrocarbon group (e.g., tri- or tetravalent saturated hydrocarbon group), or $C_6$-$C_{30}$ arylene group. The saturated hydrocarbon group may be straight, branched or cyclic. $L^B$ is —C(═O)—O—, —NH—C(═O)—O— or —NH—C(═O)—NH—.

Examples of the crosslinking acetal groups having formulae (AL-2a) and (AL-2b) include groups having the formulae (AL-2)-70 to (AL-2)-77.

(0AL-2)-70

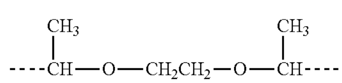

(AL-2)-71

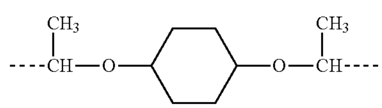

(AL-2)-72

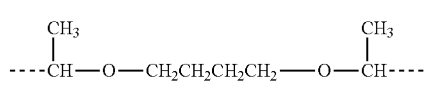

(AL-2)-73

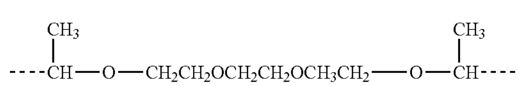

-continued (AL-2)-74

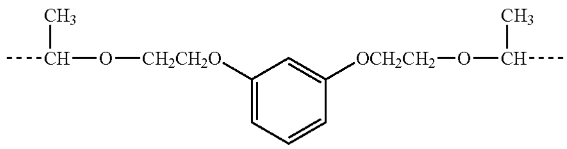

(AL-2)-75

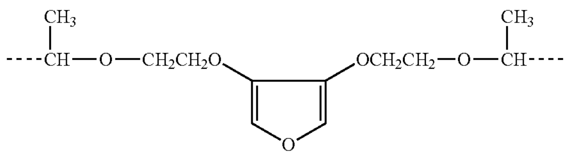

(AL-2)-76

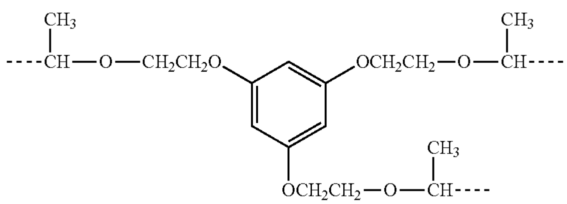

(AL-2)-77

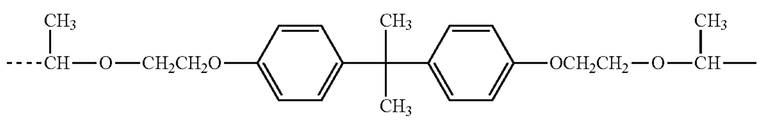

In formula (AL-3), $R^{L5}$, $R^{L6}$ and $R^{L7}$ are each independently a $C_1$-$C_{20}$ hydrocarbyl group which may contain a heteroatom such as oxygen, sulfur, nitrogen or fluorine. The hydrocarbyl group may be saturated or unsaturated and straight, branched or cyclic. Examples thereof include $C_1$-$C_{20}$ alkyl groups, $C_3$-$C_{20}$ cyclic saturated hydrocarbyl groups. $C_2$-$C_{20}$ alkenyl groups, $C_3$-$C_{20}$ cyclic unsaturated hydrocarbyl groups, and $C_6$-$C_{10}$ aryl groups. A pair of $R^{L5}$ and $R^{L6}$, $R^{L5}$ and $R^{L7}$, or $R^{L6}$ and $R^{L7}$ may bond together to form a $C_3$-$C_{20}$ aliphatic ring with the carbon atom to which they are attached.

Examples of the group having formula (AL-3) include tert-butyl, 1,1-diethylpropyl, 1-ethylnorbornyl, 1-methylcyclopentyl, 1-ethylcyclopentyl, 1-isopropylcyclopentyl, 1-methylcyclohexyl, 2-(2-methyl)adamantyl, 2-(2-ethyl)adamantyl, and tert-pentyl.

Examples of the group having formula (AL-3) also include groups having the formulae (AL-3)-1 to (AL-3)-19.

(AL-3)-1

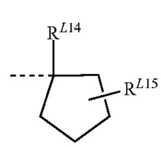

(AL-3)-2

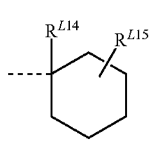

(AL-3)-3

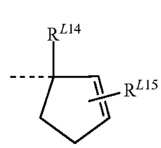

-continued (AL-3)-4

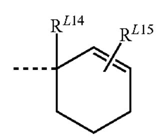

(AL-3)-5

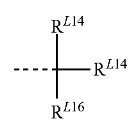

(AL-3)-6

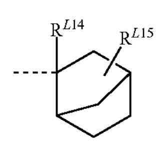

(AL-3)-7

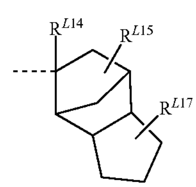

(AL-3)-8

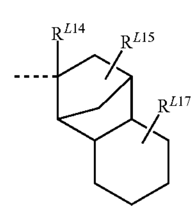

-continued (AL-3)-9

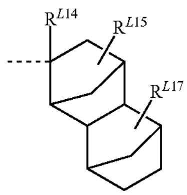

(AL-3)-10

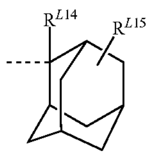

(AL-3)-11

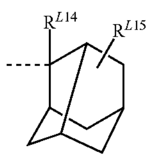

(AL-3)-12

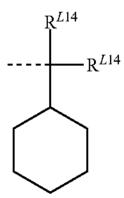

(AL-3)-13

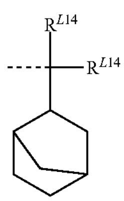

(AL-3)-14

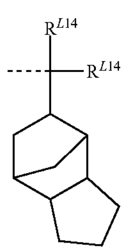

(AL-3)-15

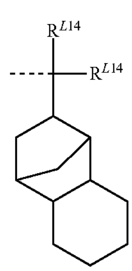

-continued (AL-3)-16

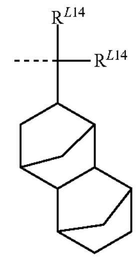

(AL-3)-17

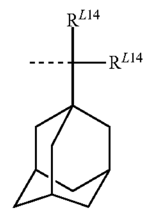

(AL-3)-18

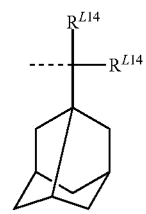

(AL-3)-19

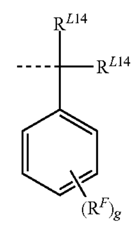

In formulae (AL-3)-1 to (AL-3)-19, $R^{L14}$ is each independently a $C_1$-$C_8$ saturated hydrocarbyl group or $C_6$-$C_{20}$ aryl group. $R^{L15}$ and $R^{L17}$ are each independently hydrogen or a $C_1$-$C_{20}$ saturated hydrocarbyl group. $R^{L16}$ is a $C_6$-$C_{20}$ aryl group. The saturated hydrocarbyl group may be straight, branched or cyclic. Typical of the aryl group is phenyl. $R^F$ is fluorine or trifluoromethyl, and g is an integer of 1 to 5.

Other examples of the acid labile group having formula (AL-3) include groups having the formulae (AL-3)-20 and (AL-3)-21. The base polymer may be crosslinked within the molecule or between molecules with these acid labile groups.

(AL-3)-20

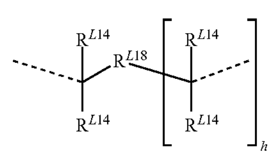

(AL-3)-21

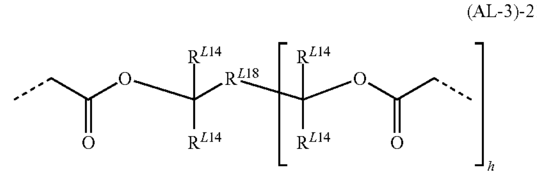

In formulae (AL-3)-20 and (AL-3)-21. $R^{L14}$ is as defined above. $R^{L18}$ is a (h+1)-valent $C_1$-$C_{20}$ saturated hydrocarbylene group or (h+1)-valent $C_6$-$C_{20}$ arylene group, which may contain a heteroatom such as oxygen, sulfur or nitrogen. The saturated hydrocarbylene group may be straight, branched or cyclic. The subscript h is an integer of 1 to 3.

Examples of the monomer from which repeat units containing an acid labile group of formula (AL-3) are derived include (meth)acrylates (inclusive of exo-form structure) having the formula (AL-3)-22.

(AL-3)-22

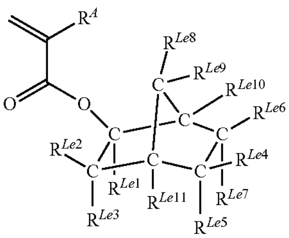

In formula (AL-3)-22, $R^A$ is as defined above. $R^{Lc1}$ is a $C_1$-$C_8$ saturated hydrocarbyl group or an optionally substituted $C_6$-$C_{20}$ aryl group; the saturated hydrocarbyl group may be straight, branched or cyclic. $R^{Lc2}$ to $R^{Lc11}$ are each independently hydrogen or a $C_1$-$C_{15}$ hydrocarbyl group which may contain a heteroatom; oxygen is a typical heteroatom. Suitable hydrocarbyl groups include $C_1$-$C_{15}$ alkyl groups and $C_6$-$C_{15}$ aryl groups. Alternatively, a pair of $R^{Lc2}$ and $R^{Lc3}$, $R^{Lc4}$ and $R^{Lc6}$, $R^{Lc4}$ and $R^{Lc7}$, $R^{Lc5}$ and $R^{Lc7}$, $R^{Lc5}$ and $R^{Lc11}$, $R^{Lc6}$ and $R^{Lc10}$, $R^{Lc8}$ and $R^{Lc9}$, or $R^{Lc9}$ and $R^{Lc10}$, taken together, may form a ring with the carbon atom to which they are attached, and in this event, the ring-forming group is a $C_1$-$C_{15}$ hydrocarbylene group which may contain a heteroatom. Also, a pair of $R^{Lc2}$ and $R^{Lc11}$, $R^{Lc8}$ and $R^{Lc11}$, or $R^{Lc4}$ and $R^{Lc6}$ which are attached to vicinal carbon atoms may bond together directly to form a double bond. The formula also represents an enantiomer.

Examples of the monomer from which repeat units having formula (AL-3)-22 are derived are described in U.S. Pat. No. 6,448,420 (JP-A 2000-327633). Illustrative non-limiting examples of suitable monomers are given below. $R^A$ is as defined above.

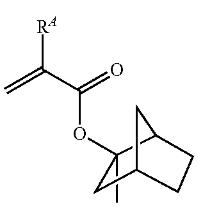
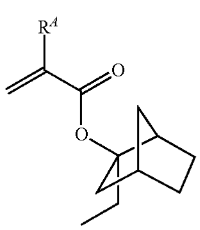
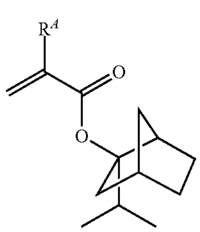
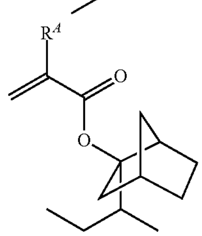

-continued

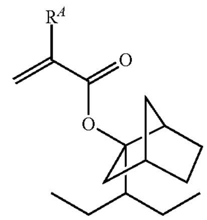
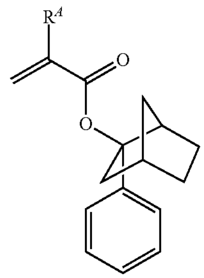
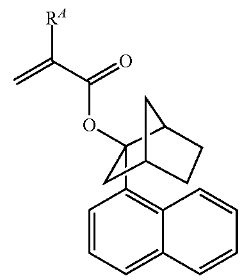
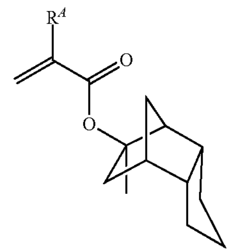
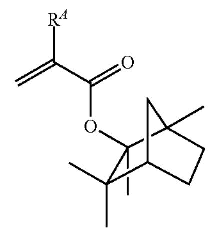
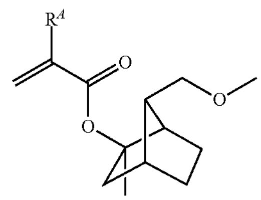
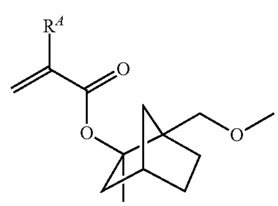
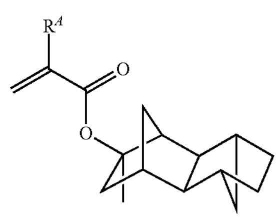
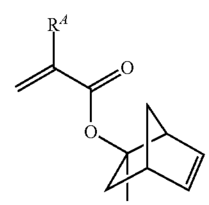
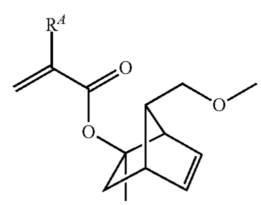
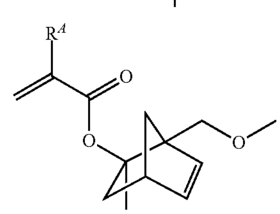
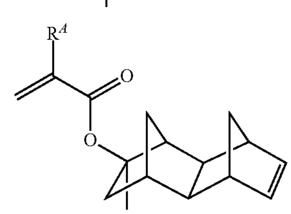
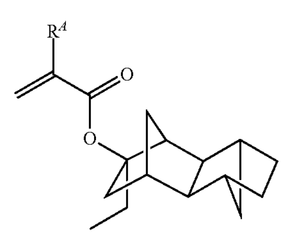
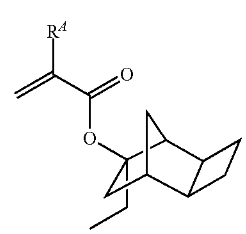

-continued

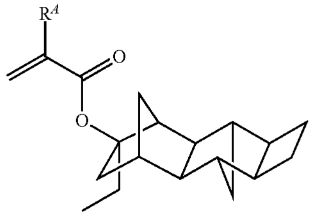

Also included in the repeat units having an acid labile group of formula (AL-3) are repeat units of (meth)acrylate having a furandiyl, tetrahydrofurandiyl or oxanorbornanediyl group as represented by the following formula (AL-3)-23.

(AL-3)-23

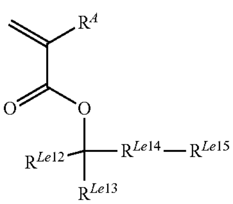

In formula (AL-3)-23, $R^A$ is as defined above. $R^{Lc12}$ and $R^{Lc13}$ are each independently a $C_1$-$C_{10}$ hydrocarbyl group, or $R^{Lc12}$ and $R^{Lc13}$, taken together, may form an aliphatic ring with the carbon atom to which they are attached. $R^{Lc14}$ is furandiyl, tetrahydrofurandiyl or oxanorbornanediyl. $R^{Lc15}$ is hydrogen or a $C_1$-$C_{10}$ hydrocarbyl group which may contain a heteroatom. The hydrocarbyl group may be straight, branched or cyclic, and examples thereof include $C_1$-$C_{10}$ saturated hydrocarbyl groups.

Examples of the monomer from which the repeat units having formula (AL-3)-23 are derived are shown below, but not limited thereto. Herein $R^A$ is as defined above.

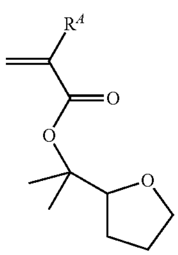
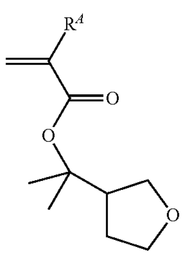
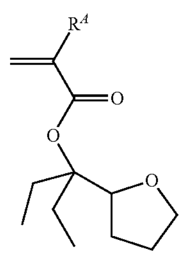
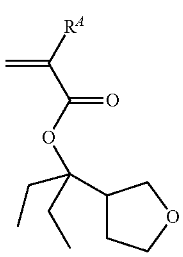
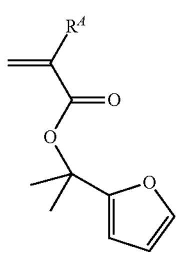
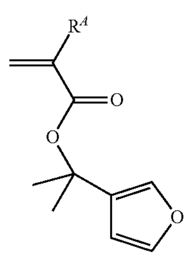

-continued

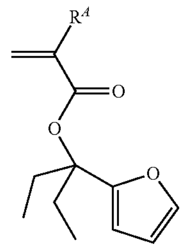
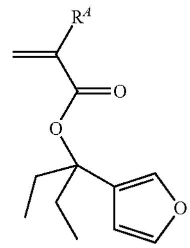
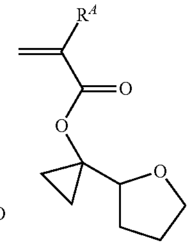
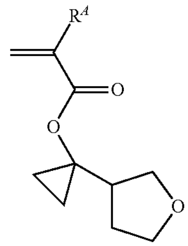
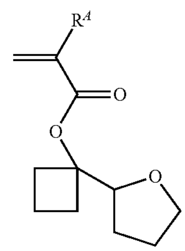
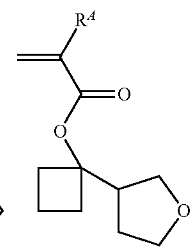
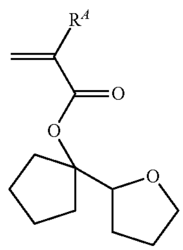
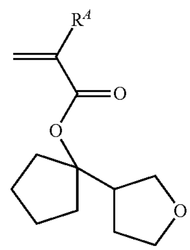
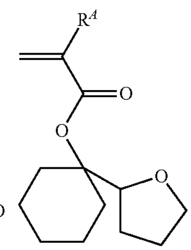
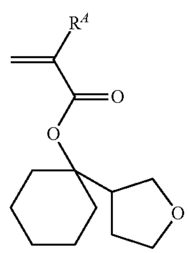
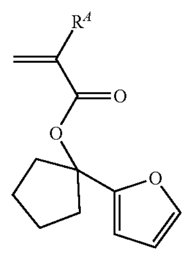
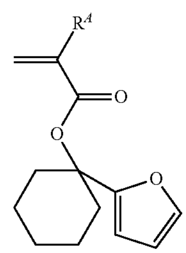
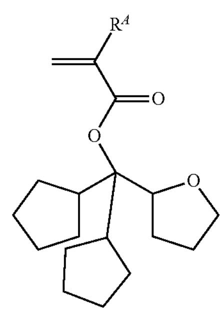
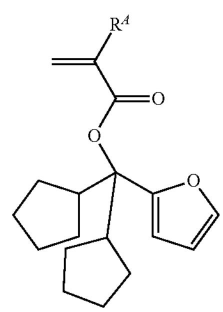
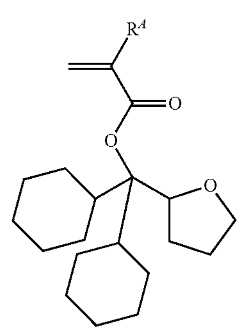
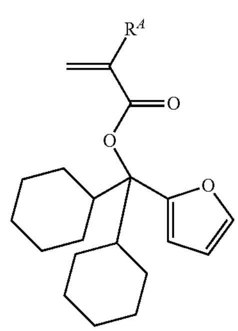

-continued
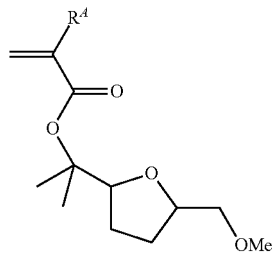
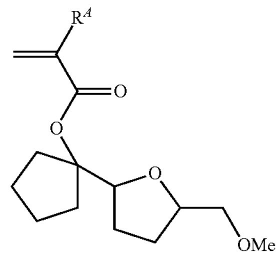
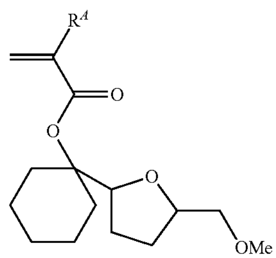
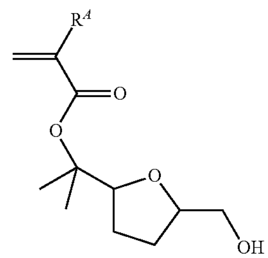
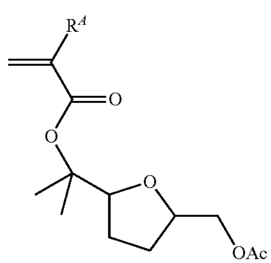
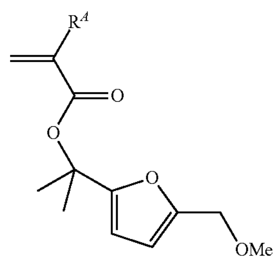
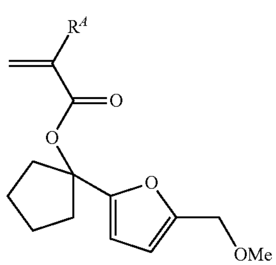
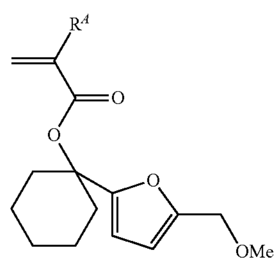
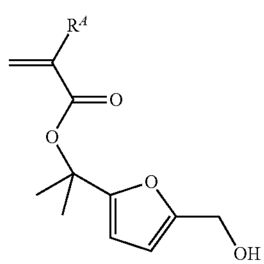
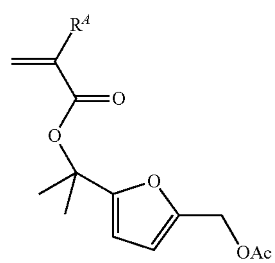
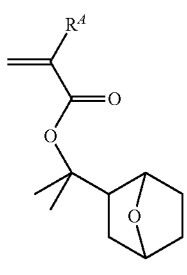
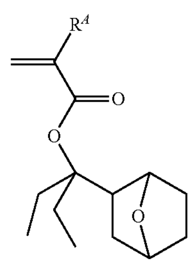
-continued
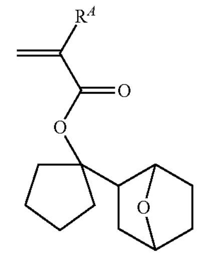
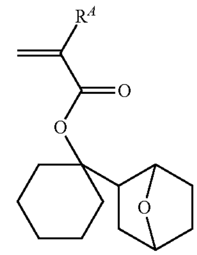
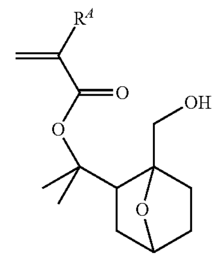
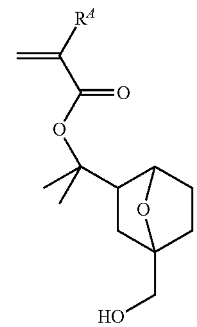
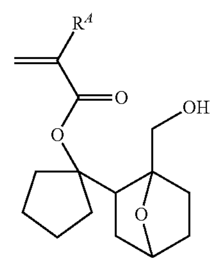
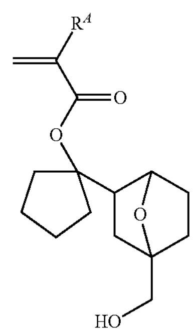
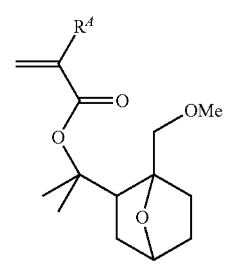
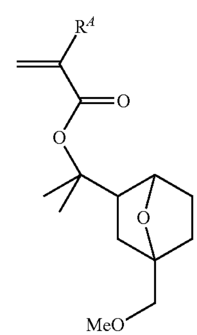
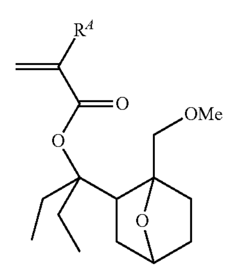
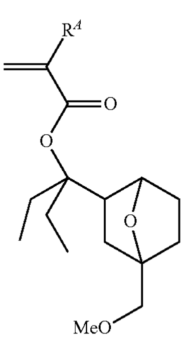

-continued

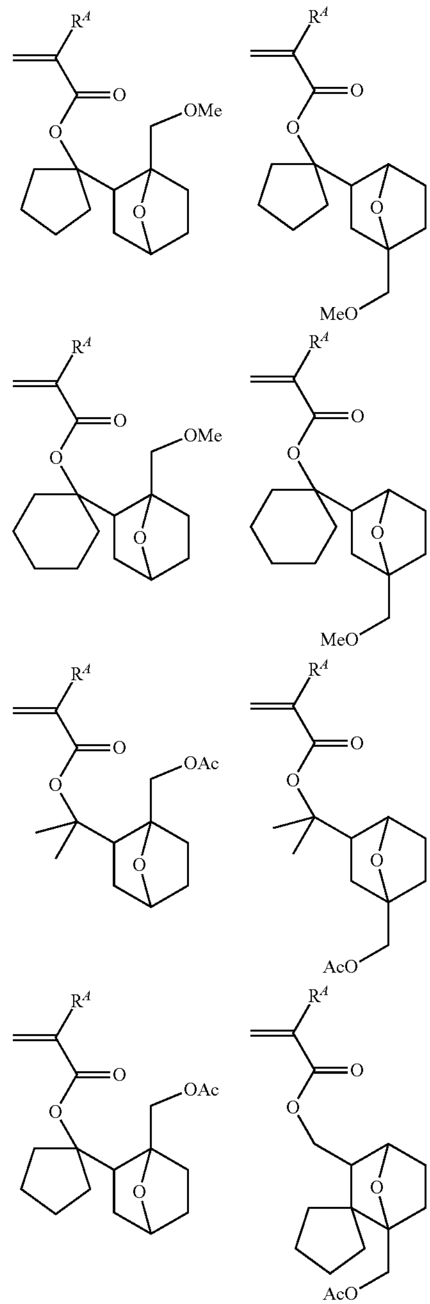

The base polymer may further comprise repeat units (c) having an adhesive group. The adhesive group is selected from hydroxy, carboxy, lactone ring, carbonate bond, thiocarbonate bond carbonyl, cyclic acetal, ether bond, ester bond, sulfonic ester bond, cyano, amide bond, —O—C(═O)—S— and —O—C(═O)—NH—.

Examples of the monomer from which repeat units (c) are derived are given below, but not limited thereto. Herein $R^A$ is as defined above.

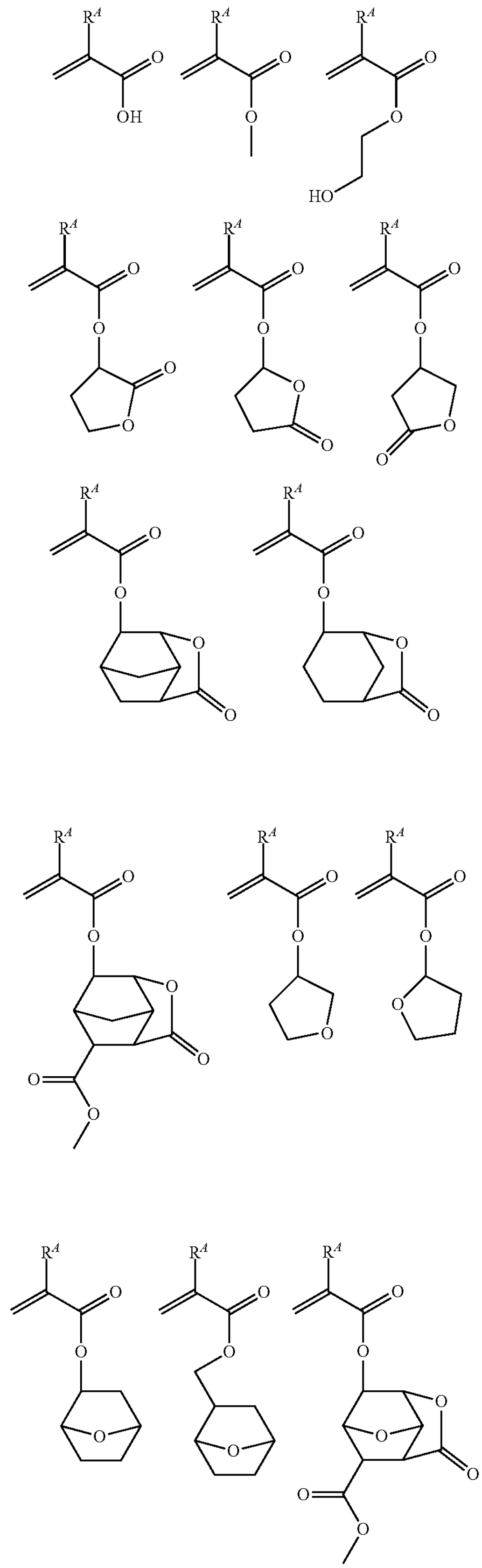

-continued
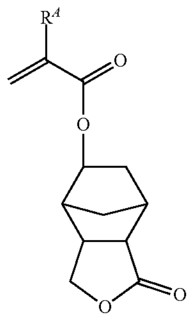
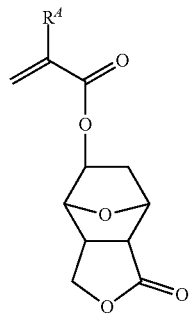
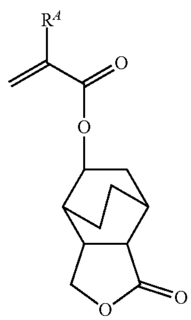
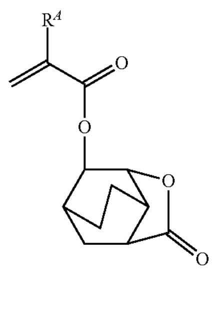
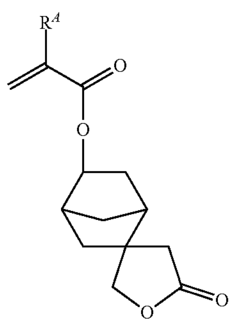
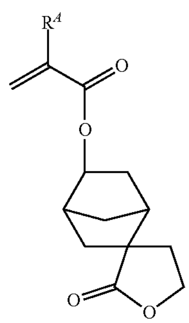
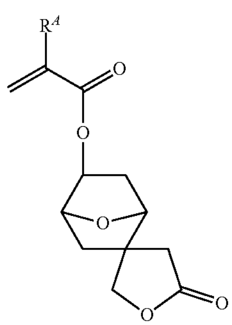
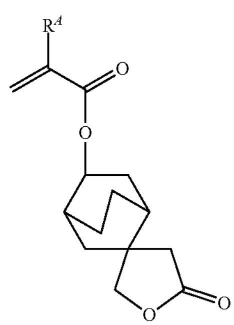
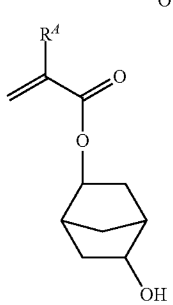
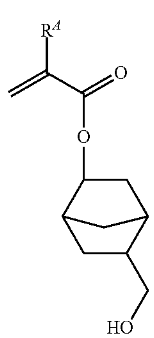
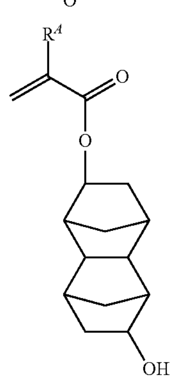
-continued
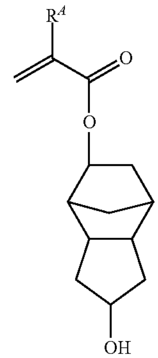
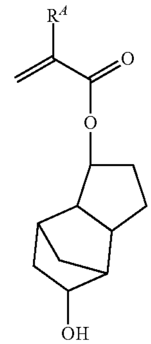
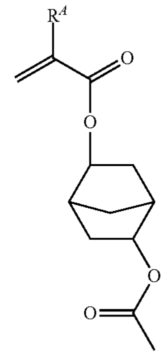
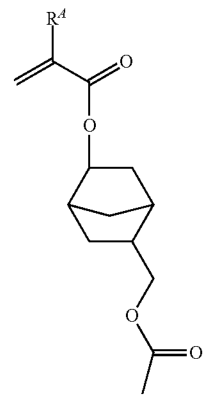
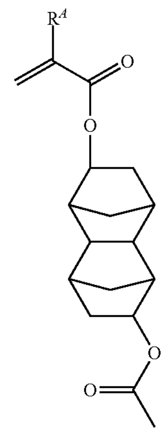
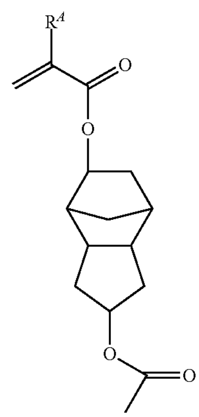
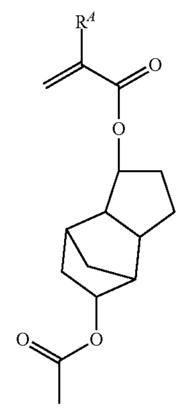
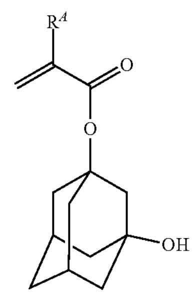
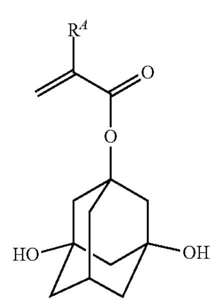
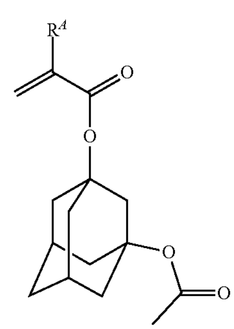

-continued
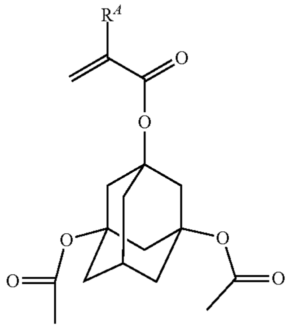
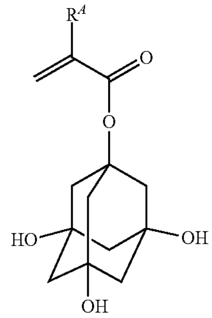
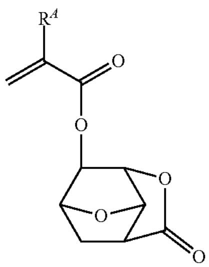
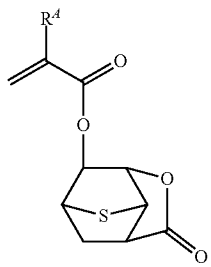
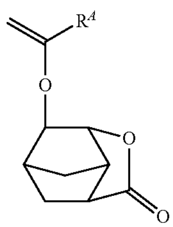
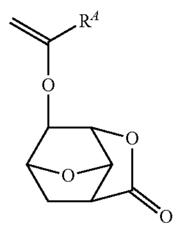
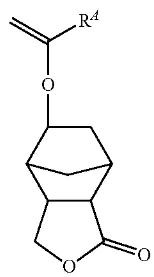
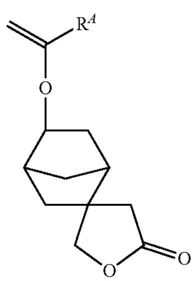
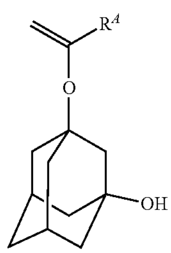
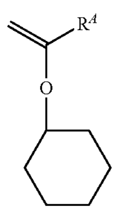
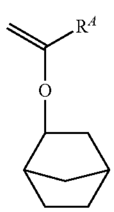
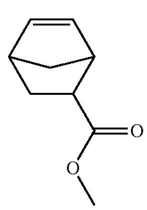
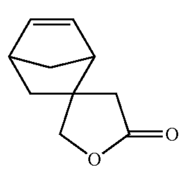
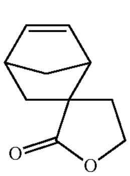
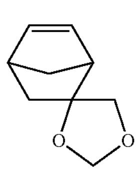
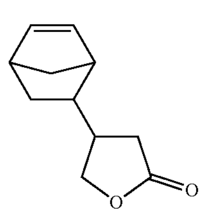
-continued
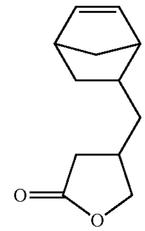
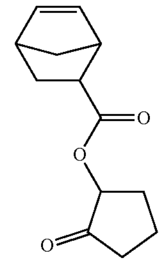
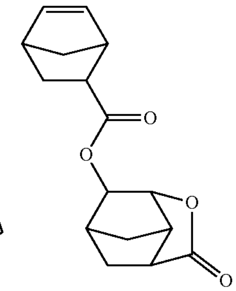
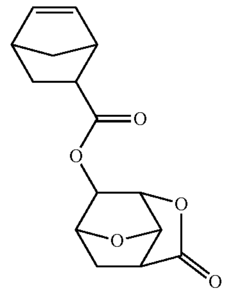
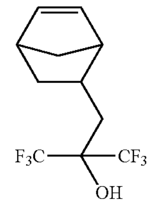
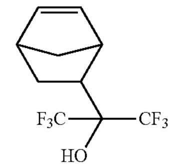
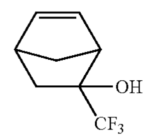
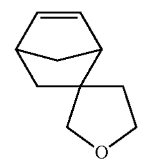
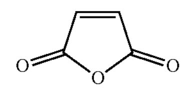
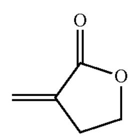
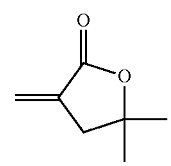
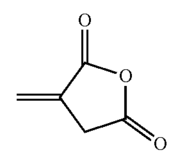
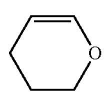
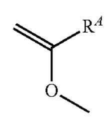
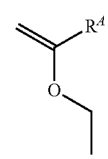
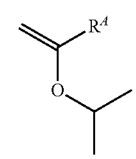
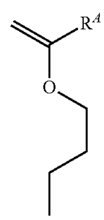
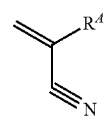
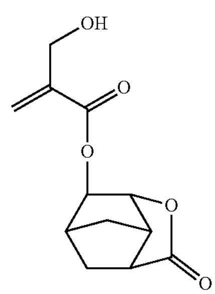
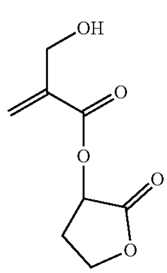
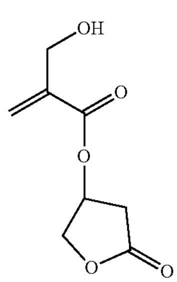
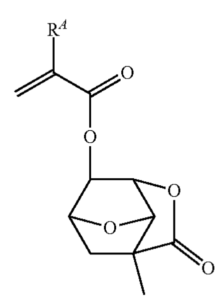

-continued
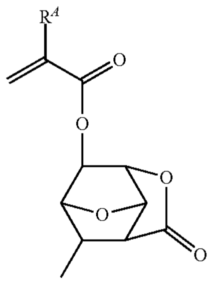
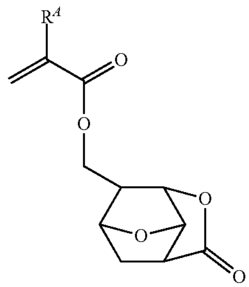
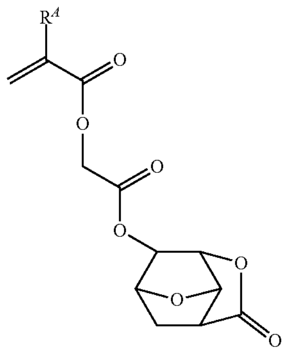
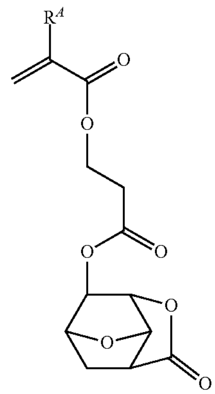
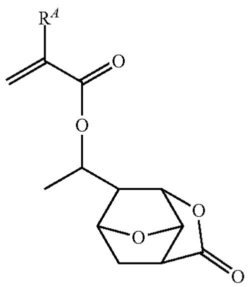
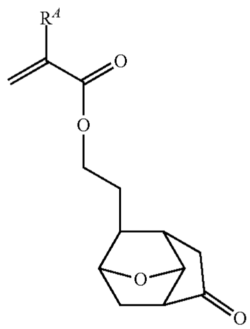
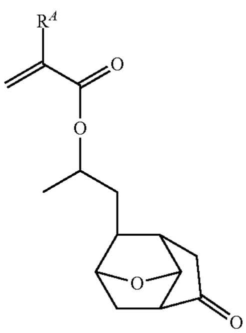
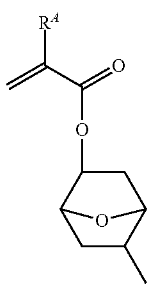
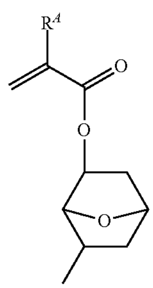
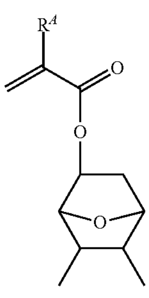
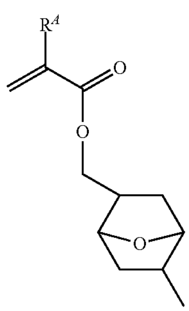
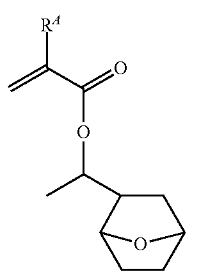
-continued
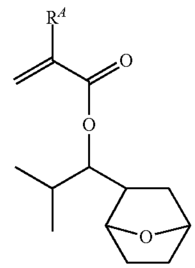
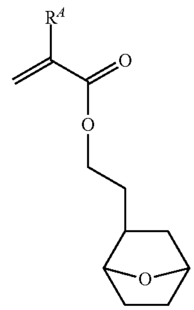
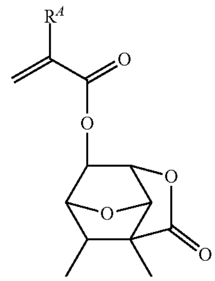
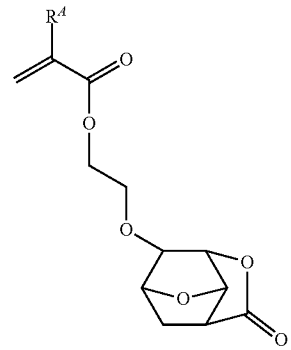
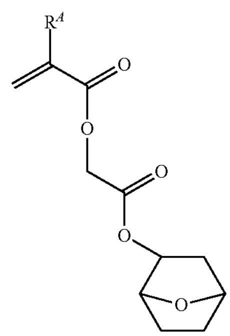
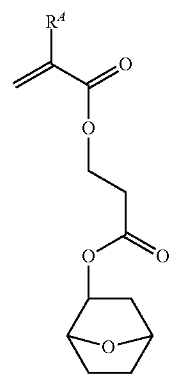
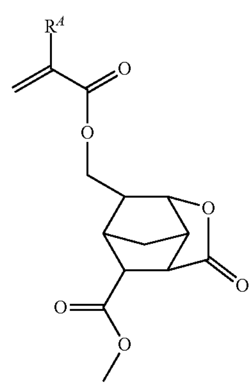
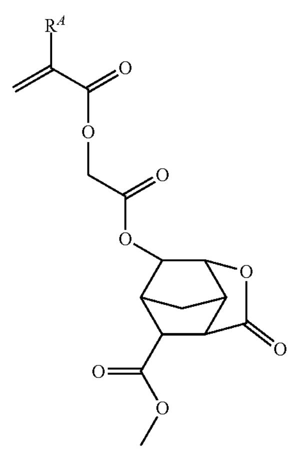

-continued
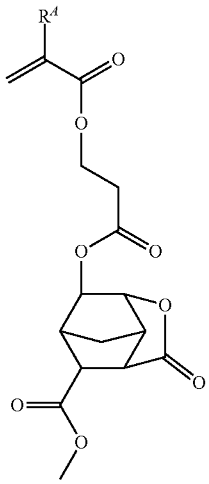
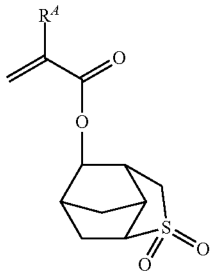
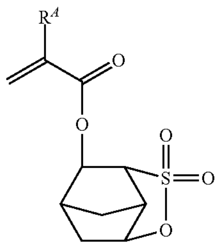
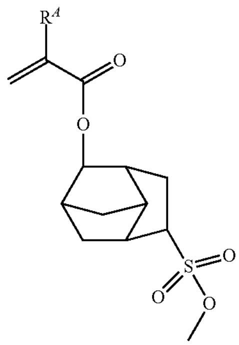
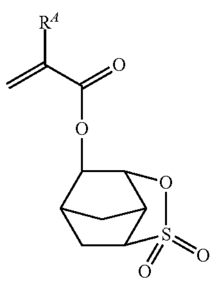
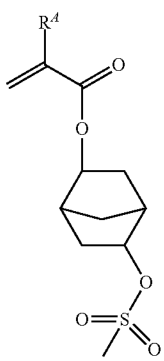
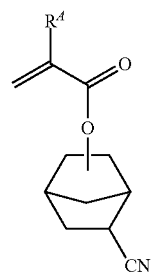
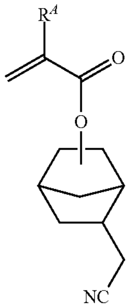
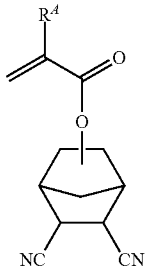
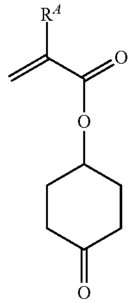
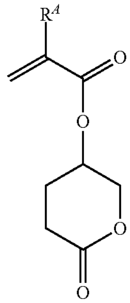
-continued
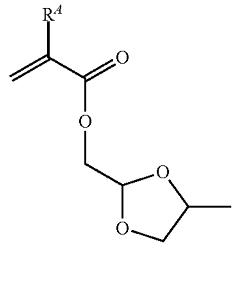
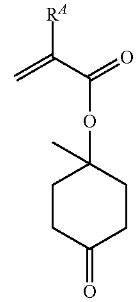
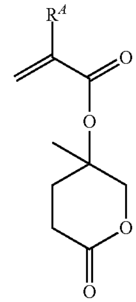
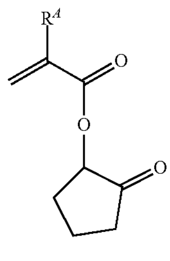
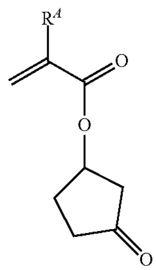
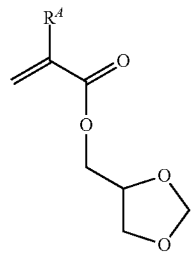
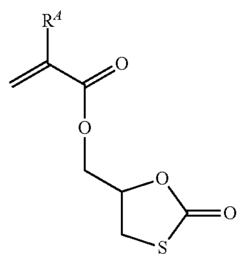
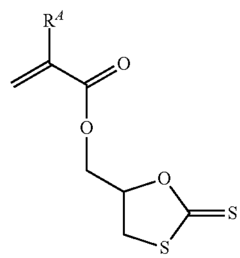
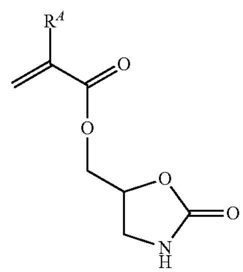
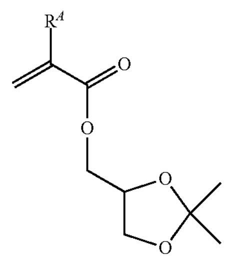
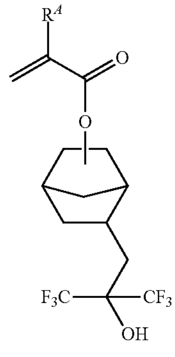
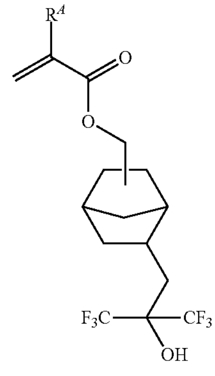

-continued
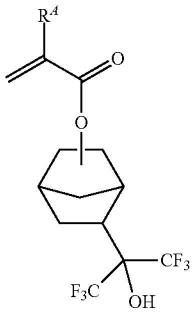
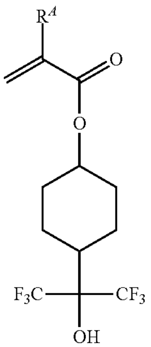
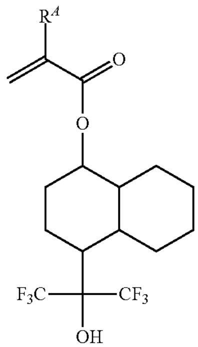
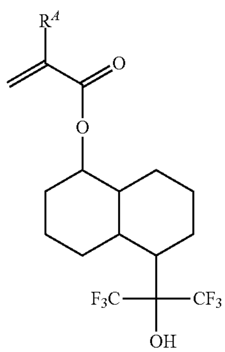
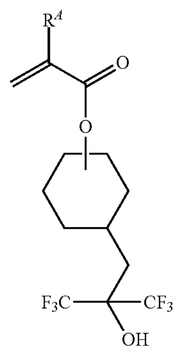
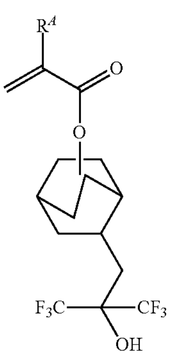
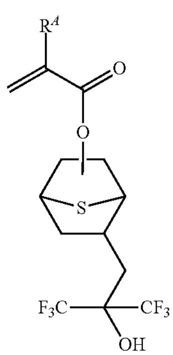
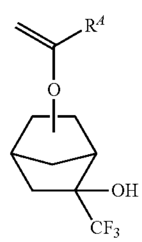
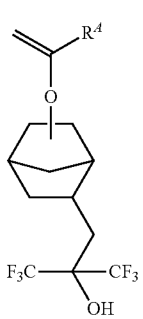
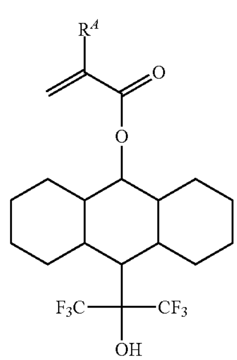
-continued
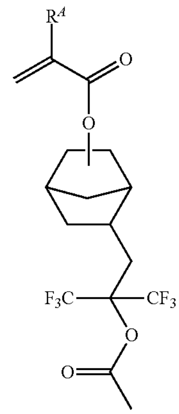
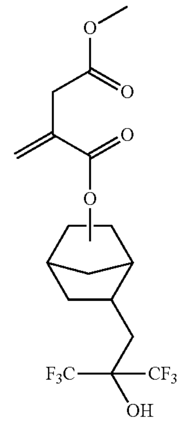
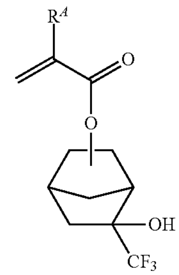
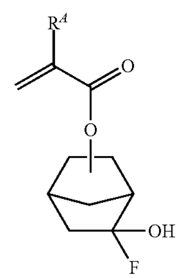
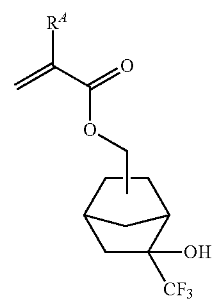
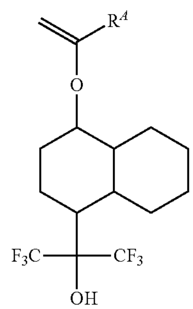
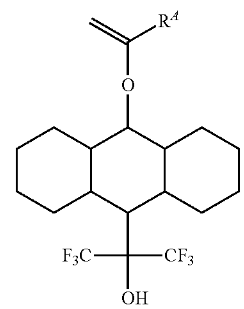
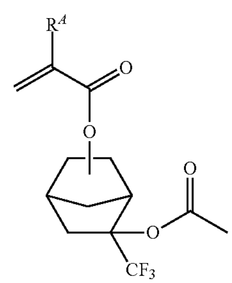
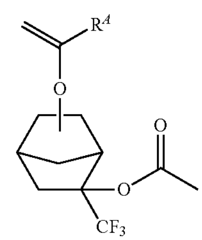
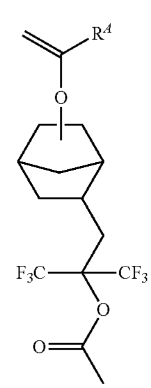
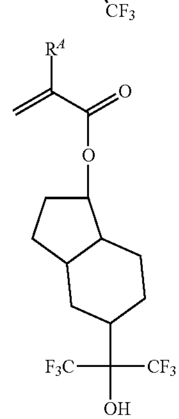

-continued
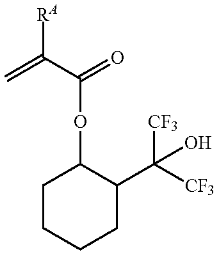
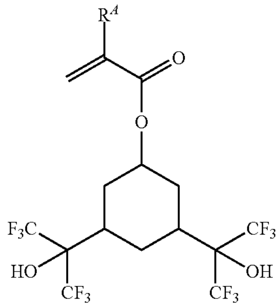
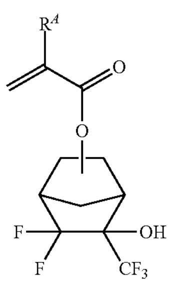
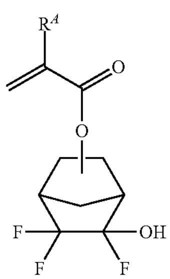
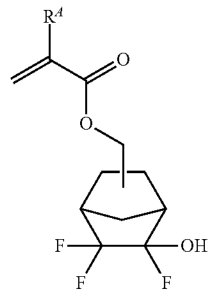
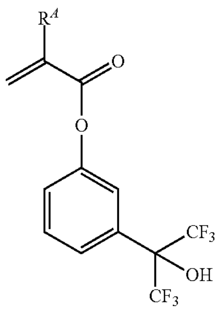
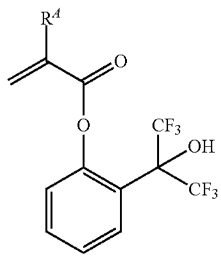
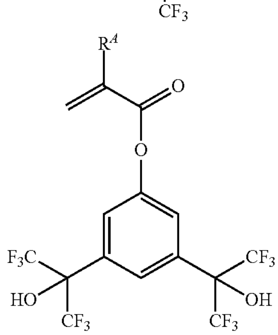
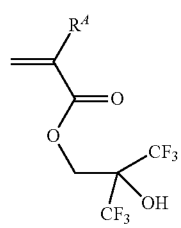
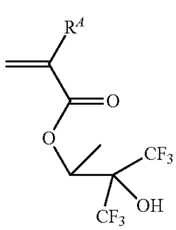
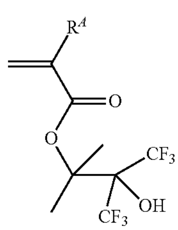
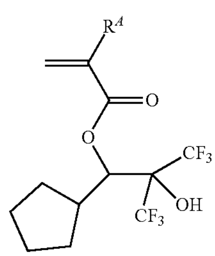
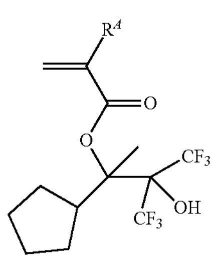
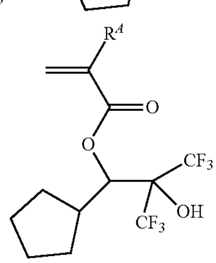
-continued
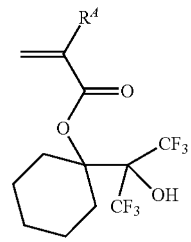
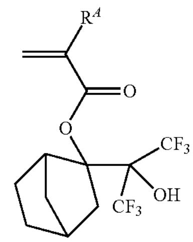
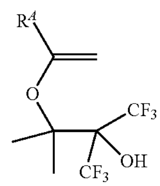
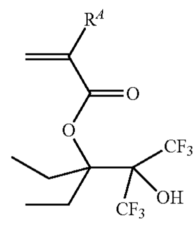
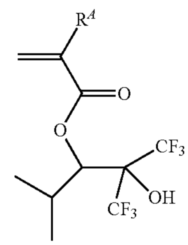
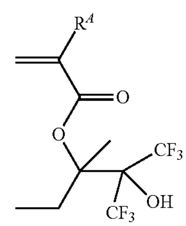
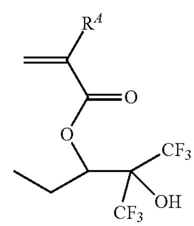
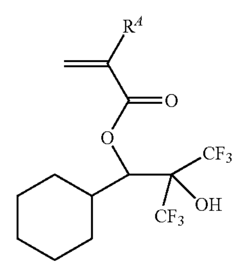
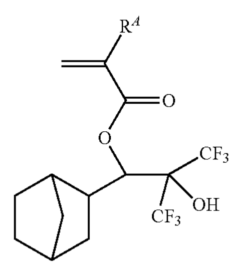
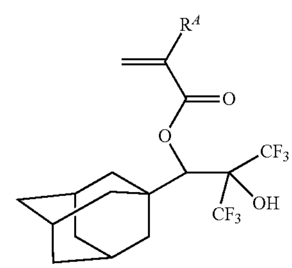
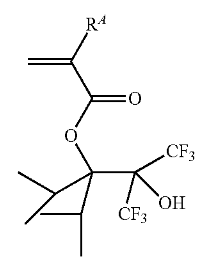
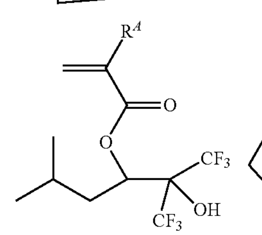
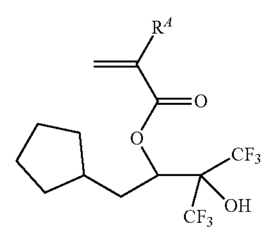
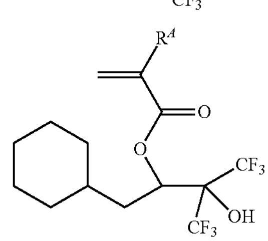
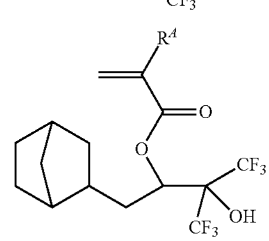

-continued
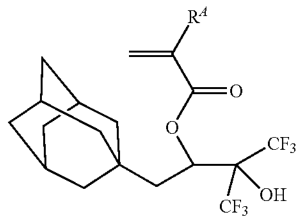
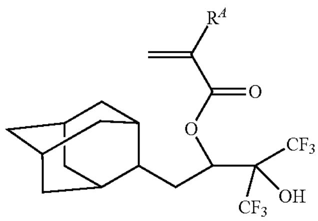
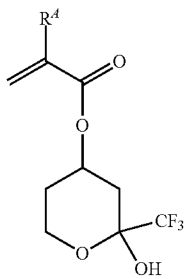
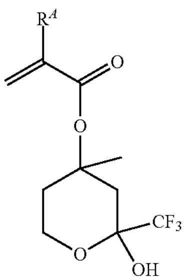
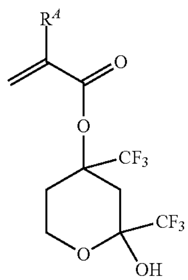
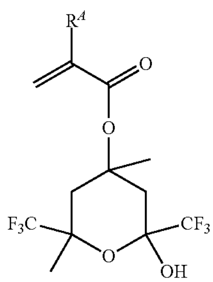
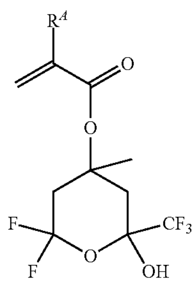
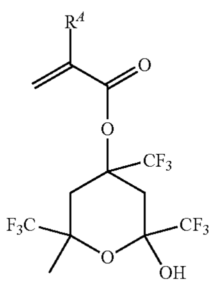
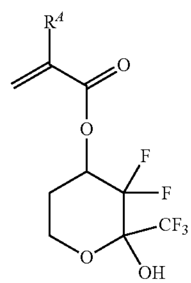
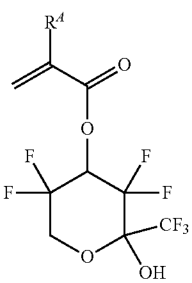
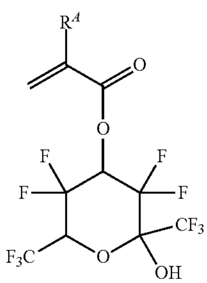
-continued
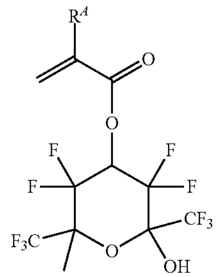
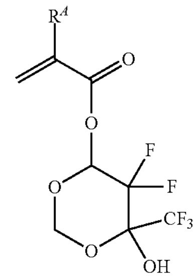
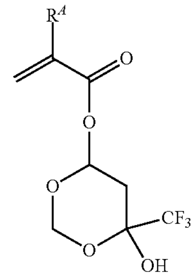
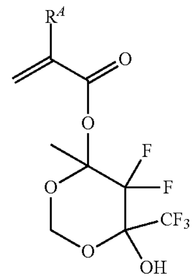
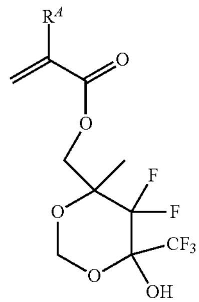
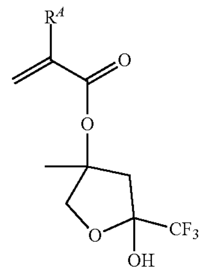
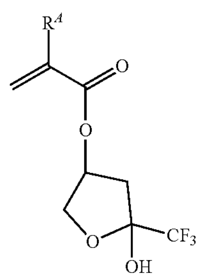
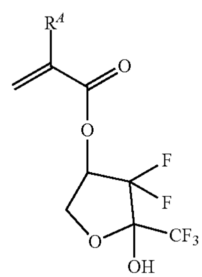
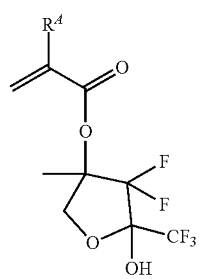
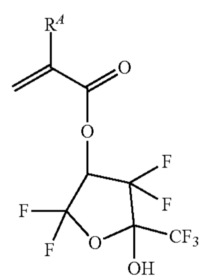
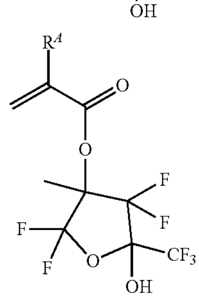
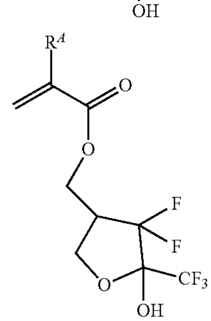

-continued
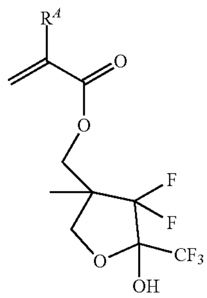
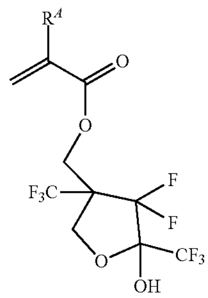
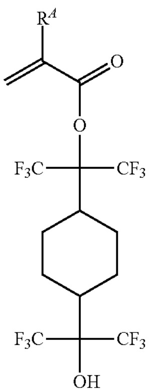
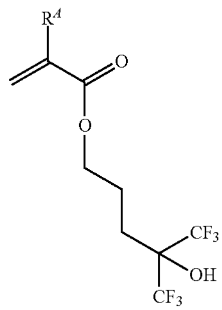
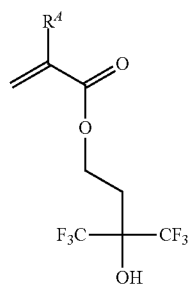
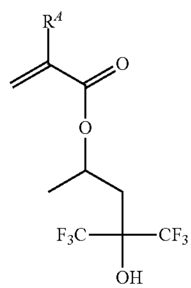
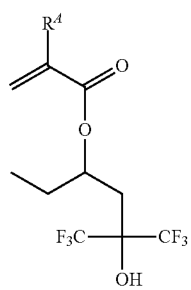
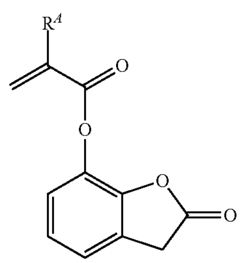
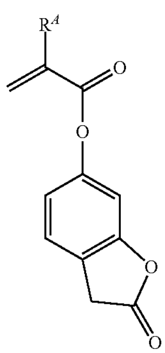
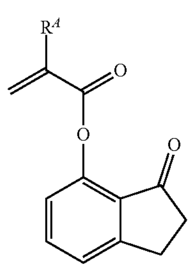
-continued
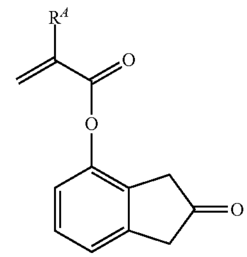
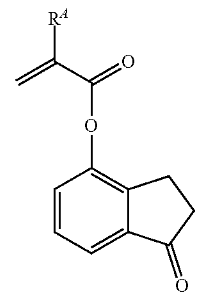
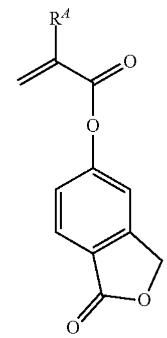
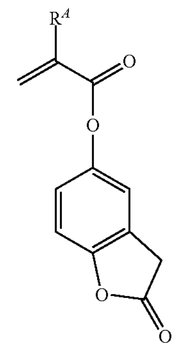
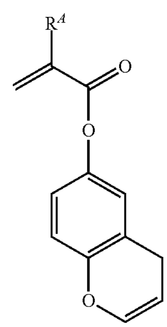
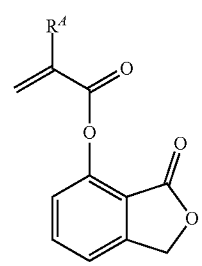
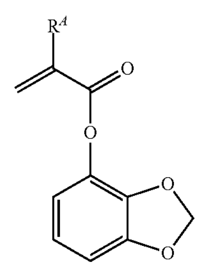
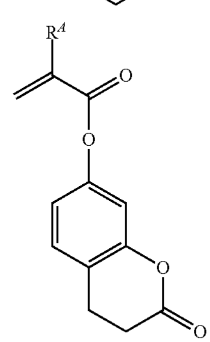
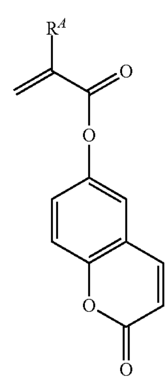
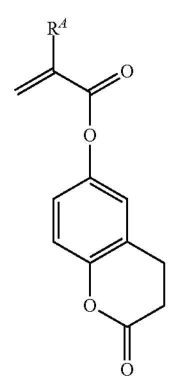
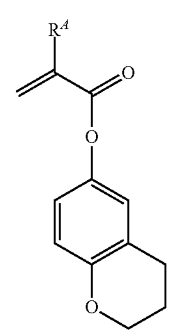
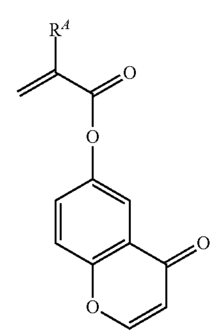

-continued
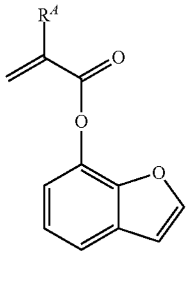
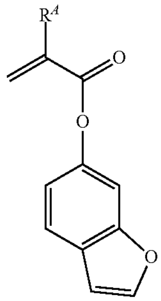
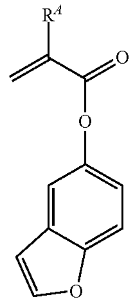
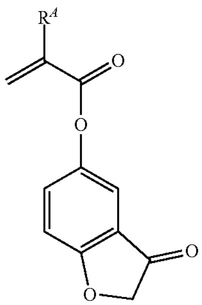
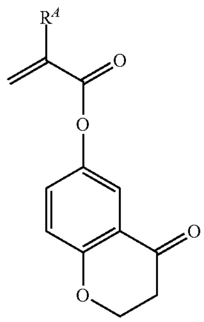
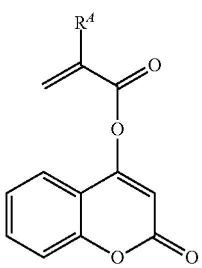
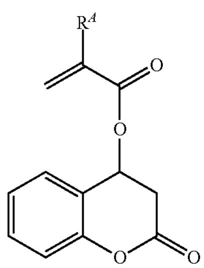
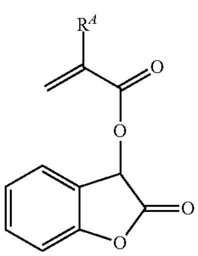
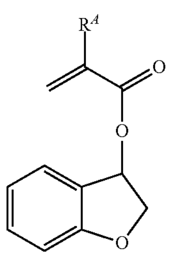
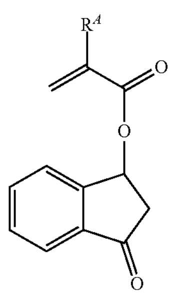
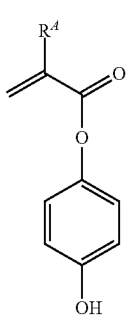
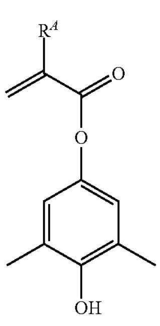
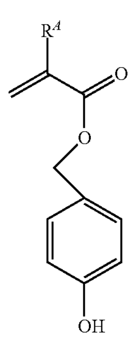
-continued
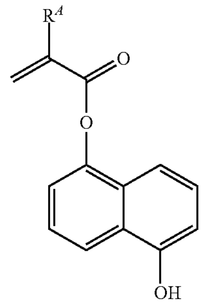
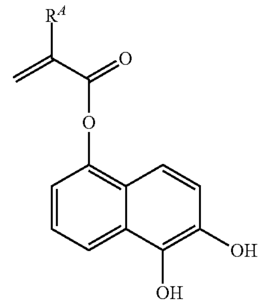
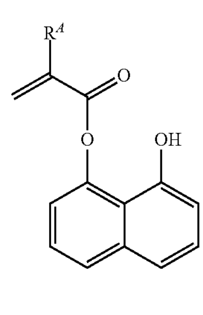
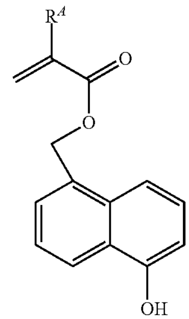
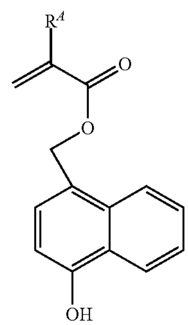
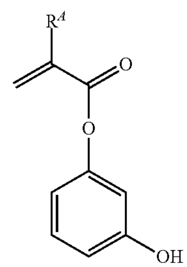
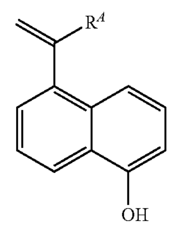
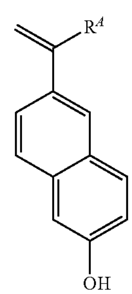
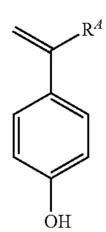
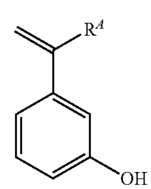
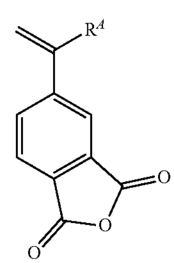
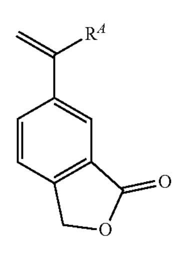
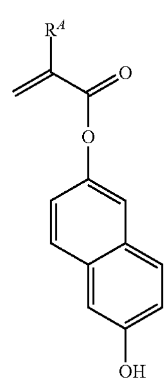

-continued
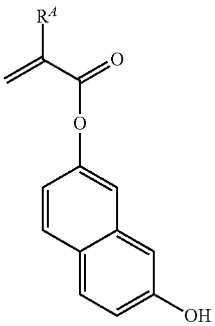
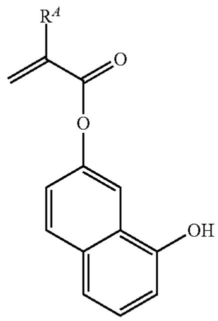
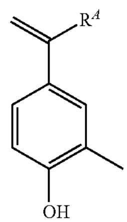
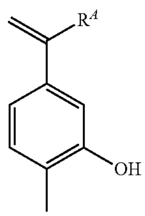
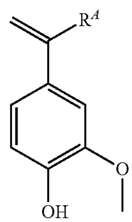
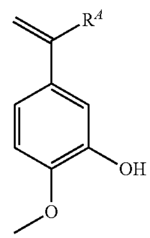
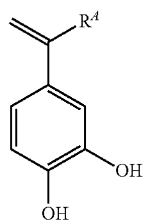
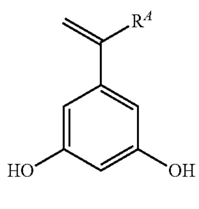
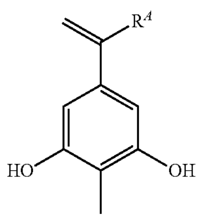
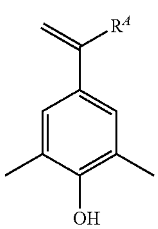
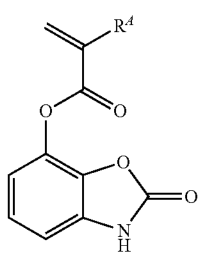
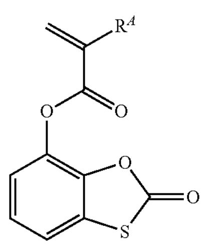
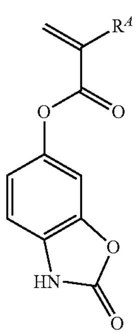
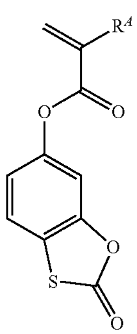
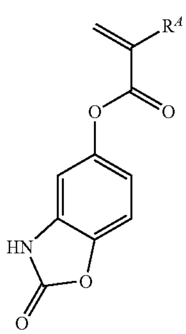
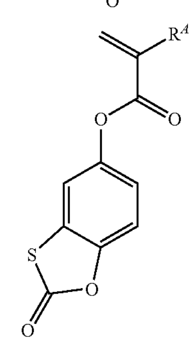
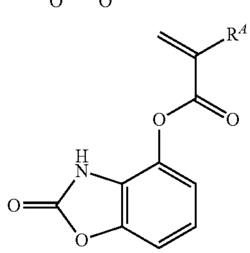
-continued
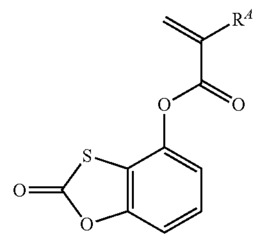
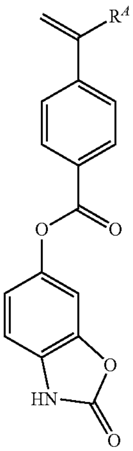
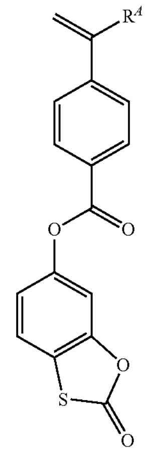
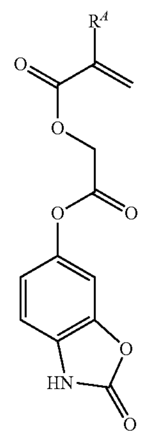
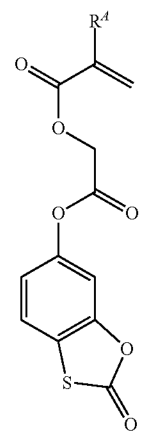
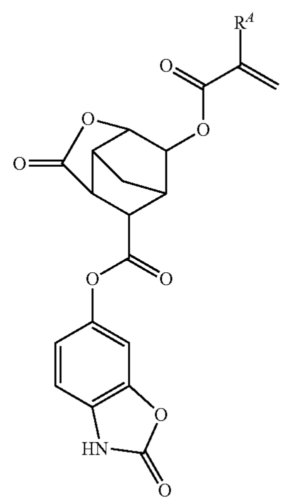
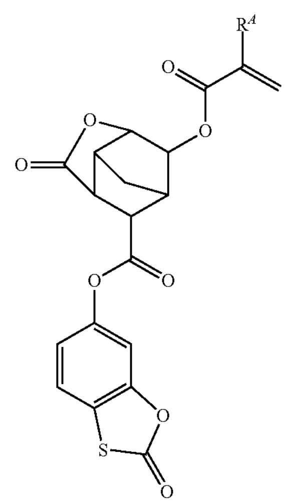

-continued

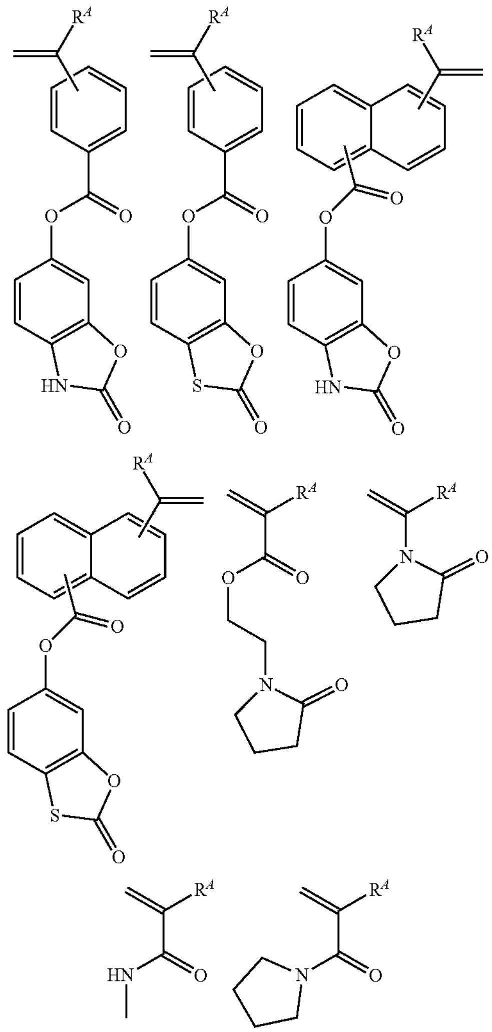

In a further embodiment, the base polymer may comprise repeat units (d) of at least one type selected from repeat units having the following formulae (d1), (d2) and (d3). These units are also referred to as repeat units (d1), (d2) and (d3).

(d1)

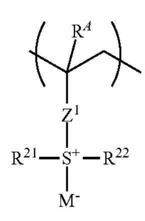

(d2)

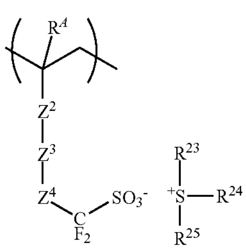

-continued (d3)

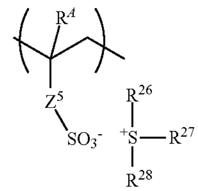

In formulae (d1) to (d3), $R^A$ is each independently hydrogen or methyl. $Z^1$ is a single bond, $C_1$-$C_6$ aliphatic hydrocarbylene group, phenylene, naphthylene, or a $C_7$-$C_1$s group obtained by combining the foregoing, or —O—$Z^{11}$—, —C(═O)—O—$Z^{11}$— or —C(═O)—NH—$Z^{11}$—, wherein $Z^{11}$ is a $C_1$-$C_6$ aliphatic hydrocarbylene group, phenylene, naphthylene, or a $C_7$-$C_{18}$ group obtained by combining the foregoing, which may contain a carbonyl moiety, ester bond, ether bond or hydroxy moiety. $Z^2$ is a single bond or ester bond. $Z^3$ is a single bond, —$Z^{31}$—C(═O)—O—, —$Z^{31}$—O—, —$Z^{31}$—O—, or —$Z^{31}$—O—C(═O)—, wherein $Z^{31}$ is a $C_1$-$C_{12}$ aliphatic hydrocarbylene group, phenylene group, or a $C_7$-$C_{18}$ group obtained by combining the foregoing, which may contain a carbonyl moiety, ester bond ether bond, bromine or iodine. $Z^4$ is methylene, 2,2,2-trifluoro-1,1-ethanediyl or carbonyl. $Z^5$ is a single bond, methylene, ethylene, phenylene, fluorinated phenylene, trifluoromethyl-substituted phenylene, —O—$Z^{51}$—, —C(═O)—O—$Z^{51}$—, or —C(═O)—NH—$Z^{51}$—, wherein $Z^{51}$ is a $C_1$-$C_6$ aliphatic hydrocarbylene group, phenylene, fluorinated phenylene, or trifluoromethyl-substituted phenylene group, which may contain a carbonyl moiety, ester bond, ether bond, halogen or hydroxy moiety. The aliphatic hydrocarbylene group represented by $Z^1$, $Z^{11}$, $Z^{31}$ and $Z^{51}$ may be saturated or unsaturated and straight, branched or cyclic.

In formulae (d1) to (d3), $R^{21}$ to $R^{28}$ are each independently halogen or a $C_1$-$C_{20}$ hydrocarbyl group which may contain a heteroatom. The hydrocarbyl group may be saturated or unsaturated and straight, branched or cyclic. Examples thereof are as will be exemplified later for $R^{101}$ to $R^{105}$ in formulae (1-1) and (1-2). A pair of $R^{23}$ and $R^{24}$, or $R^{26}$ and $R^{27}$ may bond together to form a ring with the sulfur atom to which they are attached. Examples of the ring are as will be exemplified later for the ring that $R^{101}$ and $R^{102}$ in formula (I-1), taken together, form with the sulfur atom to which they are attached.

In formula (d1), $M^-$ is a non-nucleophilic counter ion. Examples of the non-nucleophilic counter ion include halide ions such as chloride and bromide ions; fluoroallylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; methide ions such as tris(trifluoromethylsulfonyl)methide and tris(perfluoroethylsulfonyl)methide.

Also included are sulfonate ions having fluorine substituted at α-position as represented by the formula (d1-1) and sulfonate ions having fluorine substituted at α-position and trifluoromethyl at n-position as represented by the formula (d1-2).

$$R^{31}-CF_2-SO_3^-$$ (d1-1)

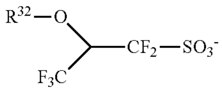

(d1-2)

In formula (d1-1), $R^{31}$ is hydrogen or a $C_1$-$C_{20}$ hydrocarbyl group which may contain an ether bond, ester bond, carbonyl moiety, lactone ring, or fluorine atom. The hydrocarbyl group may be saturated or unsaturated and straight, branched or cyclic. Examples thereof are as will be exemplified later for the hydrocarbyl group $R^{111}$ in formula (1A').

In formula (d1-2), $R^{3'}$ is hydrogen, or a $C_1$-$C_{30}$ hydrocarbyl group or $C_2$-$C_{30}$ hydrocarbylcarbonyl group, which may contain an ether bond, ester bond, carbonyl moiety or lactone ring. The hydrocarbyl group and the hydrocarbyl moiety in the hydrocarbylcarbonyl group may be saturated or unsaturated and straight, branched or cyclic. Examples thereof are as will be exemplified later for the hydrocarbyl group $R^{111}$ in formula (1A').

Examples of the cation in the monomer from which repeat unit (d1) is derived are shown below, but not limited thereto. $R^A$ is as defined above.

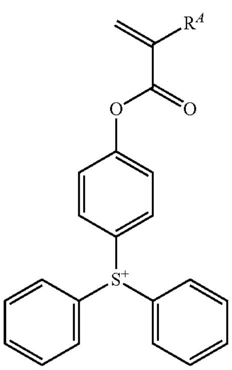

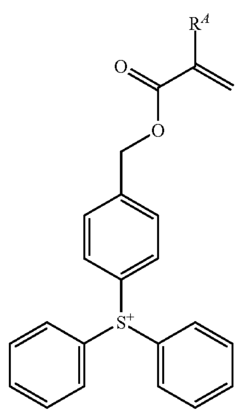

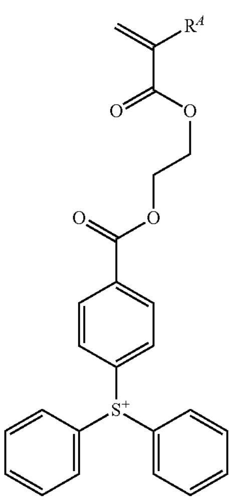

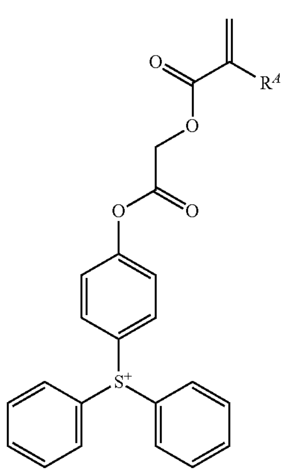

-continued

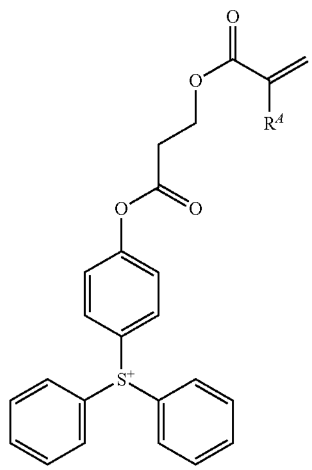

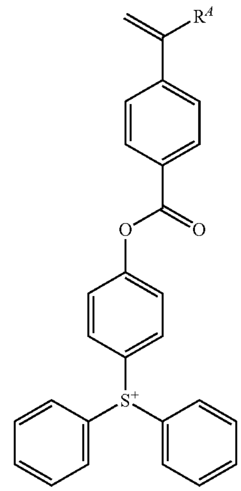

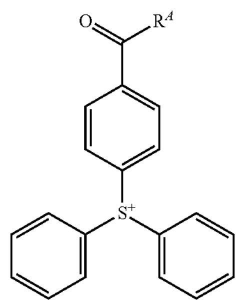

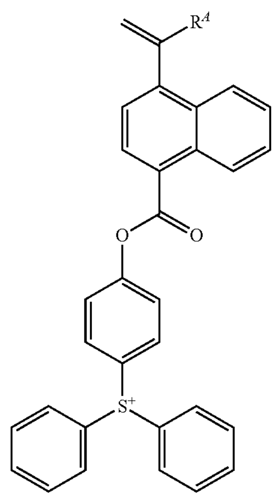

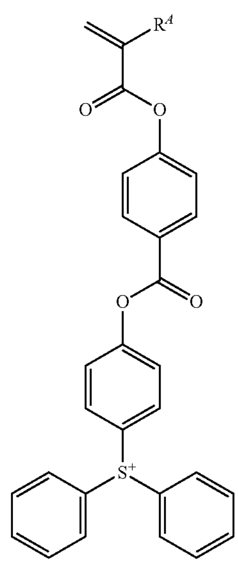

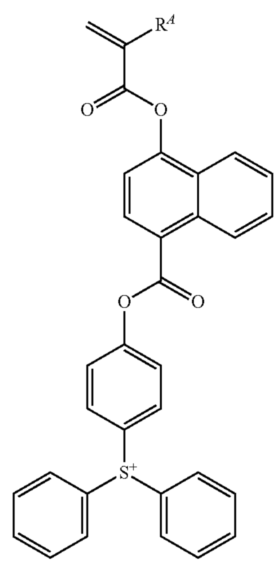

-continued
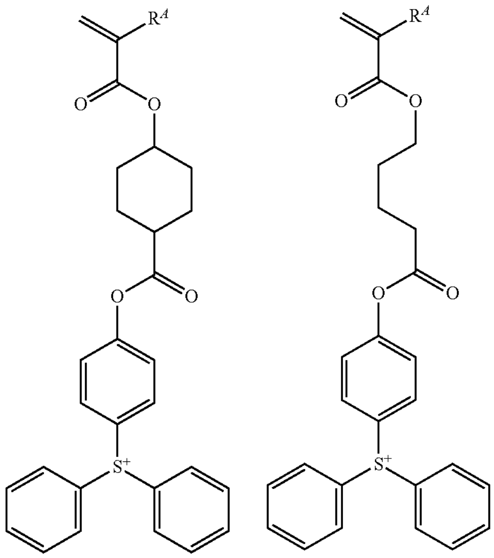
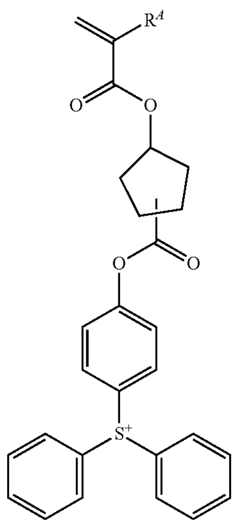
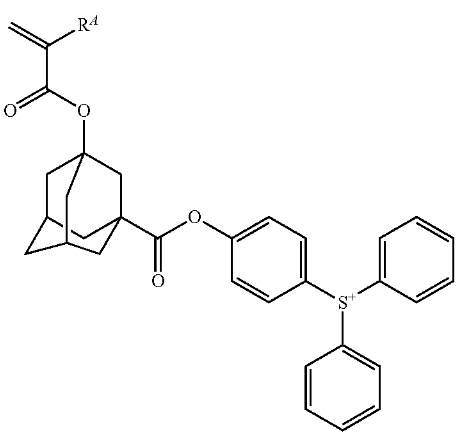
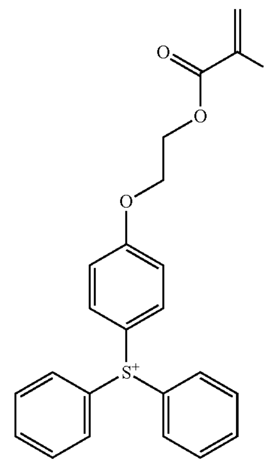
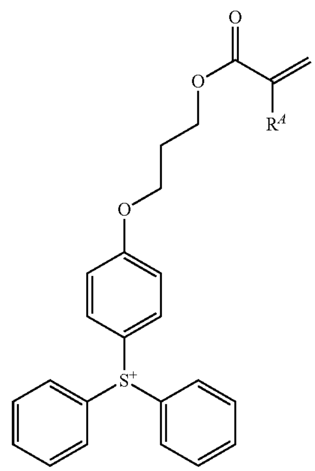
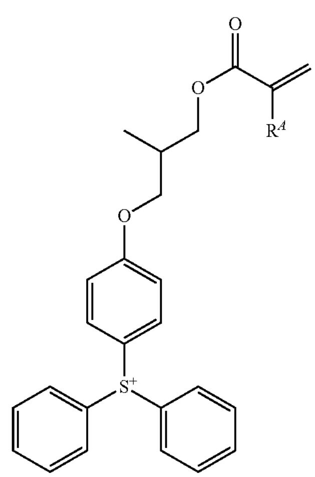
-continued -continued
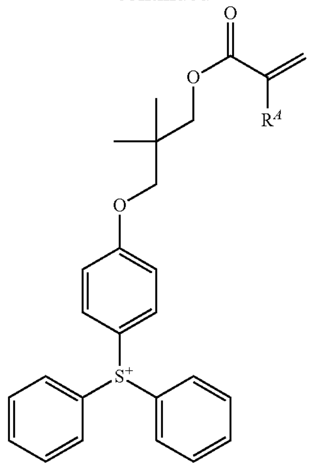
Examples of the cation in the monomer from which repeat unit (d2) or (d3) is derived are as will be exemplified later for the cation in the sulfonium salt having formula (1-1).
Examples of the anion in the monomer from which repeat unit (d2) is derived are shown below, but not limited thereto. $R^A$ is as defined above.
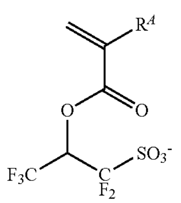
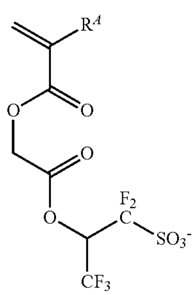
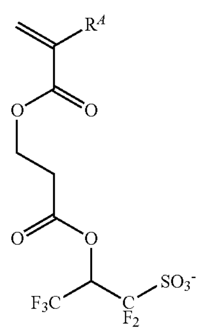
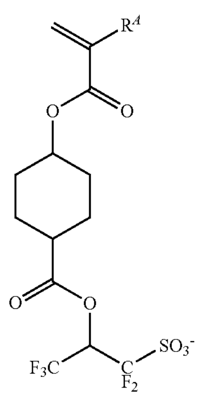
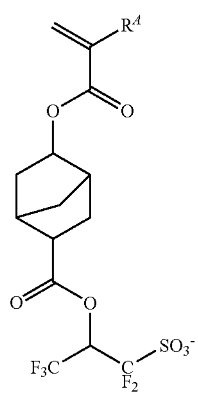
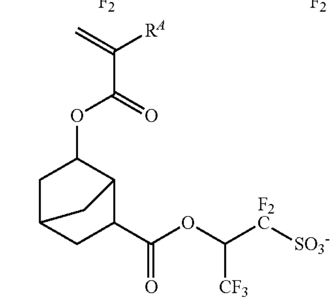
-continued
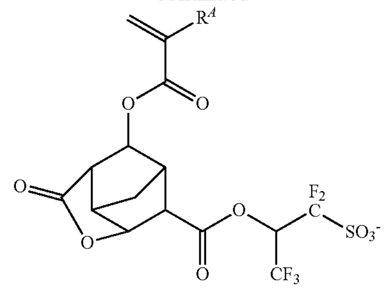
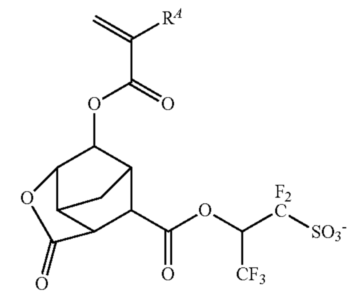
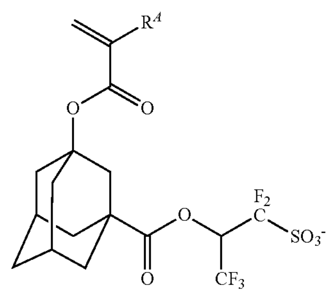
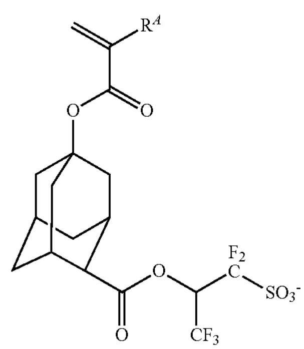
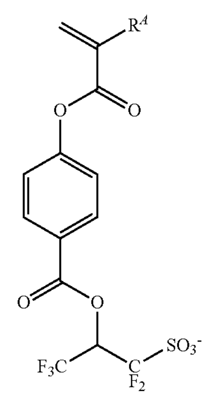
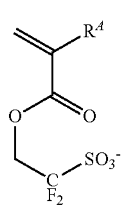
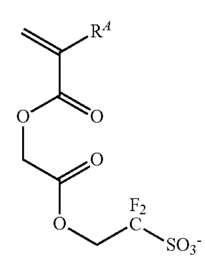
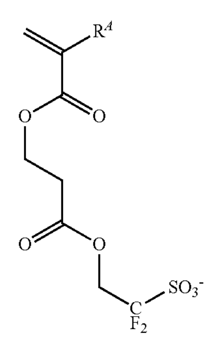

-continued
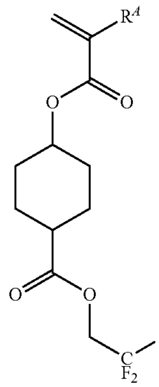
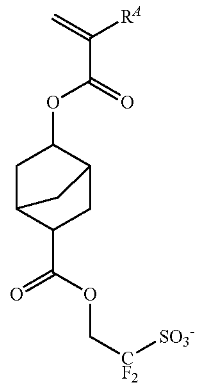
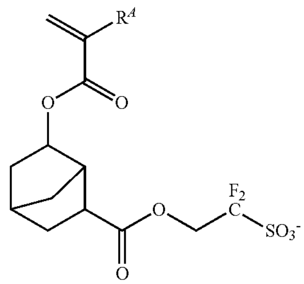
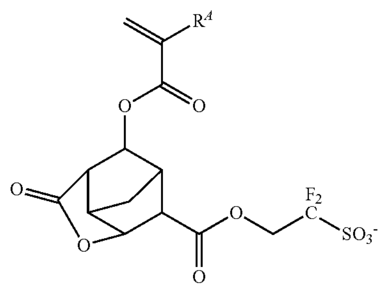
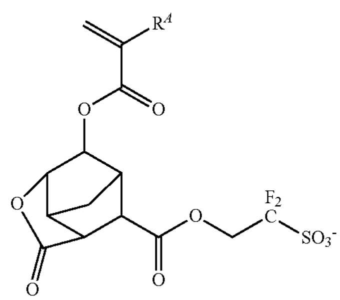
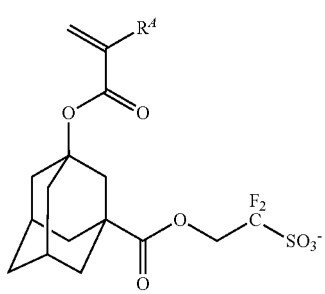
-continued
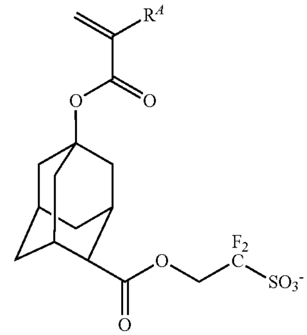
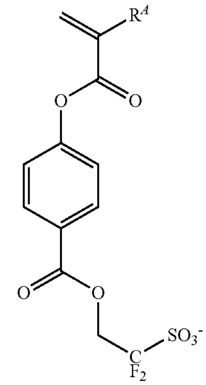
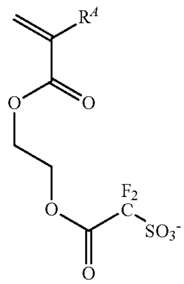
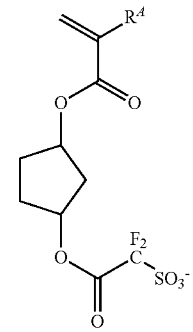
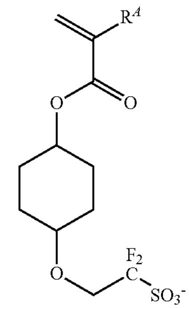
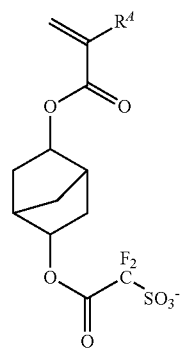
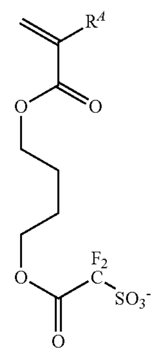
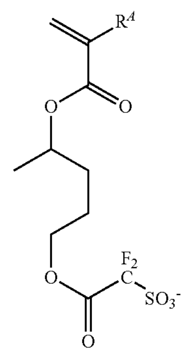
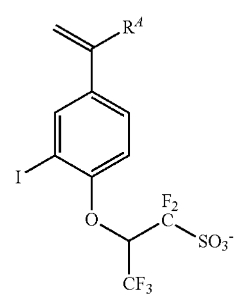
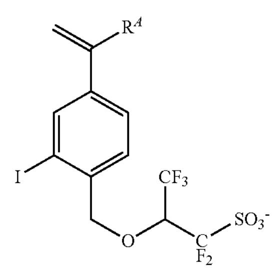
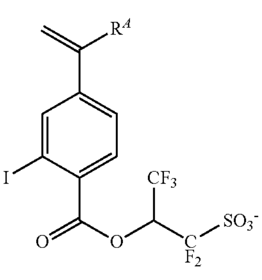
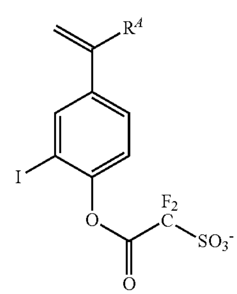

-continued
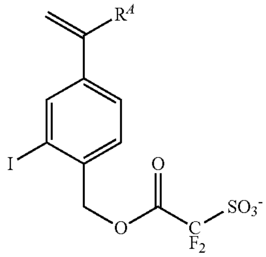
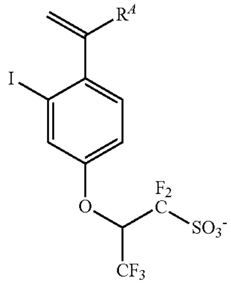
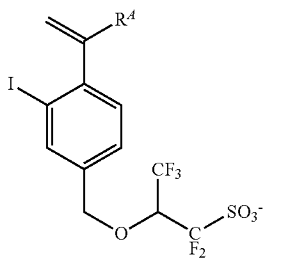
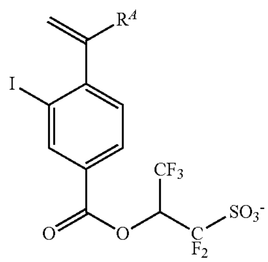
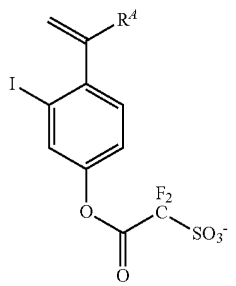
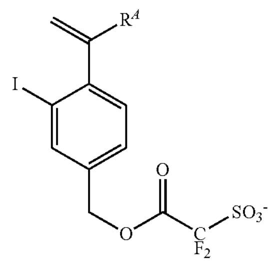
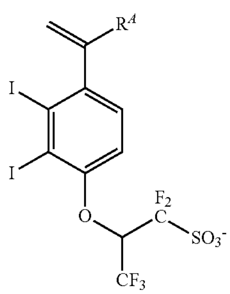
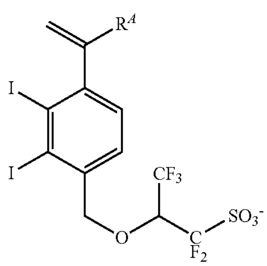
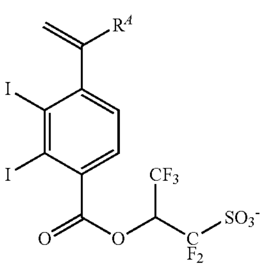
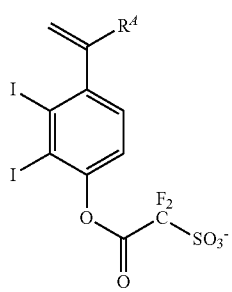
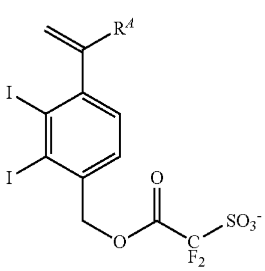
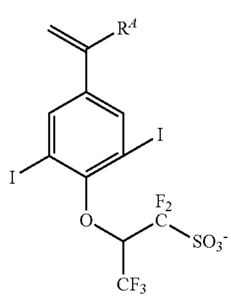
-continued
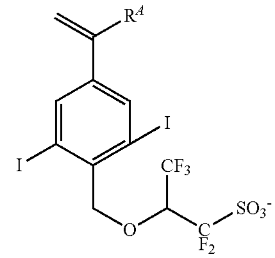
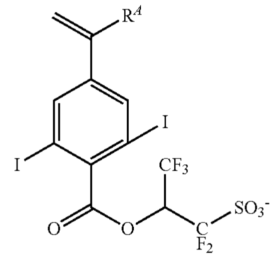
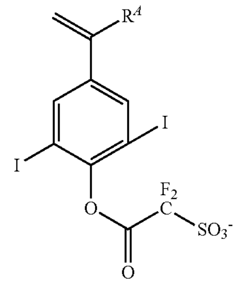
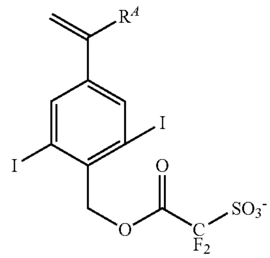
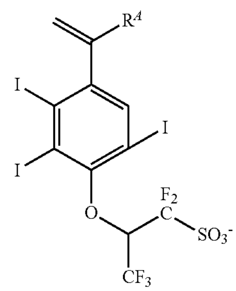
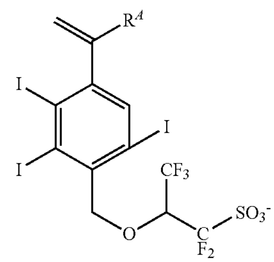
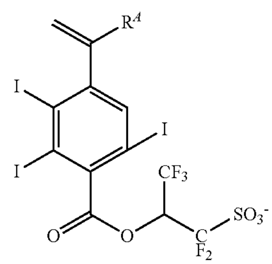
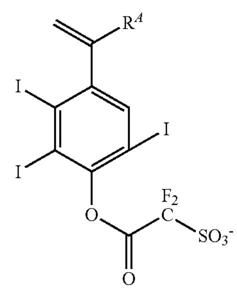
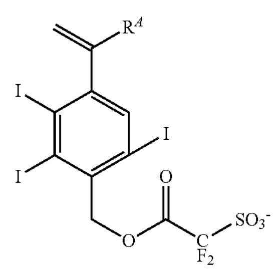
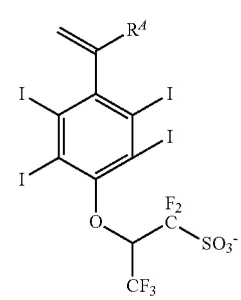
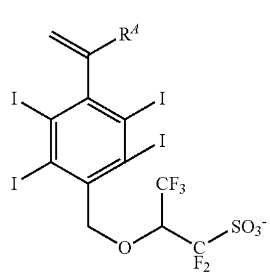
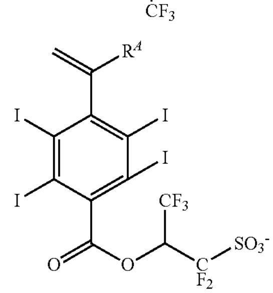

-continued
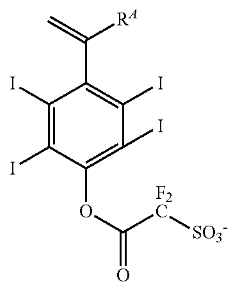
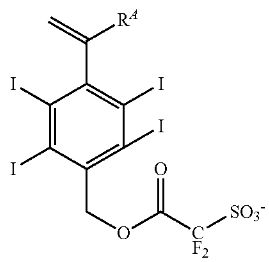
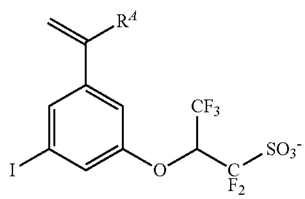
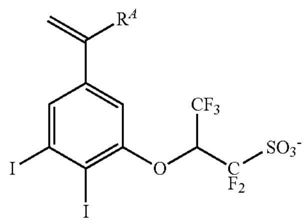
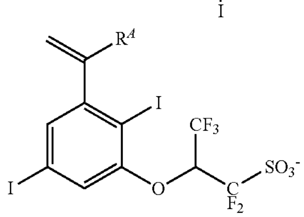
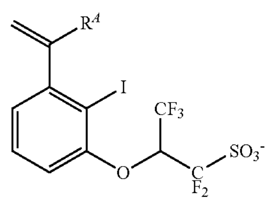
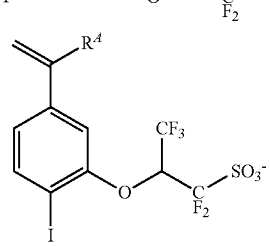
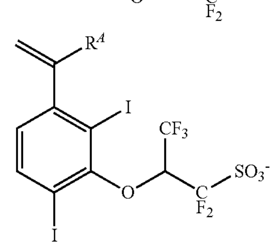
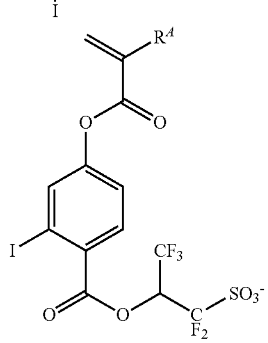
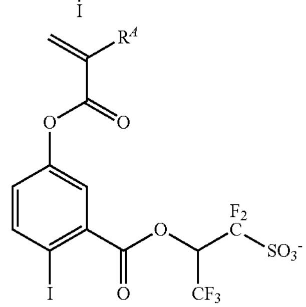
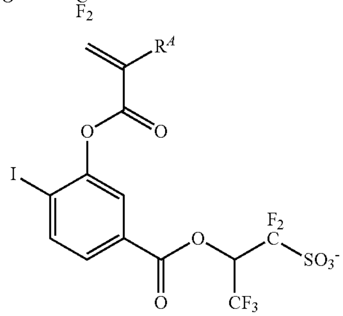
-continued
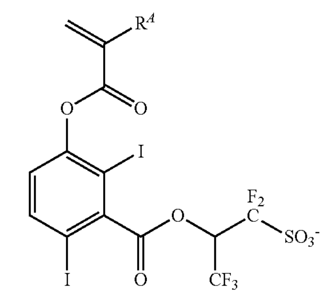
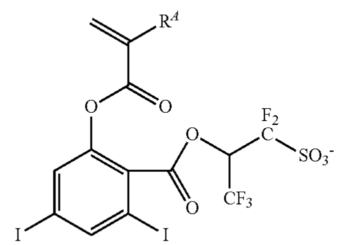
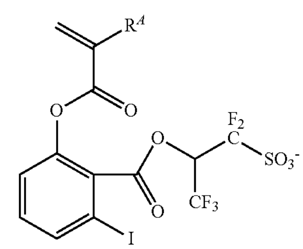
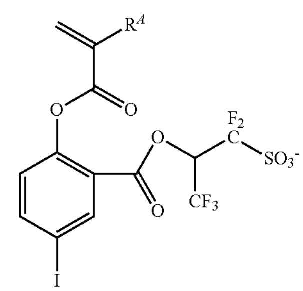
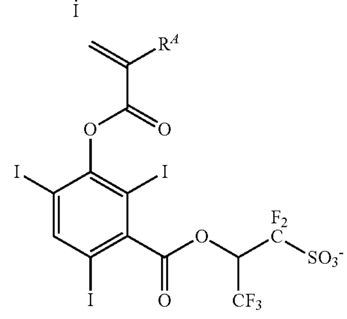
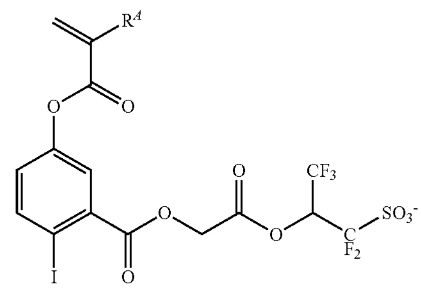

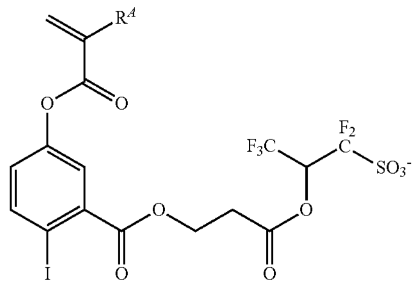
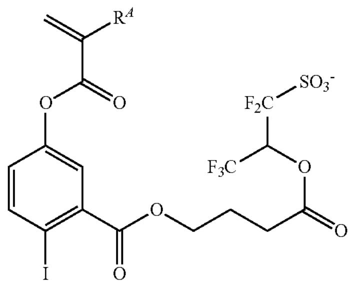
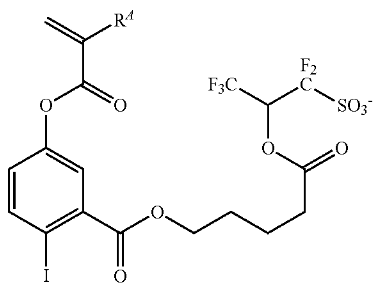
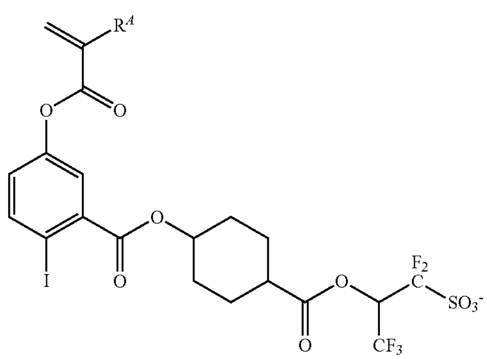
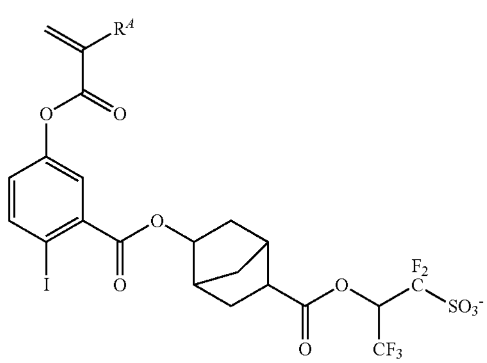
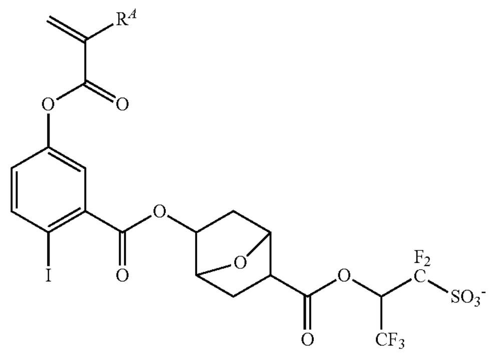
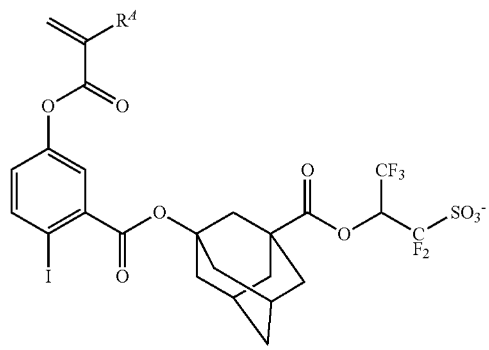
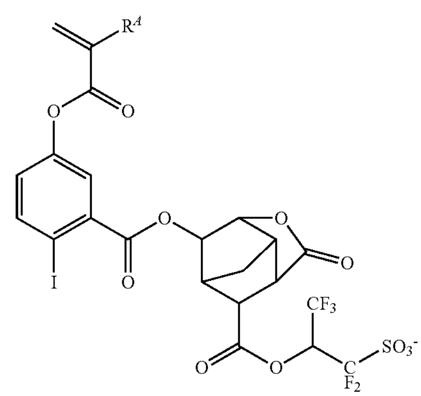
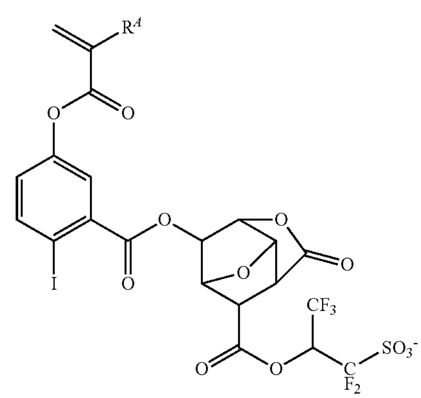

-continued
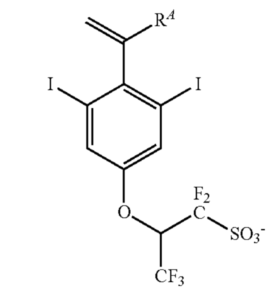
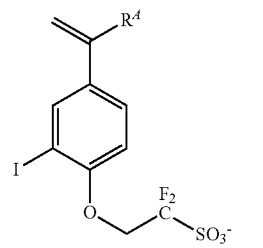
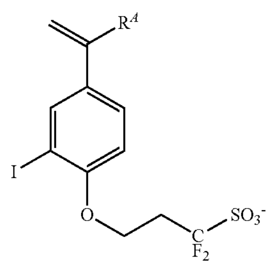
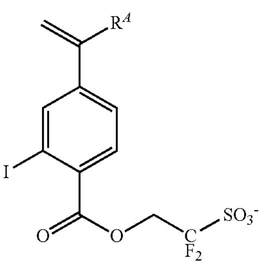
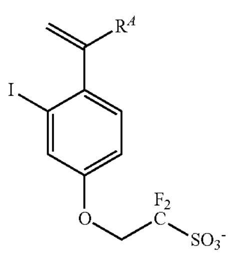
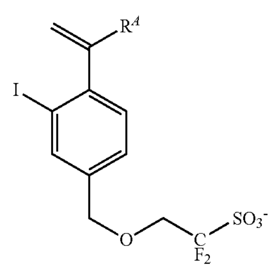
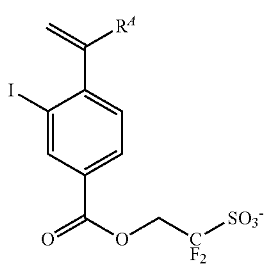
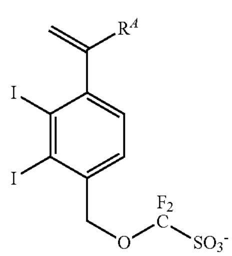
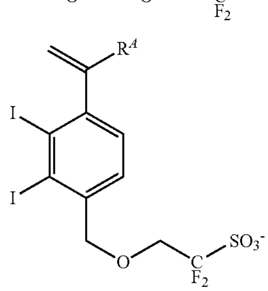
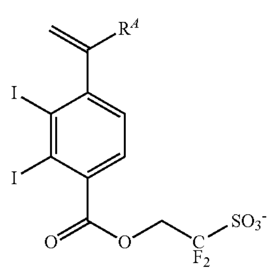
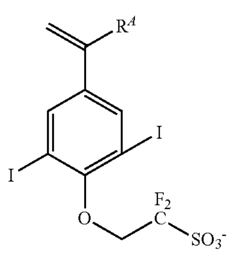
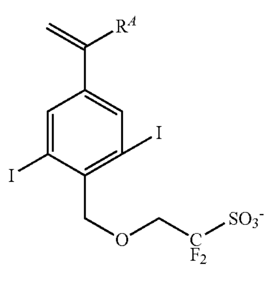
-continued
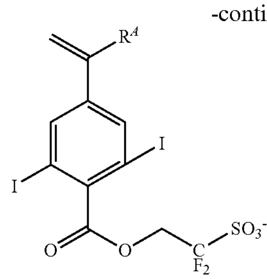
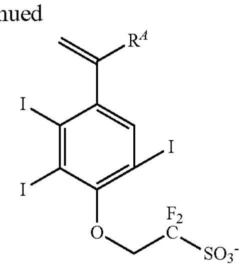
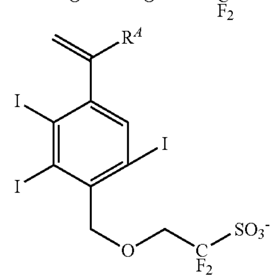
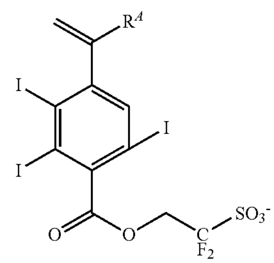
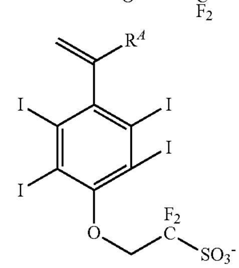
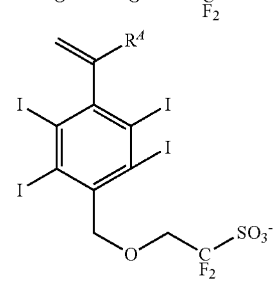
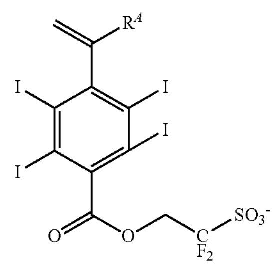
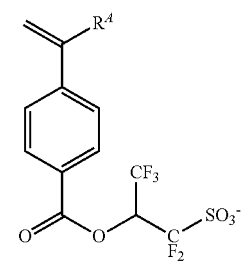
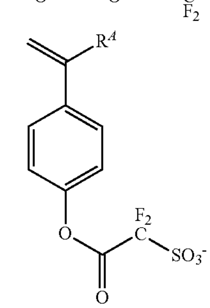
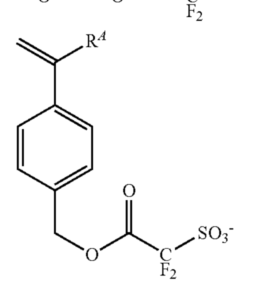
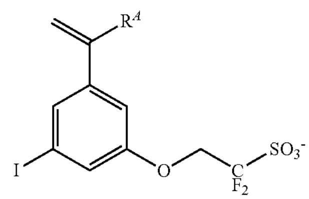
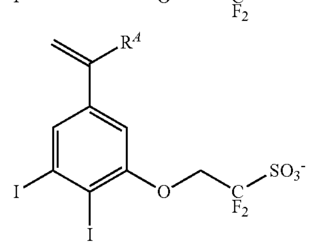

-continued
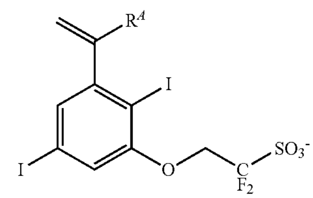
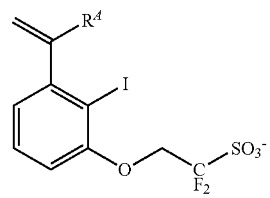
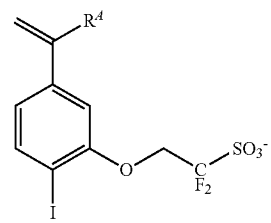
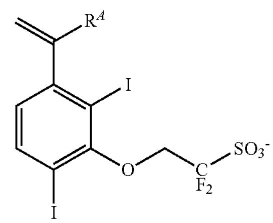
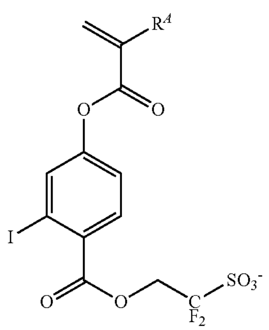
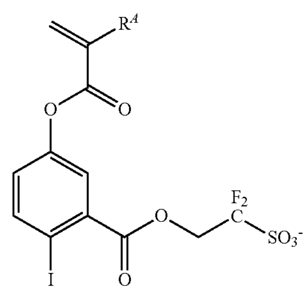
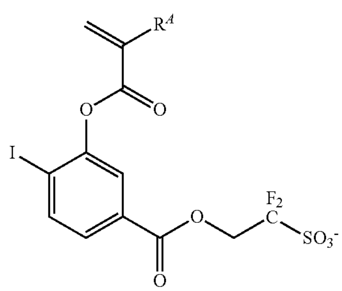
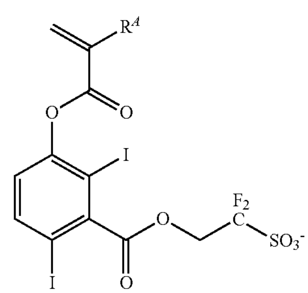
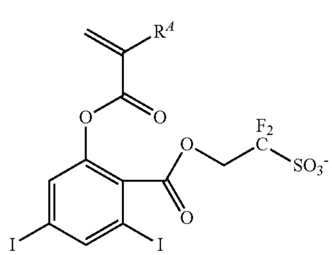
-continued
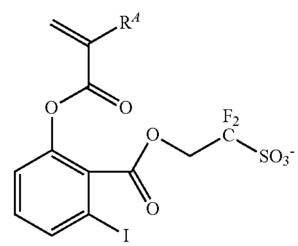
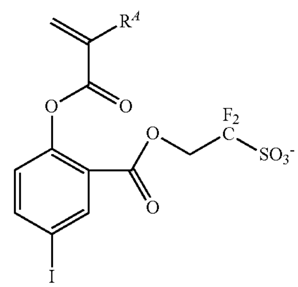
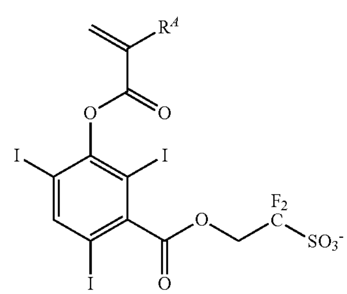
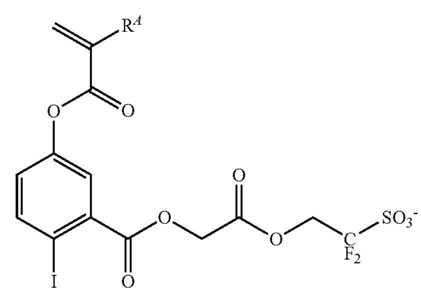
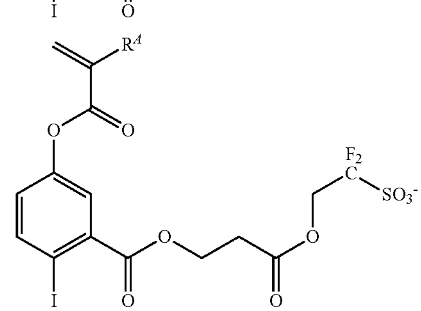
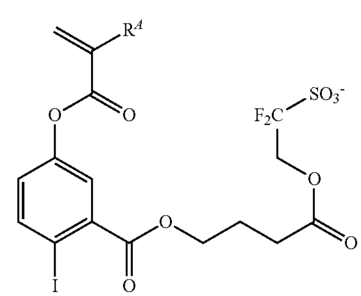

-continued
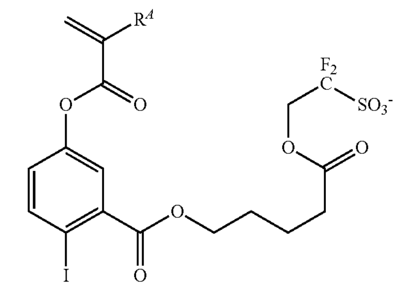
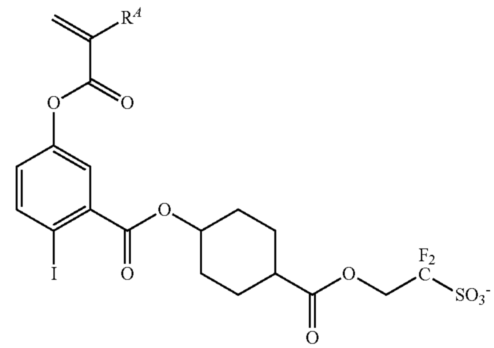
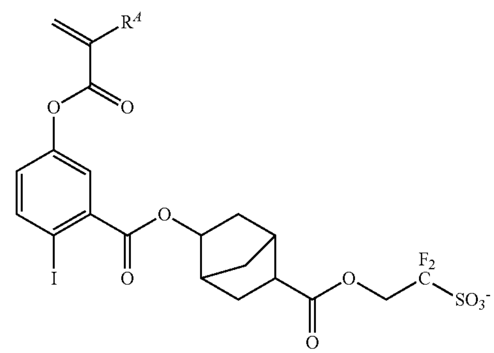
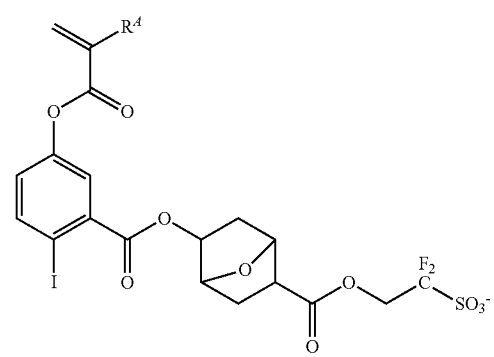
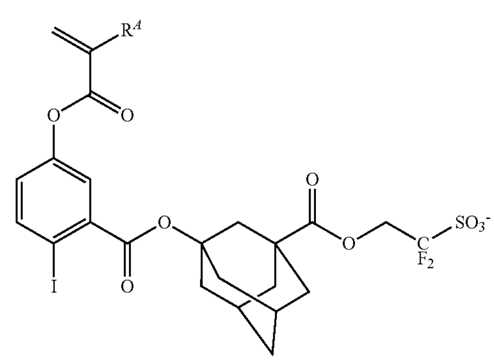
-continued
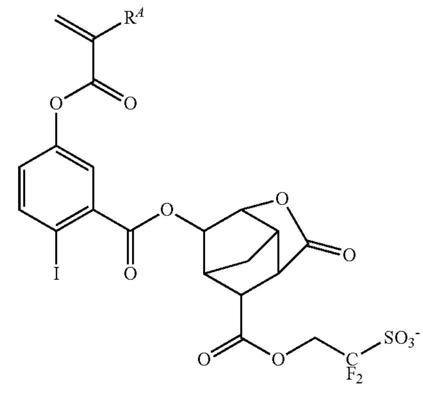
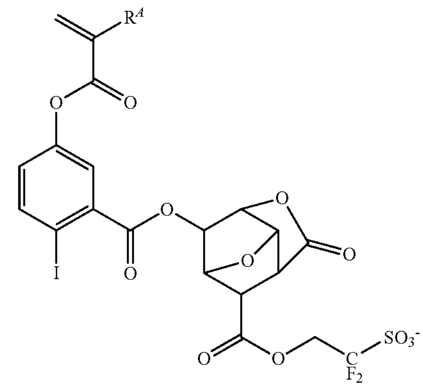
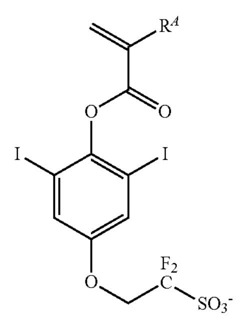
Examples of the anion in the monomer from which repeat unit (d3) is derived are shown below, but not limited thereto. $R^A$ is as defined above.
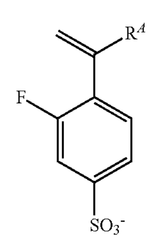
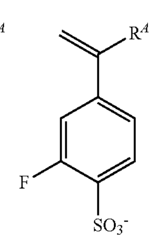
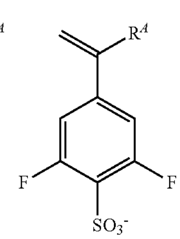
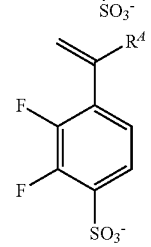
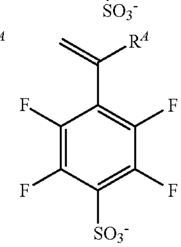
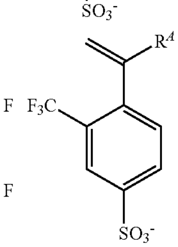

-continued
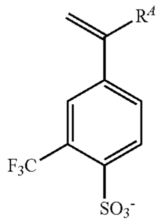
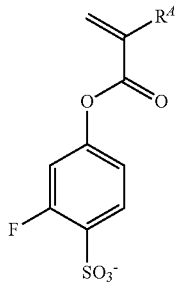
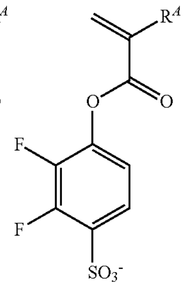
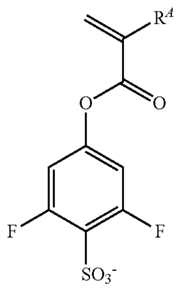
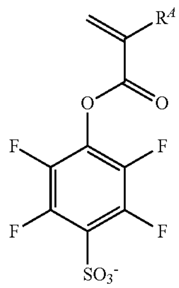
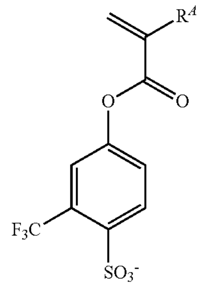
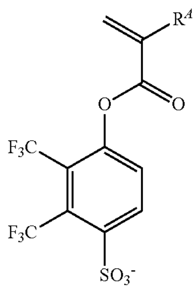
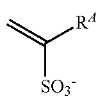
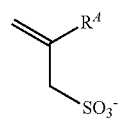
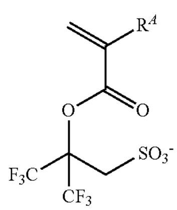
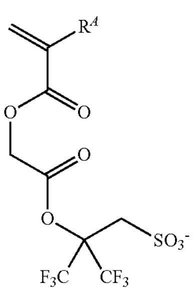
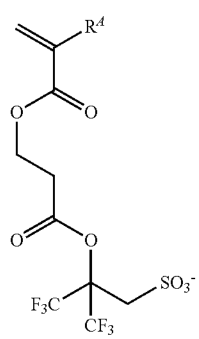
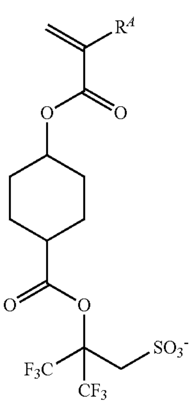
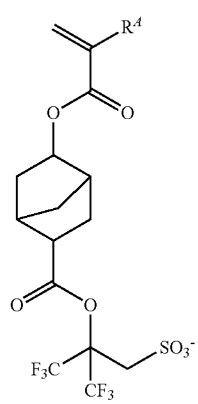
-continued
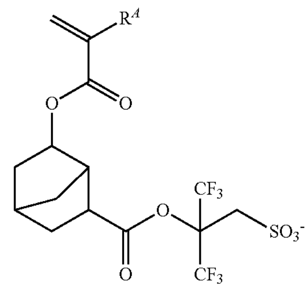
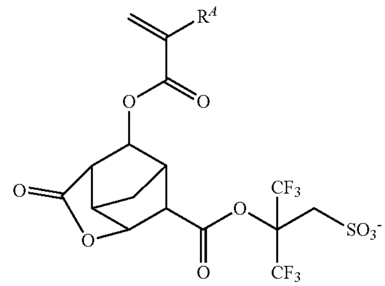
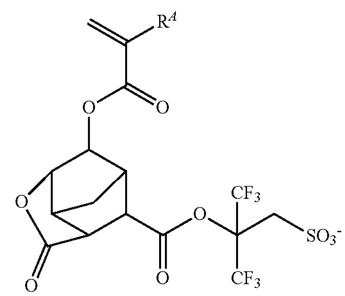
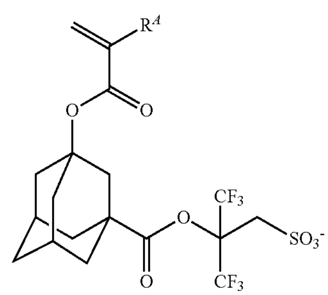
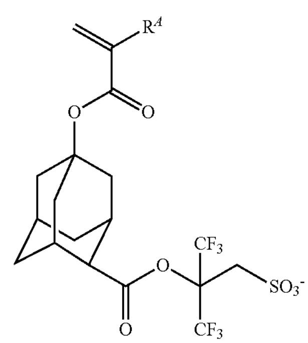

-continued

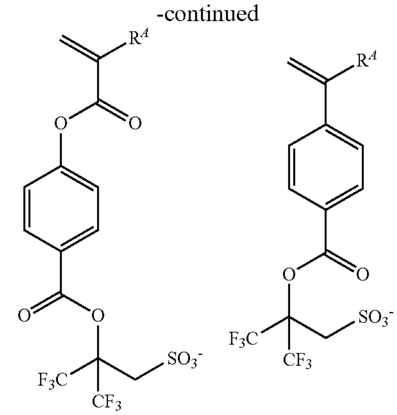

Repeat units (d1) to (d3) have the function of acid generator. The attachment of an acid generator to the polymer main chain is effective in restraining acid diffusion, thereby preventing a reduction of resolution due to blur by acid diffusion. Also, LWR and CDU are improved since the acid generator is uniformly distributed. When a base polymer comprising repeat units (d) is used, that is, in the case of polymer-bound acid generator, an acid generator of addition type (to be described later) may be omitted.

Besides the repeat units described above, the base polymer may further comprise repeat units (e) which are derived from styrene, vinylnaphthalene, indene, acenaphthylene, coumarin, and coumarone.

In the base polymer comprising repeat units (a), (b1), (b2), (c), (d1), (d2), (d3), and (e), a fraction of these omits is: preferably $0<a<1.0$, $0\le b1\le 0.9$, $0\le b2\le 0.9$, $0\le b1+b2\le 0.9$, $0\le c\le 0.9$, $0\le d1\le 0.5$, $0\le d2\le 0.5$, $0\le d3\le 0.5$, $0\le d1+d2+d3\le 0.5$, and $0\le e\le 0.5$; more preferably $0.01\le a\le 0.8$, $0\le b1\le 0.8$, $0\le b2\le 0.8$, $0\le b1+b2\le 0.8$, $0\le c\le 0.8$, $0\le d1\le 0.4$, $0\le d2\le 0.4$, $0\le d3\le 0.4$, $0\le d1+d2+d3\le 0.4$, and $0\le e\le 0.4$; and even more preferably $0.02\le a\le 0.7$, $0\le b1\le 0.7$, $0\le b2\le 0.7$, 0b1+b2≤0.7, $0\le c\le 0.7$, $0\le d1\le 0.3$, $0\le d2\le 0.3$, $0\le d3\le 0.3$, $0\le d1+d2+d3\le 0.3$, and $0\le e\le 0.3$. Notably, $a+b1+b2+c+d1+d2+d3+e=1.0$.

The base polymer may be synthesized by any desired methods, for example, by dissolving one or more monomers selected from the monomers corresponding to the foregoing repeat units in an organic solvent, adding a radical polymerization initiator thereto, and heating for polymerization. Examples of the organic solvent which can be used for polymerization include toluene, benzene, tetrahydrofuran (THF), diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the reaction temperature is 50 to 80° C., and the reaction time is 2 to 100 hours, more preferably 5 to 20 hours.

In the case of a monomer having a hydroxy group, the hydroxy group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C., to 100° C., more preferably 0° C., to 60° C., and the reaction time is 0.2 to 100 hours, more preferably 0.5 to 20 hours.

The base polymer should preferably have a weight average molecular weight (Mw) in the range of 1,000 to 500.000, and more preferably 2,000 to 30,000, as measured by GPC versus polystyrene standards using tetrahydrofuran (THF) solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

The base polymer may be a blend of two or more polymers which differ in compositional ratio, Mw or Mw/Mn. It may also be a blend of a polymer comprising repeat units (a) and a polymer comprising repeat units (b1) and/or (b2), but not repeat units (a).

Acid Generator

The positive resist composition may comprise an acid generator capable of generating a strong acid (referred to as acid generator of addition type, hereinafter). As used herein, the term "strong acid" refers to a compound having a sufficient acidity to induce deprotection reaction of an acid labile group on the base polymer.

The acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, imide acid (imidic acid) or methide acid are preferred. Suitable PACs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG used herein, sulfonium salts having the formula (1-1) and iodonium salts having the formula (1-2) are also preferred.

$$R^{102}-\overset{\displaystyle R^{101}\atop|}{S^+}-R^{103}\quad Xa'' \tag{1-1}$$

$$R^{104}-I^+-R^{105}\quad Xa'' \tag{1-2}$$

In formulae (1-1) and (1-2), $R^{101}$ to $R^{105}$ are each independently halogen or a $C_1$-$C_{20}$ hydrocarbyl group which may contain a heteroatom.

Suitable halogen atoms include fluorine, chlorine, bromine and iodine. The $C_1$-$C_{20}$ hydrocarbyl group represented by $R^{101}$ to $R^{105}$ may be saturated or unsaturated and straight, branched or cyclic. Examples thereof include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl and icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl and adamantyl; $C_2$-$C_{20}$ alkenyl groups such as vinyl, propenyl, butenyl and hexenyl; $C_2$-$C_{20}$ alkynyl groups such as ethynyl, propynyl and butynyl; $C_3$-$C_{20}$ cyclic unsaturated aliphatic hydrocarbyl groups such as cyclohexenyl and norbornenyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl and tert-butylnaphthyl; $C_7$-$C_{20}$ aralkyl groups such as benzyl and phenethyl; and combinations thereof.

Also included are substituted forms of the foregoing groups in which some or all of the hydrogen atoms are substituted by a moiety containing a heteroatom such as oxygen, sulfur, nitrogen or halogen, or some constituent —$CH_2$— is replaced by a moiety containing a heteroatom such as oxygen, sulfur or nitrogen, so that the group may contain a hydroxy moiety, fluorine, chlorine, bromine, iodine, cyano moiety, nitro moiety, carbonyl moiety, ether bond, ester bond, sulfonic ester bond, carbonate moiety, lactone ring, sultone ring, carboxylic anhydride (—C(═O)—O—C(═O))—) or haloalkyl moiety.

A pair of $R^{101}$ and $R^{102}$ may bond together to form a ring with the sulfur atom to which they are attached. Preferred are those rings of the structure shown below.

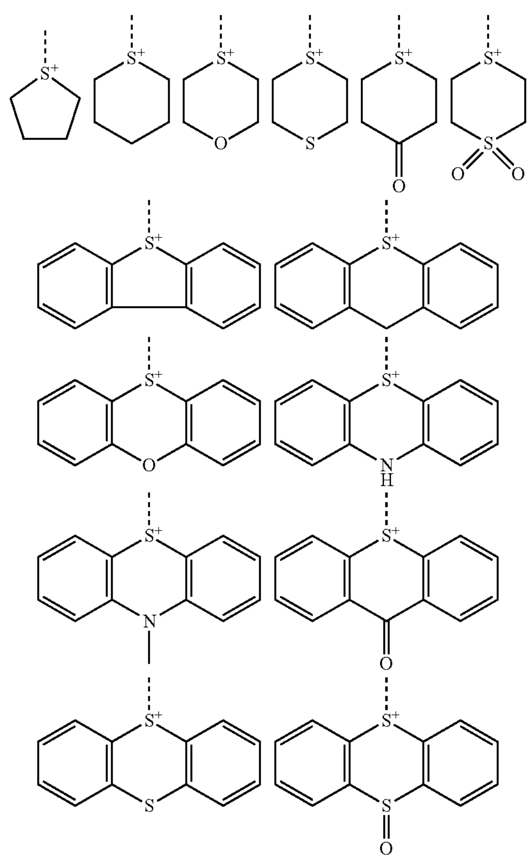

-continued

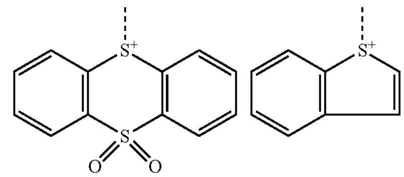

Herein, the broken line denotes a point of attachment to $R^{103}$.

Examples of the cation in the sulfonium salt having formula (1-1) are shown below, but not limited thereto.

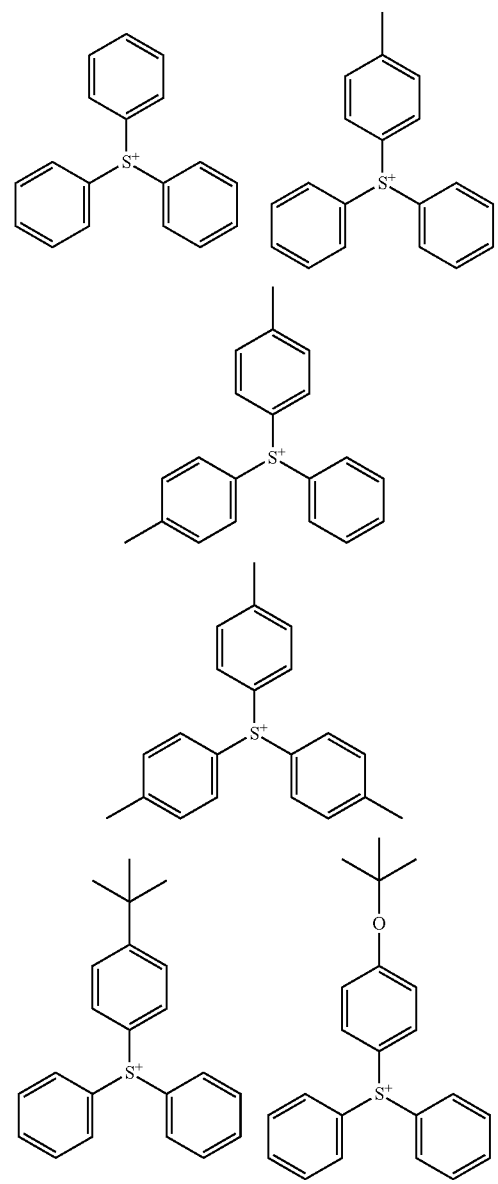

-continued
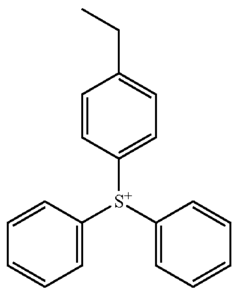
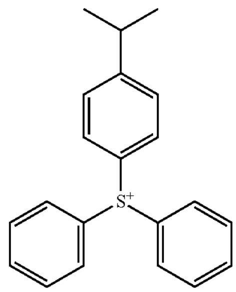
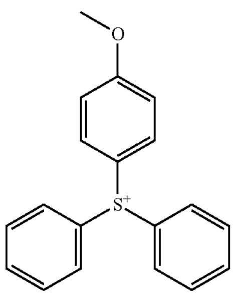
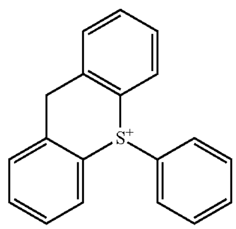
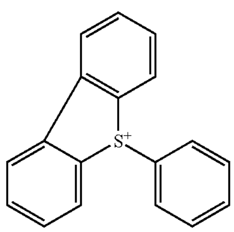
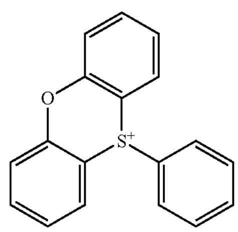
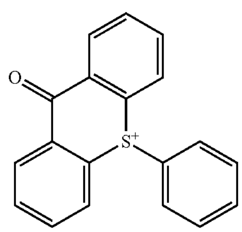
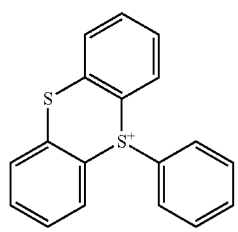
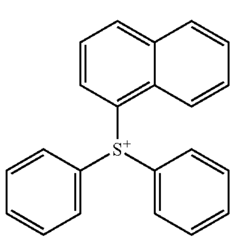
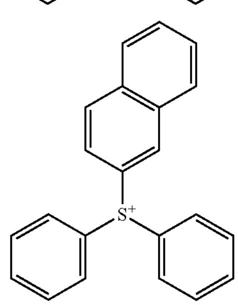
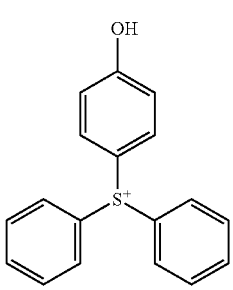
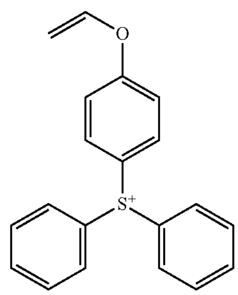
-continued
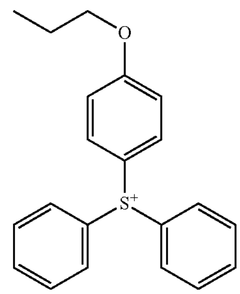
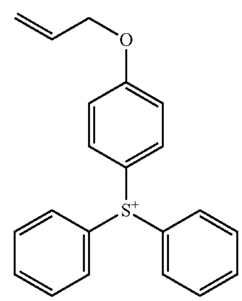
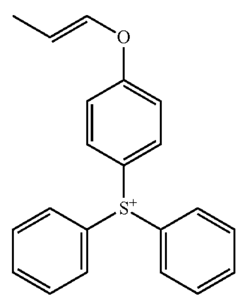
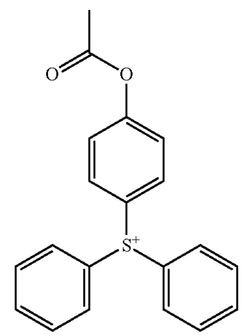
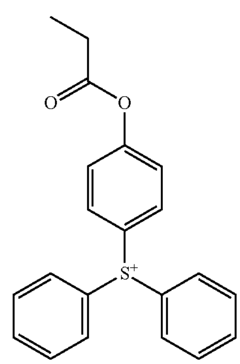
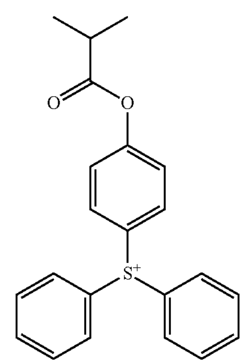
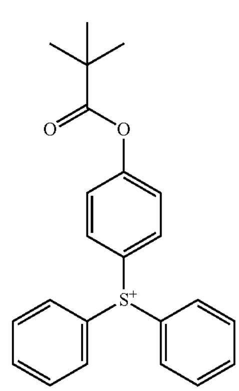
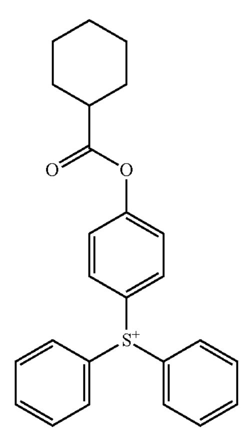

-continued
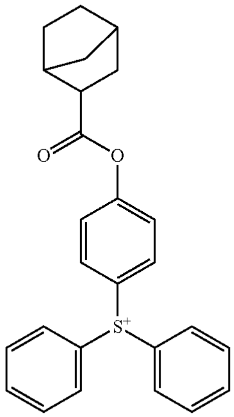
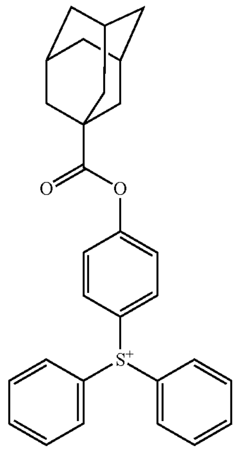
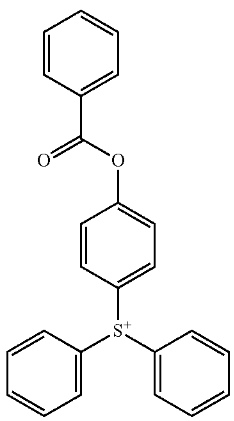
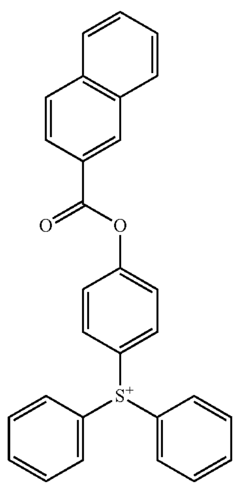
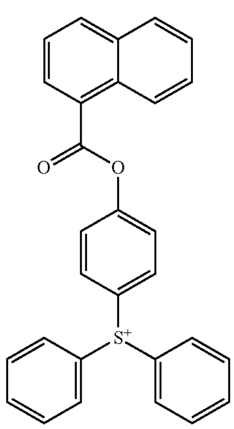
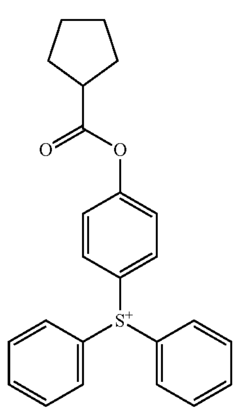
-continued
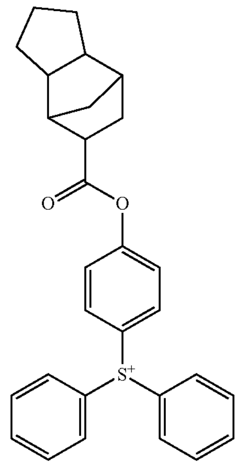
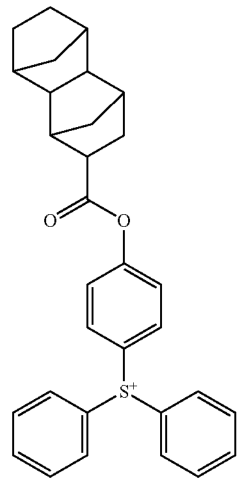
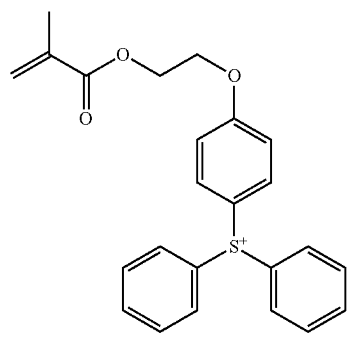
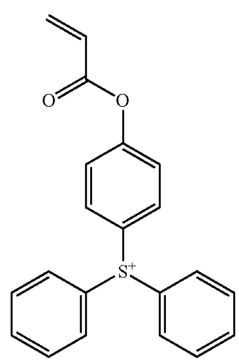
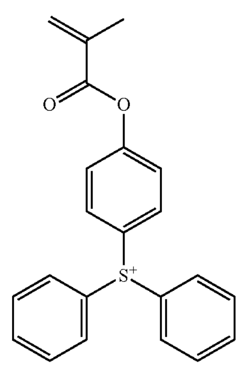
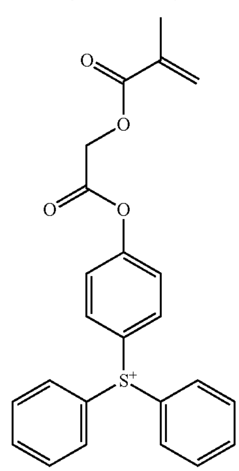

-continued
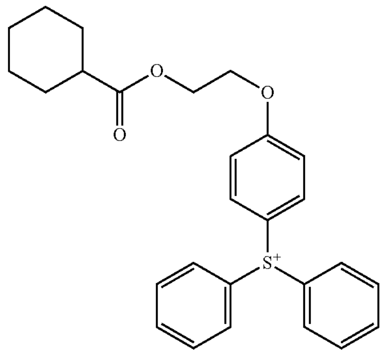
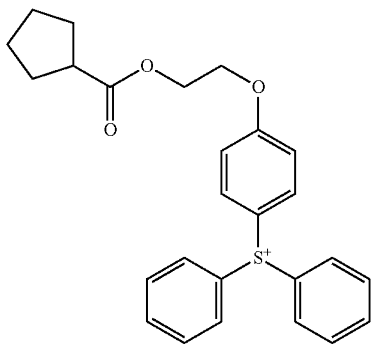
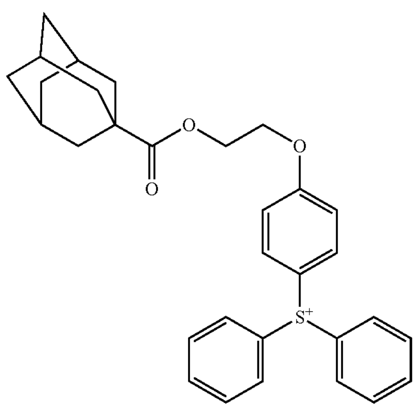
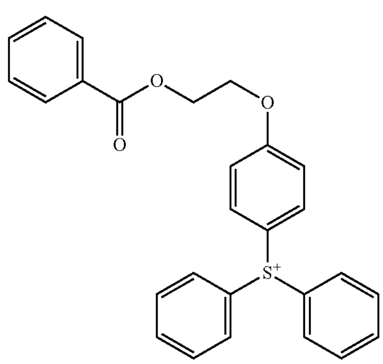
-continued
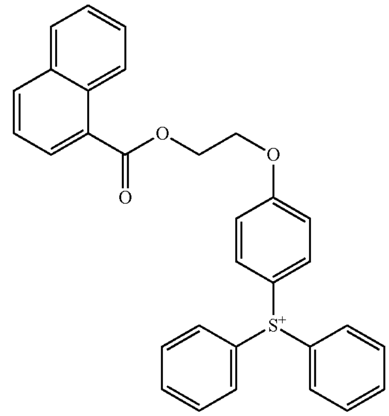
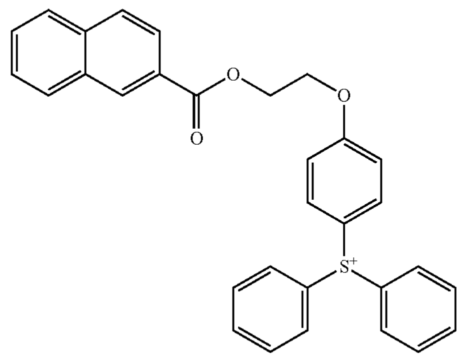
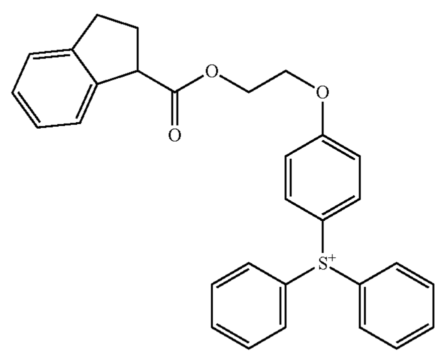
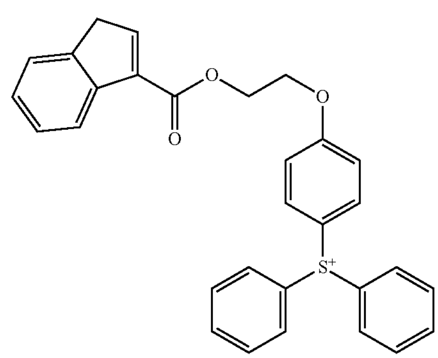

-continued
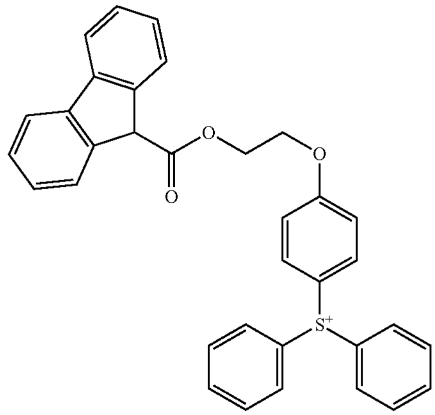
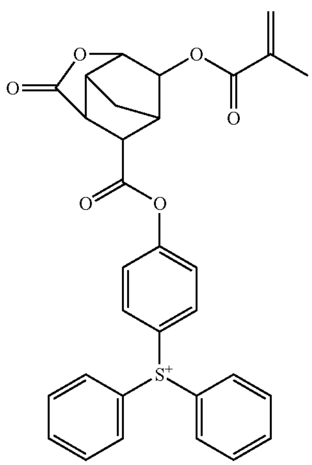
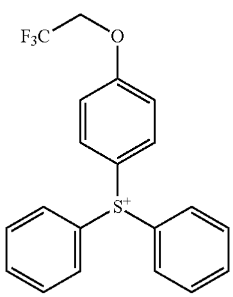
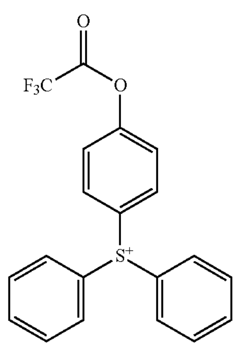
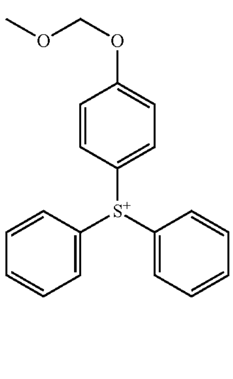
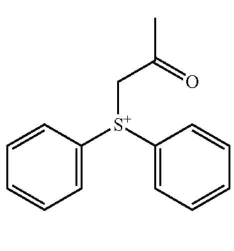
-continued
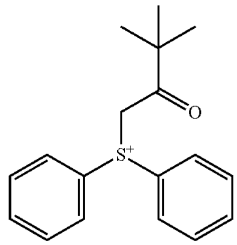
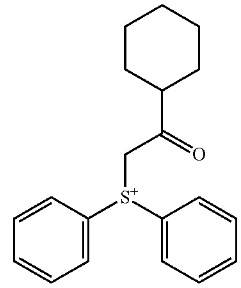
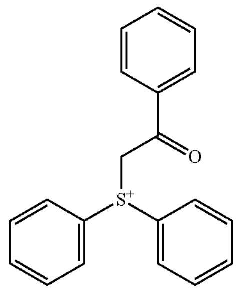
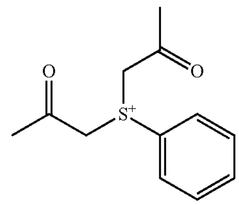
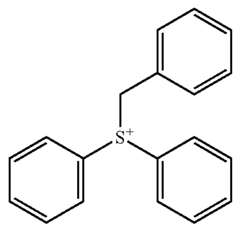
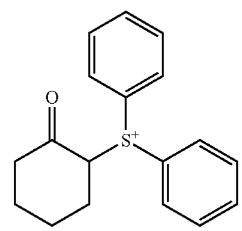
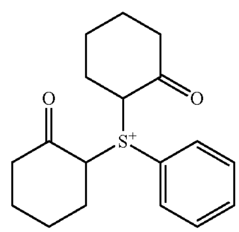
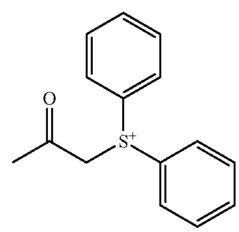
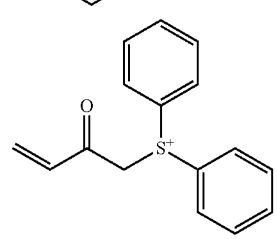
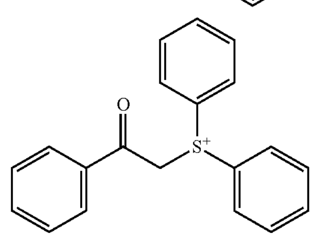
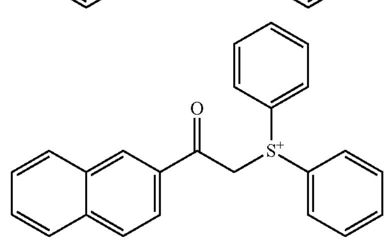

-continued
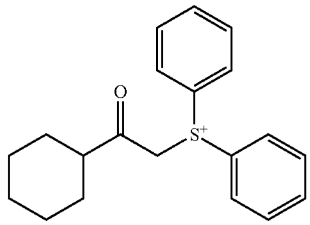
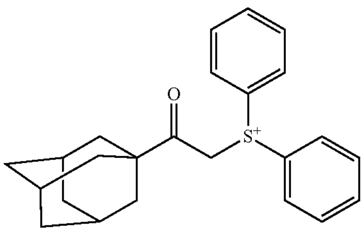
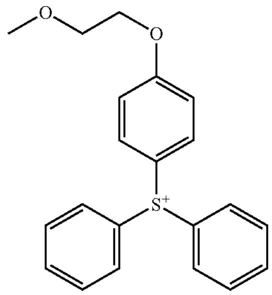
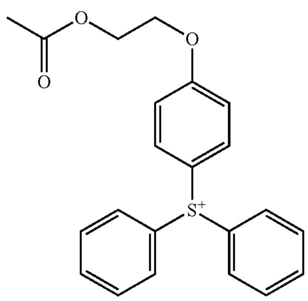
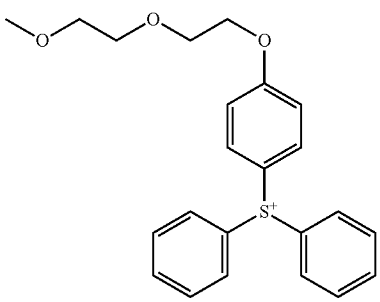
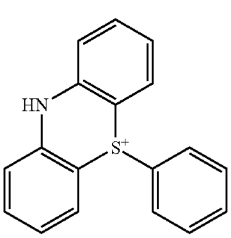
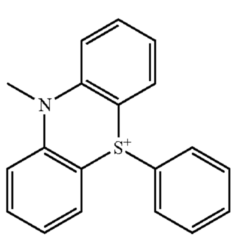
-continued
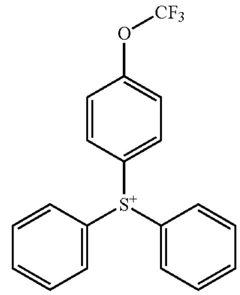
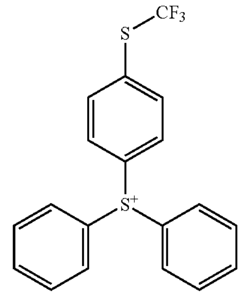
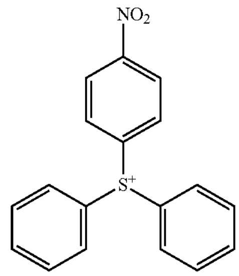
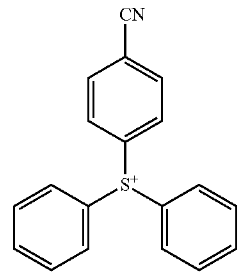
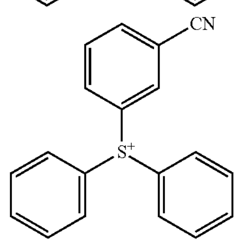
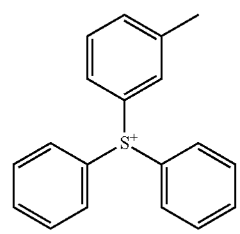
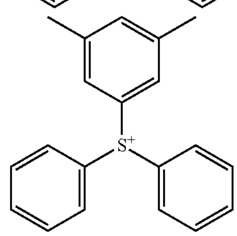
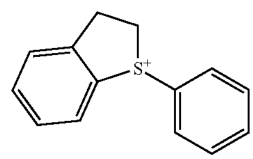
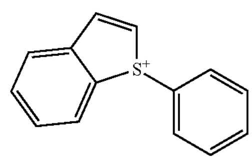
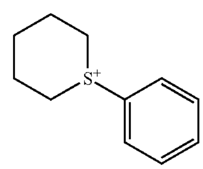
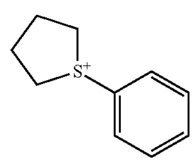
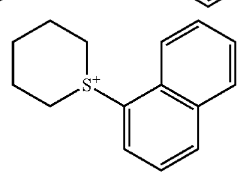
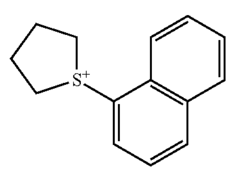
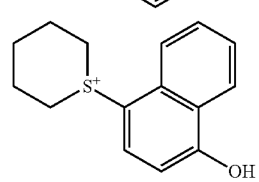
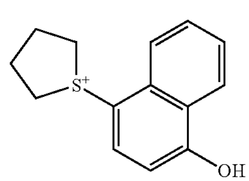
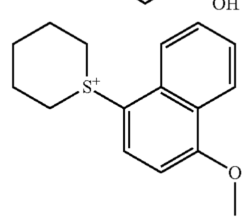

-continued
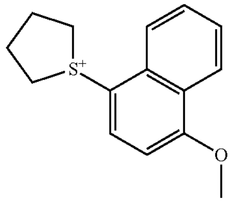
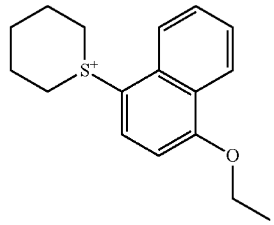
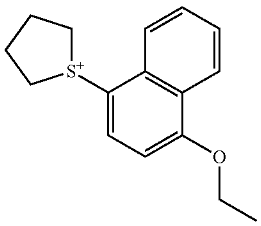
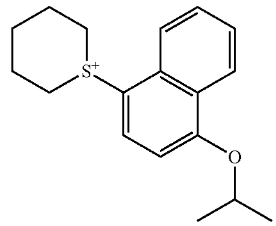
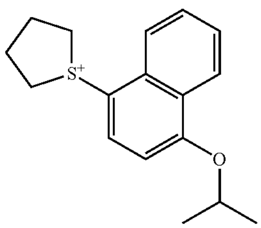
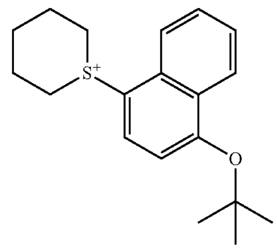
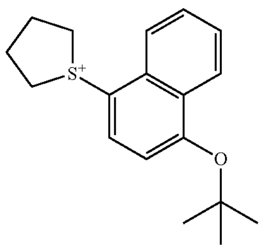
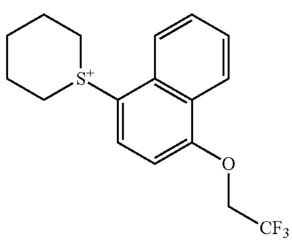
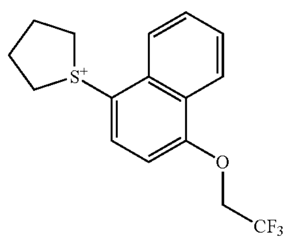
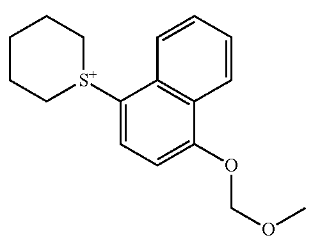
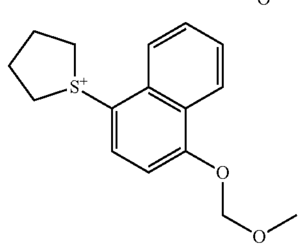
-continued
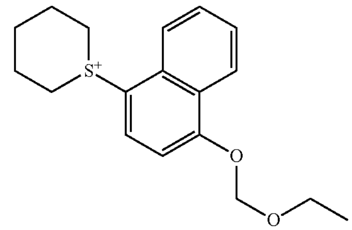
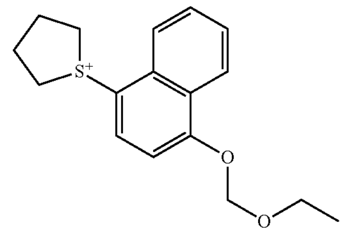
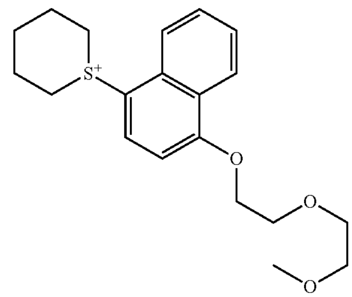
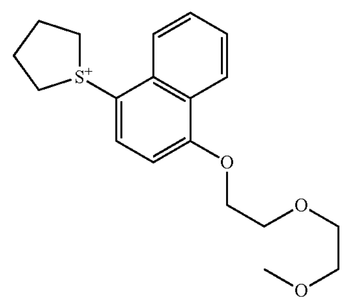
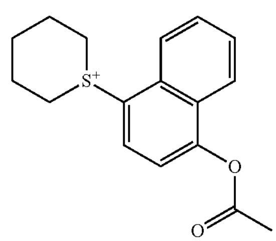
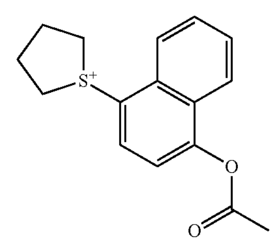
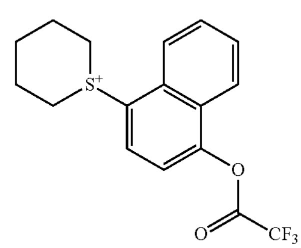

-continued
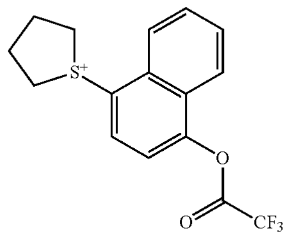
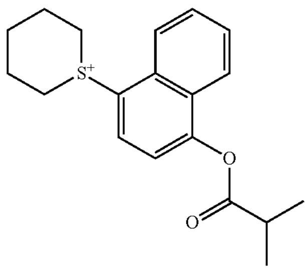
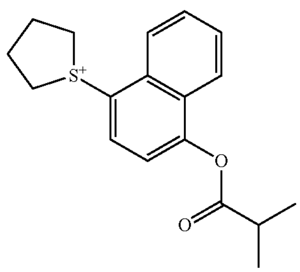
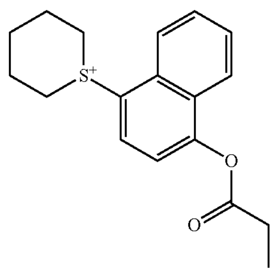
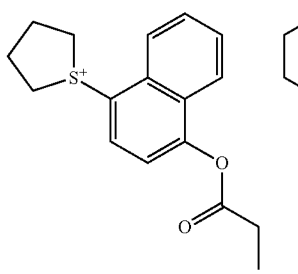
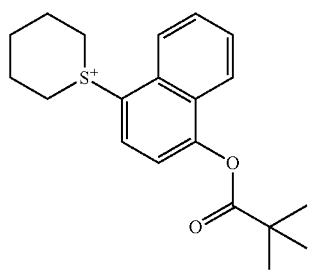
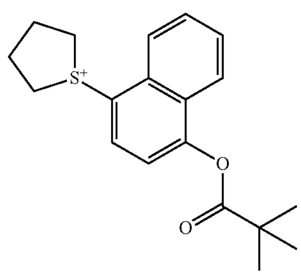
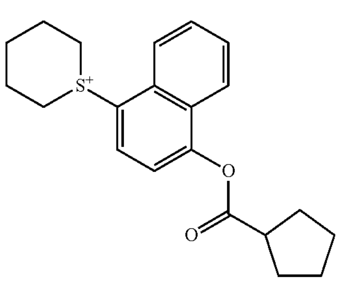
-continued
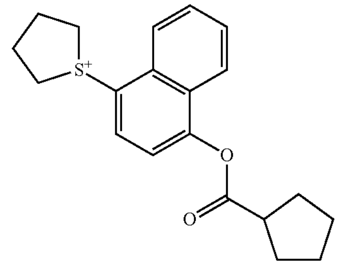
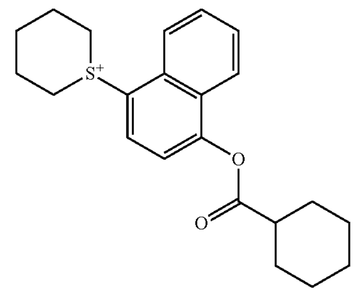
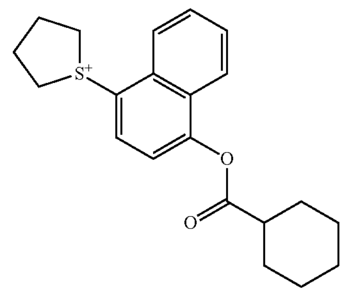
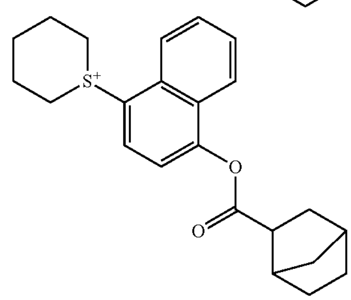
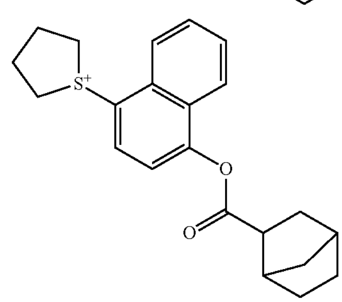
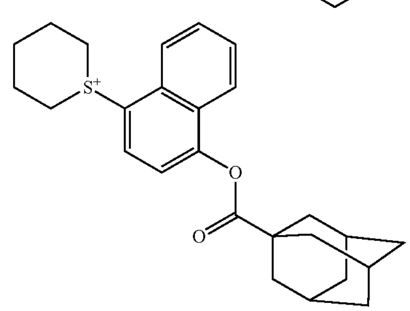

-continued
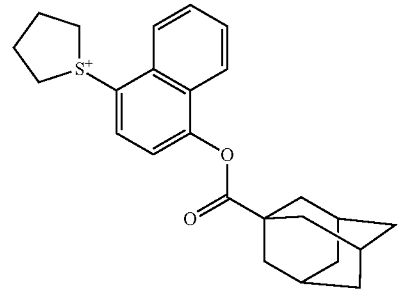
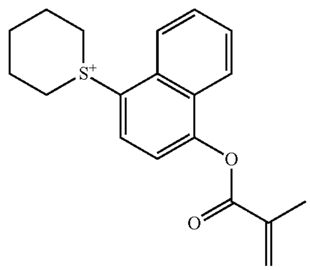
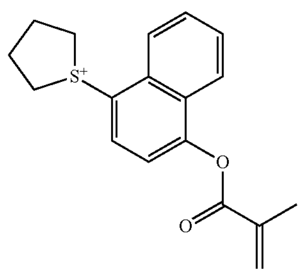
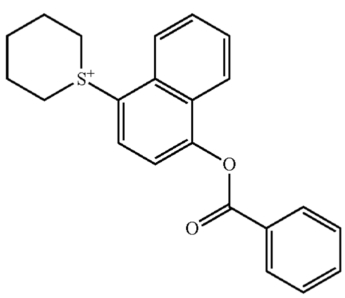
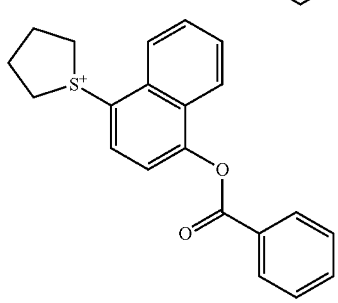
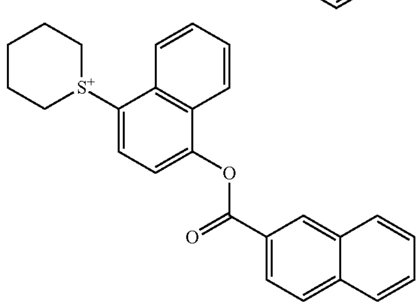
-continued
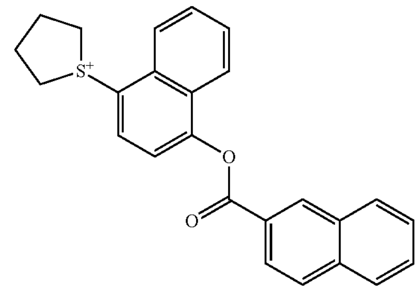
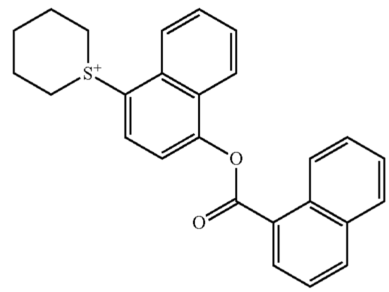
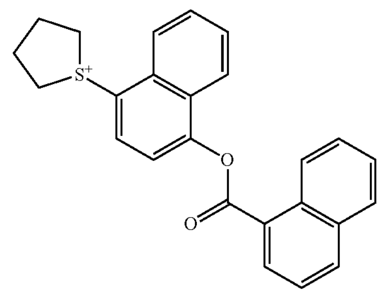
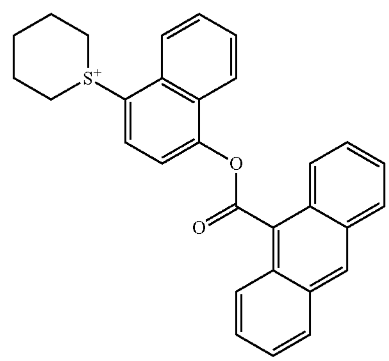
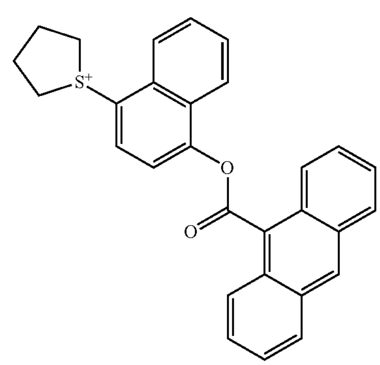

-continued
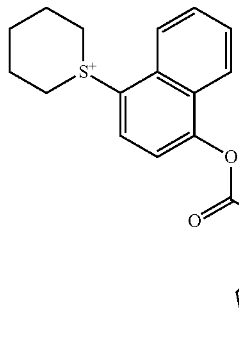
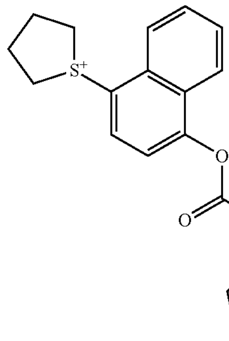
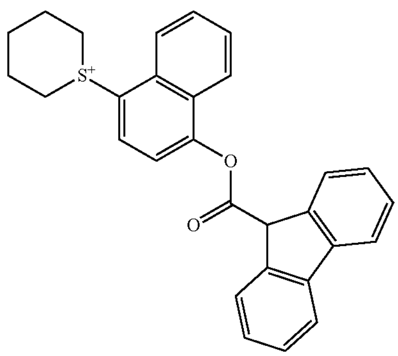
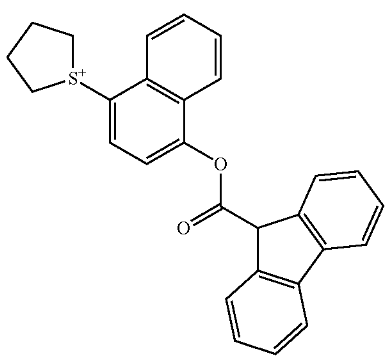
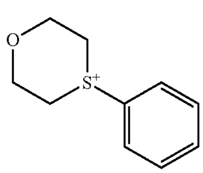
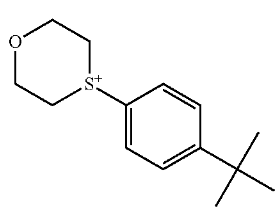
-continued
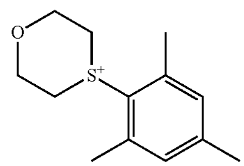
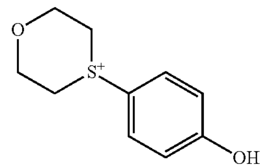
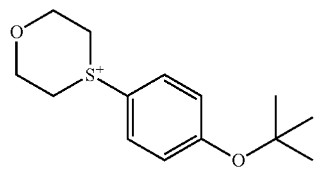
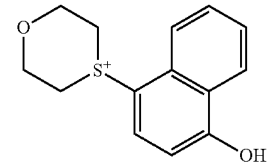
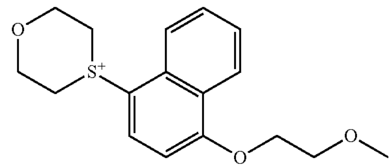
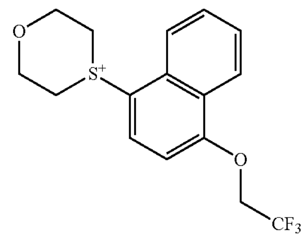
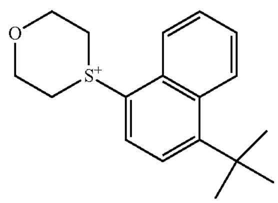
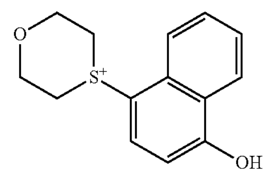
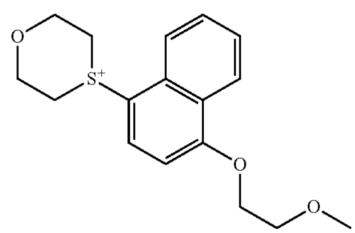
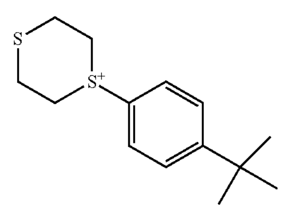
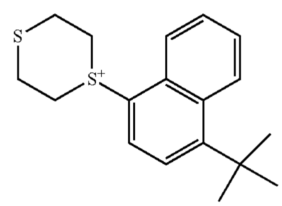
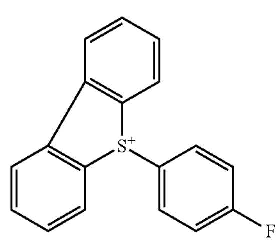
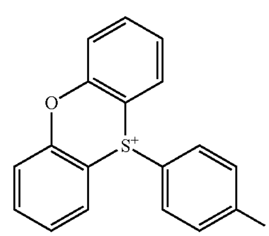

-continued
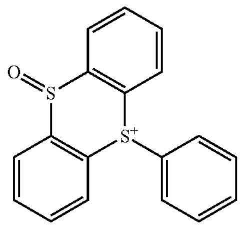
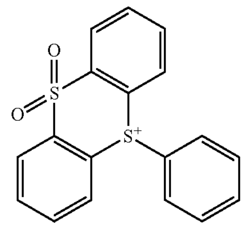
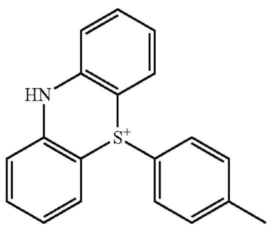
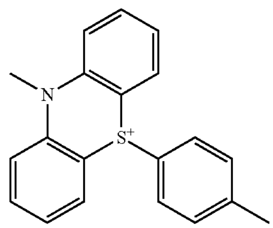
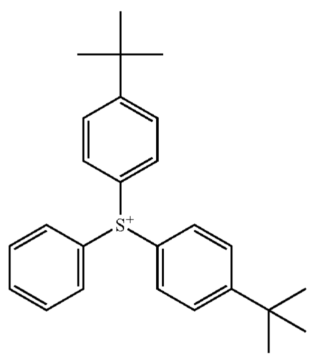
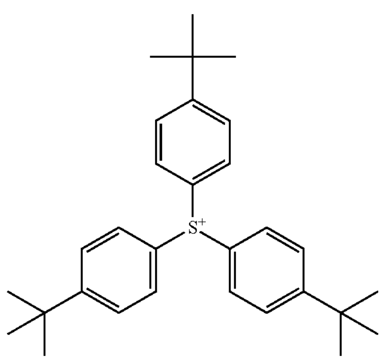
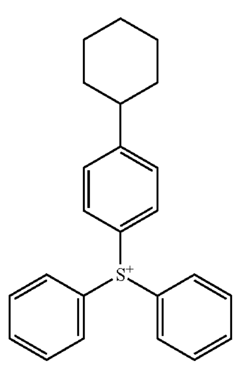
-continued
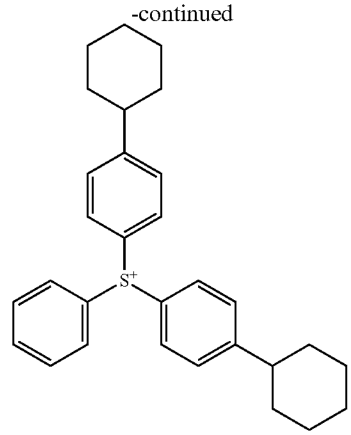
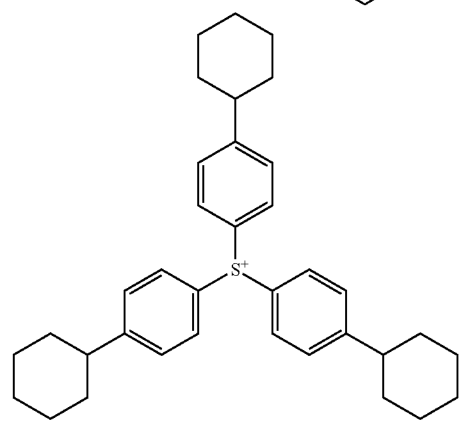
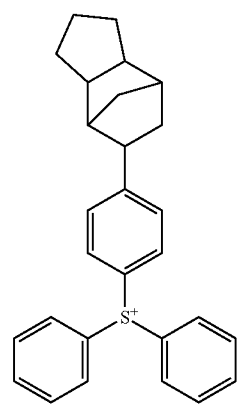
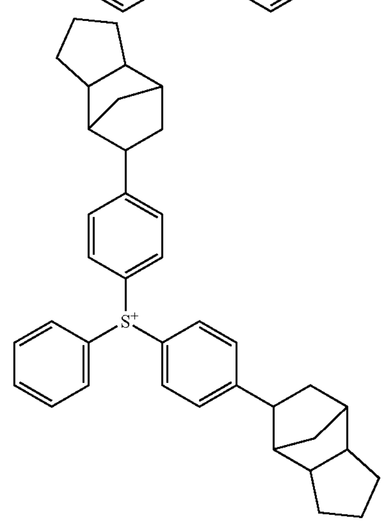

-continued
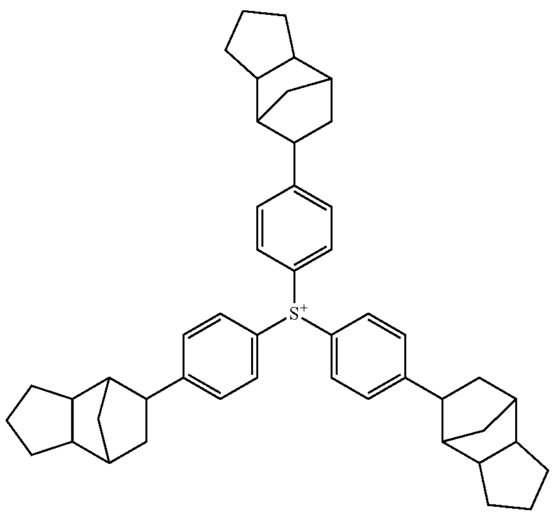
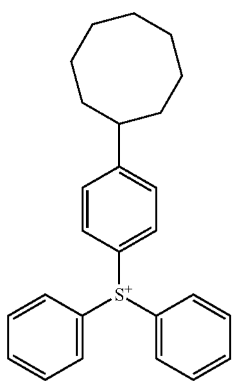
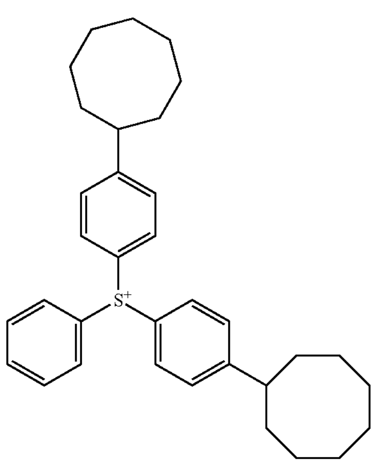
-continued
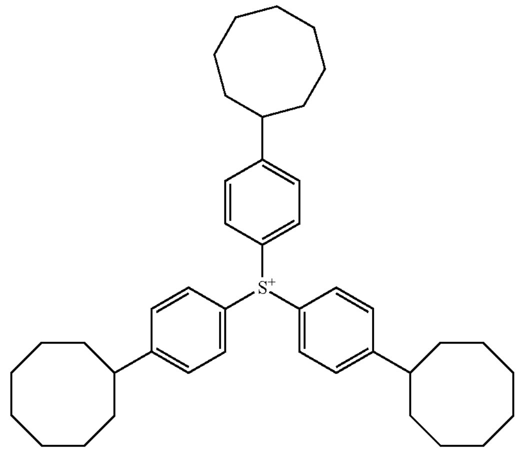
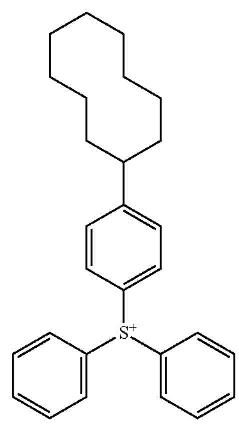
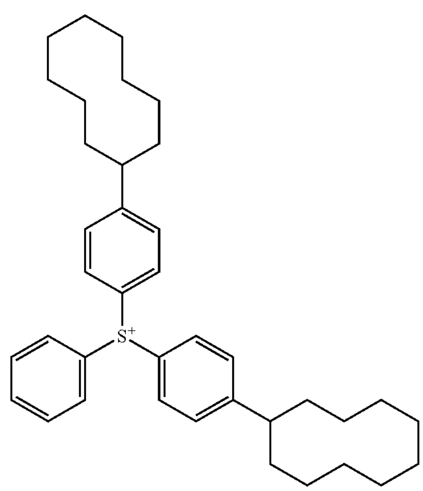

-continued
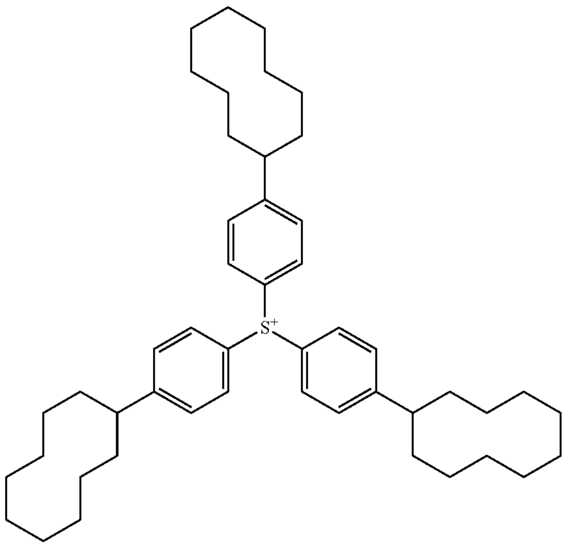
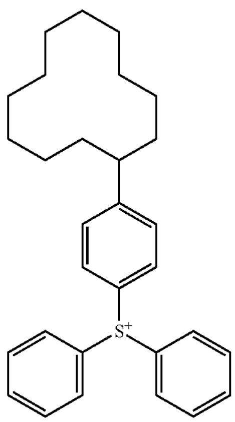
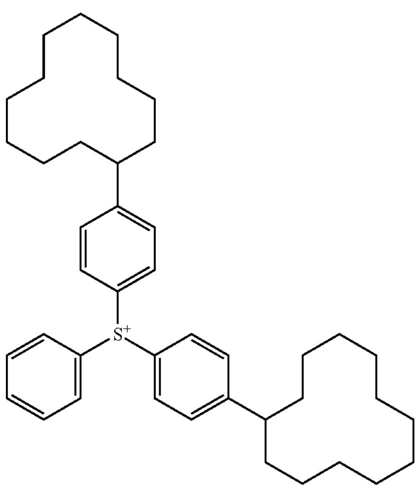
-continued
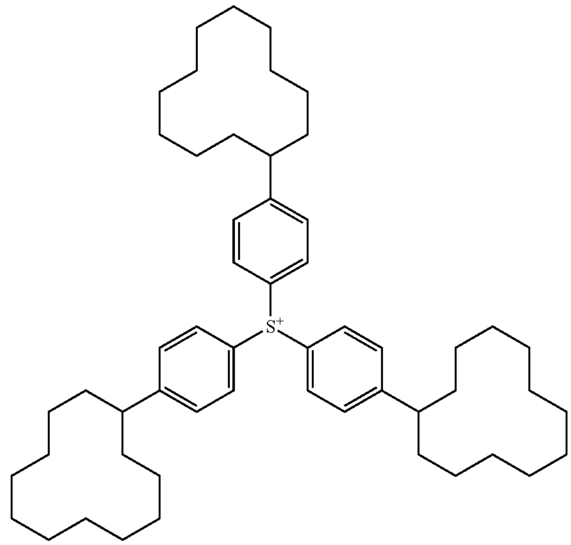
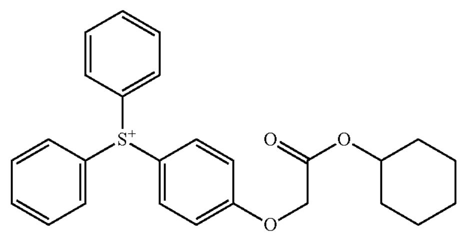
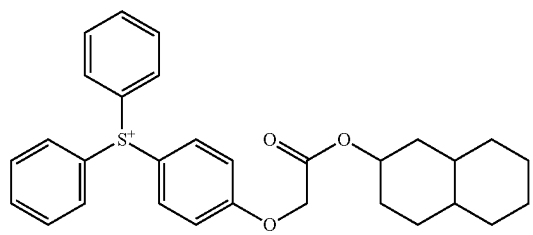
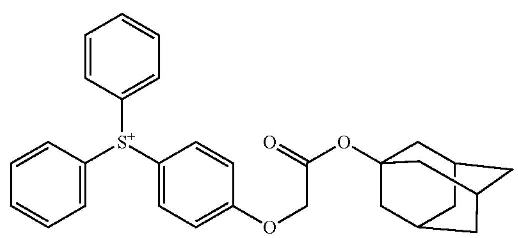
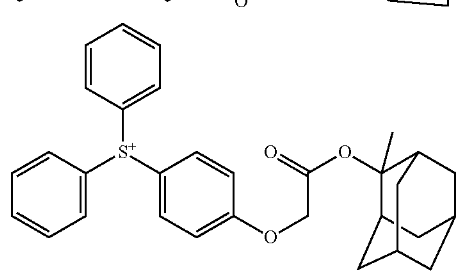

-continued
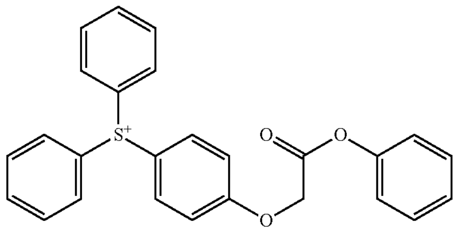
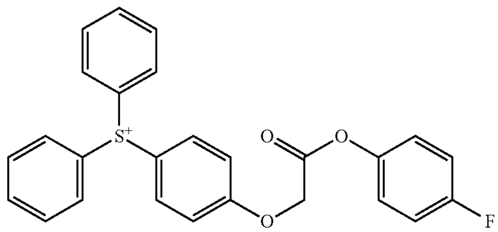
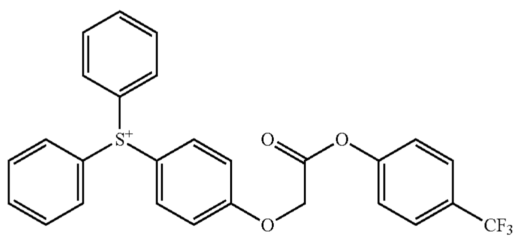
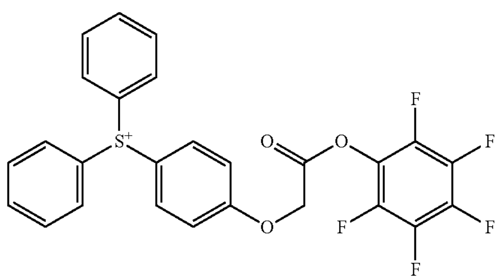
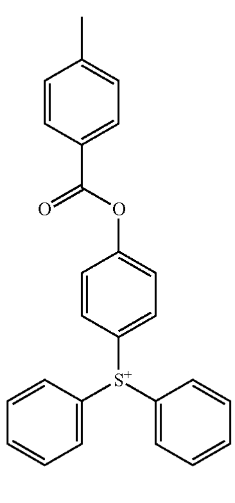
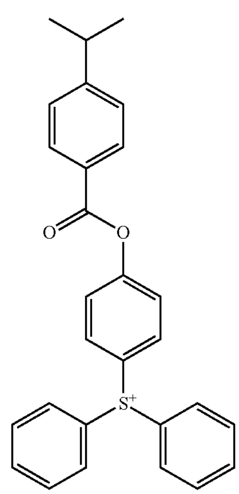
-continued
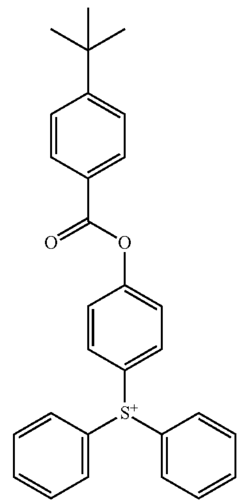
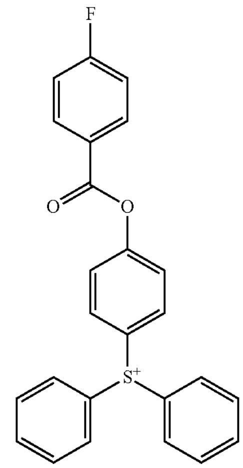
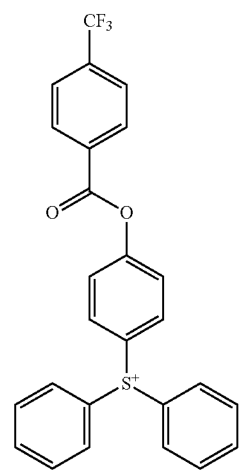
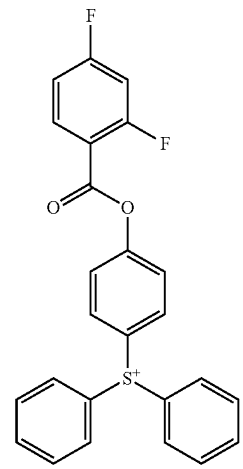
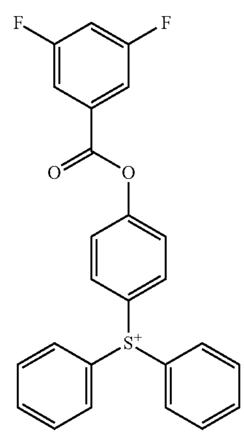
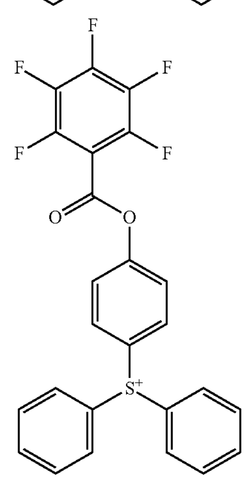
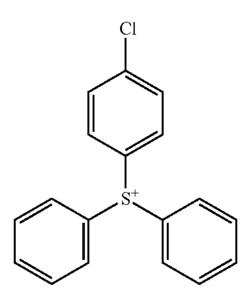
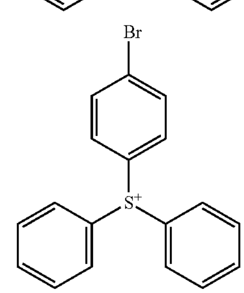

-continued
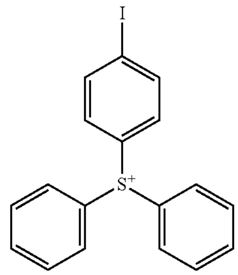
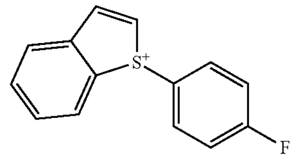
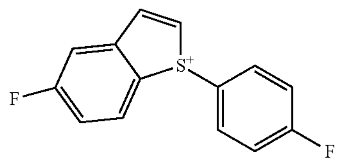
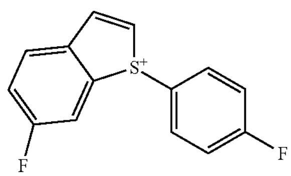
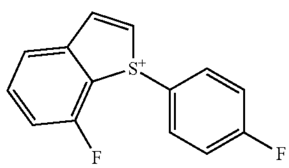
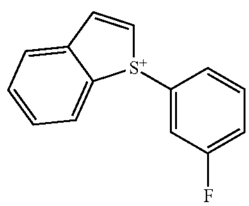
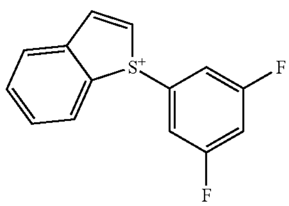
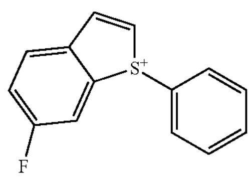
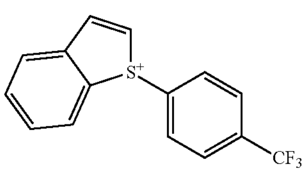
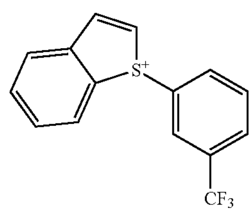
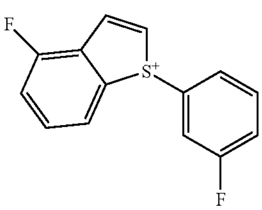
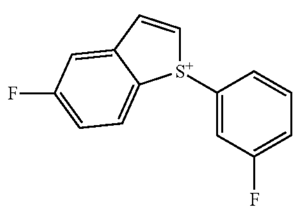
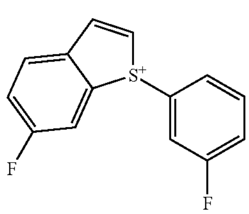
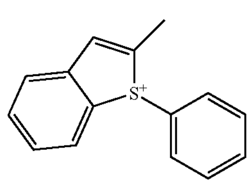
-continued
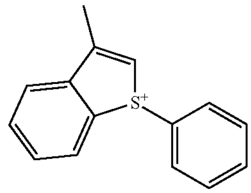
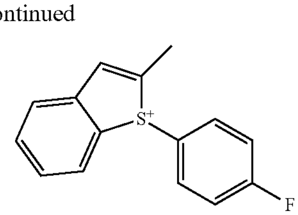
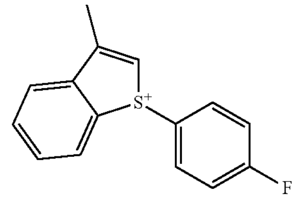
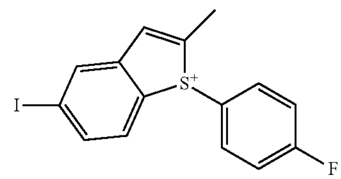
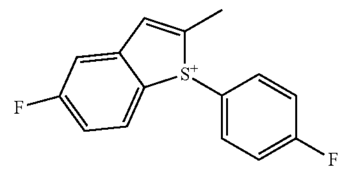
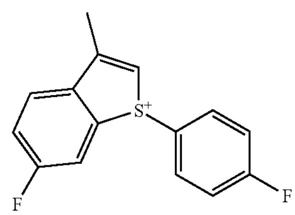
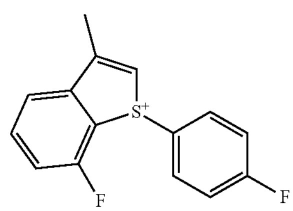
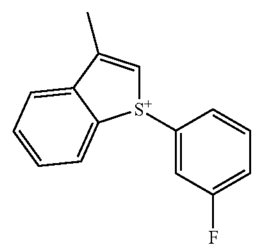
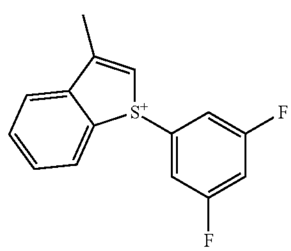
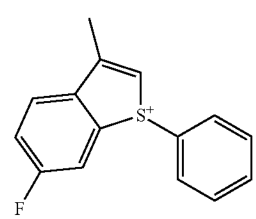
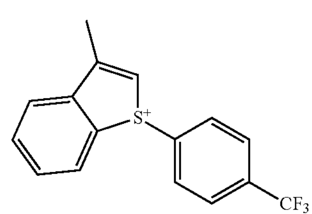
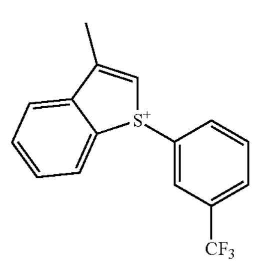

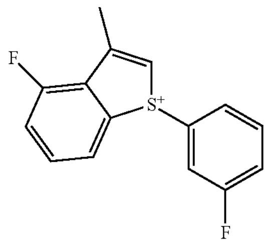
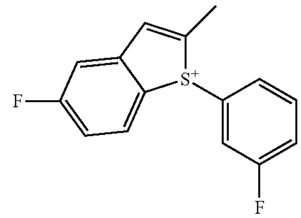
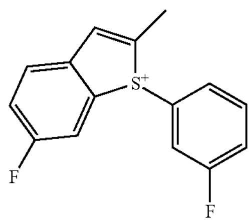
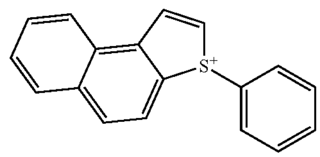
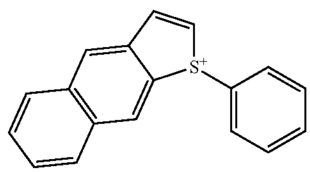
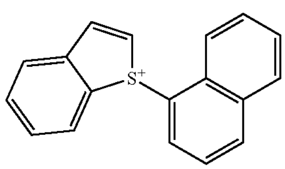
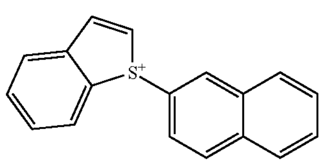
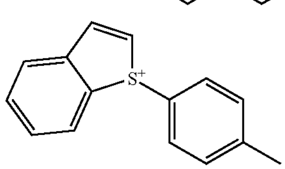
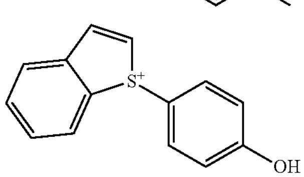
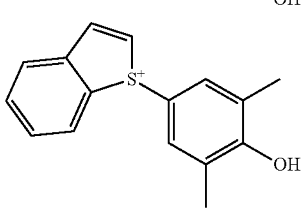
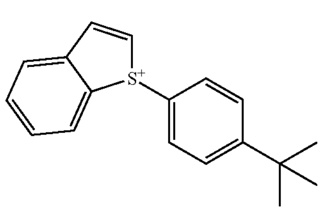
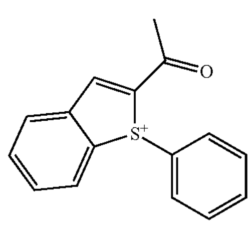
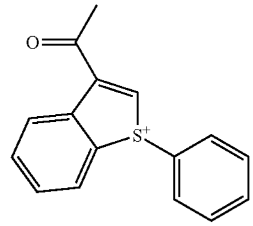
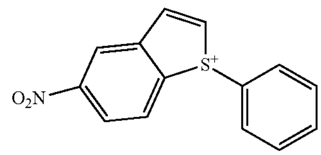
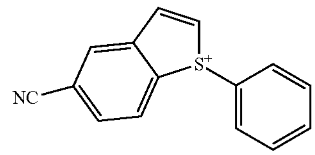
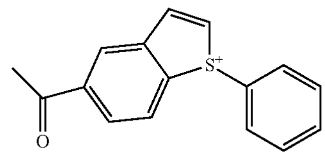
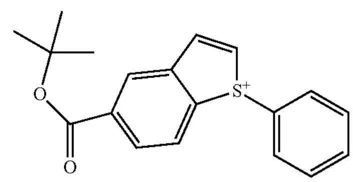
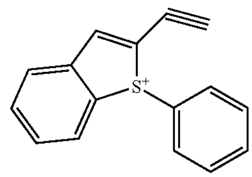
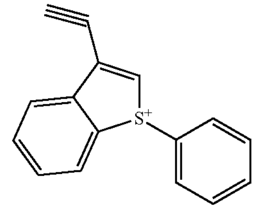
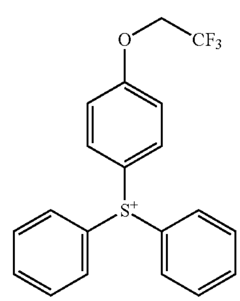
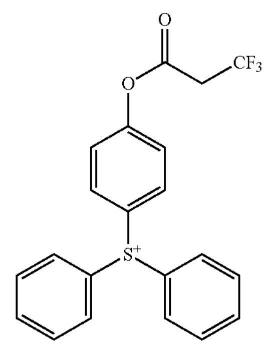
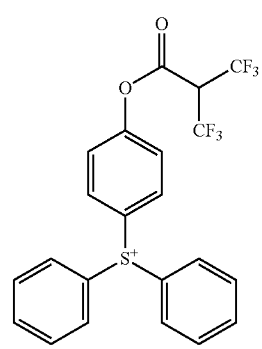
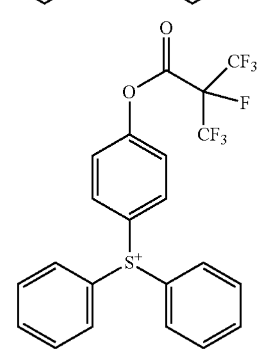

-continued
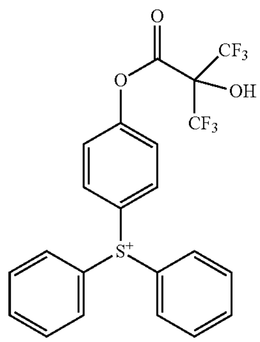
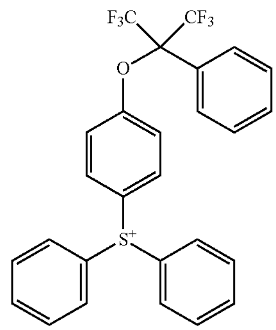
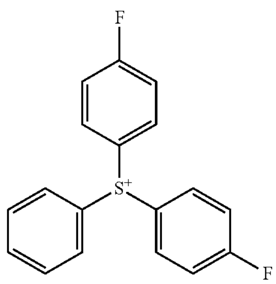
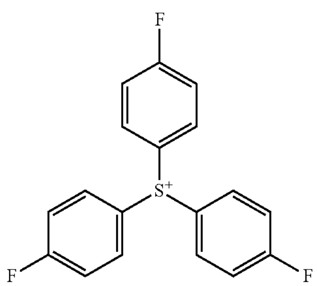
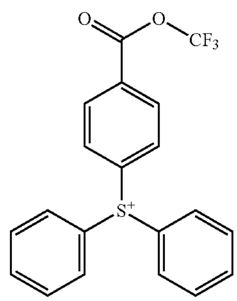
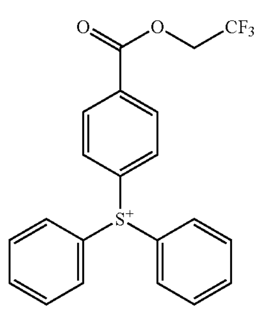
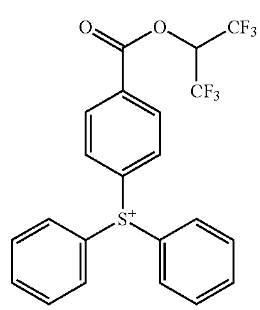
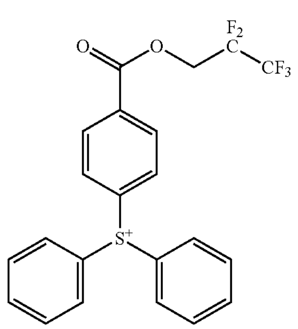
-continued
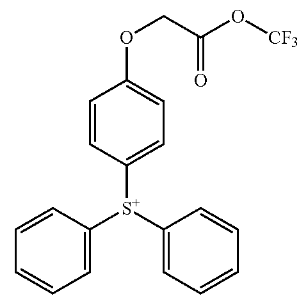
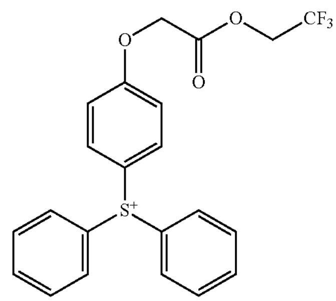
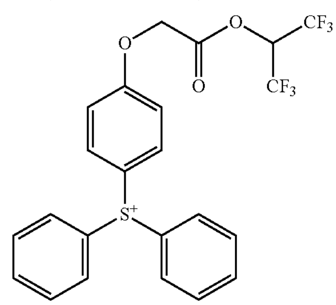
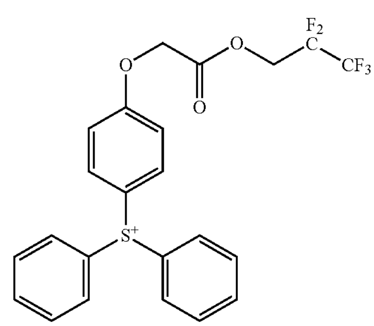
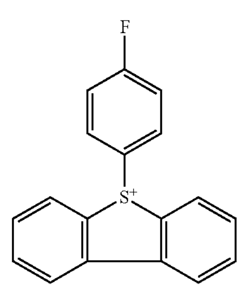
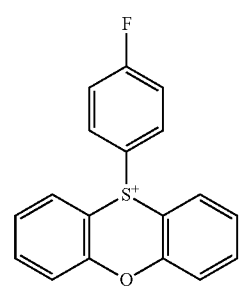

-continued
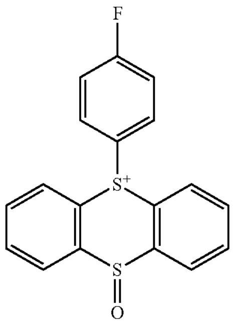
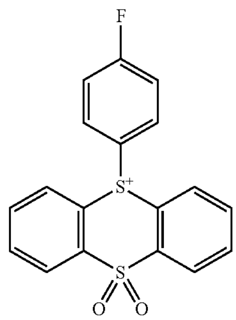
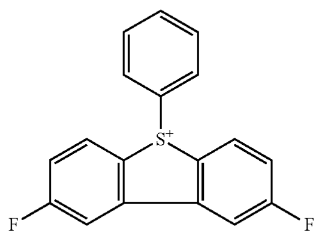
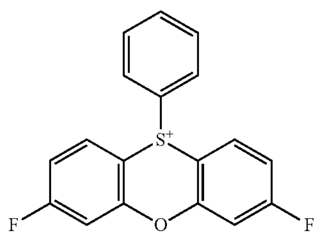
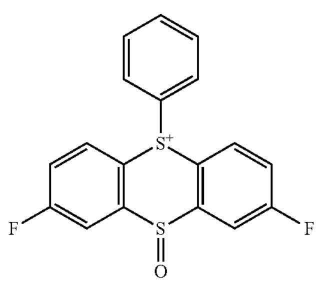
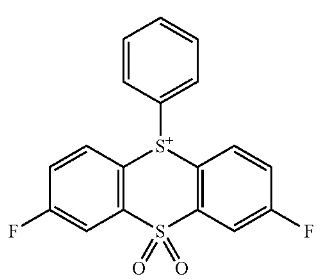
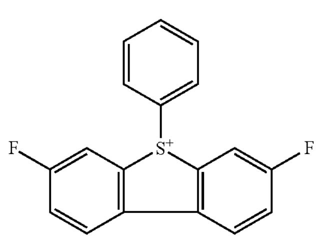
-continued
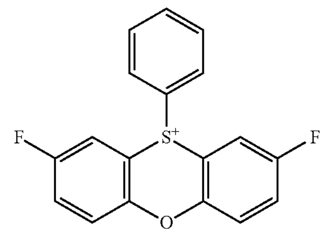
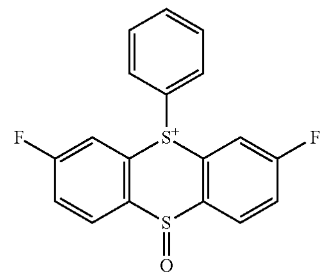
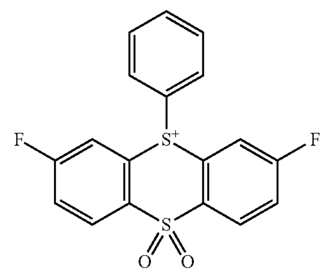
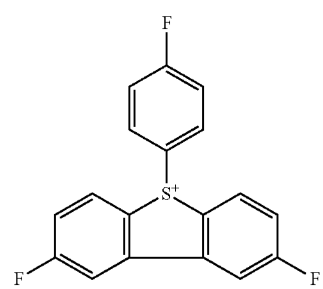
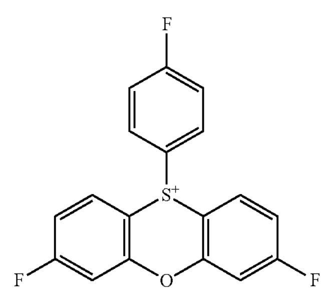
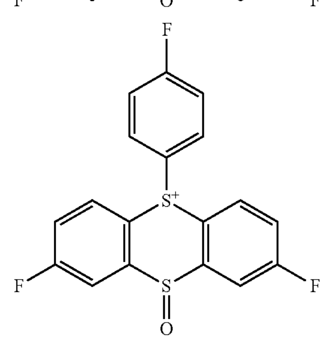

-continued
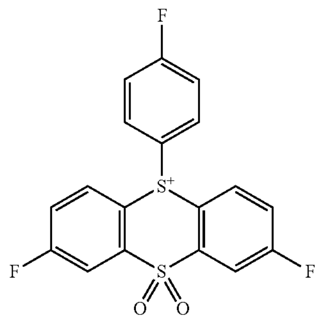
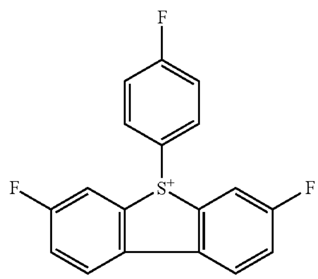
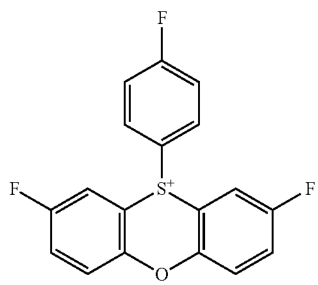
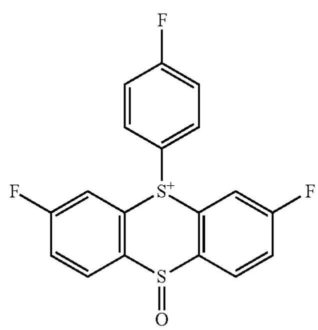
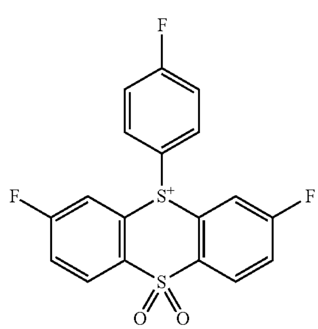
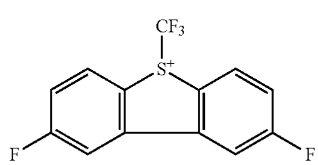
-continued
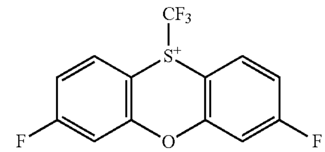
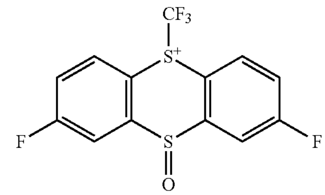
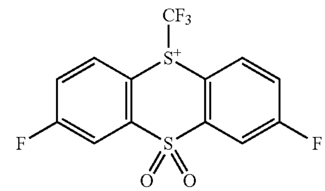
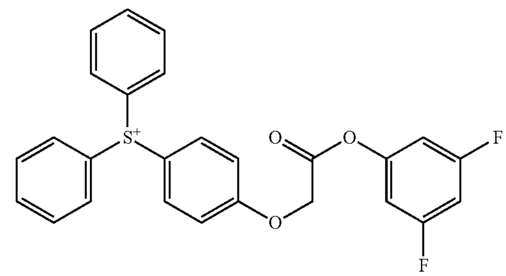
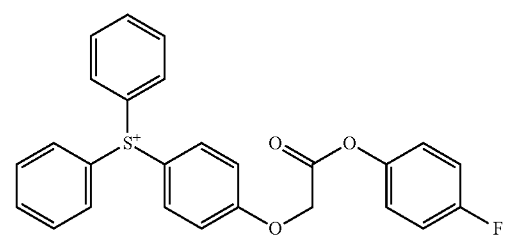
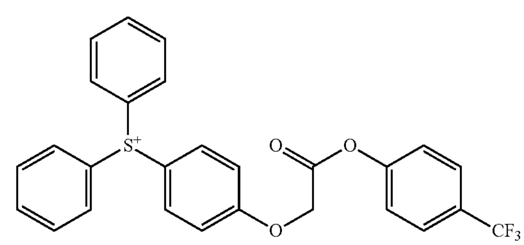
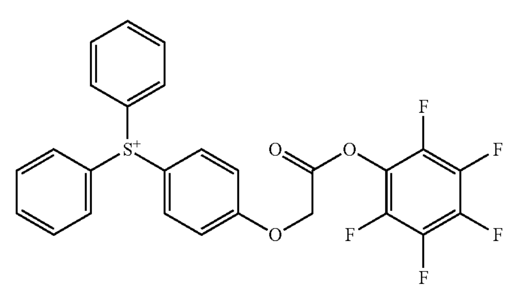

-continued
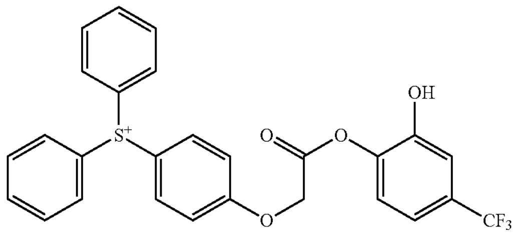
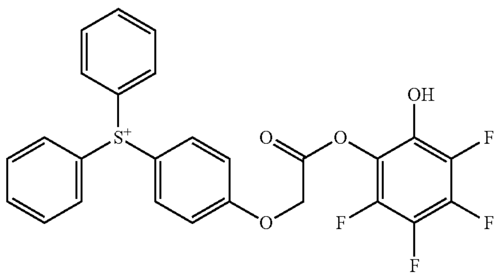
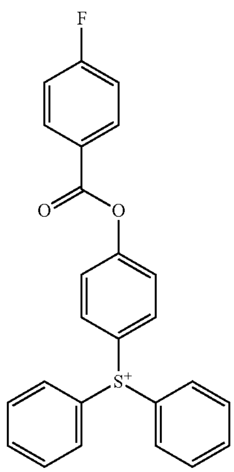
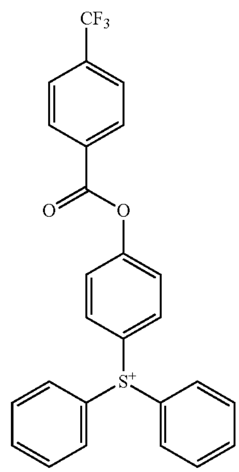
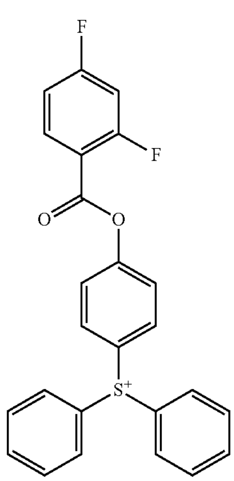
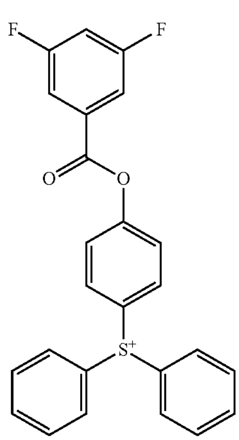
-continued
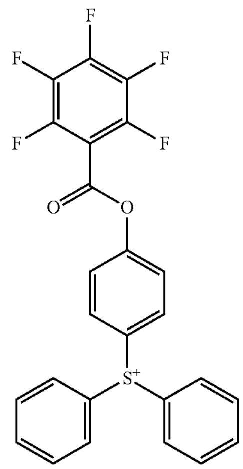
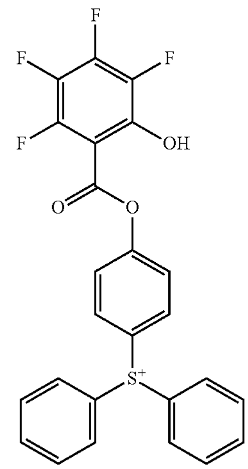
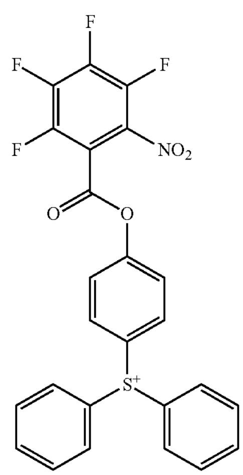
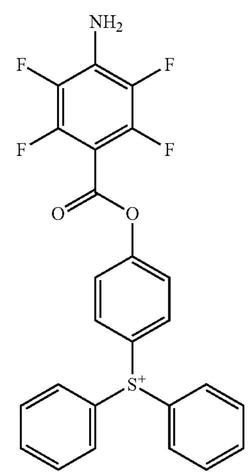
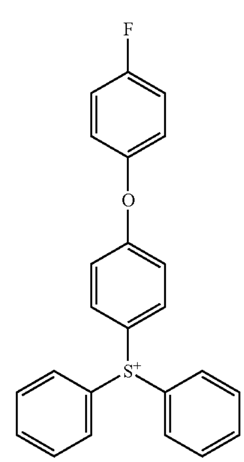
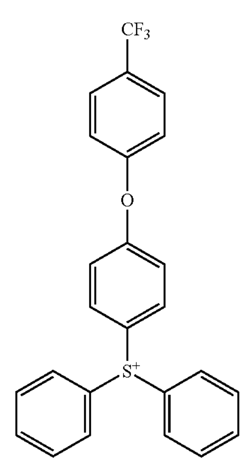

-continued
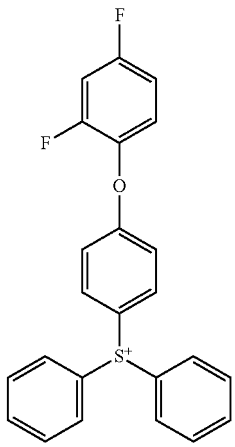
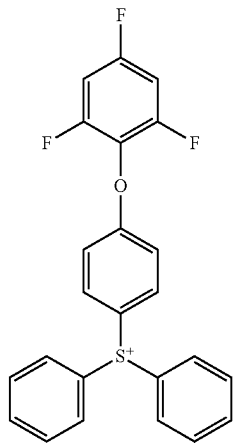
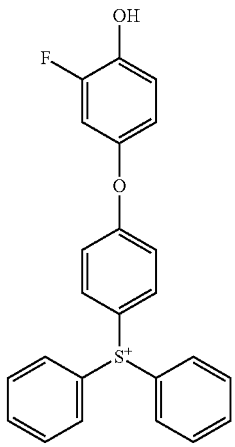
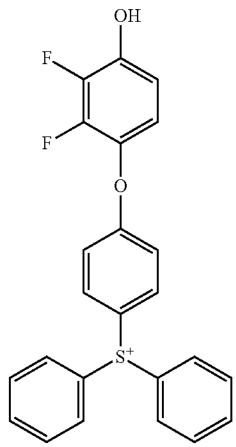
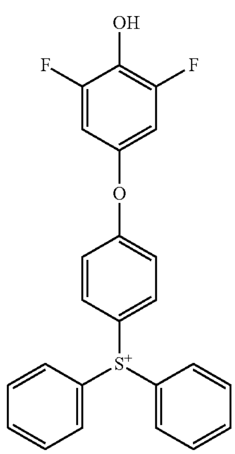
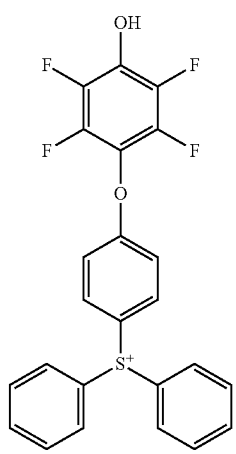
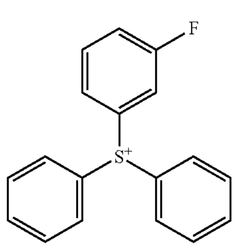
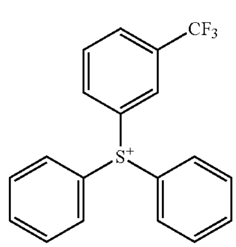
-continued
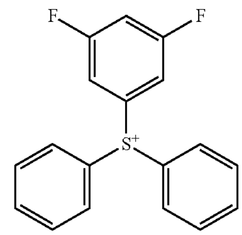
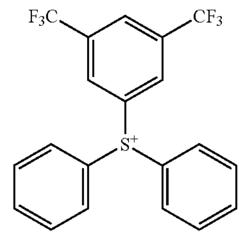
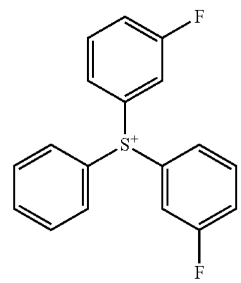
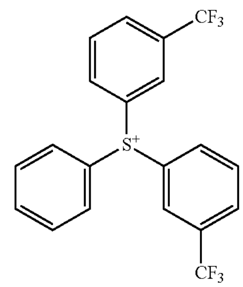
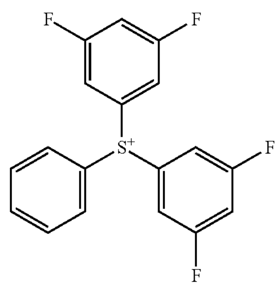
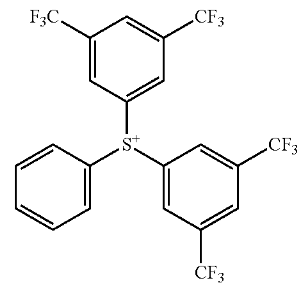
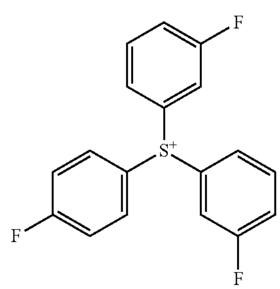
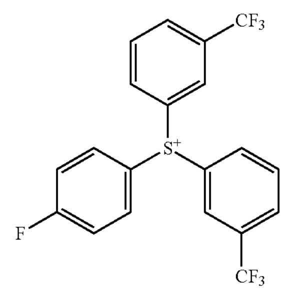
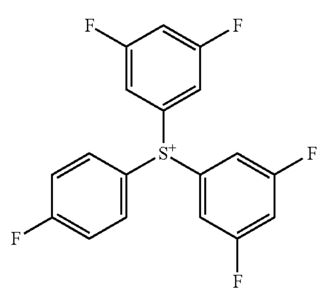
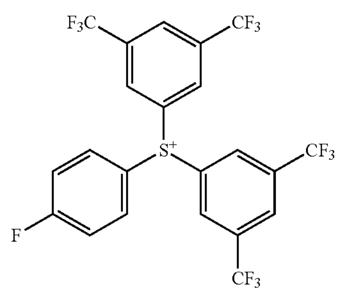
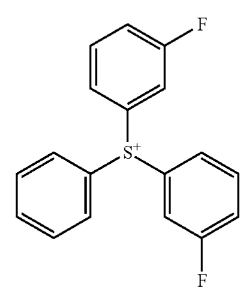

-continued
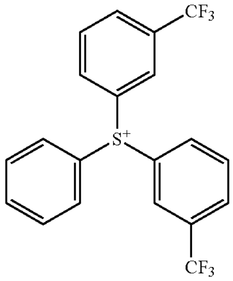
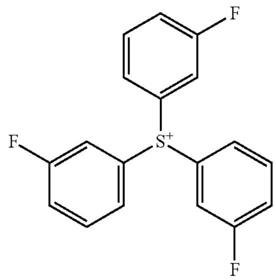
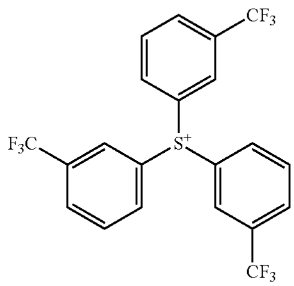
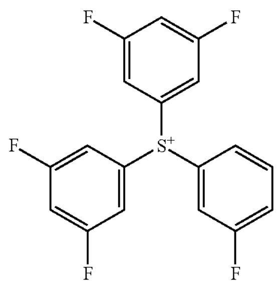
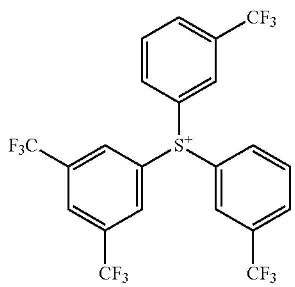
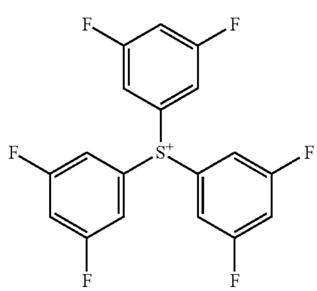
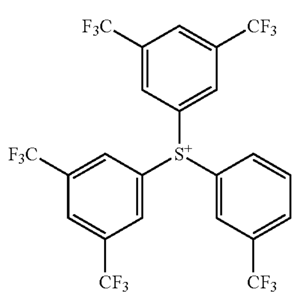
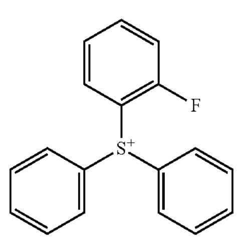
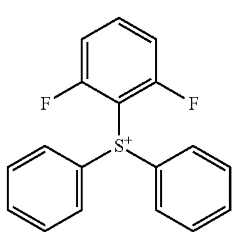
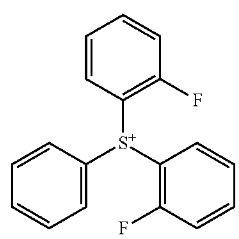
-continued
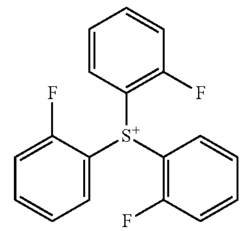
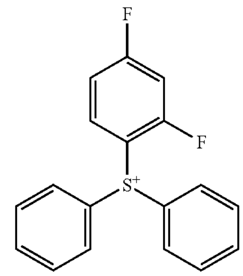
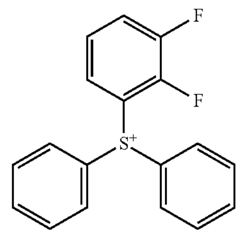
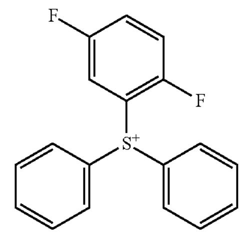
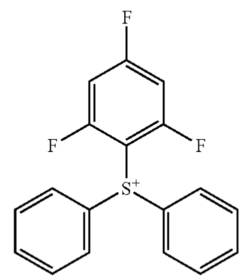
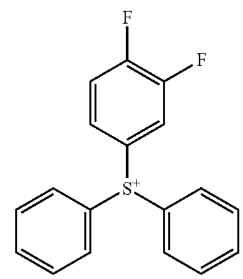
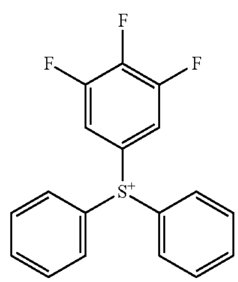
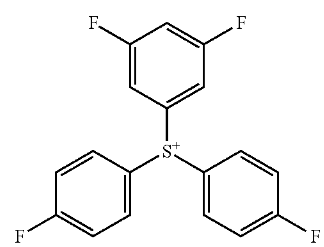
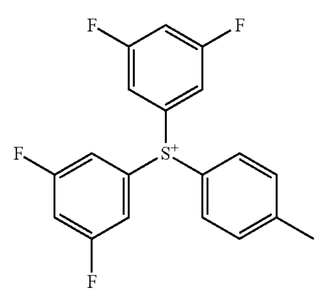
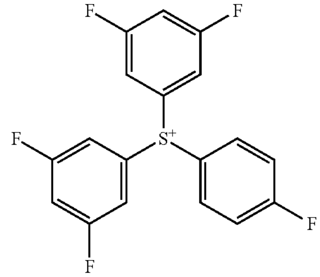
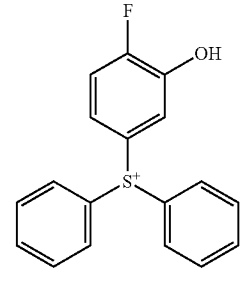

-continued
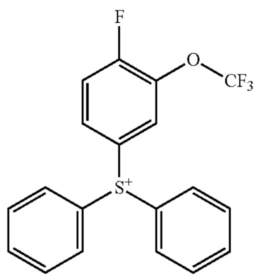
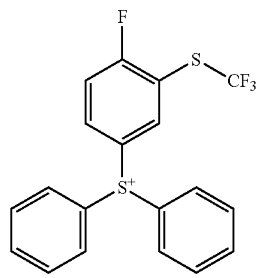
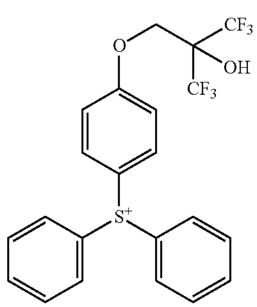
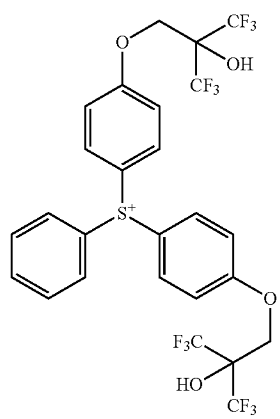
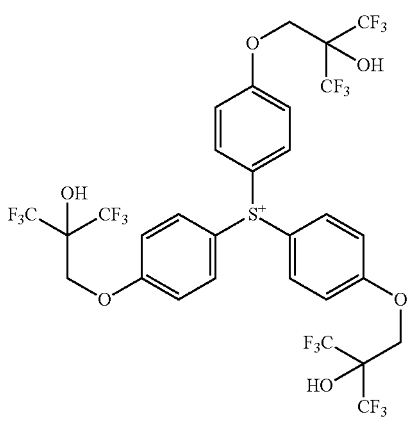
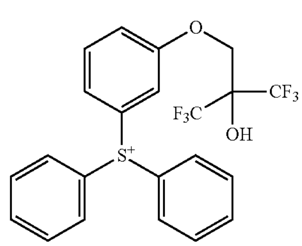
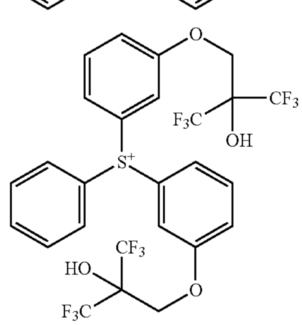
-continued
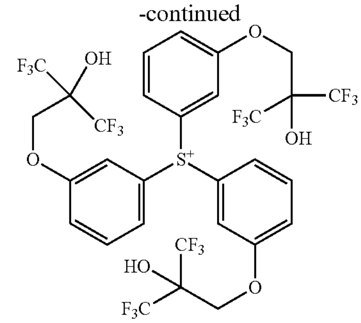
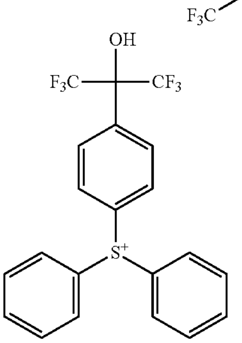
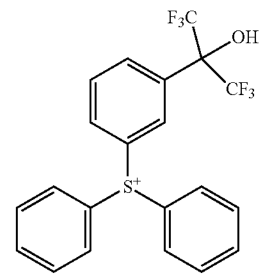
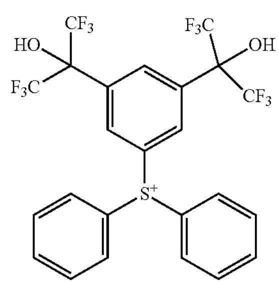
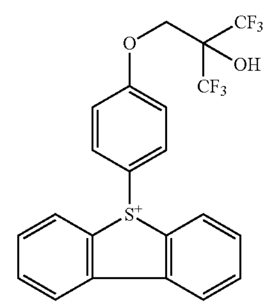
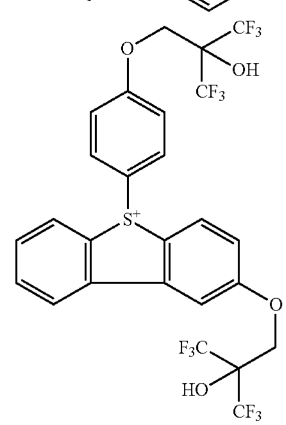
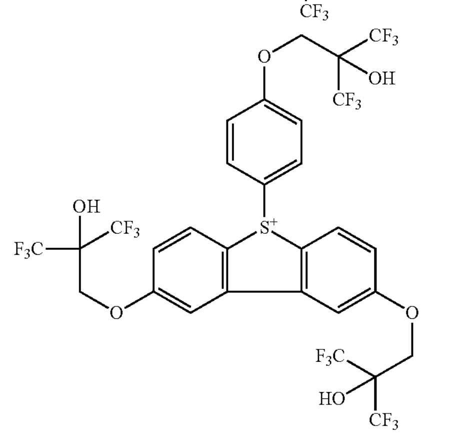

-continued
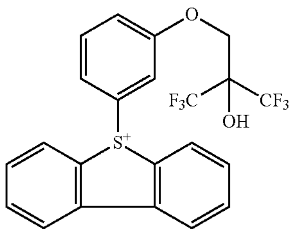
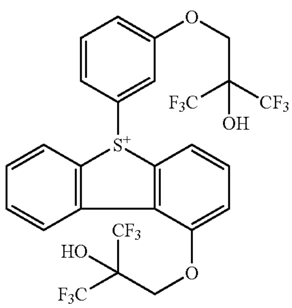
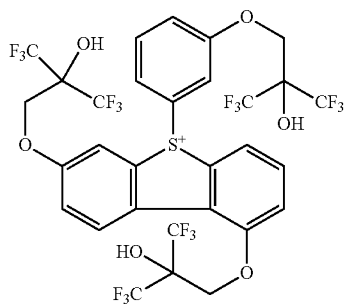
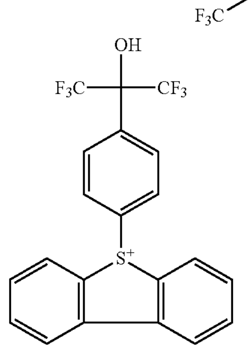
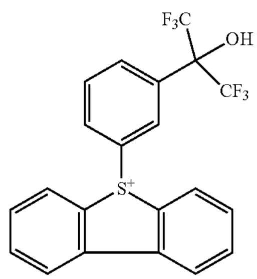
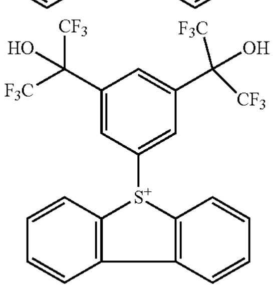
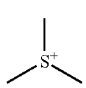
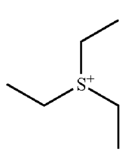
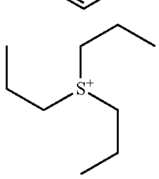
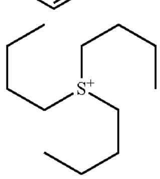
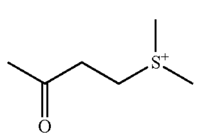
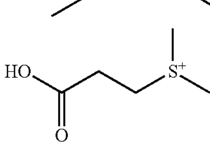
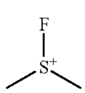
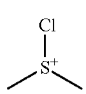
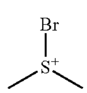
-continued
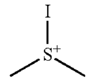
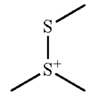
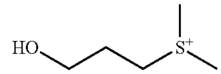
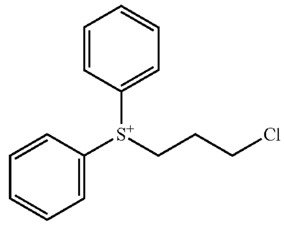
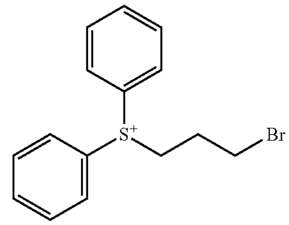
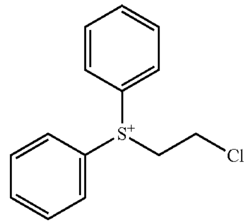
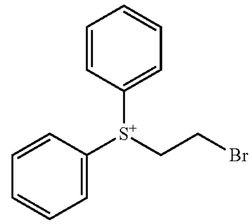
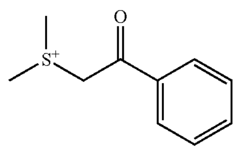
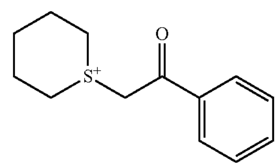
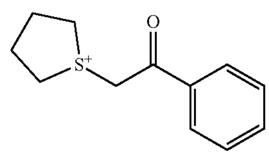
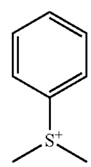
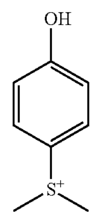
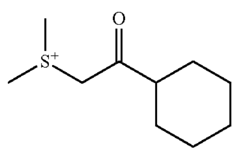
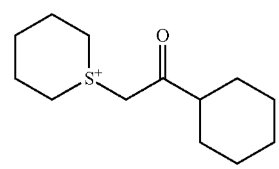
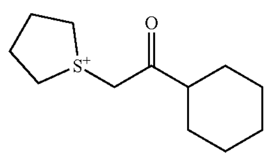
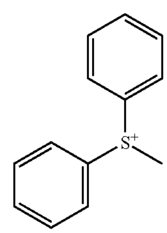
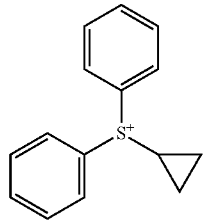
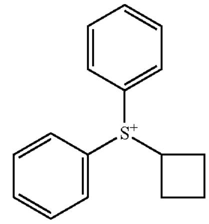

-continued
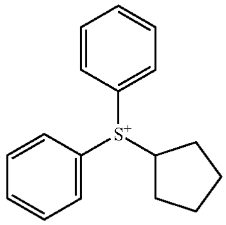
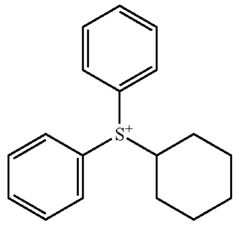
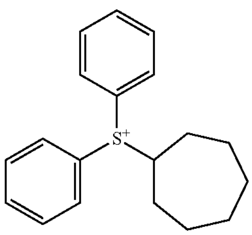
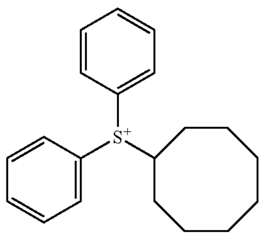
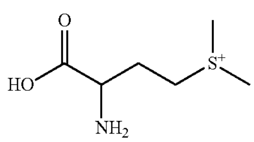
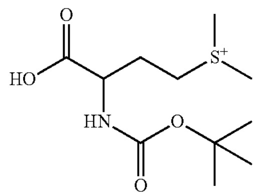
Examples of the cation in the iodonium salt having formula (1-2) are shown below, but not limited thereto.
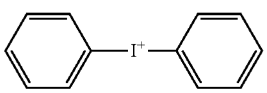
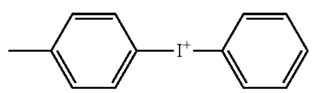
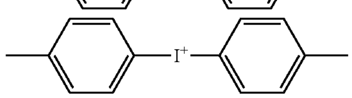
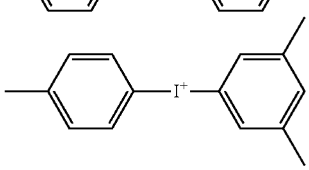
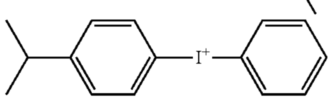
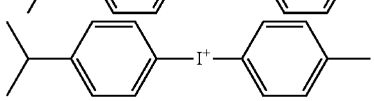
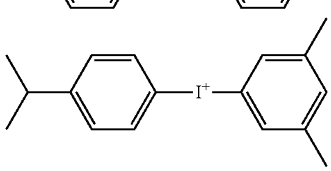
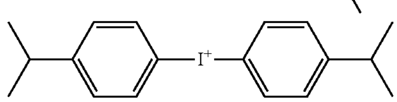
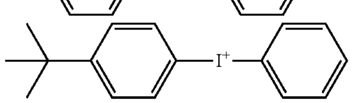
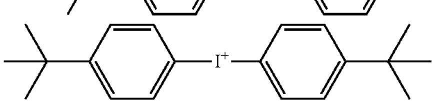
-continued
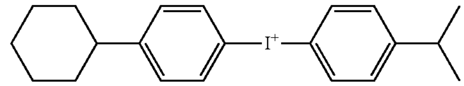
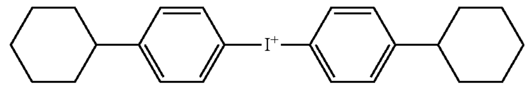
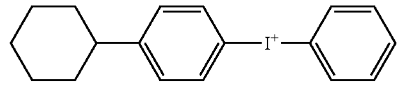
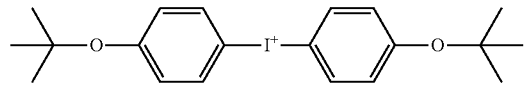
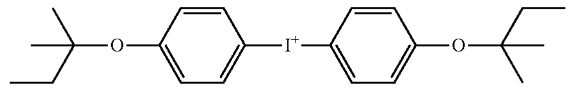
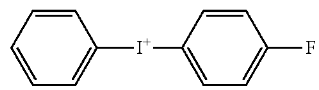
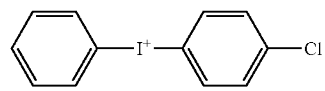
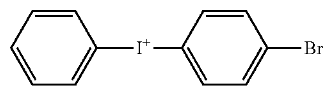
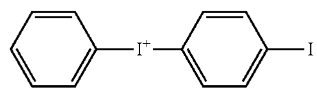
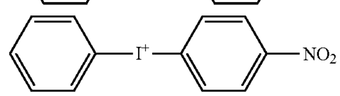
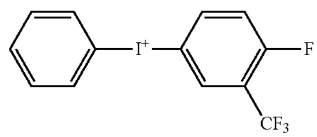
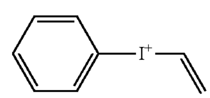
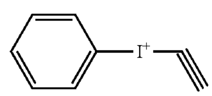
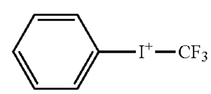
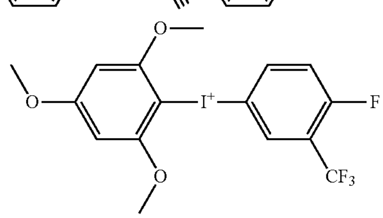
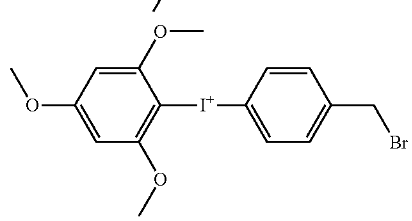
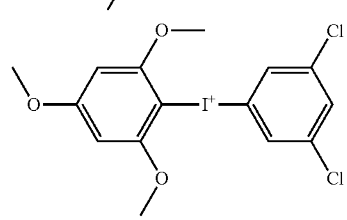

-continued

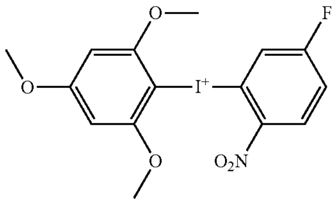

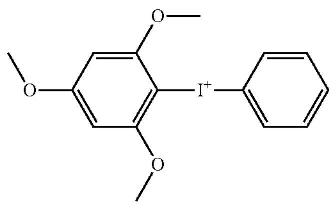

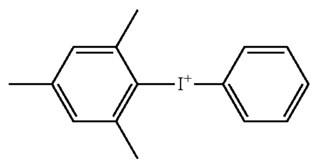

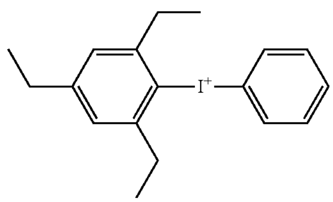

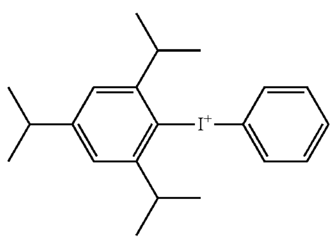

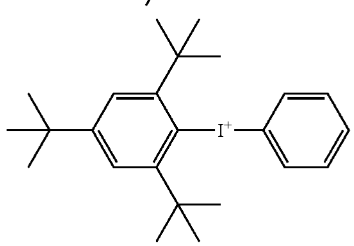

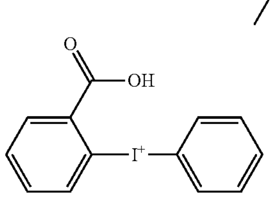

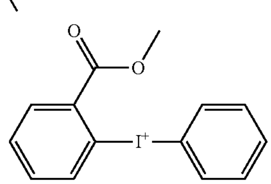

In formulae (1-1) and (1-2), $Xa^-$ is an anion of the following formula (1A), (1B), (1C) or (1D).

(1A)

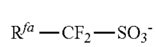

(1B)

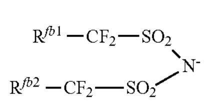

-continued (1C)

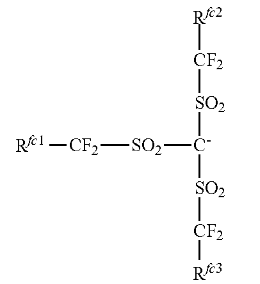

(1D)

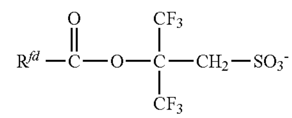

In formula (1A), $R^{fa}$ is fluorine or a $C_1$-$C_{40}$ hydrocarbyl group which may contain a heteroatom. The hydrocarbyl group may be saturated or unsaturated and straight, branched or cyclic. Examples thereof are as will be exemplified later for hydrocarbyl group $R^{111}$ in formula (1A').

Of the anions of formula (1A), a structure having formula (1A') is preferred.

(1A')

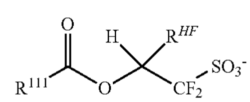

In formula (1A'), $R^{HF}$ is hydrogen or trifluoromethyl, preferably trifluoromethyl.

$R^{111}$ is a $C_1$-$C_{38}$ hydrocarbyl group which may contain a heteroatom. Suitable heteroatoms include oxygen, nitrogen, sulfur and halogen, with oxygen being preferred. Of the hydrocarbyl groups, those of 6 to 30 carbon atoms are preferred because a high resolution is available in fine pattern formation. The hydrocarbyl group $R^{111}$ may be saturated or unsaturated and straight, branched or cyclic. Suitable hydrocarbyl groups include $C_1$-$C_3$a alkyl groups such as methyl, ethyl, n-propyl, isopropyl, butyl, isobutyl, sec-butyl, tert-butyl, pentyl, neopentyl, hexyl, heptyl, 2-ethylhexyl, nonyl, undecyl, tridecyl, pentadecyl, heptadecyl, icosanyl; $C_3$-$C_{38}$ cyclic saturated hydrocarbyl groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, dicyclohexylmethyl; $C_2$-$C_{38}$ unsaturated aliphatic hydrocarbyl groups such as allyl and 3-cyclohexenyl; $C_5$-$C_{38}$ aryl groups such as phenyl, 1-naphthyl, 2-naphthyl; $C_7$-$C_{38}$ aralkyl groups such as benzyl and diphenylmethyl; and combinations thereof.

In these groups, some or all of the hydrogen atoms may be substituted by a moiety containing a heteroatom such as oxygen, sulfur, nitrogen or halogen, or some constituent —$CH_2$— may be replaced by a moiety containing a heteroatom such as oxygen, sulfur or nitrogen, so that the group may contain a hydroxy, fluorine, chlorine, bromine, iodine, cyano, nitro, carbonyl, ether bond, ester bond, sulfonic ester bond, carbonate bond lactone ring, sultone ring, carboxylic anhydride (—C(═O)—O—C(═O)—) or haloalkyl moiety. Examples of the heteroatom-containing hydrocarbyl group include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo−1-adamantyl, and 3-oxocyclohexyl.

With respect to the synthesis of the sulfonium salt having an anion of formula (1A'), reference is made to JP-A 2007-145797, JP-A 2008-106045, JP-A 2009-007327, and JP-A 2009-258695. Also useful are the sulfonium salts described in JP-A 2010-215608, JP-A 2012-041320. JP-A 2012-106986, and JP-A 2012-153644.

Examples of the anion having formula (1A) are as exemplified for the anion having formula (1A) in US 20180335696 (JP-A 2018-197853).

In formula (1B), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$ in formula (1A'). Preferably $R^{fb1}$ and $R^{fb2}$ each are fluorine or a straight $C_1$-$C_4$ fluorinated alkyl group. A pair of $R^{fb1}$ and $R^{fb2}$ may bond together to form a ring with the linkage (—$CF_2$—$SO_2$—$N^-$—$SO_2$—$CF_2$—) to which they are attached, and the ring-forming pair is preferably a fluorinated ethylene or fluorinated propylene group.

In formula (1C), $R^{fc1}$, $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$ in formula (1A'). Preferably $R^{fc1}$, $R^{fc2}$ and $R^{fc3}$ each are fluorine or a straight $C_1$-$C_4$ fluorinated alkyl group. A pair of $R^{fc1}$ and $R^{fc2}$ may bond together to form a ring with the linkage (—$CF_2$—$SO_2$—$C^-$—$SO_2$—$CF_2$—) to which they are attached, and the ring-forming pair is preferably a fluorinated ethylene or fluorinated propylene group.

In formula (1D), $R^{fd}$ is a $C_1$-$C_{40}$ hydrocarbyl group which may contain a heteroatom. The hydrocarbyl group may be saturated or unsaturated and straight, branched or cyclic. Suitable hydrocarbyl groups are as exemplified above for $R^{111}$.

With respect to the synthesis of the sulfonium salt having an anion of formula (1D), reference is made to JP-A 2010-215608 and JP-A 2014-133723.

Examples of the anion having formula (1D) are as exemplified for the anion having formula (1D) in US 20180335696 (JP-A 2018-197853).

The compound having the anion of formula (1D) has a sufficient acid strength to cleave acid labile groups in the base polymer because it is free of fluorine at α-position of sulfo group, but has two trifluoromethyl groups at I3-position. Thus the compound is a useful PAG.

Also compounds having the formula (2) are useful as the PAG.

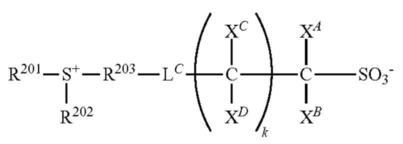

(2)

In formula (2), $R^{201}$ and $R^{202}$ are each independently halogen or a $C_1$-$C_{30}$ hydrocarbyl group which may contain a heteroatom. R is a $C_1$-$C_{30}$ hydrocarbylene group which may contain a heteroatom. A pair of $R^{201}$ and $R^{202}$, or $R^{201}$ and $R^{203}$ may bond together to form a ring with the sulfur atom to which they are attached. Exemplary rings are the same as described above for the ring that $R^{101}$ and $R^{102}$ in formula (1-1), taken together, form with the sulfur atom to which they are attached.

The hydrocarbyl groups $R^{201}$ and $R^{202}$ may be saturated or unsaturated and straight, branched or cyclic. Examples thereof include $C_1$-$C_{30}$ alkyl groups such as methyl, ethyl, n-propyl, isopropyl, n-butyl, isobutyl, sec-butyl, tert-butyl, n-pentyl, tert-pentyl, n-hexyl, n-octyl, 2-ethylhexyl, n-nonyl, and n-decyl; $C_3$-$C_{30}$ cyclic saturated hydrocarbyl groups such as cyclopentyl, cyclohexyl, cyclopentylmethyl, cyclopentylethyl, cyclopentylbutyl, cyclohexylmethyl, cyclohex ylethyl, cyclohexylbutyl, norbornyl, tricyclo[5.2.1.$0^{2,6}$]decanyl, and adamantyl; $C_6$-$C_{30}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, tert-butylnaphthyl, and anthracenyl; and combinations thereof. In these groups, some or all of the hydrogen atoms may be substituted by a moiety containing a heteroatom such as oxygen, sulfur, nitrogen or halogen, or some constituent —$CH_2$— may be replaced by a moiety containing a heteroatom such as oxygen, sulfur or nitrogen, so that the group may contain a hydroxy, fluorine, chlorine, bromine, iodine, cyano, nitro, carbonyl, ether bond, ester bond, sulfonic ester bond, carbonate bond, lactone ring, sultone ring, carboxylic anhydride (—C(═O)—O—C(O)—) or haloalkyl moiety.

The hydrocarbylene group $R^{203}$ may be saturated or unsaturated and straight, branched or cyclic. Examples thereof include $C_1$-$C_{30}$ alkanediyl groups such as methanediyl, ethane-1,1-diyl, ethane-1,2-diyl, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; $C_3$-$C_{30}$ cyclic saturated hydrocarbylene groups such as cyclopentanediyl, cyclohexanediyl, norbornanediyl and adamantanediyl: $C_6$-$C_{30}$ arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene and tert-butylnaphthylene: and combinations thereof. In these gimps, some or all of the hydrogen atoms may be substituted by a moiety containing a heteroatom such as oxygen, sulfur, nitrogen or halogen, or some constituent —$CH_2$— may be replaced by a moiety containing a heteroatom such as oxygen, sulfur or nitrogen, so that the group may contain a hydroxy, fluorine, chlorine, bromine, iodine, cyano, nitro, carbonyl, ether bond, ester bond, sulfonic ester bond, carbonate bond, lactone ring, sultone ring, carboxylic anhydride (—C(═O)—O—C(═O)—) or haloalkyl moiety. Of the heteroatoms, oxygen is preferred.

In formula (2), $L^C$ is a single bond, ether bond or a $C_1$-$C_{20}$ hydrocarbylene group which may contain a heteroatom. The hydrocarbylene group may be saturated or unsaturated and straight, branched or cyclic. Examples thereof are as exemplified above for $R^{203}$.

In formula (2), $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl.

In formula (2), k is an integer of 0 to 3.

Of the PAGs having formula (2), those having formula (2') are preferred (2')

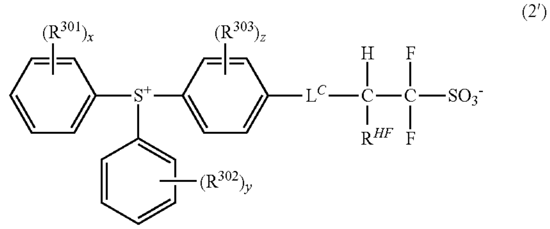

In formula (2'), $L^C$ is as defined above. $R^{HF}$ is hydrogen or trifluoromethyl, preferably trifluoromethyl. $R^{301}$, $R^{302}$ and $R^{303}$ are each independently hydrogen or a $C_1$-$C_{20}$ hydrocarbyl group which may contain a heteroatom. The hydrocarbyl group may be saturated or unsaturated and straight, branched or cyclic. Examples thereof are as exemplified above for $R^{111}$ in formula (1A'). The subscripts x and y are each independently an integer of 0 to 5, and z is an integer of 0 to 4.

Examples of the PAG having formula (2) are as exemplified for the PAG having formula (2) in JP-A 2017-026980.

Of the foregoing PAGs, those having an anion of formula (1A') or (1D) are especially preferred because of reduced acid diffusion and high solubility in the solvent. Also those having formula (2') are especially preferred because of extremely reduced acid diffusion.

Also a sulfonium or iodonium salt having an anion containing an iodized or brominated aromatic ring may be used as the PAG. Suitable are sulfonium and iodonium salts having the formulae (3-1) and (3-2).

(3-1)

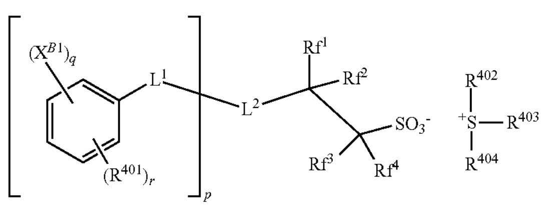

(3-2)

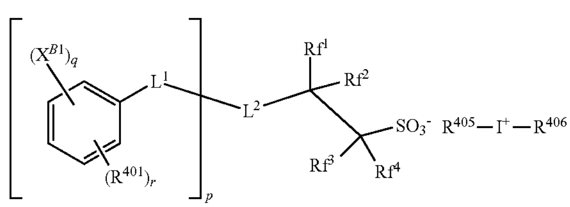

In formulae (3-1) and (3-2), p is an integer of 1 to 3, q is an integer of 1 to 5, and r is an integer of 0 to 3, and $1 \le q+r \le 5$. Preferably, q is 1, 2 or 3, more preferably 2 or 3, and r is 0, 1 or 2.

In formulae (3-1) and (3-2). $X^{BI}$ is iodine or bromine, and may be the same or different when p and/or q is 2 or more.

$L^1$ is a single bond, ether bond, ester bond, or a $C_1$-$C_6$ saturated hydrocarbylene group which may contain an ether bond or ester bond. The saturated hydrocarbylene group may be straight, branched or cyclic.

$L^2$ is a single bond or a $C_1$-$C_{20}$ divalent linking group when p is 1, and a $C_1$-$C_{20}$ (p+1)-valent linking group which may contain oxygen, sulfur or nitrogen when p is 2 or 3.

$R^{401}$ is a hydroxy group, carboxy group, fluorine, chlorine, bromine, amino group, or a $C_1$-$C_{219}$ hydrocarbyl, $C_1$-$C_{20}$ hydrocarbyloxy, $C_2$-$C_{20}$ hydrocarbylcarbonyl, $C_2$-$C_{20}$ hydrocarbyloxycarbonyl, $C_2$-$C_{20}$ hydrocarbylcarbonyloxy or $C_1$-$C_{20}$ hydrocarbylsulfonyloxy group, which may contain fluorine, chlorine, bromine, hydroxy, amino or ether bond, or —N($R^{401A}$)($R^{401B}$), —N($R^{401C}$)—C(═O)$R^{401D}$ or —N($R^{401C}$)—C(═O)—O—$R^{401D}$. $R^{401A}$ and $R^{401B}$ are each independently hydrogen or a $C_1$-$C_6$ saturated hydrocarbyl group. $R^{401C}$ is hydrogen or a $C_1$-$C_6$ saturated hydrocarbyl group which may contain halogen, hydroxy, $C_1$-$C_6$ saturated hydrocarbyloxy. $C_2$-$C_6$ saturated hydrocarbylcarbonyl or $C_2$-$C_6$ saturated hydrocarbylcarbonyloxy moiety. $R^{401D}$ is a $C_1$-$C_{16}$ aliphatic hydrocarbyl group, $C_6$-$C_{14}$ aryl group or $C_7$-$C_{15}$ aralkyl group, which may contain halogen, hydroxy, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. The aliphatic hydrocarbyl group may be saturated or unsaturated and straight, branched or cyclic. The saturated hydrocarbyl, saturated hydrocarbyloxy, saturated hydrocarbyloxycarbonyl, saturated hydrocarbylcarbonyl, and saturated hydrocarbylcarbonyloxy groups may be straight, branched or cyclic. Groups $R^{401}$ may be the same or different when p and/or r is 2 or more. Of these, $R^{401}$ is preferably hydroxy, —N($R^{401C}$)—C(═O)—$R^{401D}$, N($R^{401C}$)—C(═O)—O—$R^{401D}$, fluorine, chlorine, bromine, methyl or methoxy.

In formulae (3-1) and (3-2), $Rf^1$ to $Rf^4$ are each independently hydrogen, fluorine or trifluoromethyl, at least one of RP to RP is fluorine or trifluoromethyl, or $Rf^1$ and $Rf^2$, taken together, may form a carbonyl group. Preferably, both $Rf^3$ and $Rf^4$ are fluorine.

$R^{402}$ to $R^{406}$ are each independently halogen or a $C_1$-$C_{20}$ hydrocarbyl group which may contain a heteroatom. The hydrocarbyl group may be saturated or unsaturated and straight, branched or cyclic. Examples thereof include those exemplified above for the hydrocarbyl groups $R^{101}$ to $R^{105}$ in formulae (1-1) and (1-2). In these groups, some or all of the hydrogen atoms may be substituted by hydroxy, carboxy, halogen, cyano, nitro, mercapto, sultone, sulfone, or sulfonium salt-containing moieties, and some constituent —$CH_2$— may be replaced by an ether bond, ester bond, carbonyl moiety, amide bond, carbonate bond or sulfonic ester bond. $R^{402}$ and $R^{403}$ may bond together to form a ring with the sulfur atom to which they are attached. Exemplary rings are the same as described above for the ring that $R^{101}$ and $R^{102}$ in formula (1-1), taken together, form with the sulfur atom to which they are attached.

Examples of the cation in the sulfonium salt having formula (3-1) include those exemplified above as the cation in the sulfonium salt having formula (1-1). Examples of the cation in the iodonium salt having formula (3-2) include those exemplified above as the cation in the iodonium salt having formula (1-2).

Examples of the anion in the onium salts having formulae (3-1) and (3-2) are shown below, but not limited thereto. Herein $X^{BI}$ is as defined above.

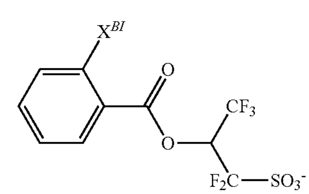

-continued
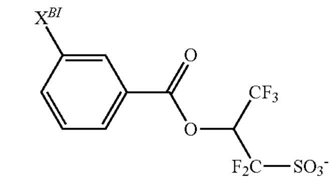
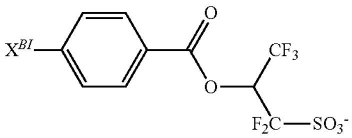
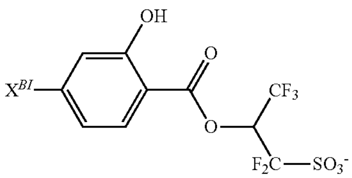
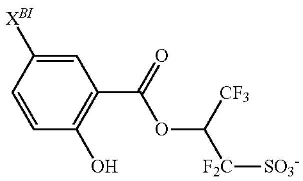
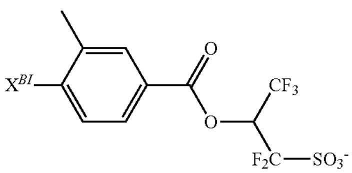
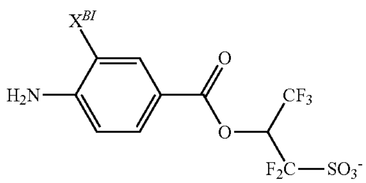
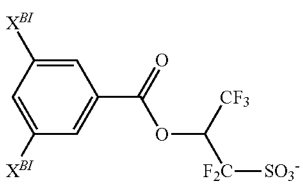
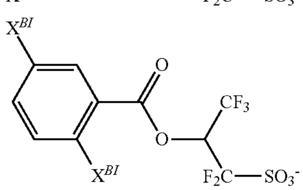
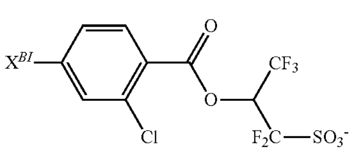
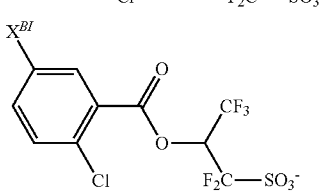
-continued
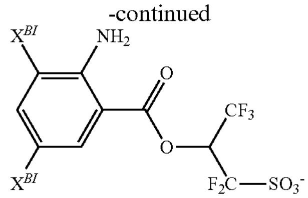
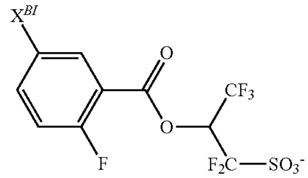
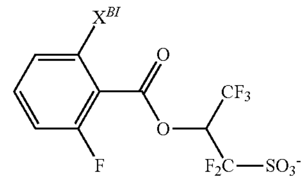
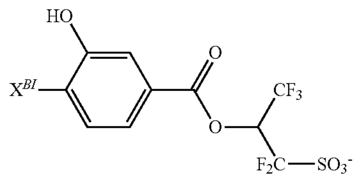
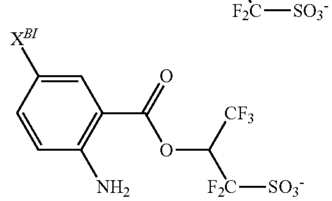
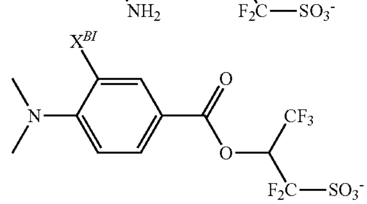
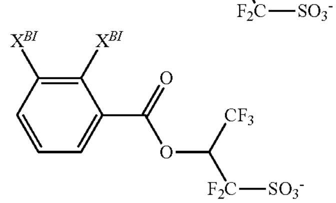
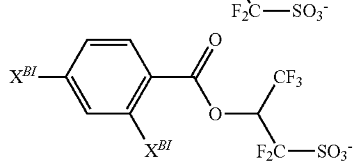
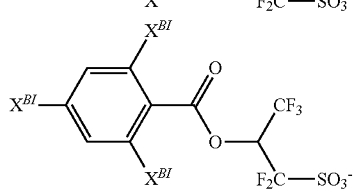
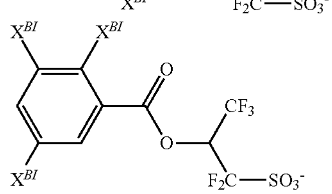

-continued
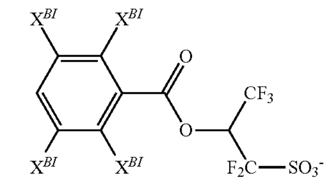
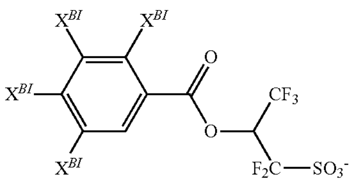
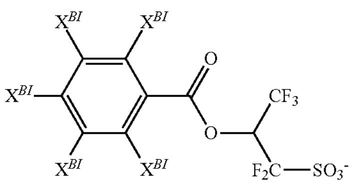
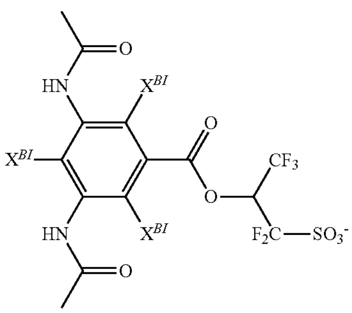
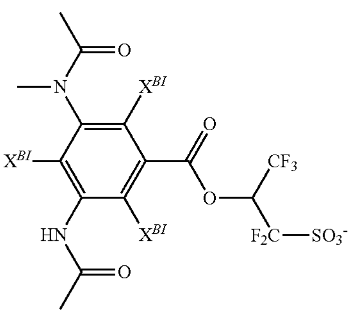
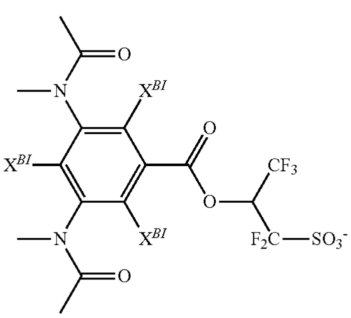
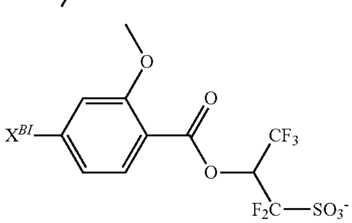
-continued
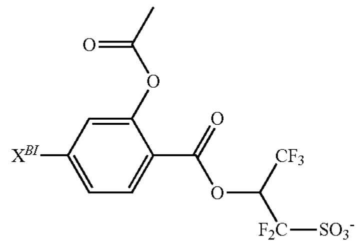
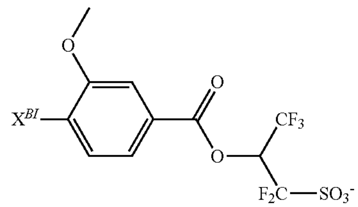
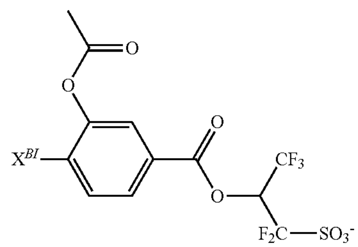
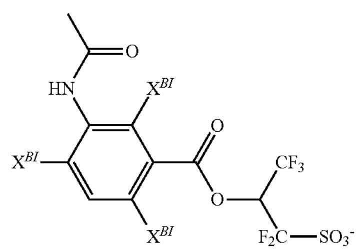
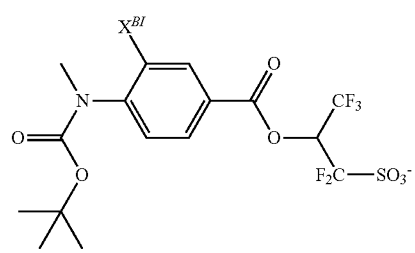
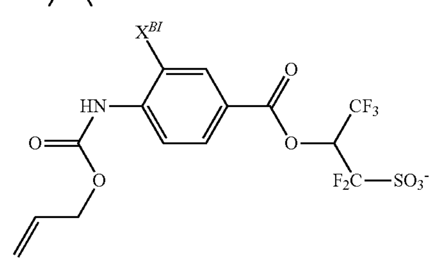
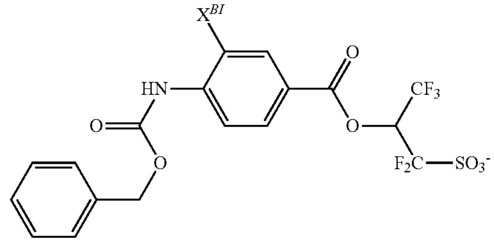

-continued
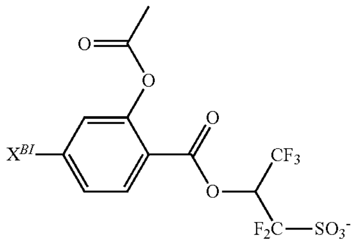
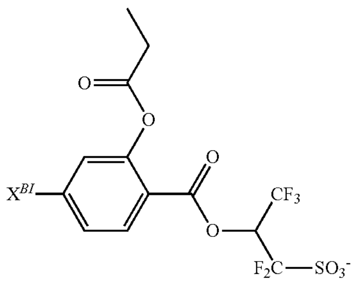
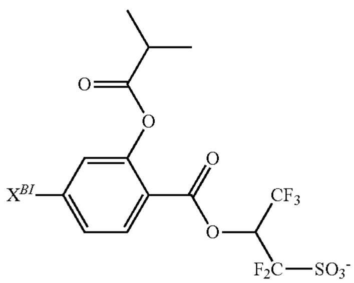
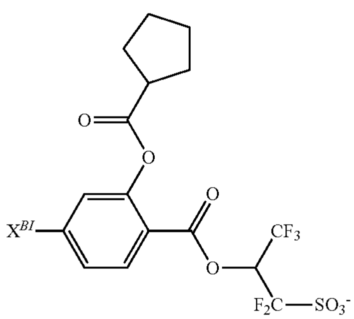
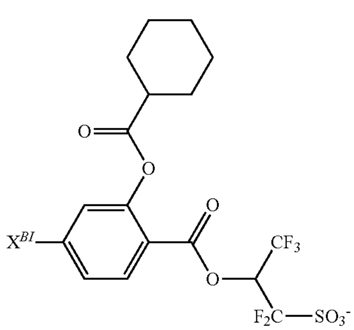
-continued
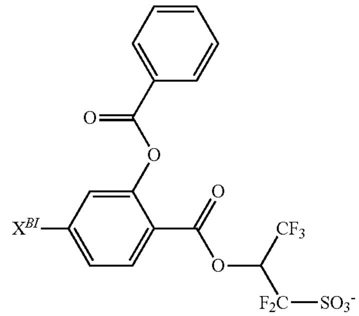
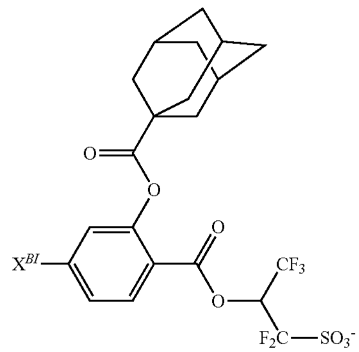
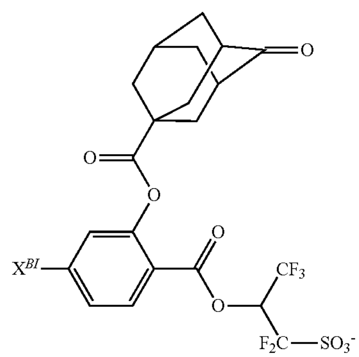
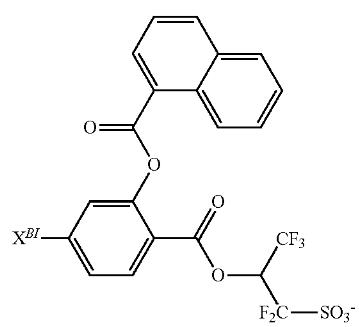
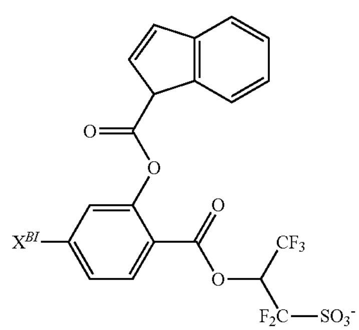

-continued
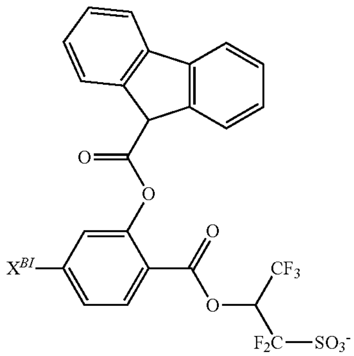
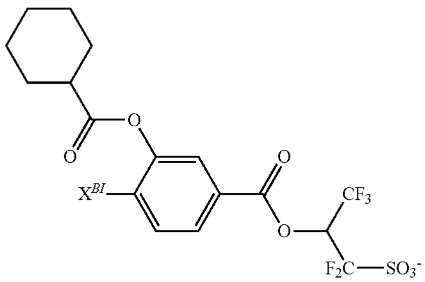
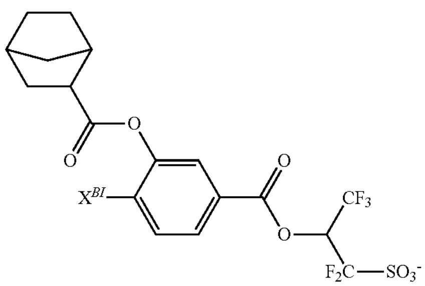
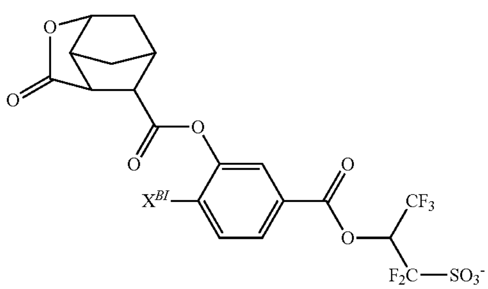
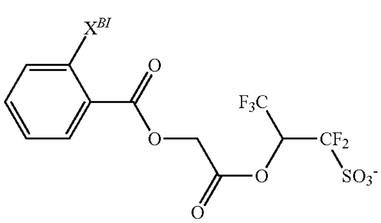
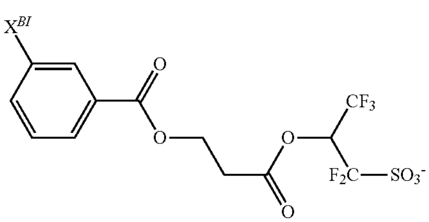
-continued
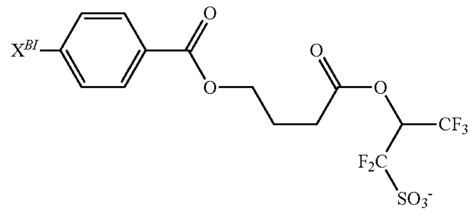
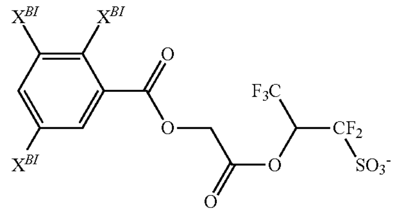
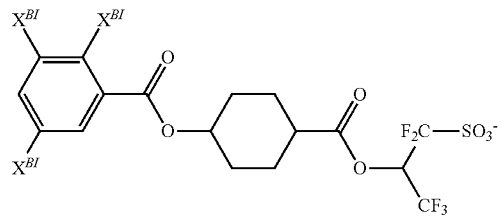
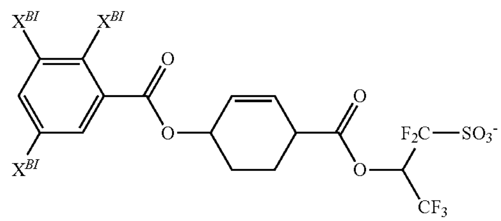
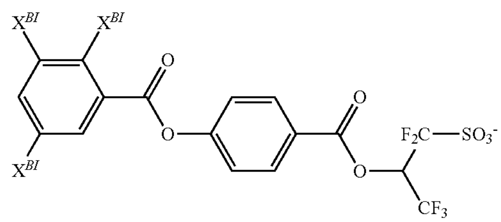
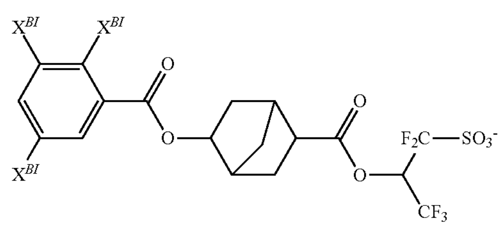
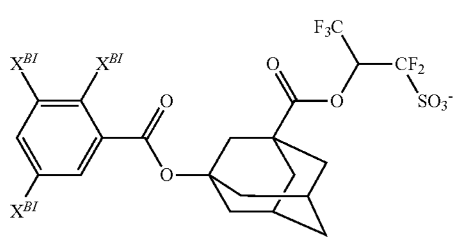

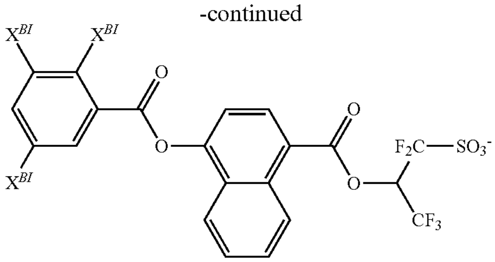
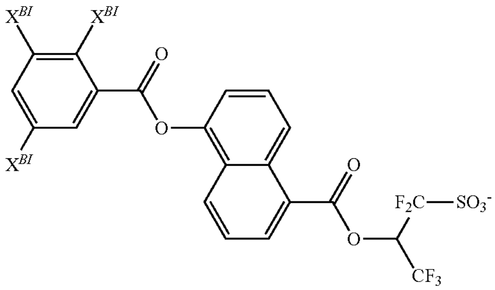
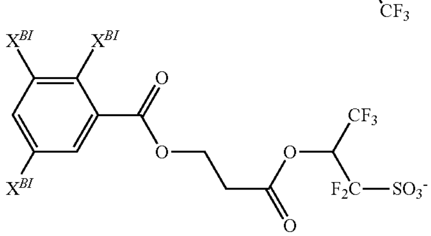
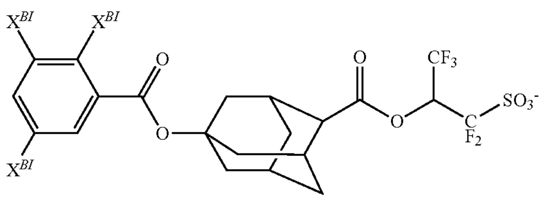
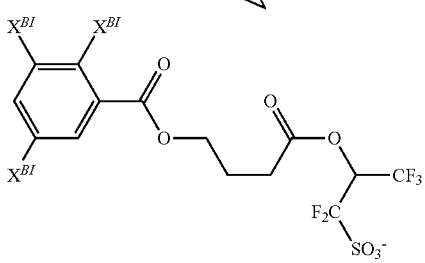
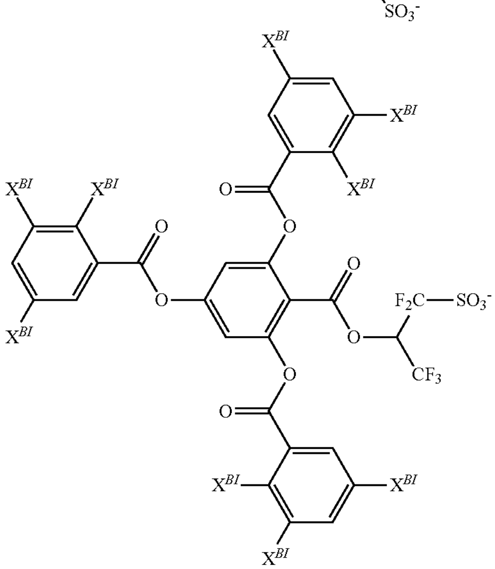
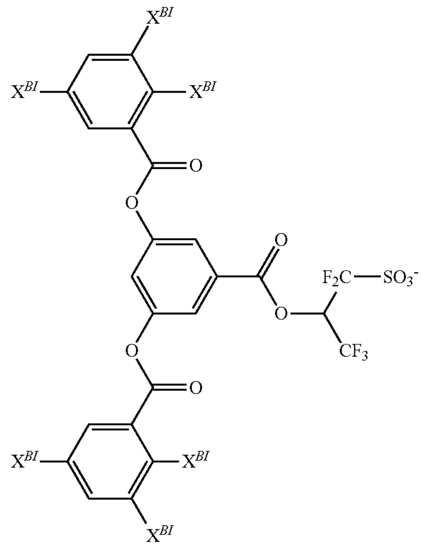
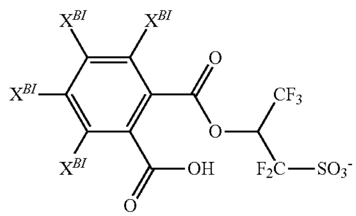
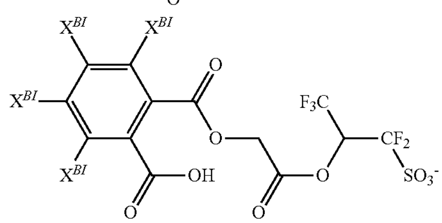
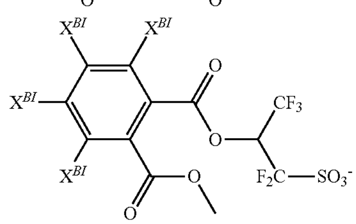
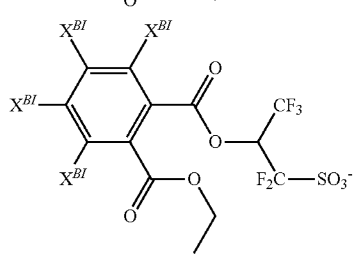
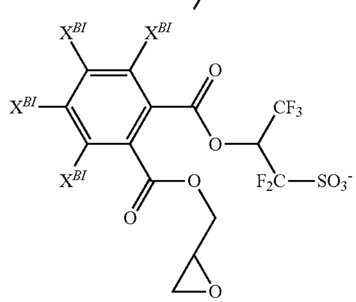

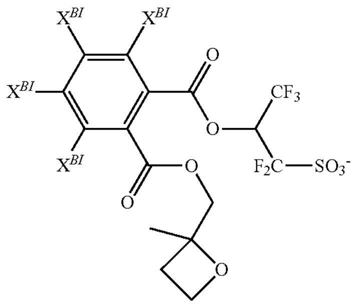
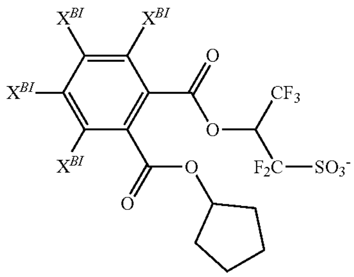
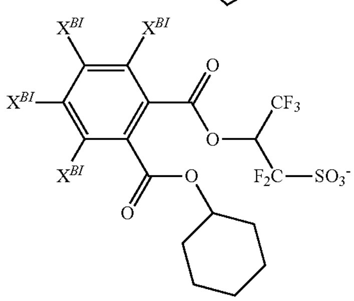
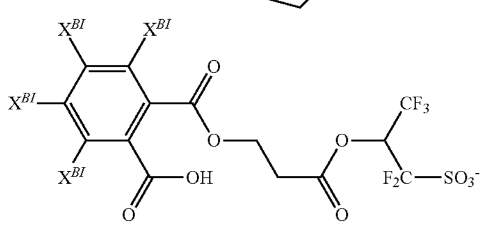
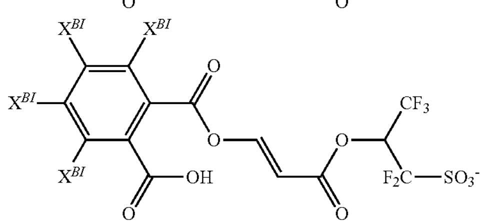
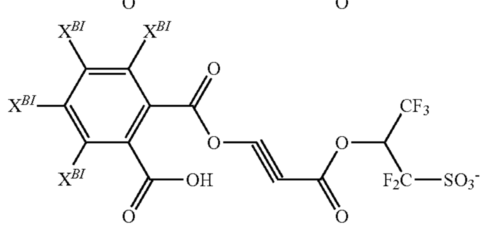
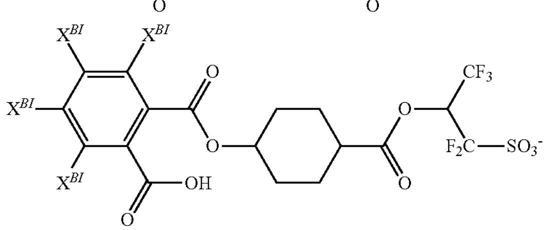
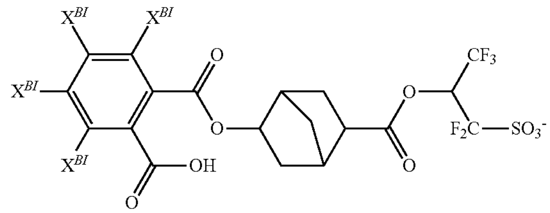
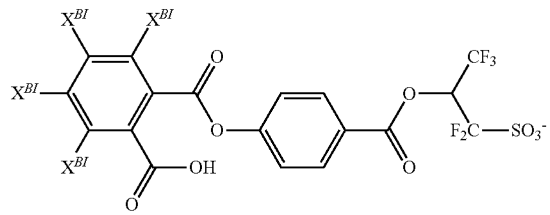
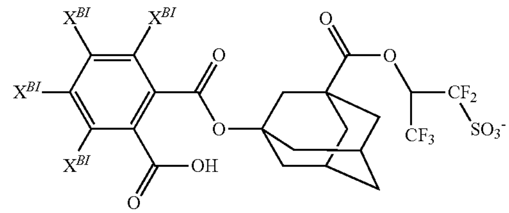
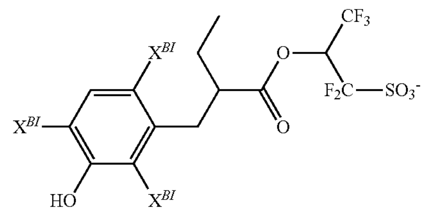
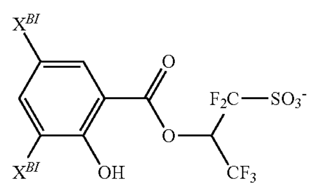
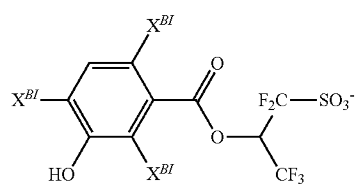
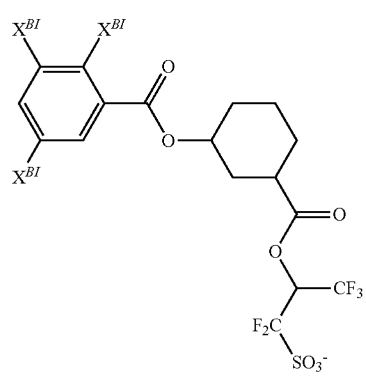

-continued
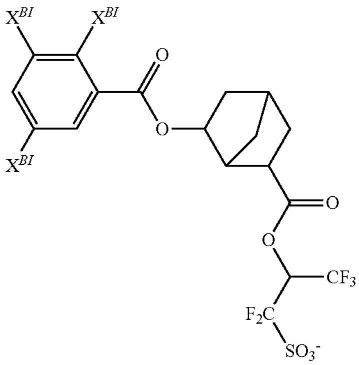
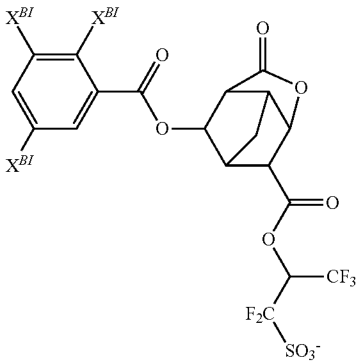
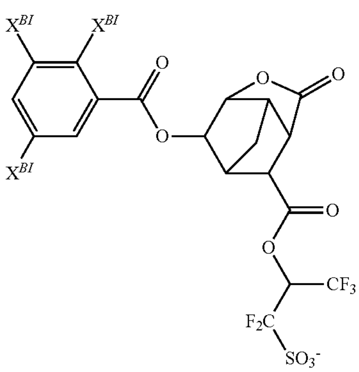
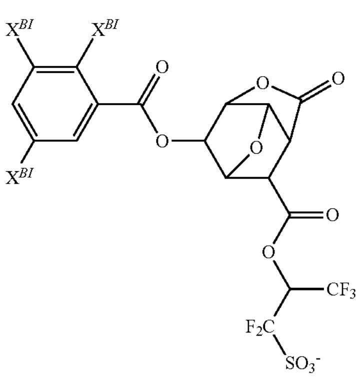
-continued
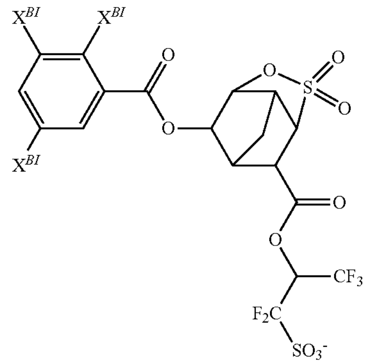
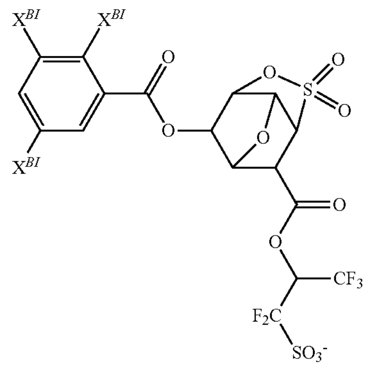
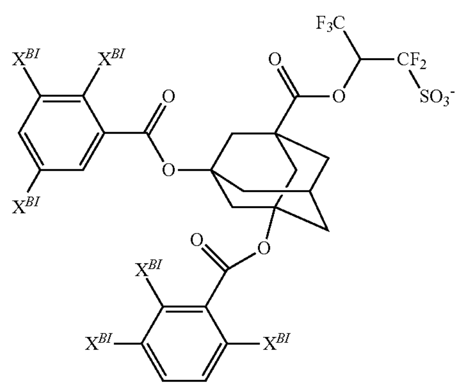
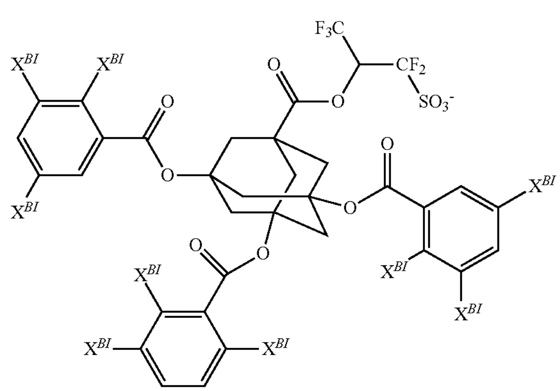

-continued
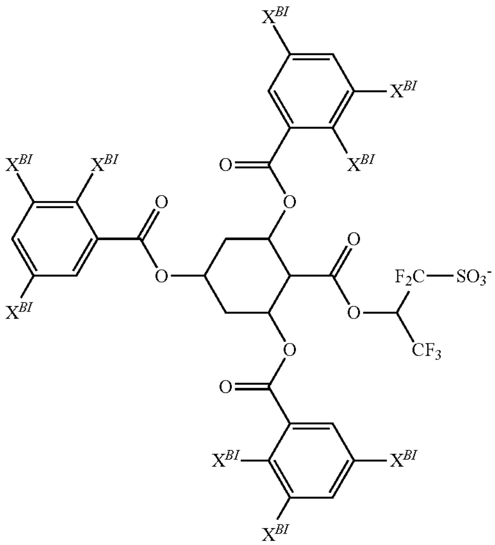
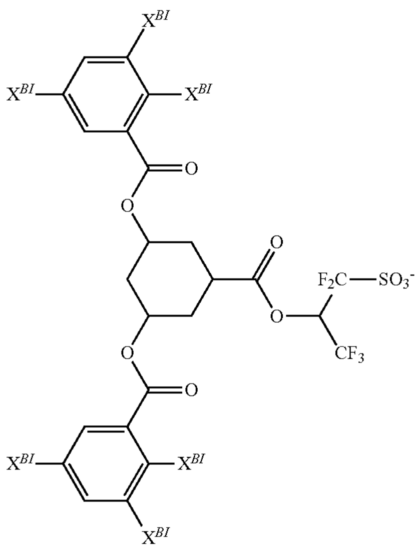
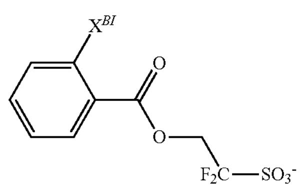
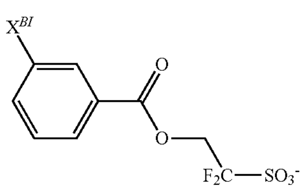
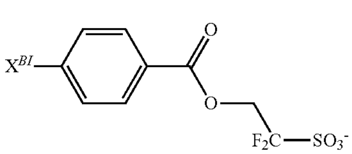
-continued
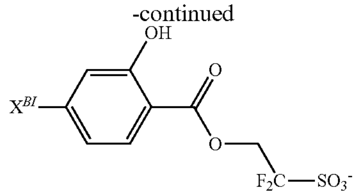
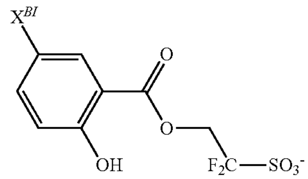
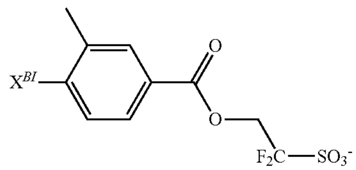
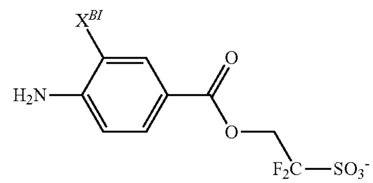
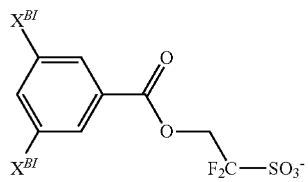
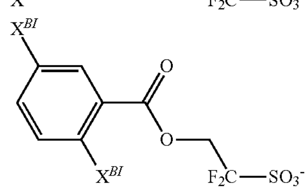
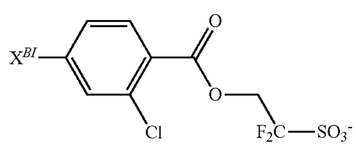
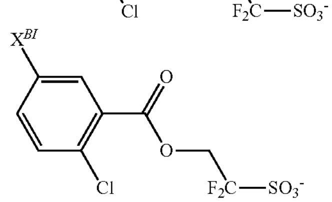
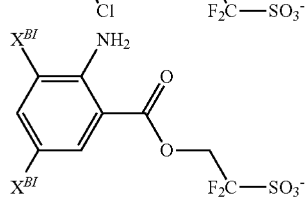
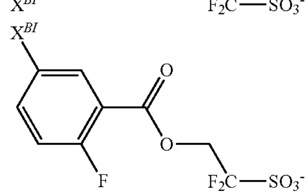

-continued
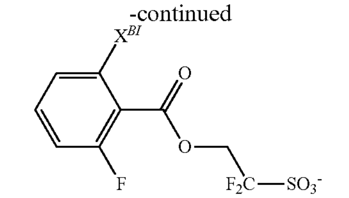
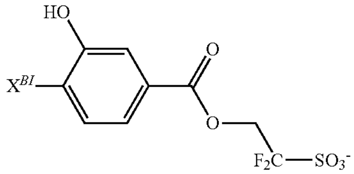
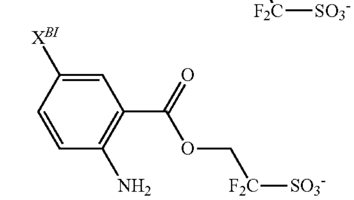
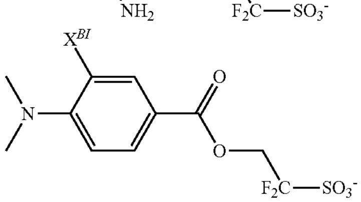
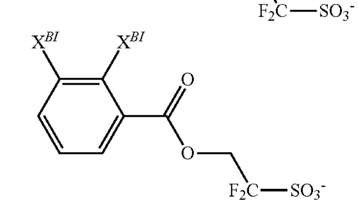
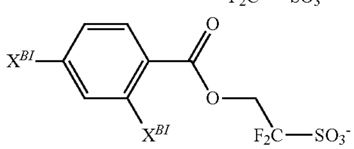
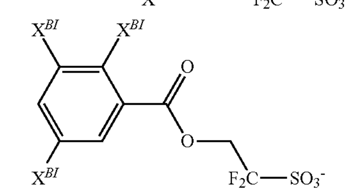
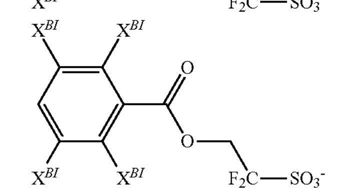
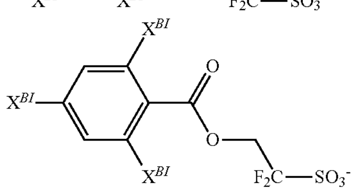
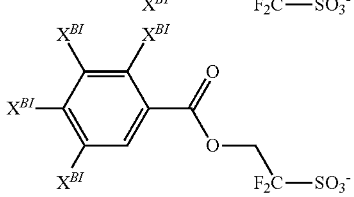
-continued
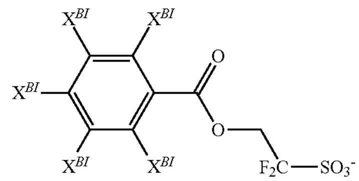
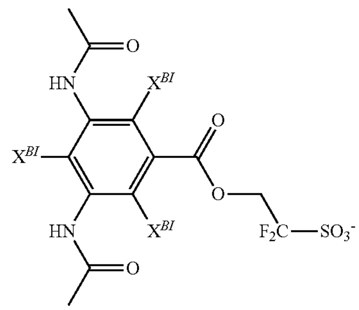
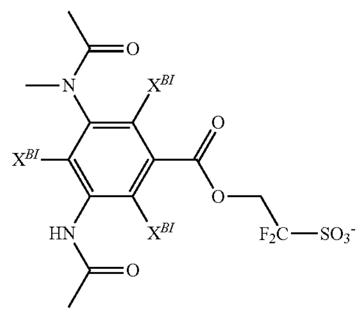
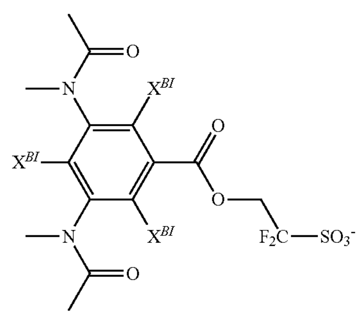
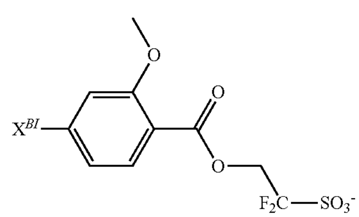
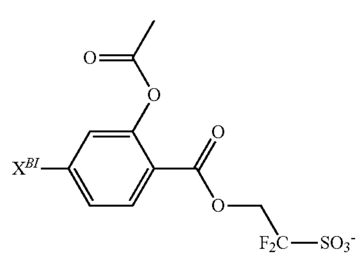

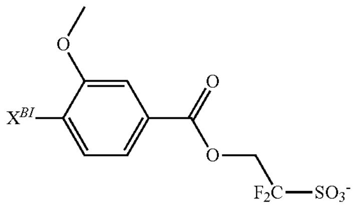
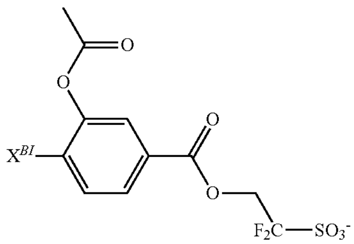
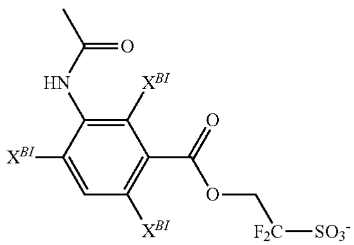
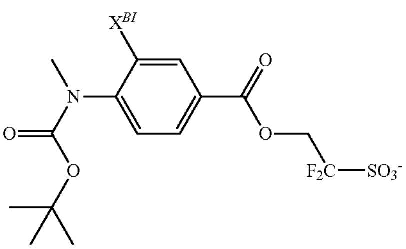
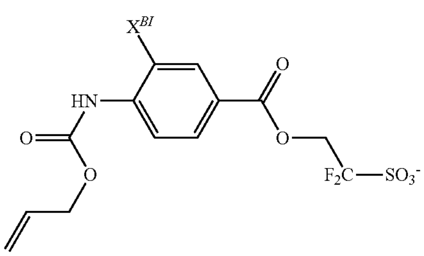
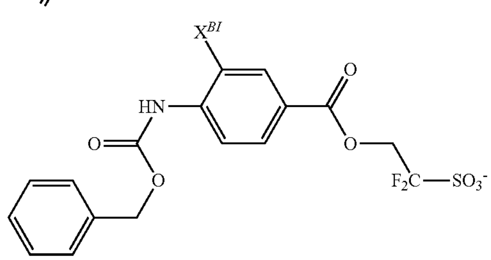
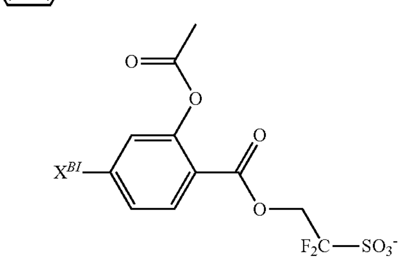
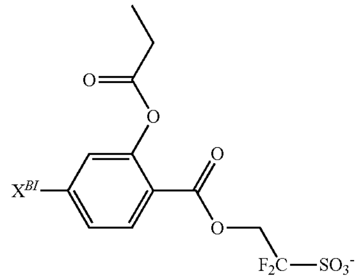
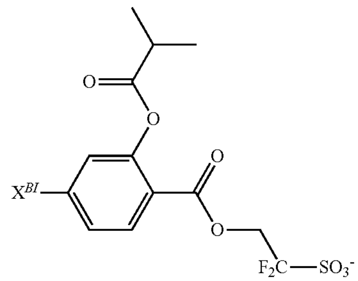
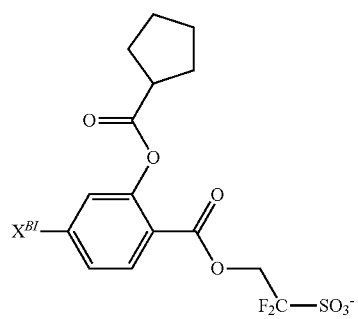
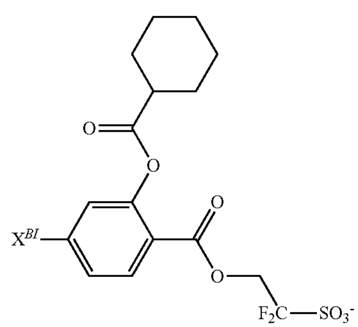
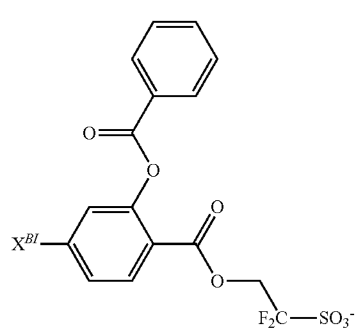

-continued
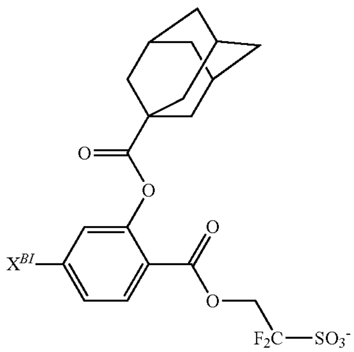
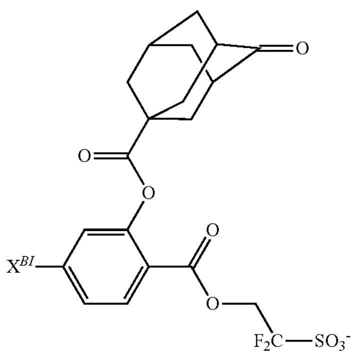
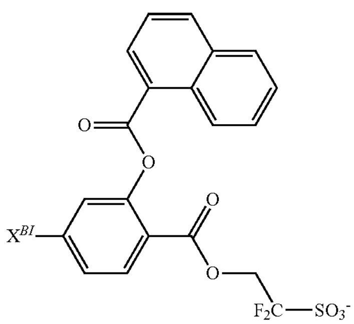
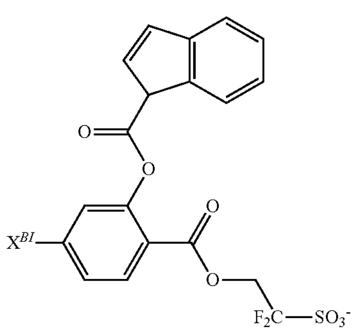
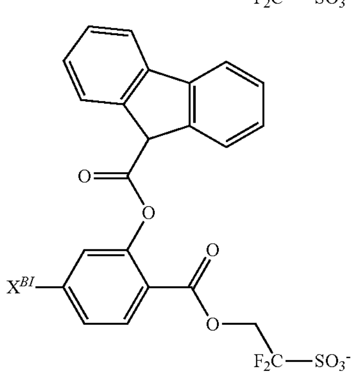
-continued
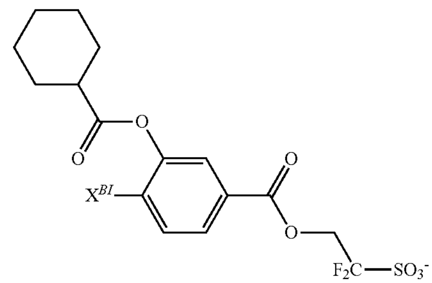
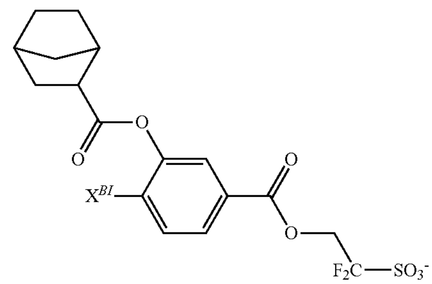
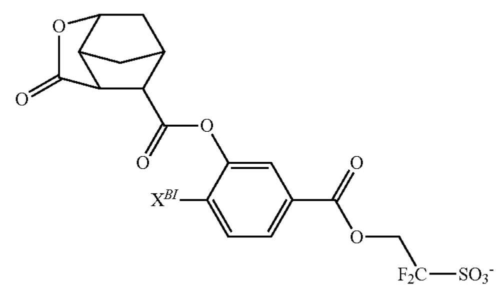
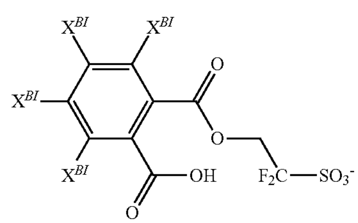
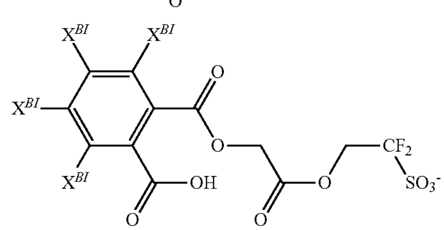
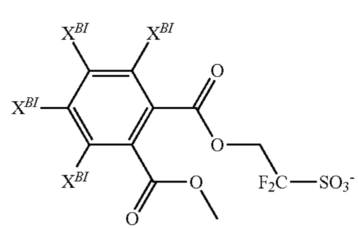

-continued
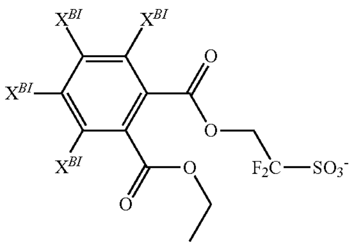
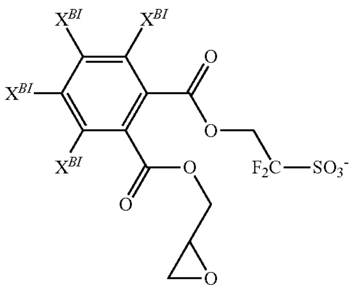
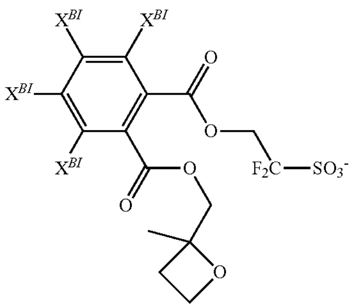
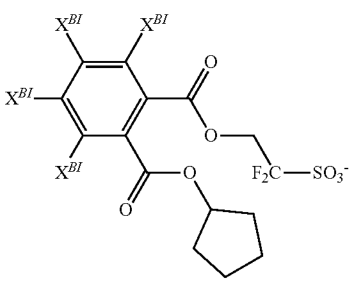
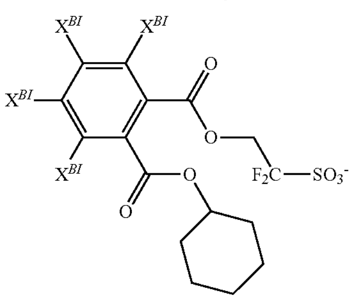
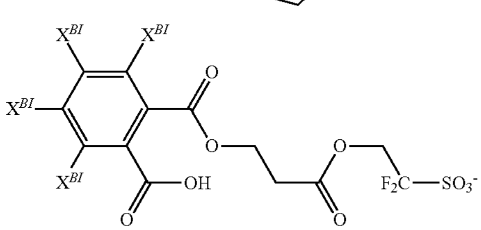
-continued
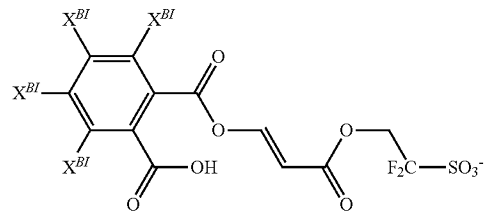
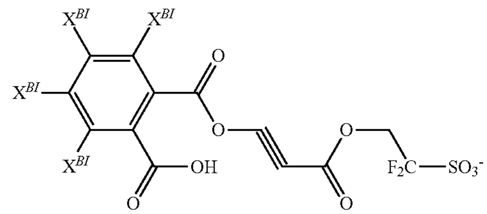
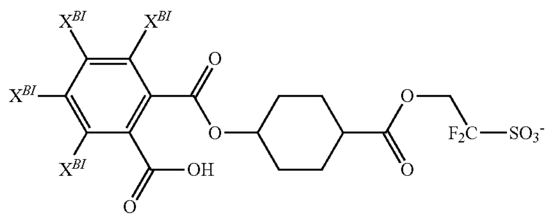
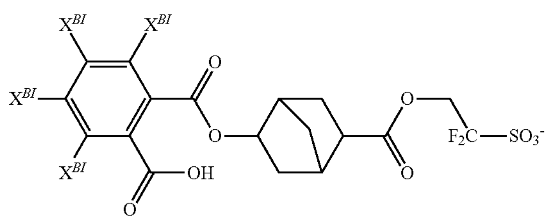
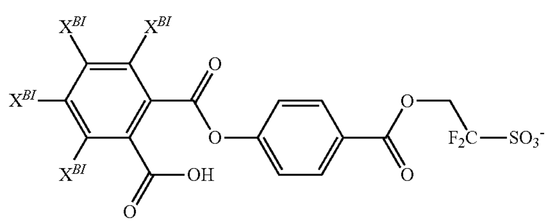
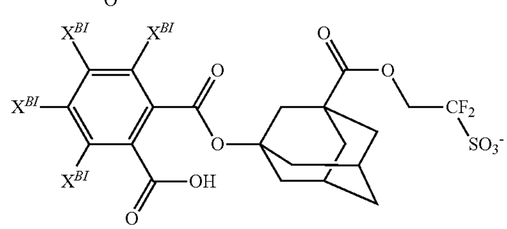
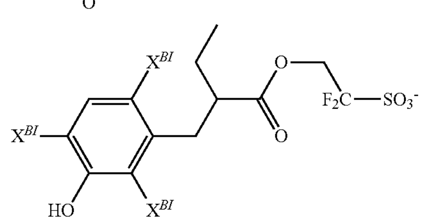
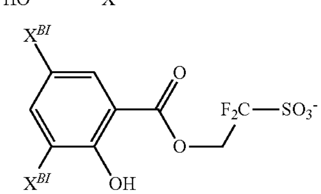

-continued
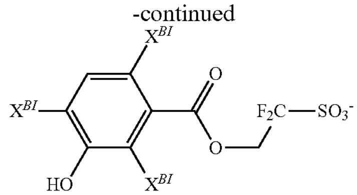
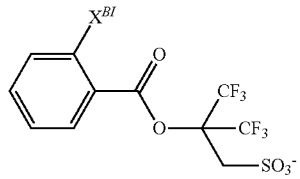
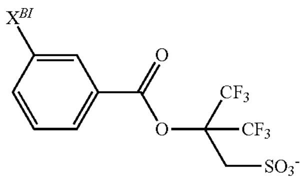
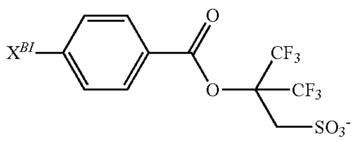
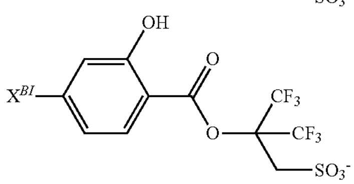
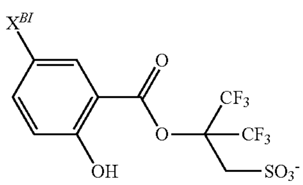
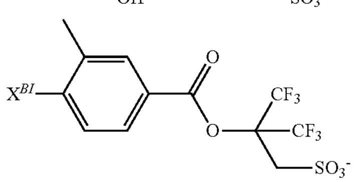
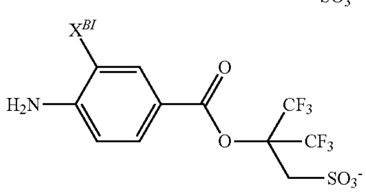
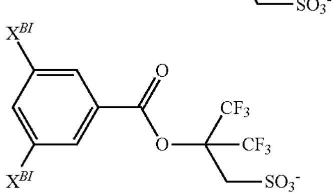
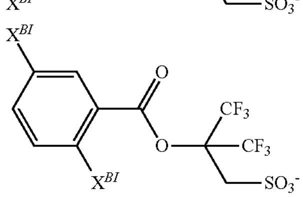
-continued
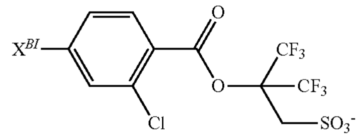
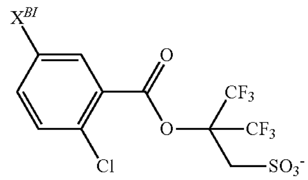
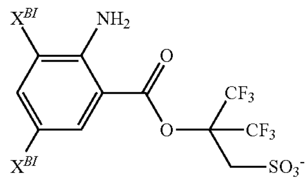
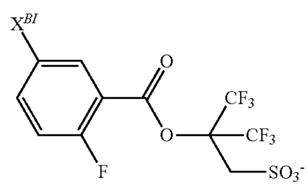
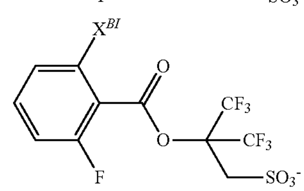
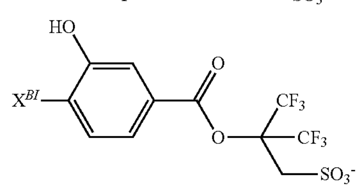
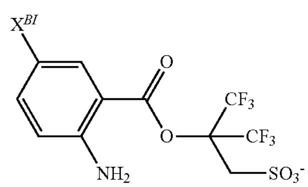
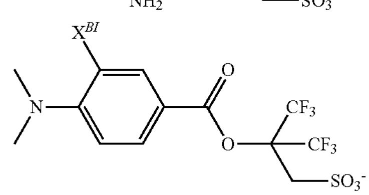
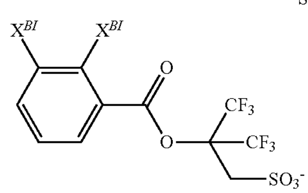
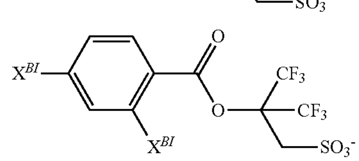

-continued
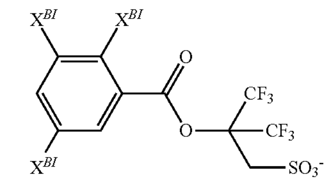
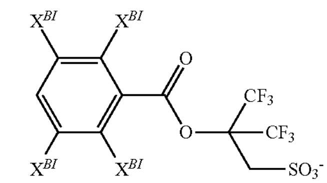
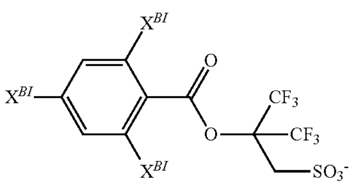
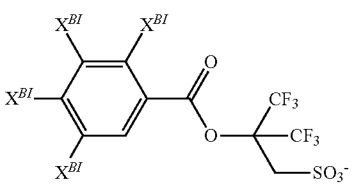
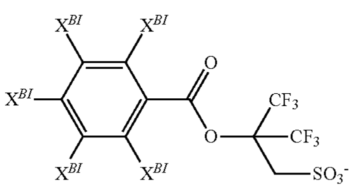
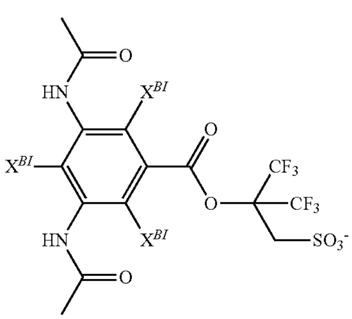
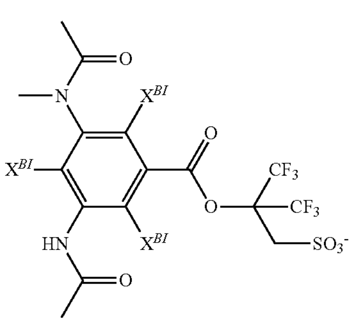
-continued
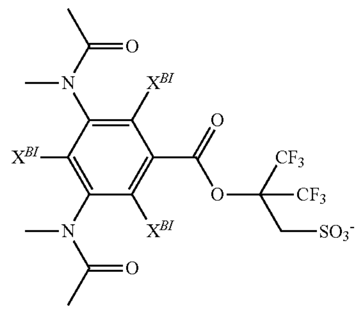
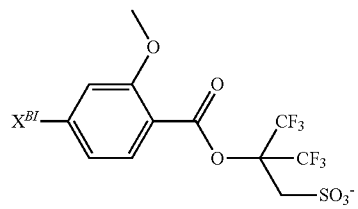
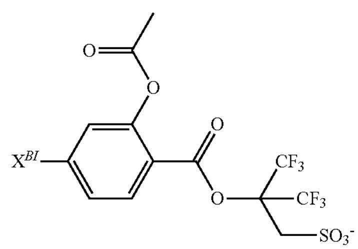
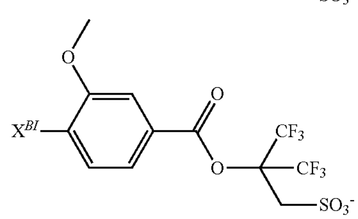
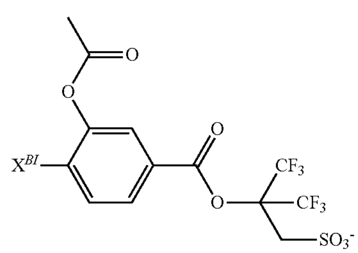
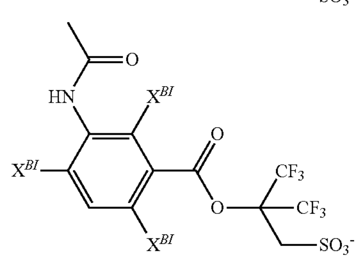
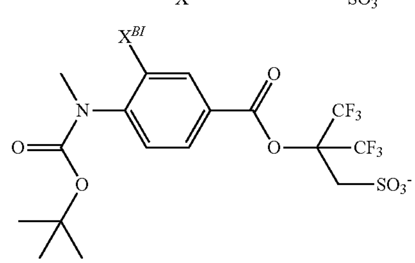

-continued
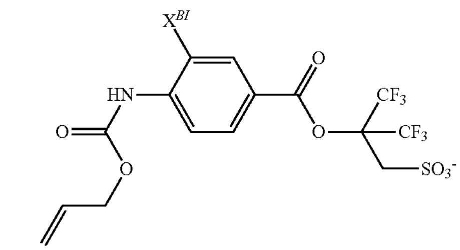
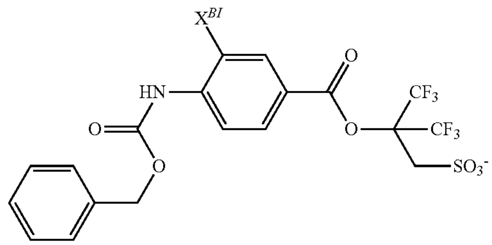
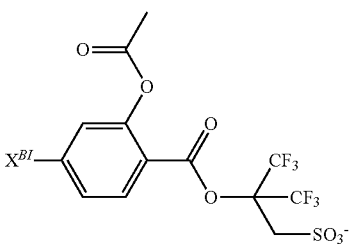
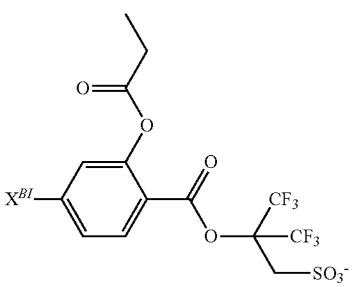
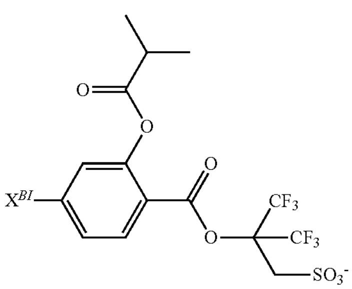
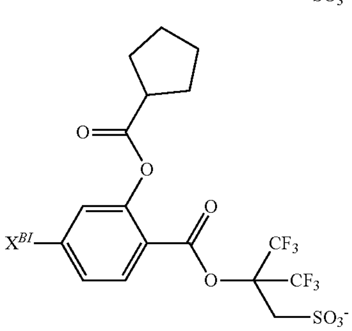
-continued
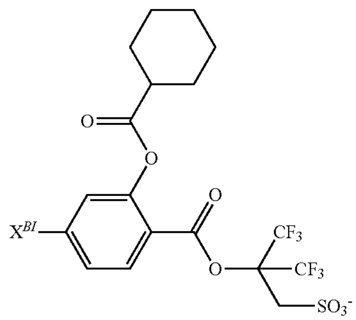
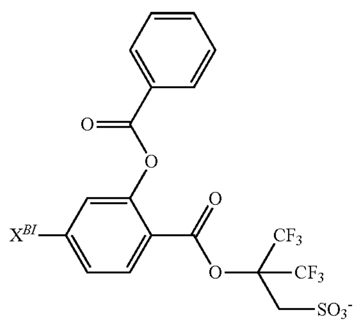
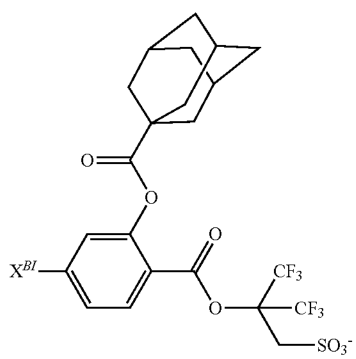
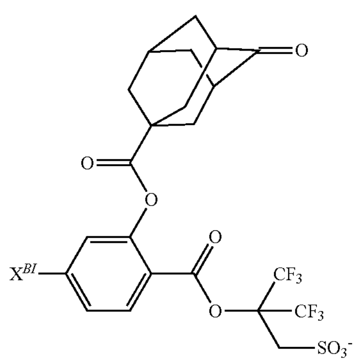
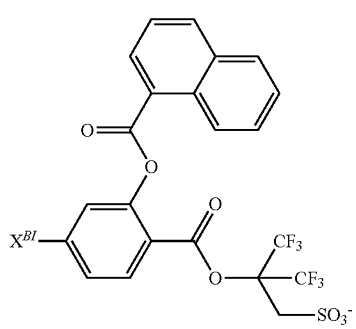

-continued
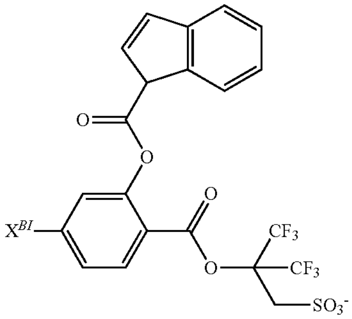
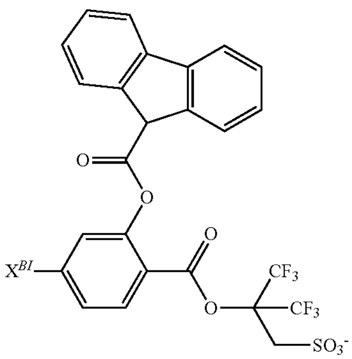
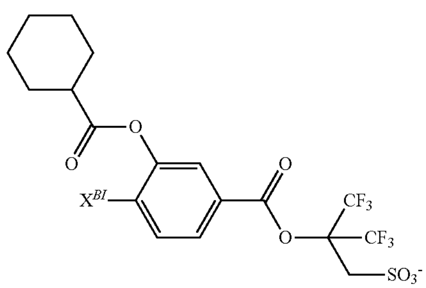
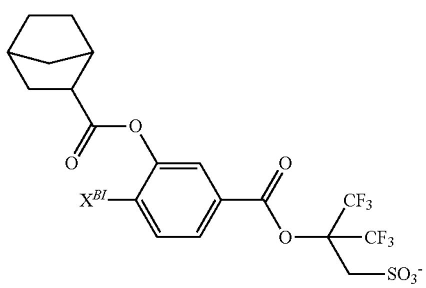
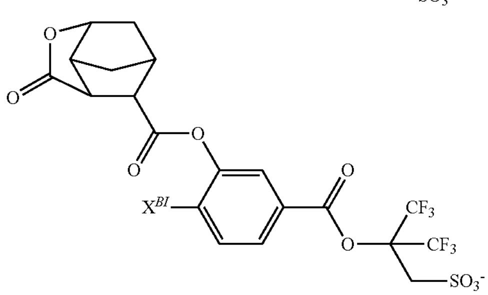
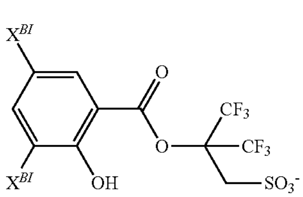
-continued
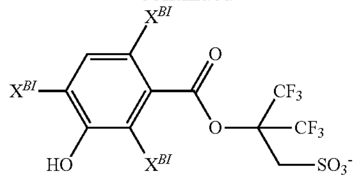
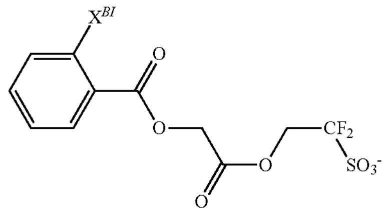
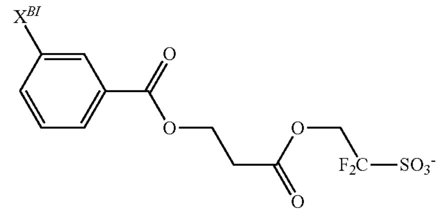
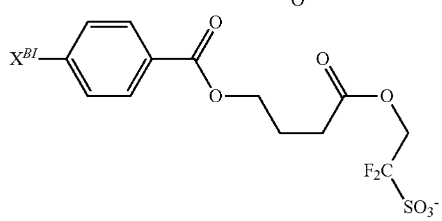
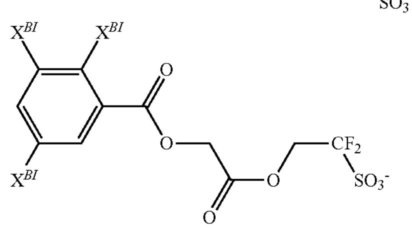
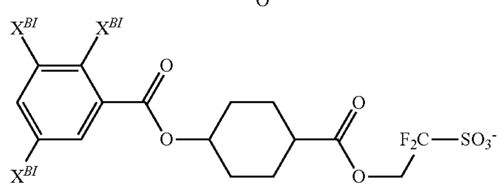
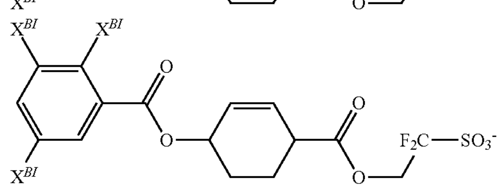
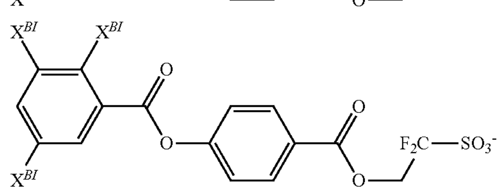
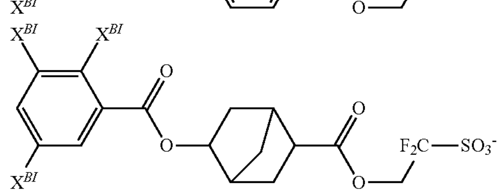

-continued
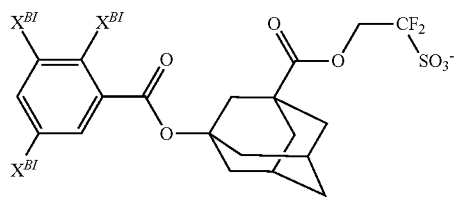
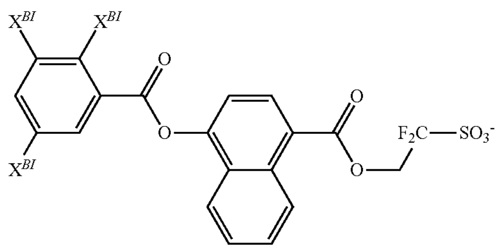
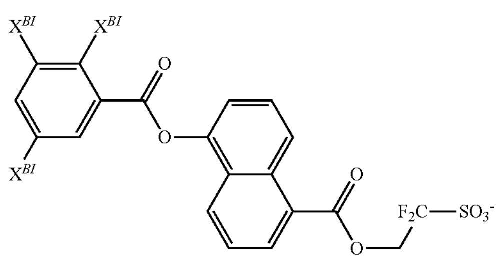
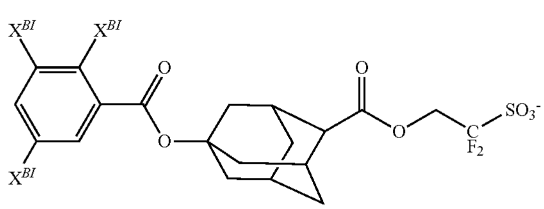
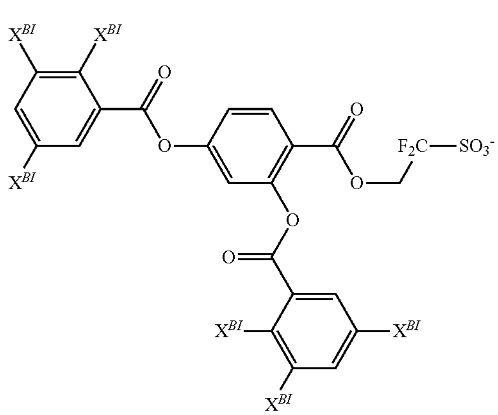
-continued
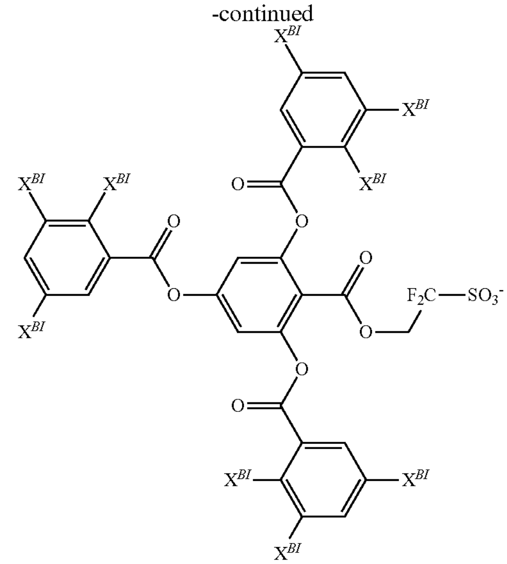
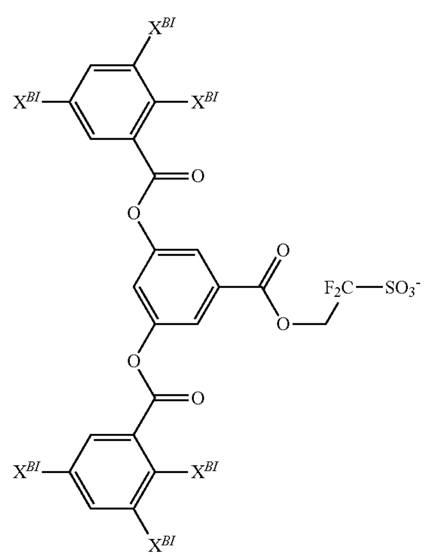
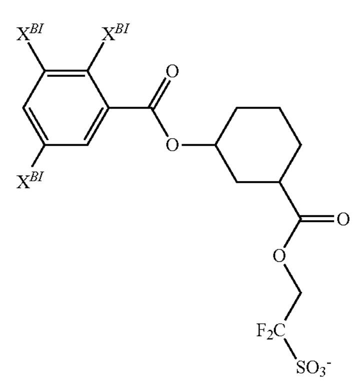

-continued
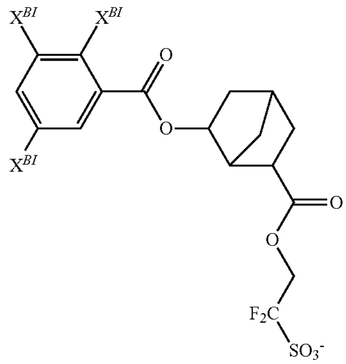
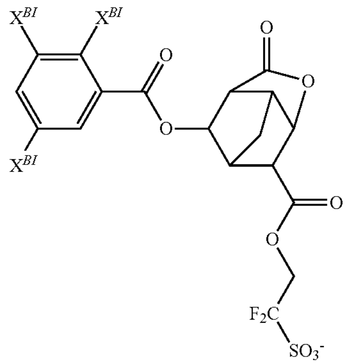
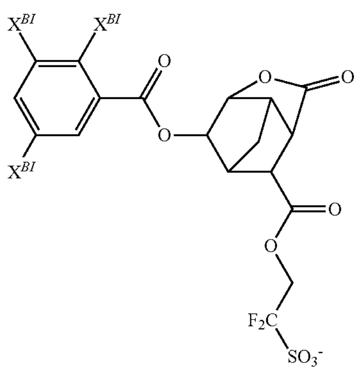
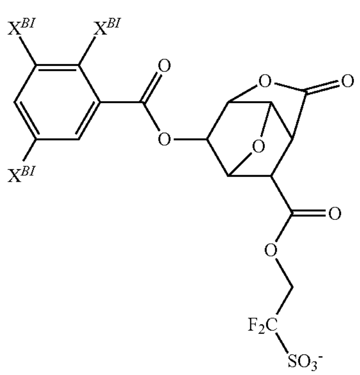
-continued
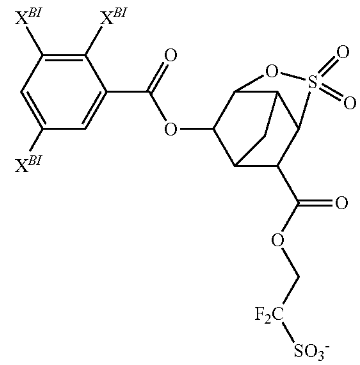
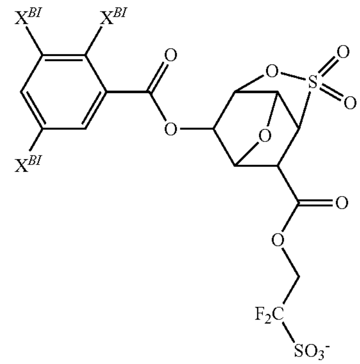
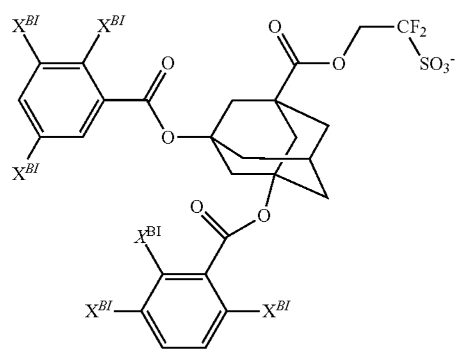
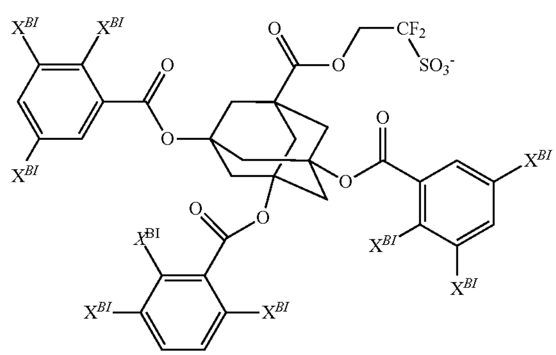

-continued
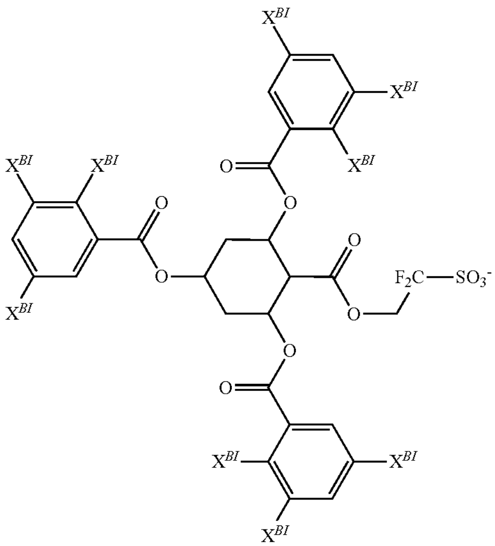
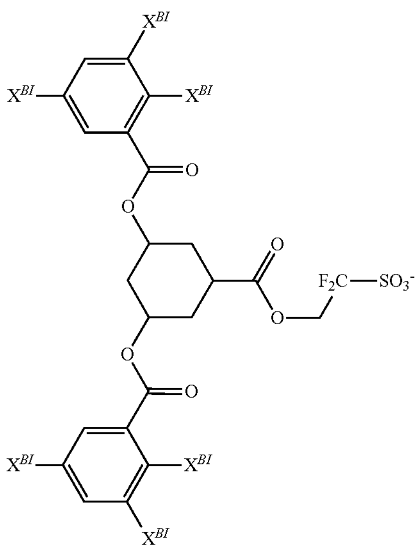
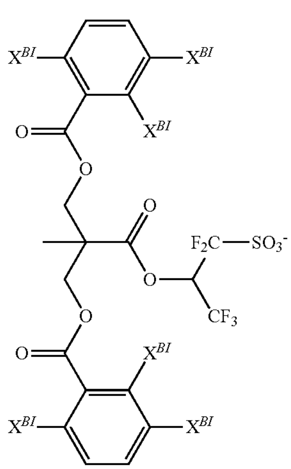
-continued
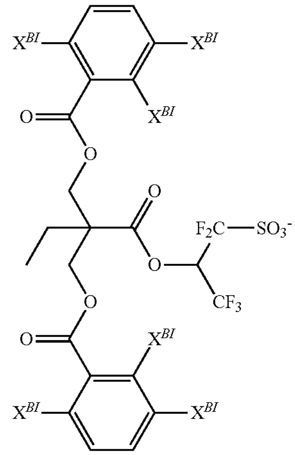
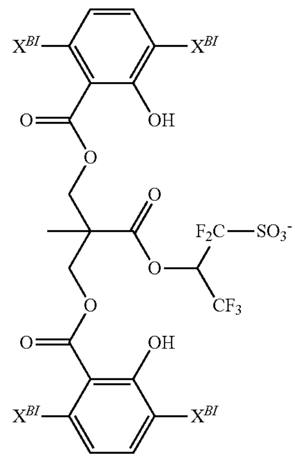
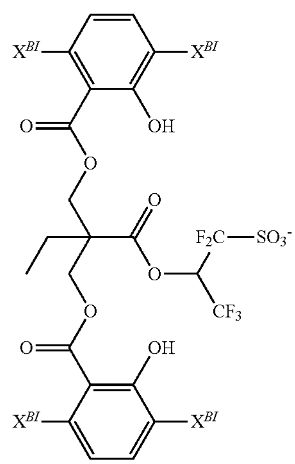
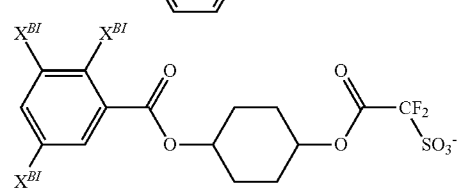
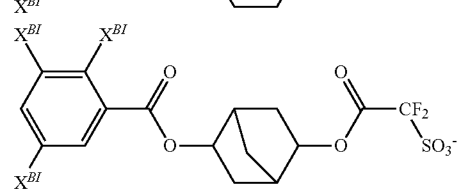

-continued
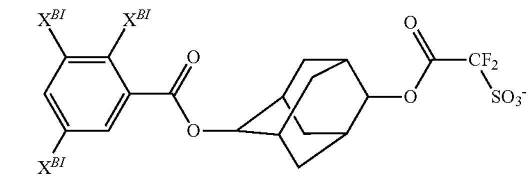
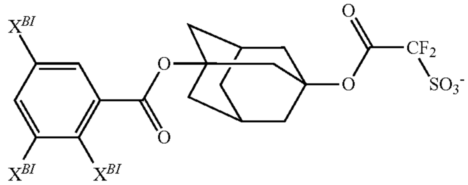
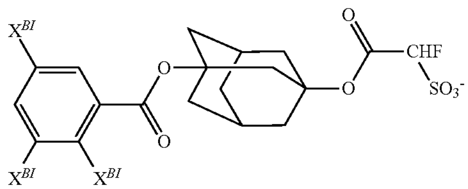
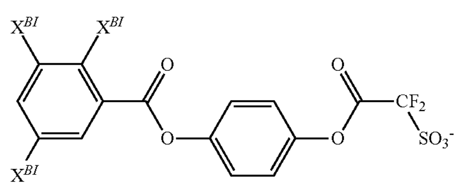
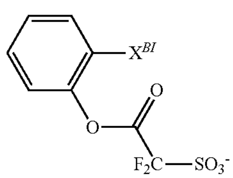
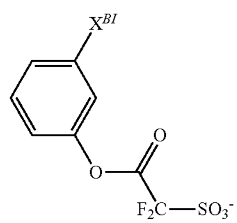
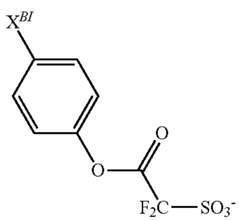
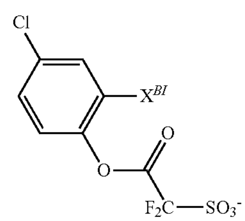
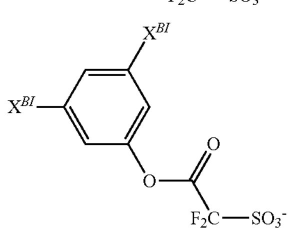
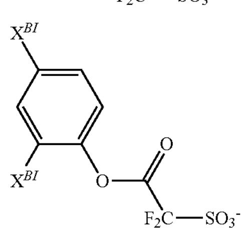
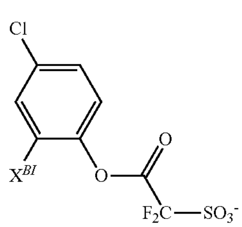
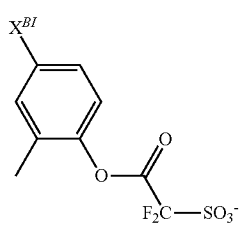
-continued
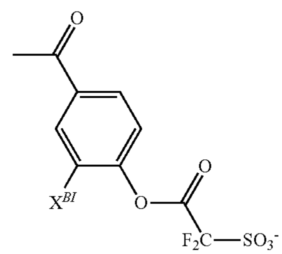
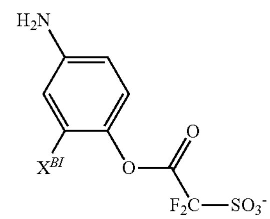
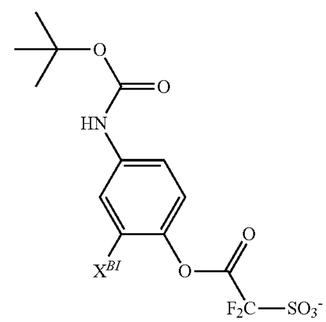
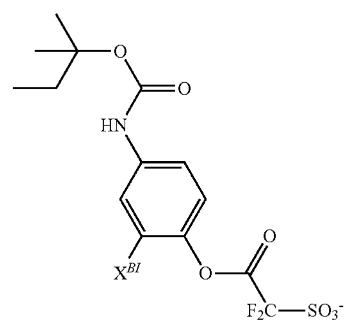
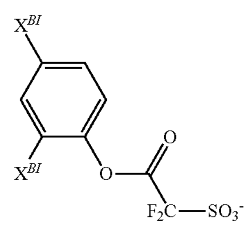
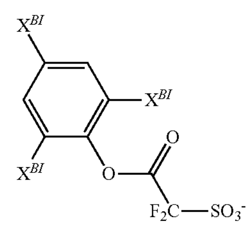
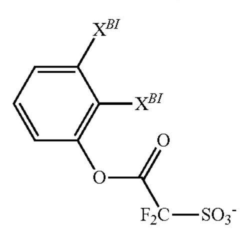
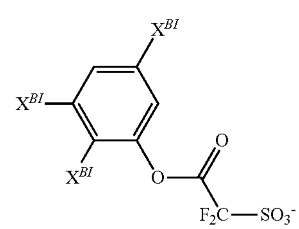
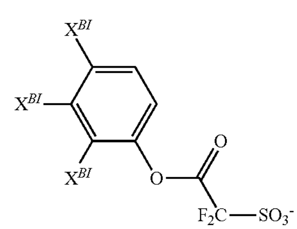

-continued
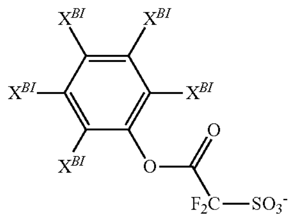
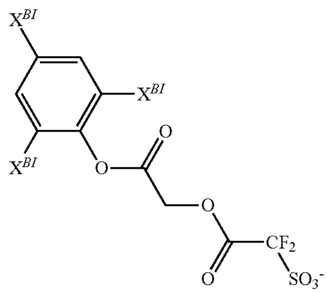
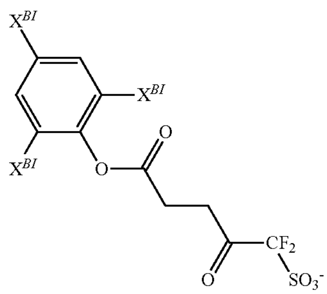
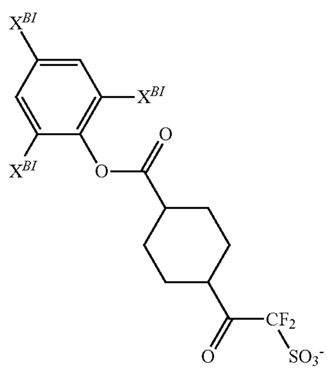
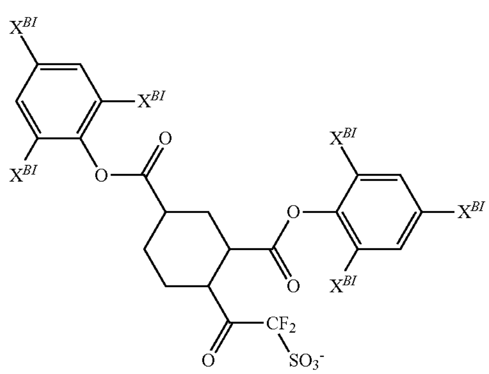
-continued
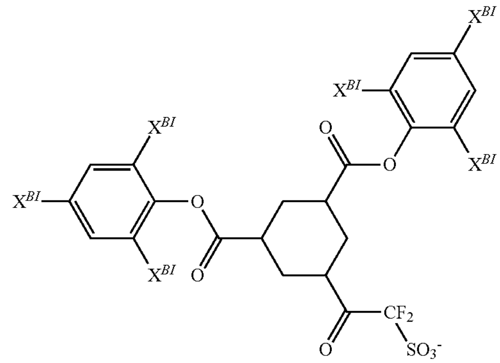
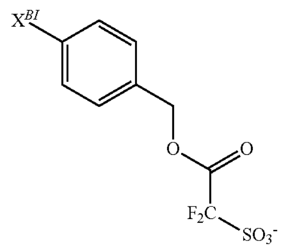
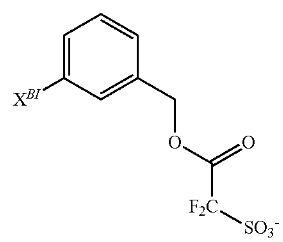
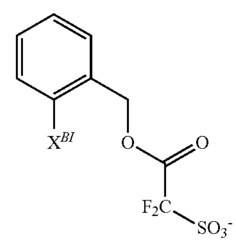
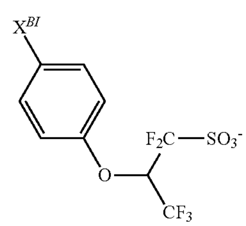
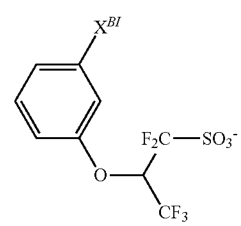
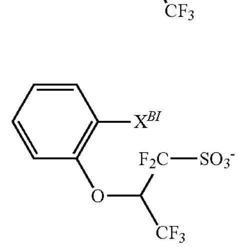
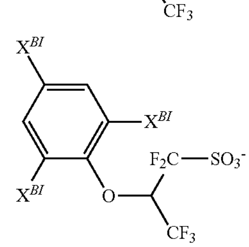
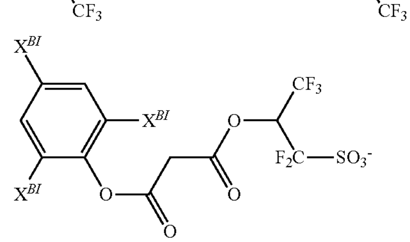
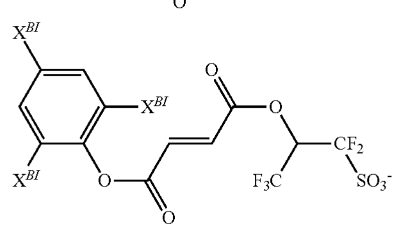

-continued
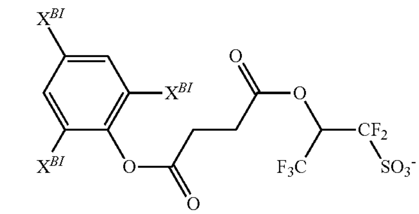
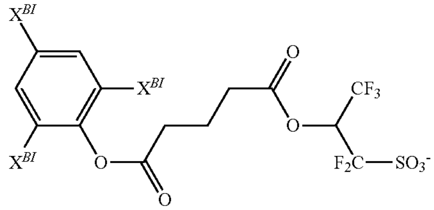
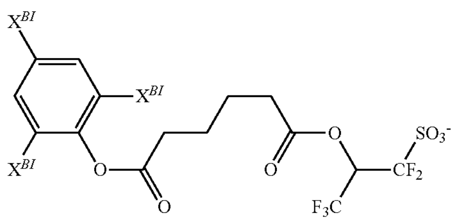
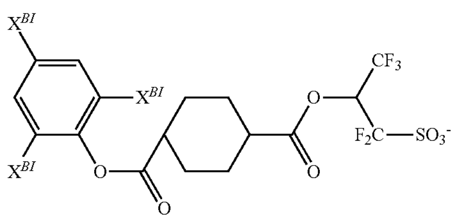
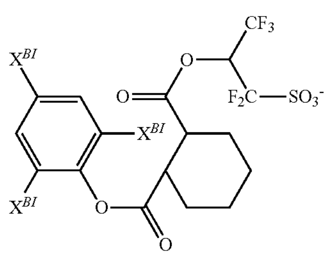
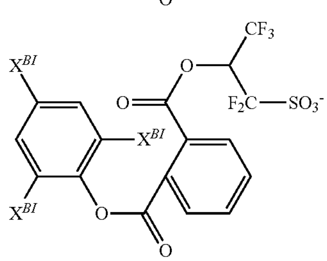
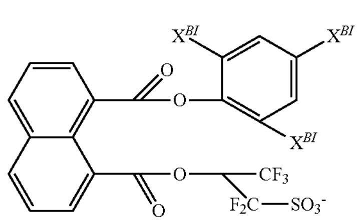
-continued
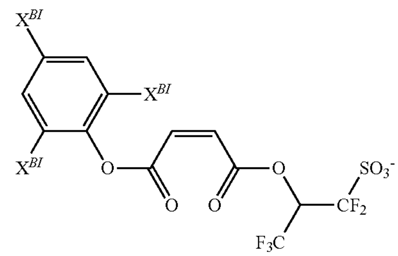
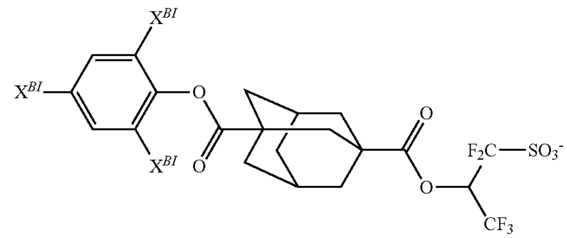
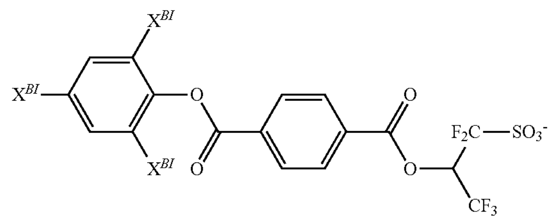
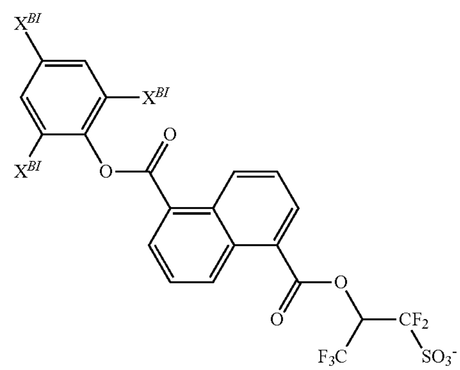
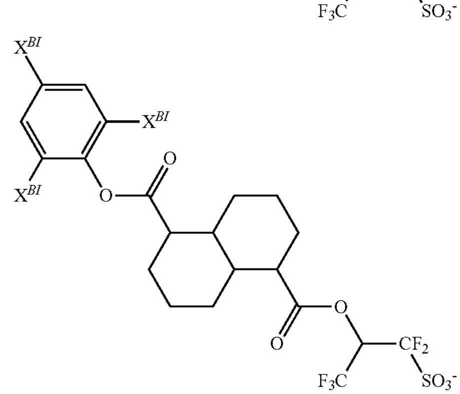
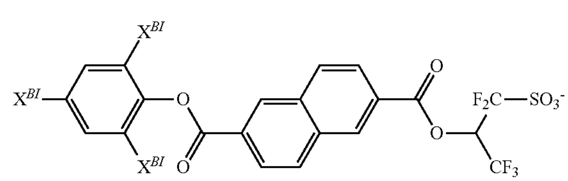

-continued
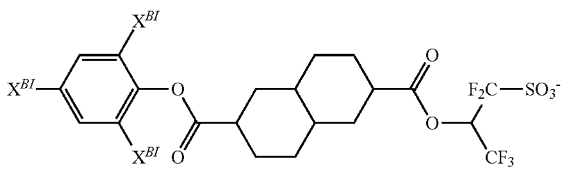
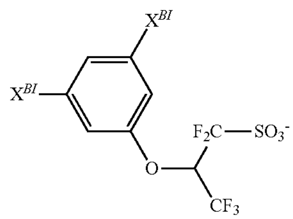
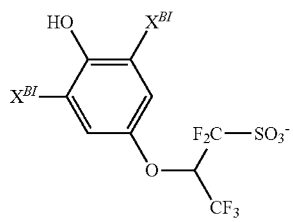
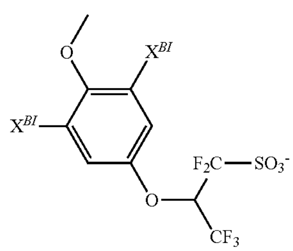
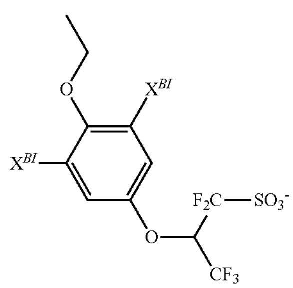
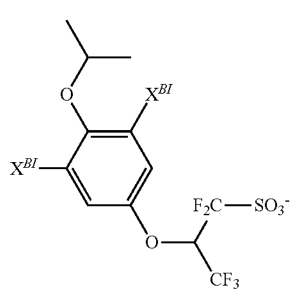
-continued
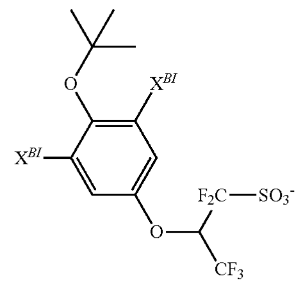
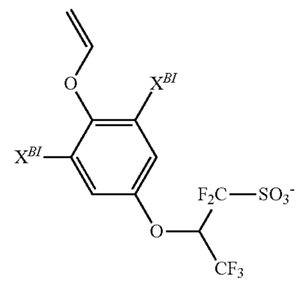
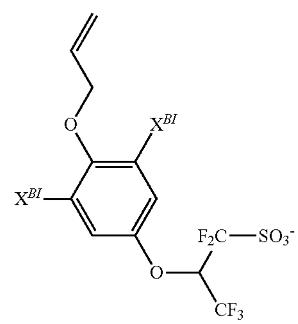
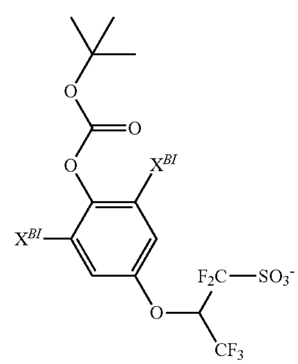
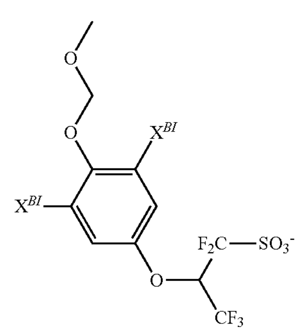

-continued
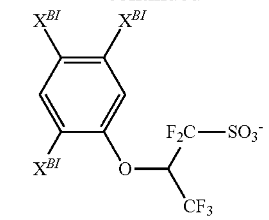
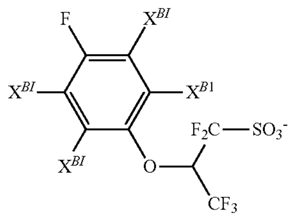
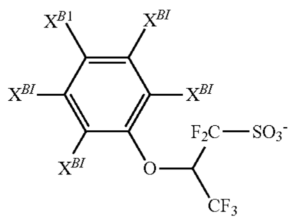
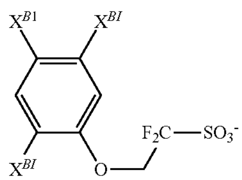
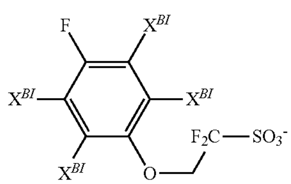
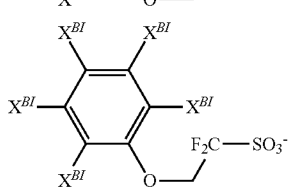
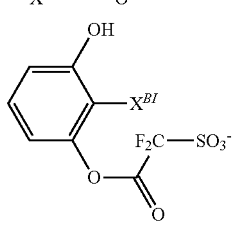
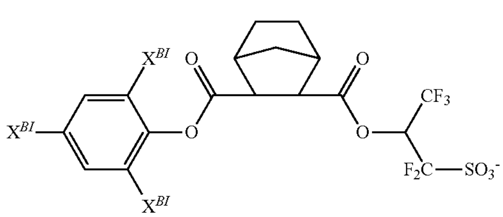
-continued
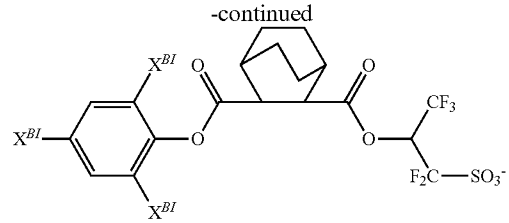
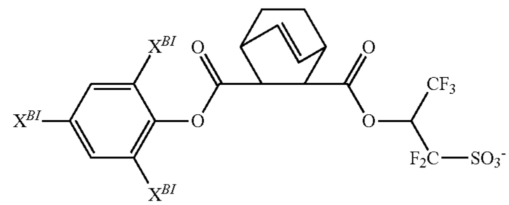
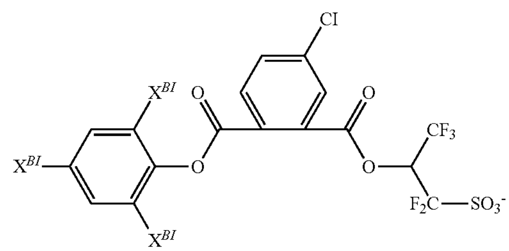
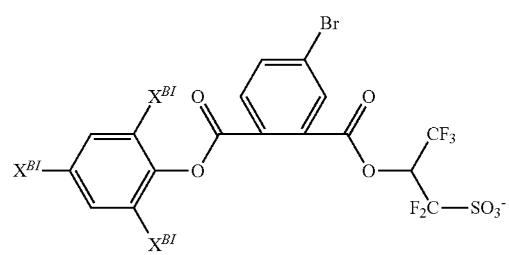
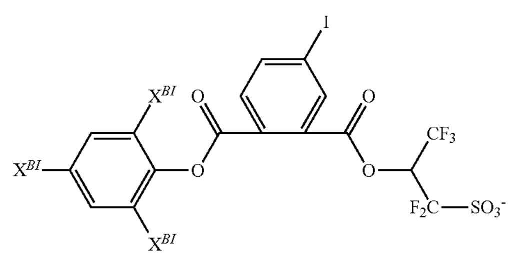
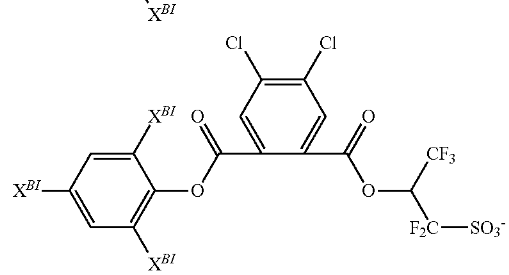
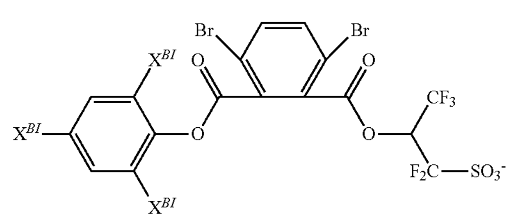

-continued
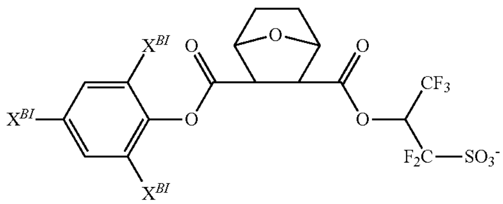
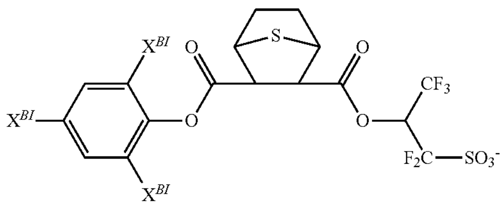
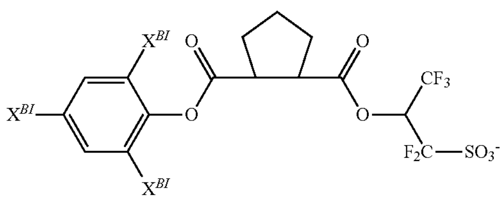
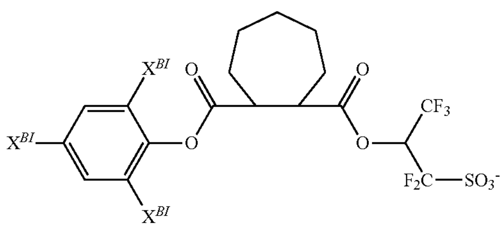
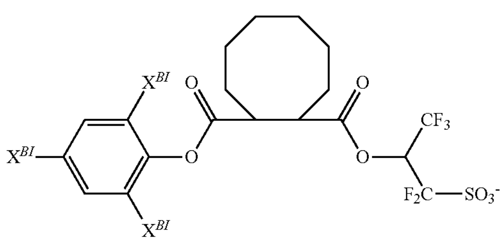
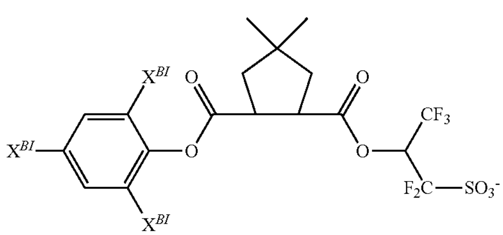
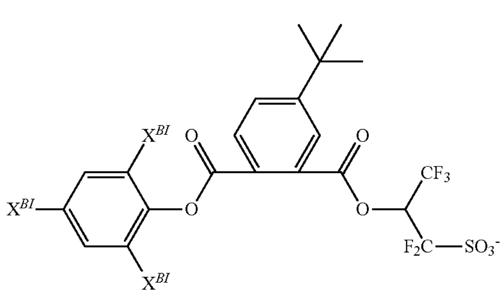
-continued
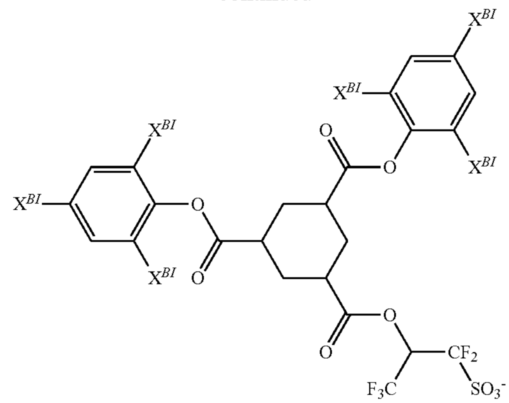
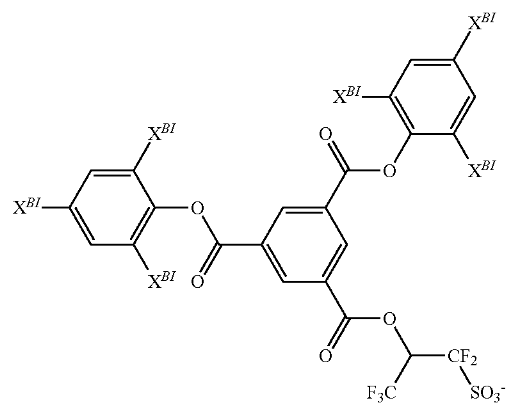
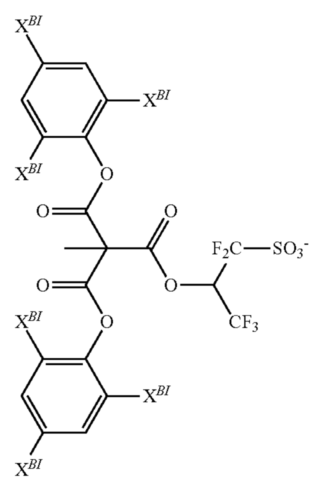
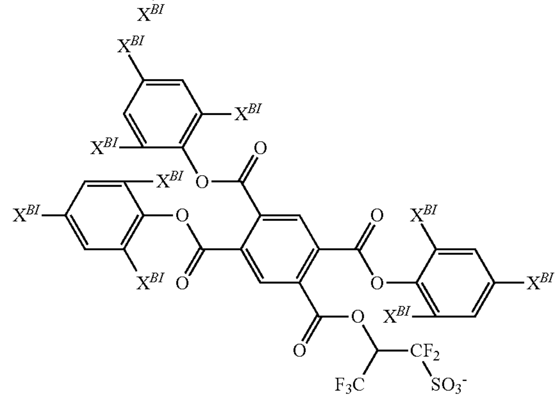

-continued
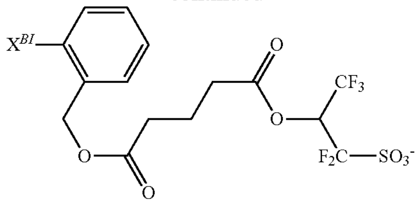
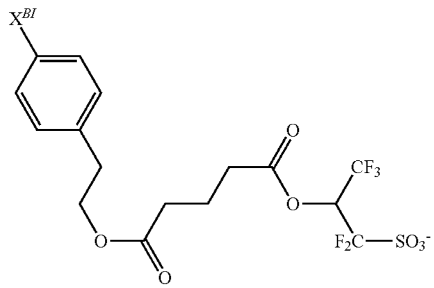
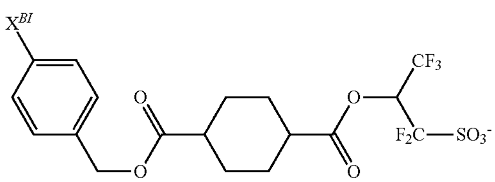
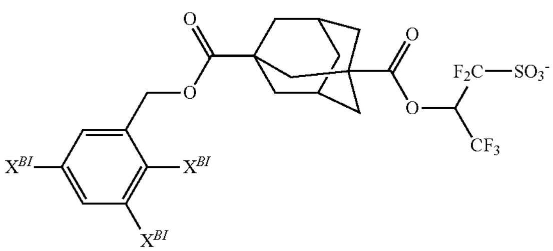
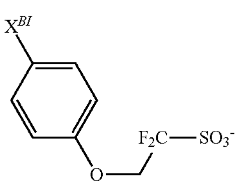
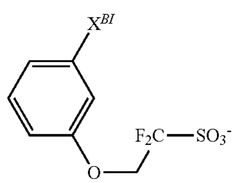
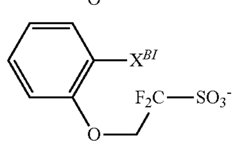
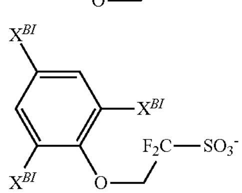
-continued
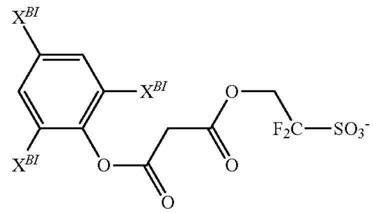
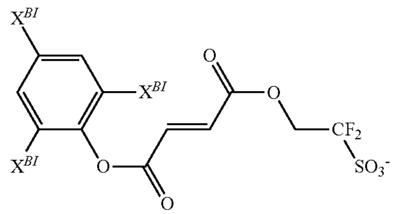
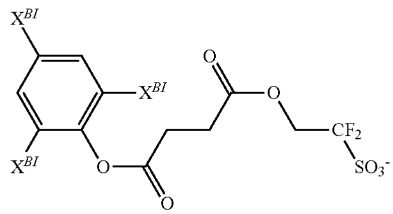
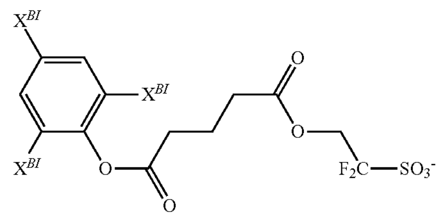
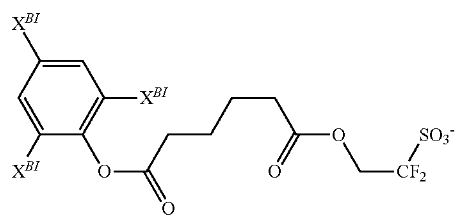
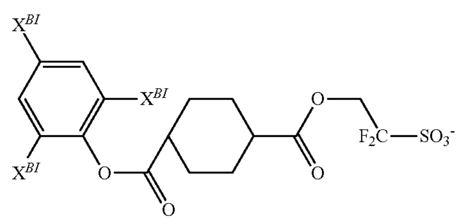
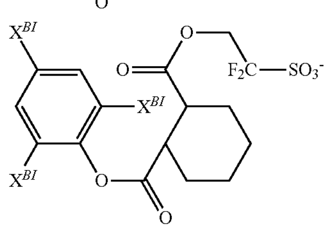
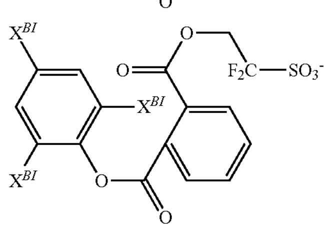

-continued
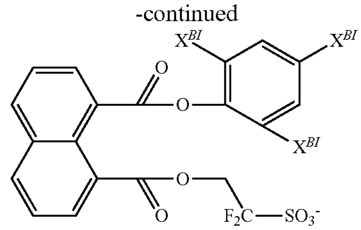
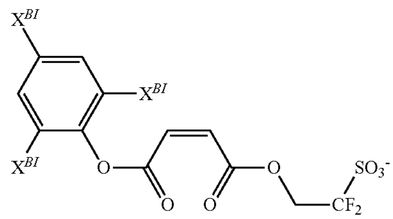
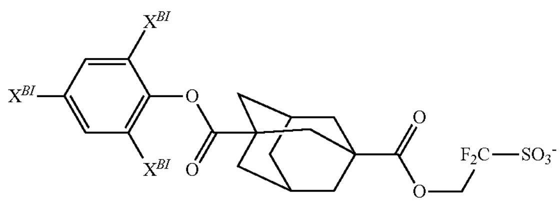
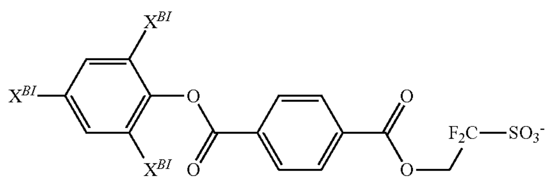
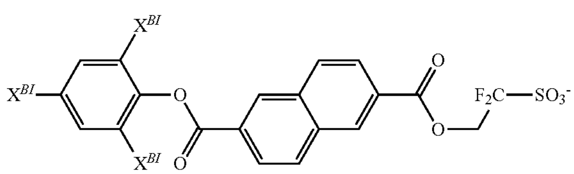
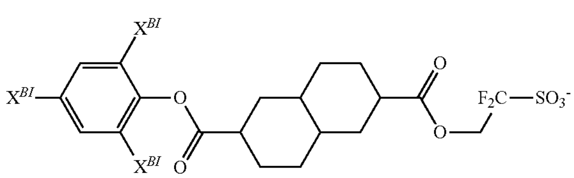
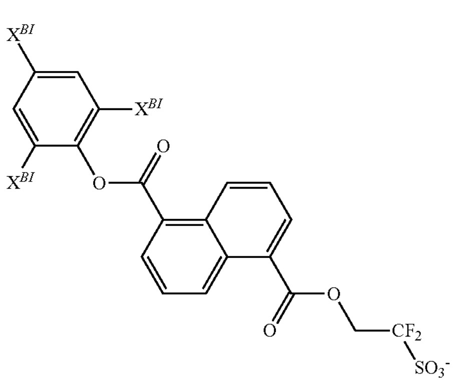
-continued
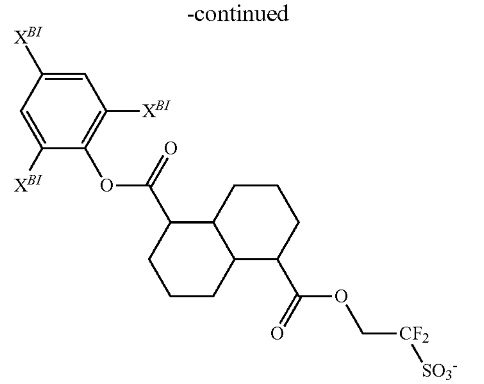
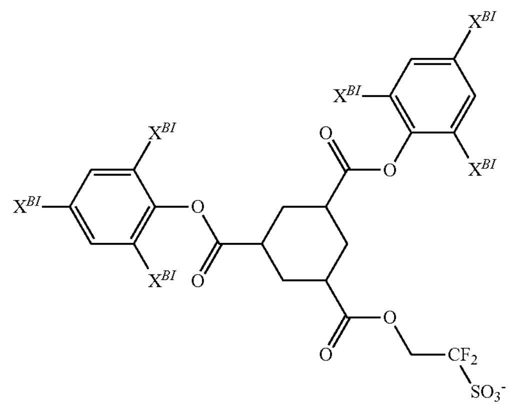
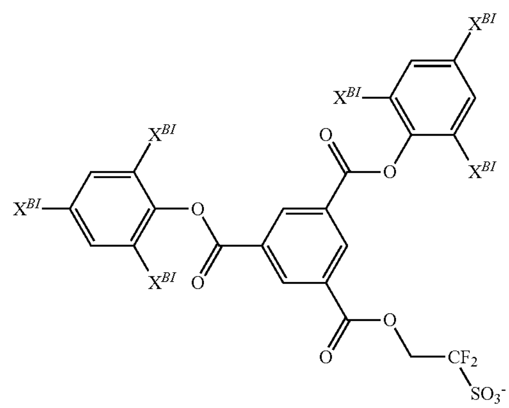
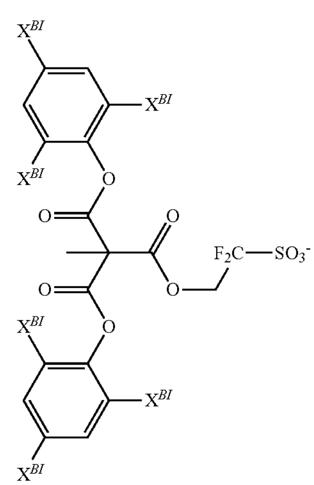

-continued
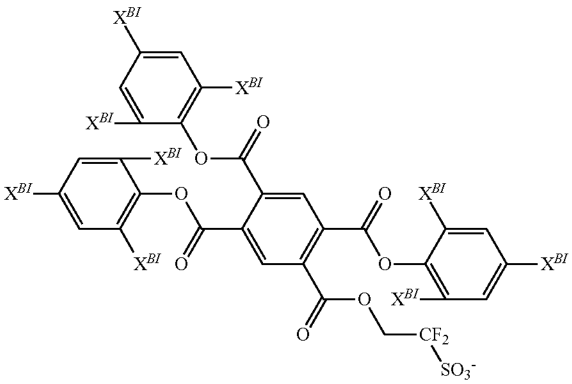
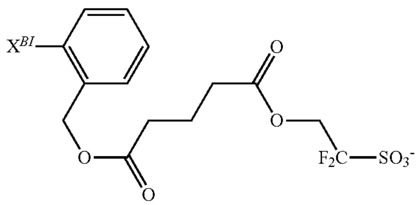
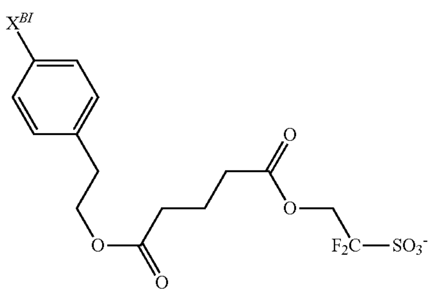
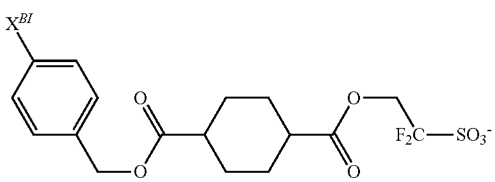
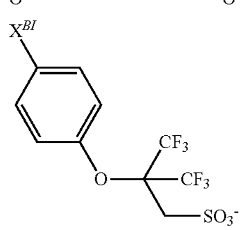
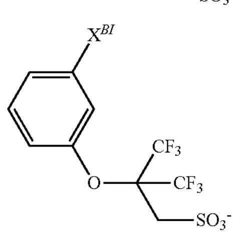
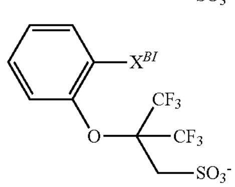
-continued
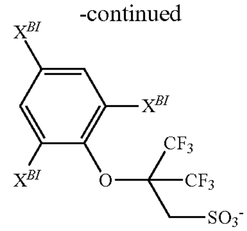
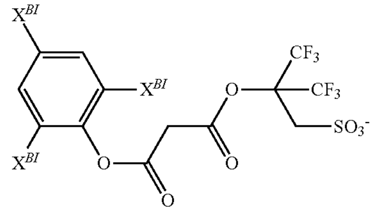
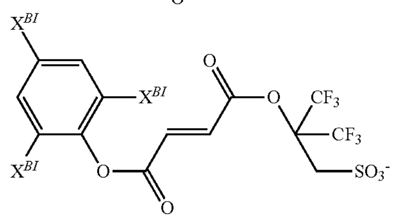
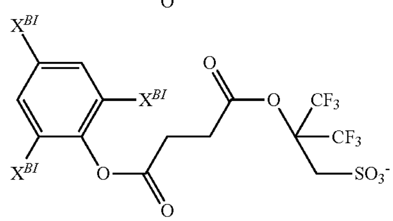
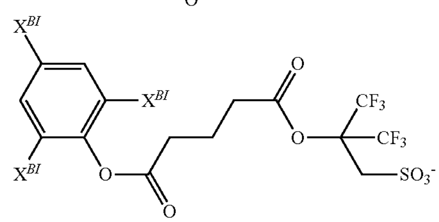
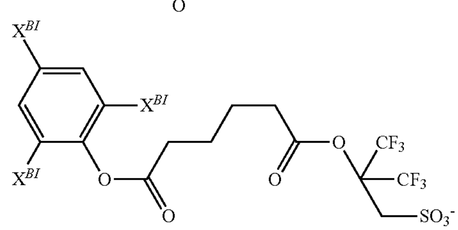
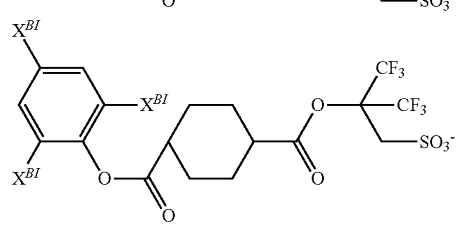
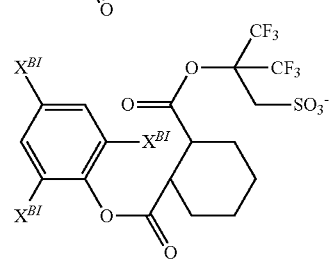

-continued
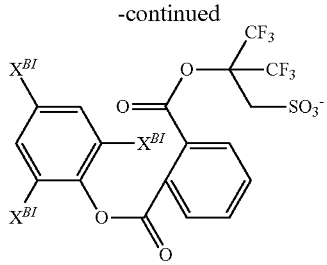
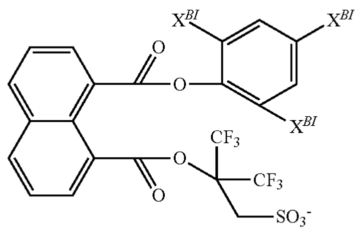
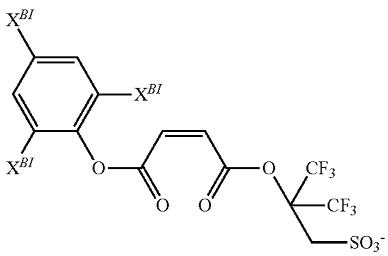
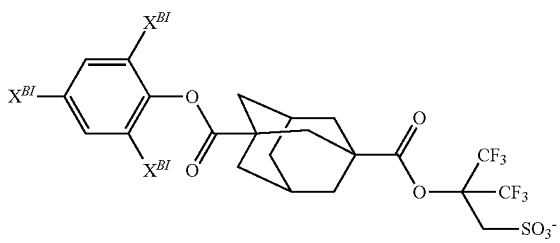
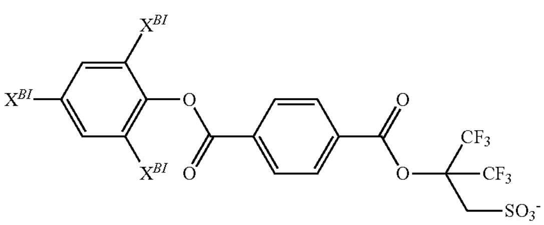
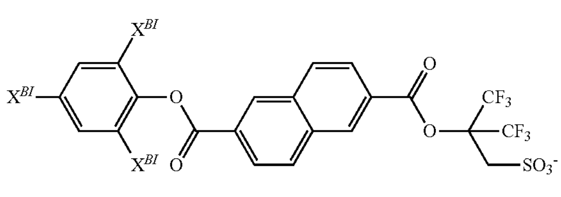
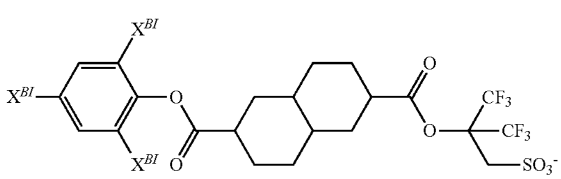
-continued
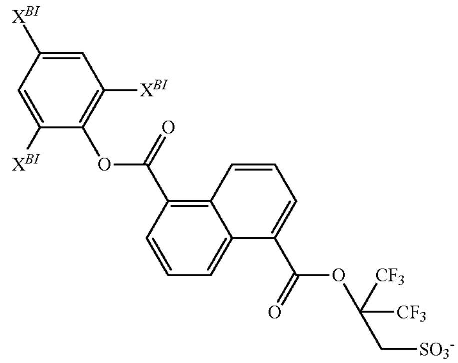
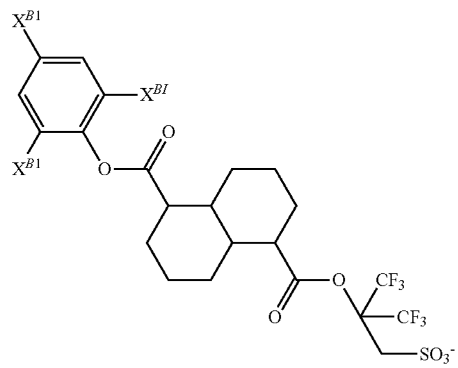
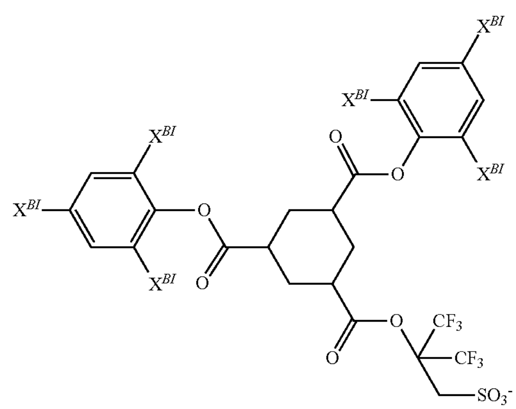
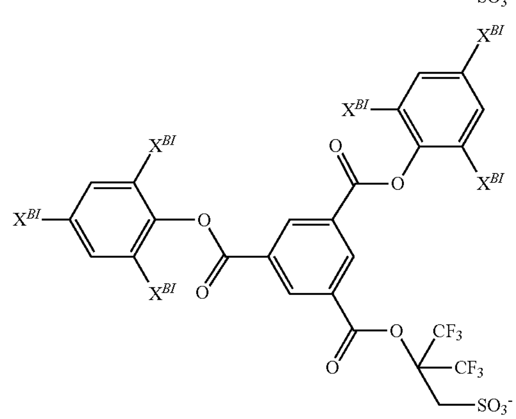

-continued

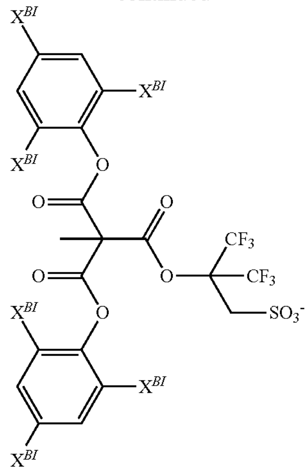

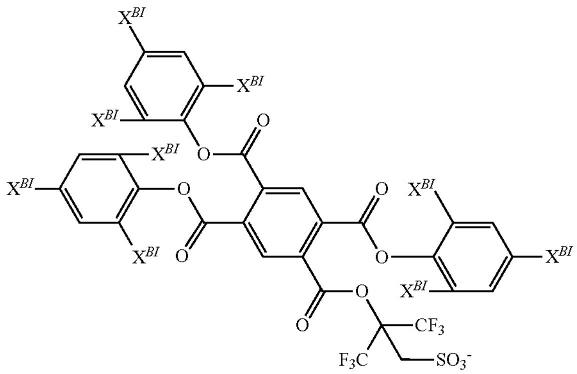

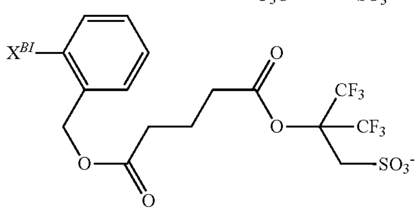

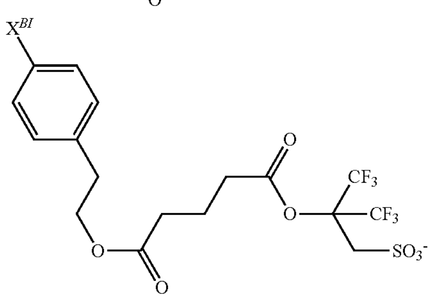

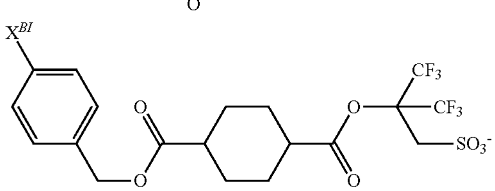

When used, the acid generator of addition type is preferably added in an amount of 0.1 to 50 parts, and more preferably 1 to 40 parts by weight per 100 parts by weight of the base polymer. The resist composition functions as a chemically amplified resist composition when the base polymer includes repeat units (d) and/or the acid generator of addition type is contained.

Organic Solvent

An organic solvent may be added to the resist composition. The organic solvent used herein is not particularly limited as long as the foregoing and other components are soluble therein. Examples of the organic solvent are described in JP-A 2008-111103, paragraphs [0144]-[0145] (U.S. Pat. No. 7,537,880). Exemplary solvents include ketones such as cyclohexanone, cyclopentanone, methyl-2 n-pentyl ketone and 2-heptanone; alcohols such as 3-methoxybutanol, 3-methyl-3-methoxybutanol, 1-methoxy-2-propanol, 1-ethoxy-2-propanol, and diacetone alcohol (DAA); ethers such as propylene glycol monomethyl ether (PG's), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Quencher

The positive resist composition may contain a quencher. As used herein, the quencher refers to a compound capable of trapping the acid generated by the acid generator in the resist composition to prevent the acid from diffusing to the unexposed region.

The quencher is typically selected from conventional basic compounds. Conventional basic compounds include primary, secondary, and tertiary aliphatic amines, mixed amines, aromatic amines, heterocyclic amines, nitrogen-containing compounds with carboxy group, nitrogen-containing compounds with sulfonyl group, nitrogen-containing compounds with hydroxy group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxy group, ether bond, ester bond, lactone ring, cyano group, or sulfonic ester bond as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium, iodonium and ammonium salts of sulfonic acids which are not fluorinated at α-position as described in U.S. Pat. No. 8,795,942 (JP-A 2008-158339) and similar curium salts of carboxylic acid may also be used as the quencher. While an α-fluorinated sulfonic acid, imide acid, and methide acid are necessary to deprotect the acid labile group of carboxylic acid ester, an α-non-fluorinated sulfonic acid and a carboxylic acid are released by salt exchange with an α-non-fluorinated onium salt. An α-non-fluorinated sulfonic acid and a carboxylic acid function as a quencher because they do not induce deprotection reaction.

Examples of the quencher include a compound (onium salt of α-non-fluorinated sulfonic acid) having the formula (4) and a compound (onium salt of carboxylic acid) having the formula (5).

$$R^{501}—SO_3^- \quad Mq^+ \tag{4}$$

-continued $$R^{502}-CO_2^{-}\quad Mq^{+} \tag{5}$$

In formula (4), $R^{501}$ is hydrogen or a $C_1$-$C_{40}$ hydrocarbyl group which may contain a heteroatom, exclusive of the hydrocarbyl group in which the hydrogen bonded to the carbon atom at α-position of the sulfone group is substituted by fluorine or fluoroalkyl moiety.

The hydrocarbyl group may be saturated or unsaturated and straight, branched or cyclic. Examples thereof include $C_1$-$C_{40}$ alkyl groups such as methyl, ethyl, n-propyl, isopropyl, n-butyl, isobutyl, sec-butyl, tert-butyl, tert-pentyl, n-pentyl, n-hexyl, n-octyl, 2-ethylhexyl, n-nonyl, n-decyl: $C_3$-Go cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbornyl, tricyclo[5.2.1.0$^{2,6}$]decanyl, adamantyl, and adamantylmethyl; $C_2$-$C_{40}$ alkenyl groups such as vinyl, allyl, propenyl, butenyl and hexenyl; $C_3$-$C_{40}$ cyclic unsaturated aliphatic hydrocarbyl groups such as cyclohexenyl; $C_6$-$C_{40}$ aryl groups such as phenyl, naphthyl, alkylphenyl groups (e.g., 2-methylphenyl, 3-methylphenyl, 4-methylphenyl, 4-ethylphenyl, 4-tert-butylphenyl, 4-n-butylphenyl), dialkylphenyl groups (e.g., 2,4-dimethylphenyl and 2,4,6-triisopropylphenyl), alkylnaphthyl groups (e.g., methylnaphthyl and ethylnaphthyl), dialkylnaphthyl groups (e.g., dimethylnaphthyl and diethylnaphthyl); and $C_7$-$C_{40}$ aralkyl groups such as benzyl, 1-phenylethyl and 2-phenylethyl.

In these groups, some or all hydrogen may be substituted by a moiety containing a heteroatom such as oxygen, sulfur, nitrogen or halogen, and some constituent —$CH_2$— may be replaced by a moiety containing a heteroatom such as oxygen, sulfur or nitrogen, so that the group may contain a hydroxy moiety, cyano moiety, carbonyl moiety, ether bond, ester bond, sulfonic ester bond, carbonate bond, lactone ring, sultone ring, carboxylic anhydride (—C(═O)—O—C(O)—), or haloalkyl moiety. Suitable heteroatom-containing hydrocarbyl groups include heteroaryl groups such as thienyl and indolyl; alkoxyphenyl groups such as 4-hydroxyphenyl, 4-methoxyphenyl, 3-methoxyphenyl, 2-methoxyphenyl, 4-ethoxyphenyl, 4-test-butoxyphenyl, 3-tert-butoxyphenyl; alkoxynaphthyl groups such as methoxynaphthyl, ethoxynaphthyl, n-propoxynaphthyl and n-butoxynaphthyl; dialkoxynaphthyl groups such as dimethoxynaphthyl and diethoxynaphthyl: and aryloxoalkyl groups, typically 2-aryl-2-oxoethyl groups such as 2-phenyl-2-oxoethyl, 2-(1-naphthyl)-2-oxoethyl and 2-(2-naphthyl)-2-oxoethyl.

In formula (5), $R^{502}$ is a $C_1$-$C_{40}$ hydrocarbyl group which may contain a heteroatom. Examples of the hydrocarbyl group $R^{502}$ are as exemplified above for the hydrocarbyl group $R^{501}$. Also included are fluorinated alkyl groups such as trifluoromethyl, trifluoroethyl, 2,2,2-trifluoro-1 methyl-1-hydroxyethyl, 2,2,2-trifluoro-1-(trifluoromethyl)-1-hydroxyethyl, and fluorinated aryl groups such as pentafluorophenyl and 4-trifluoromethylphenyl.

In formulae (4) and (5), $Mq^+$ is an onium cation. The opium cation is preferably selected from sulfonium, iodonium and ammonium cations, more preferably sulfonium and iodonium cations. Exemplary sulfonium cations are as exemplified above for the cation in the sulfonium salt having formula (1-1). Exemplary iodonium cations are as exemplified above for the cation in the iodonium salt having formula (1-2).

A sulfonium salt of iodized benzene ring-containing carboxylic acid having the formula (6) is also useful as the quencher.

(6)

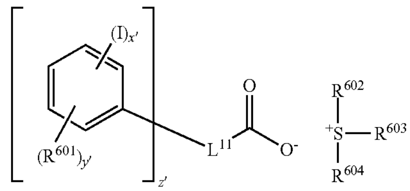

In formula (6), $R^{601}$ is hydroxy, fluorine, chlorine, bromine, amino, nitro, cyano, or a $C_1$-$C_6$ saturated hydrocarbyl, $C_1$-$C_6$ saturated hydrocarbyloxy, $C_2$-$C_6$ saturated hydrocarbylcarbonyloxy or $C_1$-$C_4$ saturated hydrocarbylsulfonyloxy group, in which some or all hydrogen may be substituted by halogen, or —N($R^{601A}$)—C(═O)—$R^{601B}$, or —N($R^{601A}$)—C(═O)—O—$R^{601B}$. $R^{601A}$ is hydrogen or a $C_1$-$C_6$ saturated hydrocarbyl group. $R^{601B}$ is a $C_1$-$C_6$ saturated hydrocarbyl or $C_2$-$C_8$ unsaturated aliphatic hydrocarbyl group.

In formula (6), x' is an integer of 1 to 5, y' is an integer of 0 to 3, and z' is an integer of 1 to 3. $L^{11}$ is a single bond, or a $C_1$-$C_{20}$ (z'+1)-valent linking group which may contain at least one moiety selected from ether bond carbonyl moiety, ester bond, amide bond, sultone ring, lactam ring, carbonate bond, halogen, hydroxy moiety, and carboxy moiety. The saturated hydrocarbyl, saturated hydrocarbyloxy, saturated hydrocarbylcarbonyloxy, and saturated hydrocarbylsulfonyloxy groups may be straight, branched or cyclic. Groups $R^{601}$ may be the same or different when y' and/or z' is 2 or 3.

In formula (6), $R^{602}$, $R^{603}$ and $R^{604}$ are each independently halogen, or a $C_1$-$C_{20}$ hydrocarbyl group which may contain a heteroatom. The hydrocarbyl group may be saturated or unsaturated and straight, branched or cyclic. Examples thereof are as exemplified above for the hydrocarbyl groups $R^{101}$ to $R^{105}$ in formulae (1-1) and (1-2). In these groups, some or all hydrogen may be substituted by hydroxy, carboxy, halogen, oxo, cyano, nitro, sultone, sulfone, or sulfonium salt-containing moiety, or some constituent —$CH_2$— may be replaced by an ether bond, ester bond, carbonyl moiety, amide bond, carbonate moiety or sulfonic ester bond. Also $R^{602}$ and $R^{603}$ may bond together to form a ring with the sulfur atom to which they are attached.

Examples of the compound having formula (6) include those described in U.S. Pat. No. 10,295,904 (JP-A 2017-219836). Since iodine is highly absorptive to EUV of wavelength 13.5 inn, it generates secondary electrons during exposure, with the energy of secondary electrons being transferred to the acid generator. This promotes the decomposition of the quencher, contributing to a higher sensitivity.

Also useful are quenchers of polymer type as described in U.S. Pat. No. 7,598,016 (JP-A 2008-239918). The polymeric quencher segregates at the resist surface and thus enhances the rectangularity of resist pattern. When a protective film is applied as is often the case in the immersion lithography, the polymeric quencher is also effective for preventing a film thickness loss of resist pattern or rounding of pattern top.

When used, the quencher is preferably added in an amount of 0 to 5 parts, more preferably 0 to 4 parts by weight per 100 pacts by weight of the base polymer. The quencher may be used alone or in admixture.

Other Components

With the foregoing components, other components such as a surfactant, dissolution inhibitor, water repellency improver, and acetylene alcohol may be blended in any desired combination to formulate a positive resist composition.

Exemplary surfactants are described in JP-A 2008-111103, paragraphs [0165]-[0166]. Inclusion of a surfactant may improve or control the coating characteristics of the resist composition. When used, the surfactant is preferably added in an amount of 0.0001 to 10 parts by weight per 100 parts by weight of the base polymer. The surfactant may be used alone or in admixture.

The inclusion of a dissolution inhibitor in the positive resist composition may lead to an increased difference in dissolution rate between exposed and unexposed areas and a further improvement in resolution. The dissolution inhibitor which can be used herein is a compound having at least two phenolic hydroxy groups on the molecule, in which an average of from 0 to 100 mol % of all the hydrogen atoms on the phenolic hydroxy groups are replaced by acid labile groups or a compound having at least one carboxy group on the molecule, in which an average of 50 to 100 mol % of all the hydrogen atoms on the carboxy groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxy or carboxy group is substituted by an acid labile group, as described in U.S. Pat. No. 7,771,914 (JP-A 2008-122932, paragraphs [0155]-[0178]).

When the positive resist composition contains a dissolution inhibitor, the dissolution inhibitor is preferably added in an amount of 0 to 50 parts, more preferably 5 to 40 parts by weight per 100 parts by weight of the base polymer. The dissolution inhibitor may be used alone or in admixture.

A water repellency improver may be added to the resist composition for improving the water repellency on surface of a resist film. The water repellency improver may be used in the topcoatless immersion lithography. Suitable water repellency improvers include polymers having a fluoroalkyl group and polymers having a specific structure with a 1,1,1,3,3,3-hexafluoro-2 propanol residue and are described in JP-A 2007-297590 and JP A 2008-111103, for example. The water repellency improver to be added to the resist composition should be soluble in the alkaline developer and organic solvent developer. The water repellency improver of specific structure with a 1,1,1,3,3,3-hexafluoro-2-propanol residue is well soluble in the developer. A polymer having an amino group or amine salt copolymerized as repeat units may serve as the water repellent additive and is effective for preventing evaporation of acid during PEB, thus preventing any hole pattern opening failure after development. An appropriate amount of the water repellency improver is 0 to 20 parts, more preferably 0.5 to 10 parts by weight per 100 parts by weight of the base polymer. The water repellency improver may be used alone or in admixture.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer. The acetylene alcohols may be used alone or in admixture.

Pattern Forming Process

The positive resist composition is used in the fabrication of various integrated circuits. Pattern formation using the resist composition may be performed by well-known lithography processes. The process generally involves the steps of applying the resist composition onto a substrate to form a resist film thereon, exposing the resist film to high-energy radiation, and developing the exposed resist film in a developer. If necessary, any additional steps may be added.

The positive resist composition is first applied onto a substrate on which an integrated circuit is to be formed (e.g., Si, $SiO_2$, SiN, SiON, TIN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150'C for 10 seconds to 30 minutes, preferably at 80 to 120'C for 30 seconds to 20 minutes. The resulting resist film is generally 0.01 to 2 μm thick.

The resist film is then exposed to a desired pattern of high-energy radiation such as UV deep-UV, EB. EUV of wavelength 3-15 mu, x-ray, soft x-ray, excimer laser light, γ-ray or synchrotron radiation. When UV, deep-UV, EUV, x-ray, soft x-ray, excimer laser light, γ-ray or synchrotron radiation is used as the high-energy radiation, the resist film is exposed thereto directly or through a mask having a desired pattern in a dose of preferably about 1 to 200 $mJ/cm^2$, more preferably about 10 to 100 $mJ/cm^2$. When EB is used as the high-energy radiation, the resist film is exposed thereto directly or through a mask having a desired pattern in a dose of preferably about 0.1 to 100 $\mu C/cm^2$, more preferably about 0.5 to 50 $\mu C/cm^2$. It is appreciated that the positive resist composition is suited in micropatterning using i-line of wavelength 365 mm, KrF excimer laser, ArF excimer laser, EB, EUV, x-ray, soft x-ray, γ-ray or synchrotron radiation, especially in micropatterning using EB or EUV.

After the exposure, the resist film may be baked (PEB) on a hotplate or in an oven preferably at 50 to 150° C., for 10 seconds to 30 minutes, more preferably at 60 to 120° C. for 30 seconds to 20 minutes.

After the exposure or PEB, the resist film is developed in a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAR), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate.

In an alternative embodiment, a negative pattern may be forayed via organic solvent development using the positive resist composition. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl–1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. The abbreviation "pbw" is parts by weight.

[1] Synthesis of monomers

Synthesis Example 1-1

Synthesis of Monomer M-1

In a reactor, 9.06 g of 2-(4-nitrophenyl)-2-propanol, 8.60 g of triethylamine, and 0.61 g of 4-dimethylaminopyridine were dissolved in 25 mL of acetonitrile. While the reactor was kept at an internal temperature of 40-60° C., 7.32 g of methacrylic chloride was added dropwise thereto. Stirring was continued for 19 hours at the internal temperature of 60° C. The reaction solution was cooled to which 20 mL of saturated sodium bicarbonate aqueous solution was added to quench the reaction. The end compound was extracted with a mixture of 25 mL toluene, 15 mL hexane and 15 mL ethyl acetate. This was followed by standard aqueous workup, solvent distillation, and vacuum distillation, obtaining 9.02 g of Monomer M-1 as colorless transparent oil.

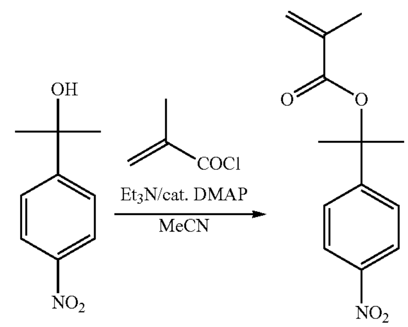

M-1

Synthesis Example 1-2

Synthesis of Monomer M-2

Monomer M-2, shown below, was synthesized by the same procedure as in Synthesis Example 1-1 except that 2-(3-nitrophenyl)-2-propanol was used instead of 2-(4-nitrophenyl)-2-propanol.

M-2

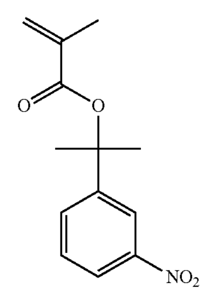

Synthesis Example 1-3

Synthesis of Monomer M-3

Monomer M-3, shown below, was synthesized by the same procedure as in Synthesis Example 1-1 except that 2-(3-fluoro-4 nitrophenyl)-2-propanol was used instead of 2-(4-nitrophenyl)-2-propanol.

M-3

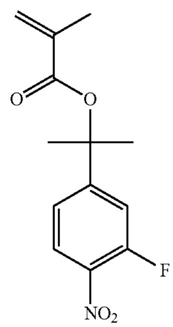

Synthesis Example 1-4

Synthesis of Monomer M-4

Monomer M-4, shown below, was synthesized by the same procedure as in Synthesis Example 1-1 except that Compound C-1, shown below, was used instead of 2-(4-nitrophenyl)-2-propanol.

C-1

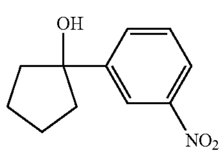

M-4

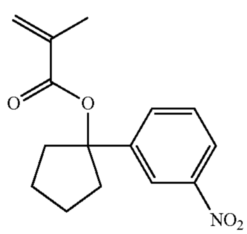

Synthesis Example 1-5

Synthesis of Monomer M-5

Monomer M-5, shown below, was synthesized by the same procedure as in Synthesis Example 1-1 except that Compound C-2, shown below, was used instead of 2-(4 nitrophenyl)-2-propanol.

C-2

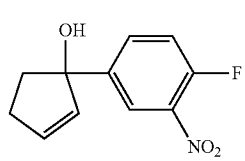

-continued

M-5

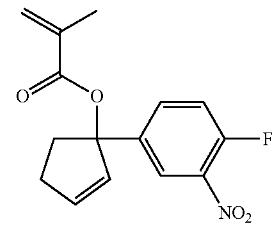

[2] Synthesis of polymers

Monomers PM-1 to PM-4, AM-1 to AM-5, FM-1 and FM-2 used in the synthesis of polymers have the structure shown below. The polymer is analyzed for composition by $^{13}C$— and $^{1}H$-NMR spectroscopy and for Mw and Mw/Mn by GPC versus polystyrene standards using tetrahydrofuran (THF) solvent.

PM-1

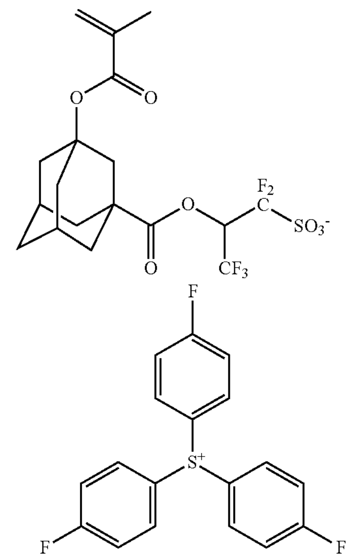

PM-2

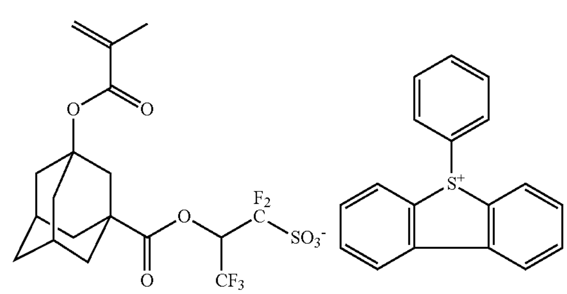

PM-3

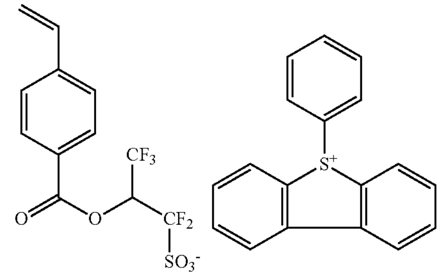

-continued

PM-4

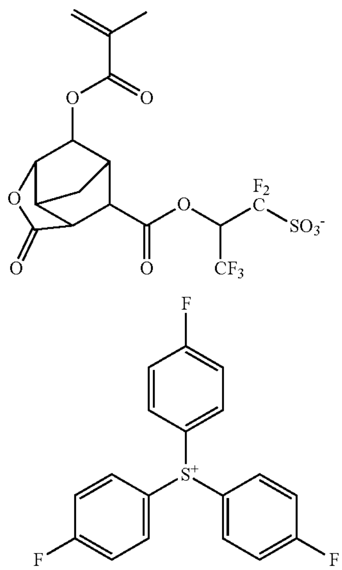

AM-1

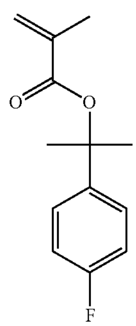

AM-2

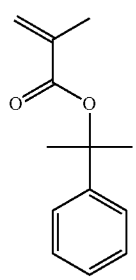

AM-3

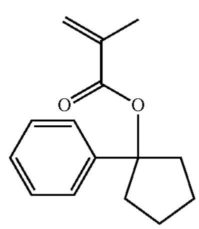

AM-4

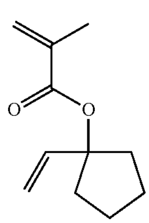

-continued

AM-5

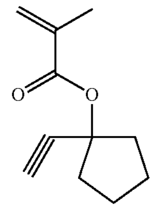

FM-1

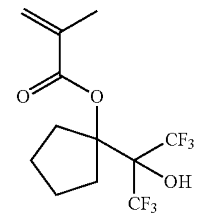

FM-2

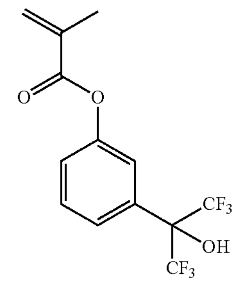

Synthesis Example 2-1

Synthesis of Polymer P-1

A 2-L flask was charged with 14.9 g of Monomer M-1, 4.8 g of 4-hydroxystyrene, and 40 g of THE solvent. The reactor was cooled at −70° C., in a nitrogen atmosphere, after which vacuum pumping and nitrogen blow were repeated three times. The reactor was warmed up to room temperature, whereupon 1.2 g of azobisisobutyronitrile (AIBN) as polymerization initiator was added. The reactor was heated at 60° C., and held at the temperature for 15 hours for reaction. The reaction solution was poured into 1 L of isopropyl alcohol (IPA) for precipitation. The resulting white solid was collected by filtration and dried in vacuum at 60° C., obtaining Polymer P-1. The polymer was analyzed by NMR spectroscopy and GPC.

P-1

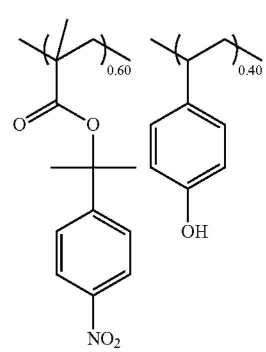

Mw = 5,600
Mw/Mn = 1.53

Synthesis Example 2-2

Synthesis of Polymer P-2

A 2-L flask was charged with 6.3 g of Monomer M-1, 5.1 g of Monomer AM-2, 6.0 g of 3-hydroxystyrene, and 40 g of THE solvent. The reactor was cooled at −70° C. in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-2. The polymer was analyzed by NMR spectroscopy and GPC.

P-2

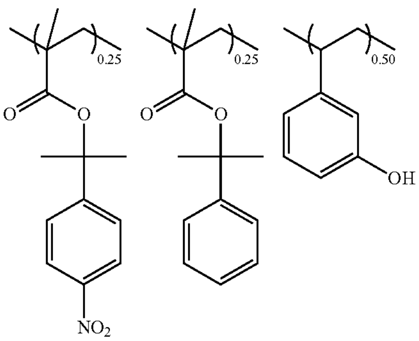

Mw = 5,000
Mw/Mn = 1.41

Synthesis Example 2-3

Synthesis of Polymer P-3

A 2-L flask was charged with 7.5 g of Monomer M-1, 4.6 g of Monomer AM-3, 6.0 g of 3-hydroxystyrene, and 40 g of THE solvent. The reactor was cooled at −70° C. in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-3. The polymer was analyzed by NMR spectroscopy and GPC.

P-3

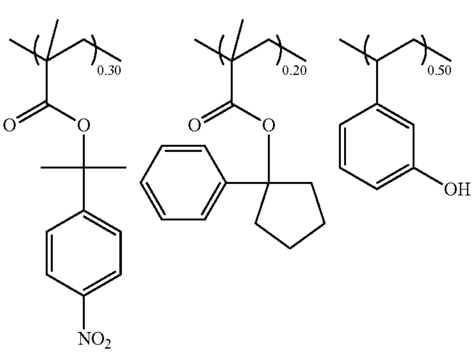

Mw = 5,100
Mw/Mn = 1.41

Synthesis Example 2-4

Synthesis of Polymer P-4

A 2-L flask was charged with 12.5 g of Monomer M-1, 4.2 g of 3-hydroxystyrene, 11.9 g of Monomer PM-1, and 40 g of THE solvent. The reactor was cooled at −70° C. in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P4. The polymer was analyzed by NMR spectroscopy and GPC.

P-4

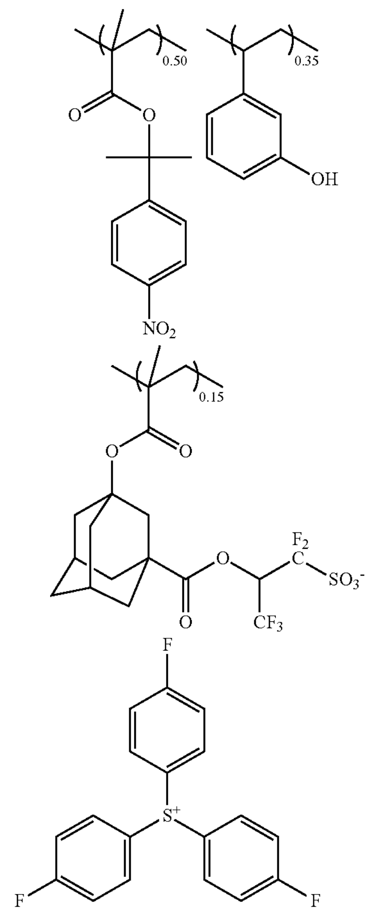

Mw = 9,700
Mw/Mn = 1.65

Synthesis Example 2-5

Synthesis of Polymer P-5

A 2-L flask was charged with 2.5 g of Monomer M-2, 5.2 g of 1-(cyclopropyl-1 yl)-1-methylethyl methacrylate, 3.5 g of 3-fluoro-4-(methylcyclohexyloxy)styrene, 4.8 g of 3-hydroxystyrene, 11.2 g of Monomer PM-3, and 40 g of THE solvent. The reactor was cooled at −70° C., in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-5. The polymer was analyzed by NMR spectroscopy and GPC.

P-5

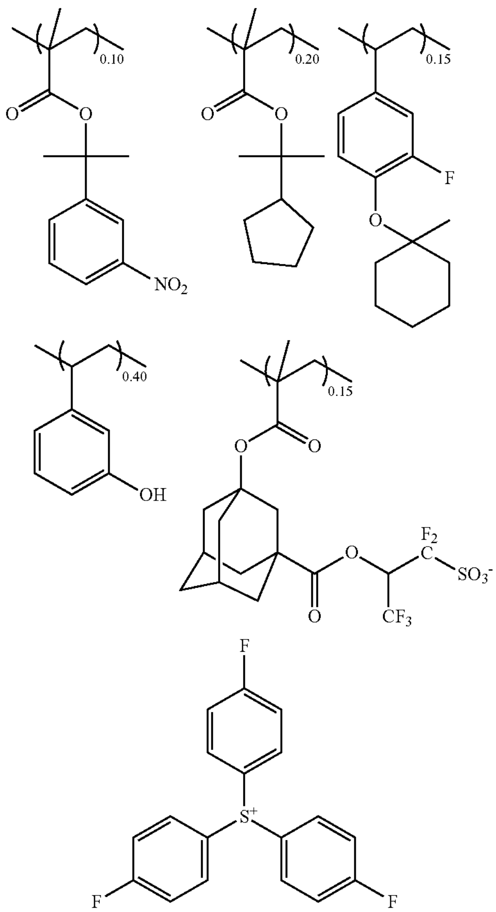

Mw = 9,600
Mw/Mn = 1.78

Synthesis Example 2-6

Synthesis of Polymer P-6

A 2-L flask was charged with 3.2 g of Monomer M-3, 6.4 g of 1-methyl-1-cyclopentyl methacrylate, 4.2 g of 4-hydroxystyrene, 11.0 g of Monomer PM-2, and 40 g of THE solvent. The reactor was cooled at −70° C., in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-6. The polymer was analyzed by NMR spectroscopy and GPC.

P-6

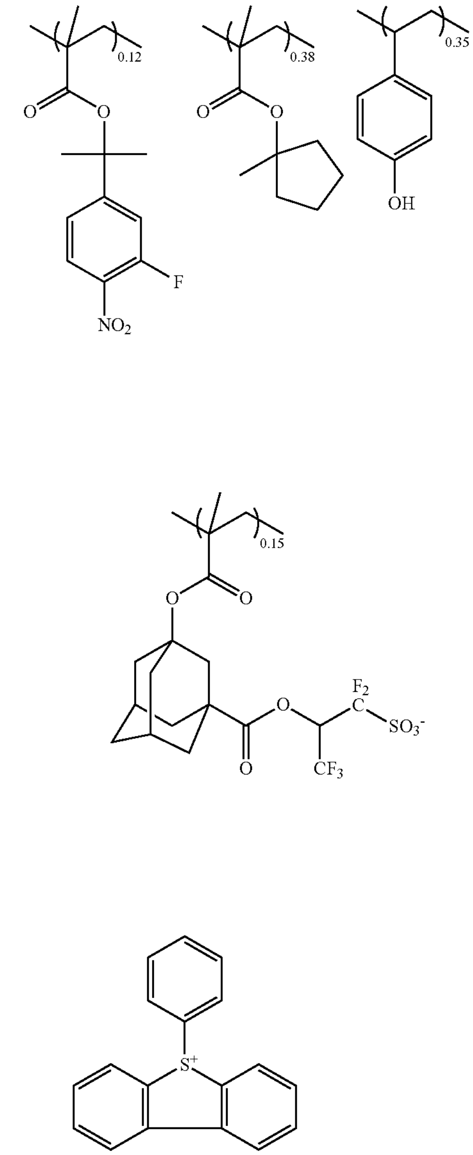

Mw = 9,700
Mw/Mn = 1.81

Synthesis Example 2-7

Synthesis of Polymer P-7

A 2-L flask was charged with 3.7 g of Monomer M-1, 7.8 g of Monomer AM-1, 4.2 g of 3-hydroxystyrene, 11.0 g of Monomer PM-2, and 40 g of THE solvent. The reactor was cooled at −70° C., in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-7. The polymer was analyzed by NMR spectroscopy and GPC.

P-7

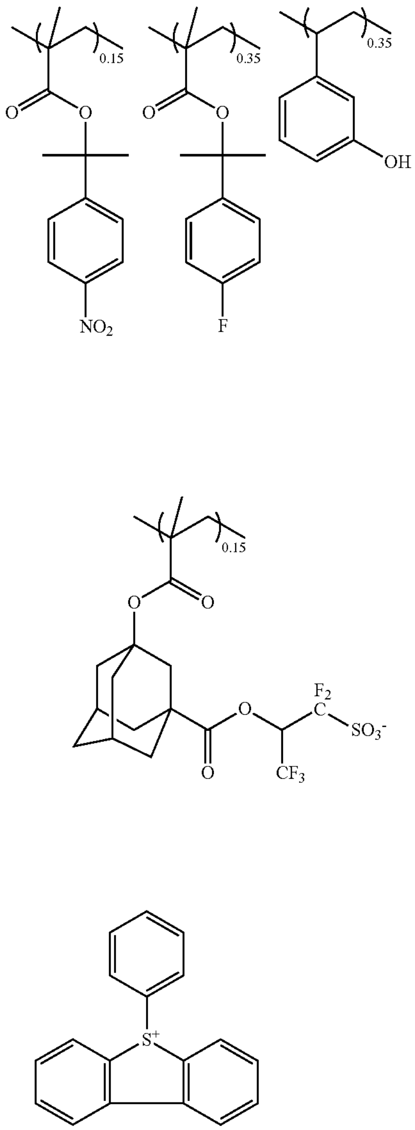

Mw = 9,800
Mw/Mn = 1.65

Synthesis Example 2-8

Synthesis of Polymer P-8

A 2-L flask was charged with 3.0 g of Monomer M-1, 6.4 g of 1-methyl-1-cyclopentyl methacrylate, 4.2 g of 4-hydroxystyrene, 9.6 g of Monomer PM-3, and 40 g of THF solvent. The reactor was cooled at −70° C., in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-8. The polymer was analyzed by NMR spectroscopy and GPC.

P-8

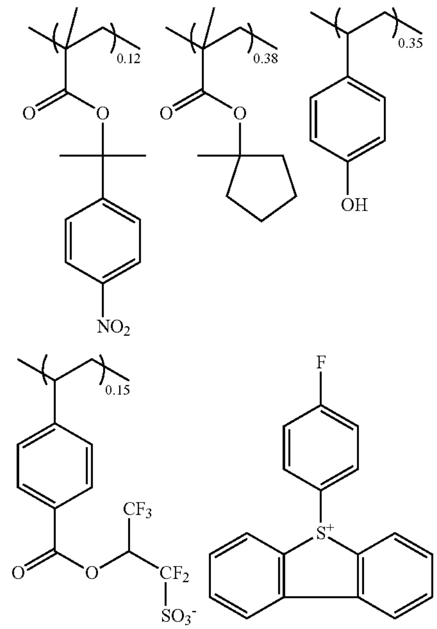

Mw = 9,600
Mw/Mn = 1.69

Synthesis Example 2-9

Synthesis of Polymer P-9

A 2-L flask was charged with 3.0 g of Monomer M-1, 5.9 g of tert-amyl methacrylate, 4.2 g of 4-hydroxystyrene, 11.9 g of Monomer PM-4, and 40 g of THE solvent. The reactor was cooled at −70° C., in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-9. The polymer was analyzed by NMR spectroscopy and GPC.

P-9

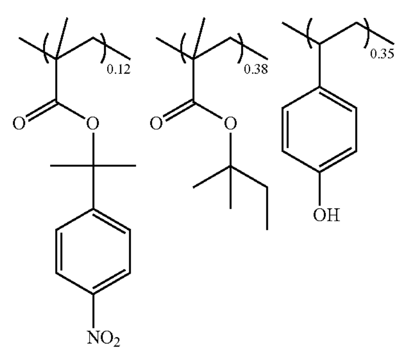

-continued

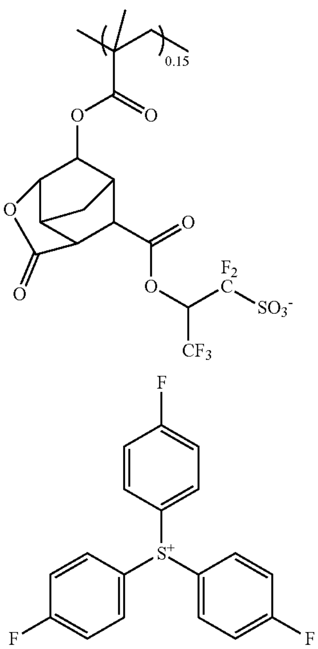

Mw = 9,400
Mw/Mn = 1.60

-continued

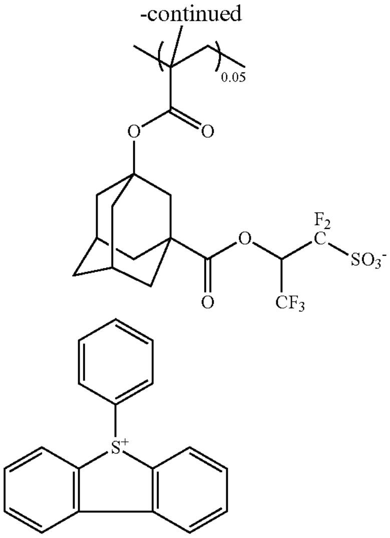

Mw = 8,200
Mw/Mn = 1.61

Synthesis Example 2-10

Synthesis of Polymer P-10

A 2-L flask was charged with 14.9 g of Monomer M-1, 4.2 g of 4-hydroxystyrene, 4.0 g of Monomer PM-2, and 40 g of THE solvent. The reactor was cooled at −70° C. in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-10. The polymer was analyzed by NMR spectroscopy and GPC.

P-10

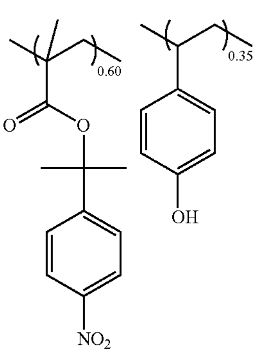

Synthesis Example 2-11

Synthesis of Polymer P-11

A 2-L flask was charged with 14.9 g of Monomer M-1, 3.2 g of 4-hydroxystyrene, 3.6 g of Monomer FM-1, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-11. The polymer was analyzed by NMR spectroscopy and GPC.

P-11

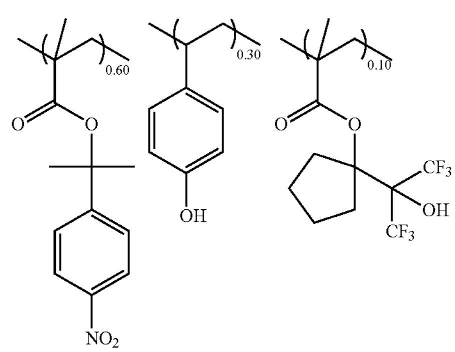

Mw = 5,400
Mw/Mn = 1.55

Synthesis Example 2-12

Synthesis of Polymer P-12

A 2-L flask was charged with 14.9 g of Monomer M-1, 3.6 g of 4-hydroxystyrene, 3.3 g of Monomer FM-2, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-12. The polymer was analyzed by NMR spectroscopy and GPC.

P-12

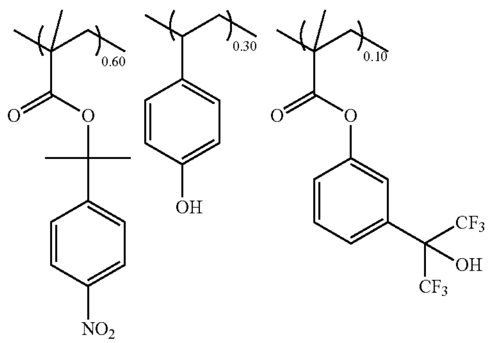

Mw = 5,300
Mw/Mn = 1.52

Synthesis Example 2-13

Synthesis of Polymer P-13

A 2-L flask was charged with 7.5 g of Monomer M-1, 3.6 g of Monomer AM-4, 6.0 g of 3-hydroxystyrene, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-13. The polymer was analyzed by NMR spectroscopy and GPC.

P-13

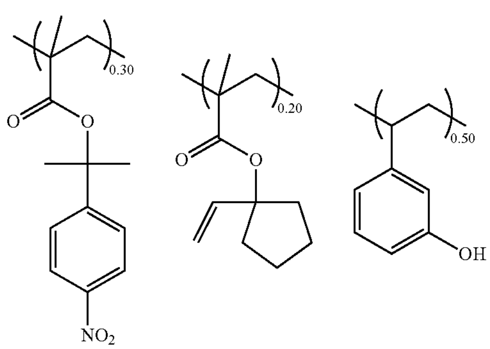

Mw = 5,500
Mw/Mn = 1,46

Synthesis Example 2-14

Synthesis of Polymer P-14

A 2-L flask was charged with 7.5 g of Monomer M-1, 3.6 g of Monomer AM-5, 6.0 g of 4-hydroxystyrene, and 40 g of THF solvent. The reactor was cooled at −70° C. in a nitrogen atmosphere, after which vacuum pumping and nitrogen blow were repeated three times. The reactor was warmed up to room temperature, whereupon 1.2 g of AIBN initiator was added. The reactor was heated at 60° C. and held at the temperature for 15 hours for reaction. The reaction solution was poured into 1 L of IPA for precipitation. The resulting white solid was collected by filtration and dried in vacuum at 60° C., obtaining Polymer P-14. The polymer was analyzed by NMR spectroscopy and GPC.

P-14

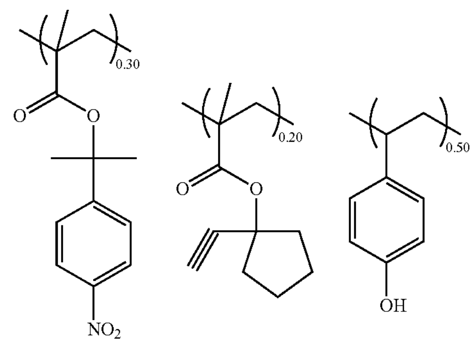

Mw = 5,600
Mw/Mn = 1.48

Synthesis Example 2-15

Synthesis of Polymer P-15

A 2-L flask was charged with 5.0 g of Monomer M-1, 4.5 g of Monomer AM-1, 10.7 g of 2-hydroxyphenyl methacrylate, and 40 g of THF solvent. The reactor was cooled at −70° C., in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-15. The polymer was analyzed by NMR spectroscopy and GPC.

P-15

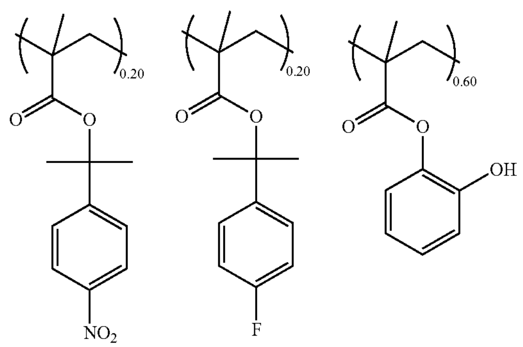

Mw = 6,100
Mw/Mn = 1.41

Synthesis Example 2-16

Synthesis of Polymer P-16

A 2-L flask was charged with 5.0 g of Monomer M-1, 6.7 g of Monomer AM-1, 8.9 g of 3-hydroxyphenyl methacrylate, and 40 g of THF solvent. The reactor was cooled at −70° C., in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-16 The polymer war analyzed by NMR spectroscopy and GPC.

P-16

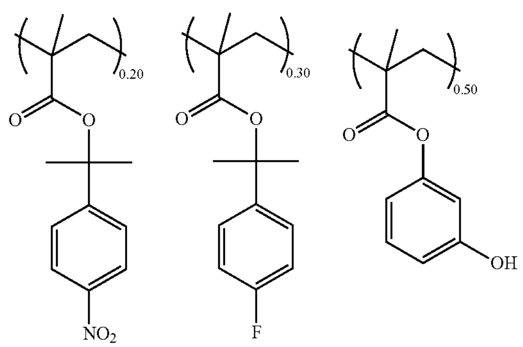

Mw = 5,900
Mw/Mn = 1.40

Synthesis Example 2-17

Synthesis of Polymer P-17

A 2-L flask was charged with 7.5 g of Monomer M-1, 7.5 g of Monomer AM-1, 7.1 g of 4-hydroxyphenyl methacrylate, and 40 g of THF solvent. The reactor was cooled at −70° C., in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-17. The polymer was analyzed by NMR spectroscopy and GPC.

P-17

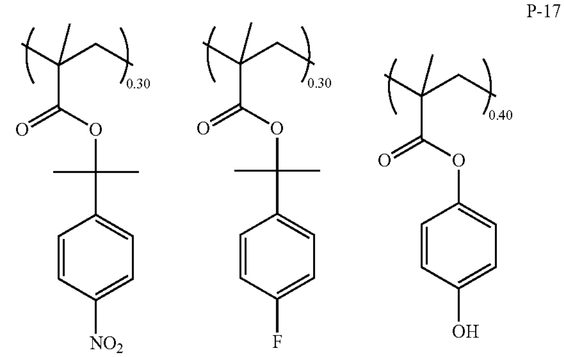

Mw = 5,800
Mw/Mn = 1.41

Synthesis Example 2-18

Synthesis of Polymer P-18

A 2-L flask was charged with 16.5 g of Monomer M-4, 4.8 g of 4-hydroxystyrene, and 40 g of THF solvent. The reactor was cooled at −70° C., in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-18. The polymer was analyzed by NMR spectroscopy and GPC.

P-18

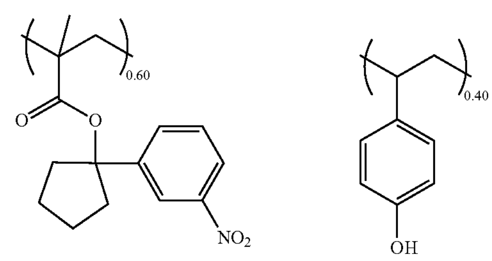

Mw = 5,500
Mw/Mn = 1.54

Synthesis Example 2-19

Synthesis of Polymer P-19

A 2-L flask was charged with 17.5 g of Monomer M-5, 4.8 g of 4-hydroxystyrene, and 40 g of THE solvent. The reactor was cooled at −70° C., in a nitrogen atmosphere, after which vacuum pumping and nitrogen blow were repeated three times. The reactor was warmed up to room temperature, whereupon 1.2 g of AIBN initiator was added. The reactor was heated at 60° C., and held at the temperature for 15 hours for reaction. The reaction solution was poured into 1 L of IPA for precipitation. The resulting white solid was collected by filtration and dried in vacuum at 60° C., obtaining Polymer P-19. The polymer was analyzed by NMR spectroscopy and GPC.

P-19

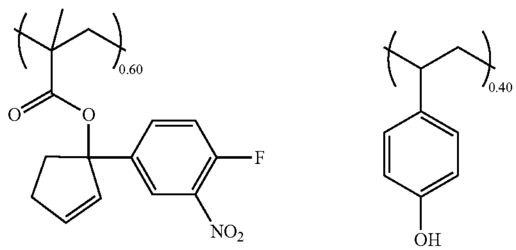

Mw = 5,300
Mw/Mn = 1.5

Comparative Synthesis Example 1

Synthesis of Comparative Polymer cP-1

Comparative Polymer cP-1 was synthesized by the same procedure as in Synthesis Example 2-1 except that 1-methyl-1-cyclopentyl methacrylate was used instead of Monomer M-1. The polymer was analyzed by NMR spectroscopy and GPC.

cP-1

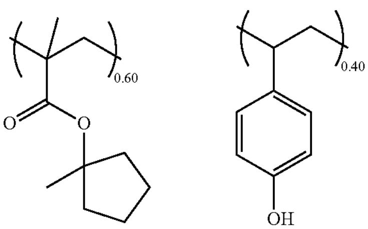

Mw = 9,900
Mw/Mn = 1.99

Comparative Synthesis Example 2

Synthesis of Comparative Polymer cP-2

Comparative Polymer cP-2 was synthesized by the same procedure as in Synthesis Example 2-6 aside from omitting Monomer M-3. The polymer was analyzed by NMR spectroscopy and GPC.

cP-2

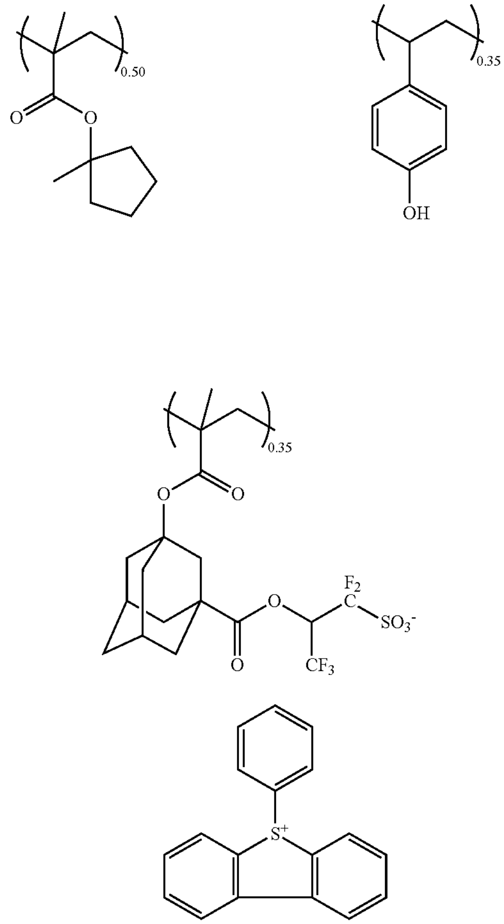

Mw = 9,800
Mw/Mn = 1.72

[3] Preparation and Evaluation of Positive Resist Compositions

Examples 1 to 19 and Comparative Examples 1, 2

(1) Preparation of Positive Resist Compositions

Positive resist compositions were prepared by dissolving the selected components in a solvent in accordance with the recipe shown in Table 1, and filtering through a filter having a pore size of 0.2 μm. The solvent contained 50 ppm of surfactant PolyFox PF-636 (Omnova Solutions Inc.).

The components in Table 1 are as identified below.

Organic Solvents:

PGMEA (propylene glycol monomethyl ether acetate)

DAA (diacetone alcohol)

EL (ethyl lactate)

Acid Generators: PAG-1, PAG-2

PAG-1

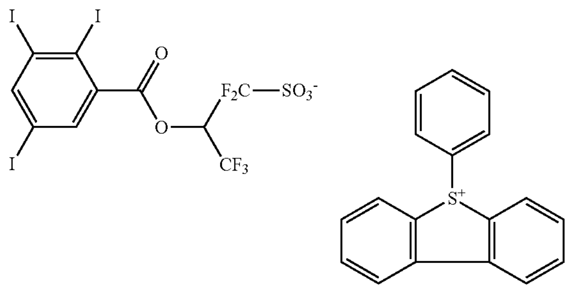

PAG-2

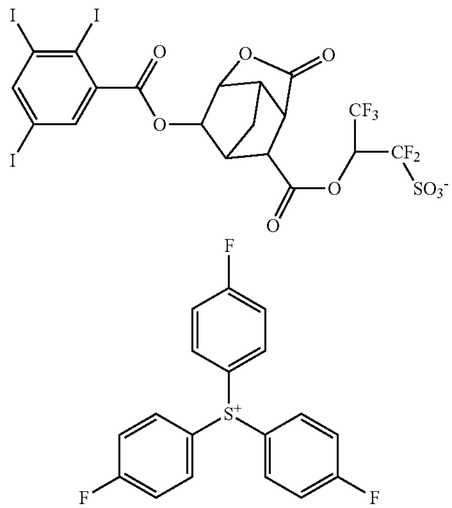

Quenchers: Q-1 to Q-3

Q-1

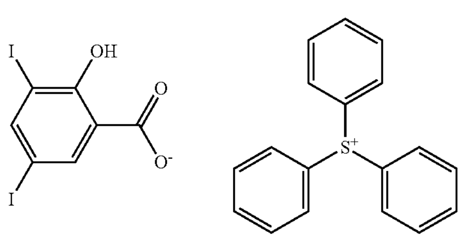

-continued

Q-2

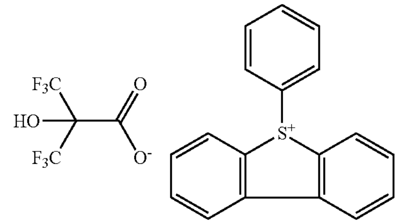

Q-3

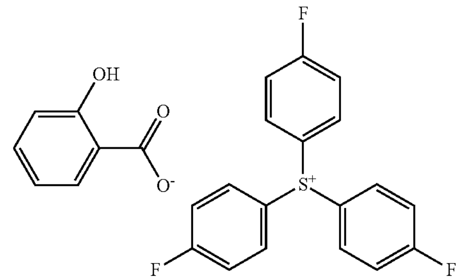

(2) EUV lithography test

Each of the positive resist compositions in Table 1 was spin coated on a silicon substrate having a 20 nm coating of silicon-containing spin-on hard mask SHB-A940 (Shin-Etsu Chemical Co., Ltd., silicon content 43 wt %) and prebaked on a hotplate at 105° C. for 60 seconds to form a resist film of 60 nm thick Using an EUV scanner NXE3300 (ASML, NA 0.33, v 0.9/0.6, quadrupole illumination), the resist film was exposed to EUV through a mask bearing a hole pattern having a pitch (on-wafer size) of 46 nm+20% bias. The resist film was baked (PEB) on a hotplate at the temperature shown in Table 1 for 60 seconds and developed in a 2.38 wt % TMAH aqueous solution for 30 seconds to form a hole pattern having a size of 23 nm.

The resist pattern was observed under CD-SEM (CG-5000, Hitachi High-Technologies Corp.). The exposure dose that provides a hole pattern of 23 nm size is reported as sensitivity. The size of 50 holes was measured, from which a 3-fold value (3σ) of standard deviation (σ) was computed and reported as CDU.

The resist composition is shown in Table 1 together with the sensitivity and CDU of EUV lithography.

TABLE 1

| | | Base polymer (pbw) | Acid generator (pbw) | Quencher (pbw) | Organic solvent (pbw) | PEB temp. (° C.) | Sensitivity ($mJ/cm^2$) | CDU (nm) |
|---|---|---|---|---|---|---|---|---|
| Example | 1 | P-1 (100) | PAG-1 (25.0) | Q-1 (6.51) | PGMEA (2,000) DAA (500) | 90 | 31 | 2.9 |
| | 2 | P-2 (100) | PAG-1 (25.0) | Q-1 (6.51) | PGMEA (2,000) DAA (500) | 85 | 34 | 2.7 |
| | 3 | P-3 (100) | PAG-1 (25.0) | Q-1 (6.51) | PGMEA (2,000) DAA (500) | 85 | 36 | 2.8 |
| | 4 | P-4 (100) | — | Q-2 (4.72) | PGMEA (2,000) DAA (500) | 95 | 31 | 2.3 |
| | 5 | P-5 (100) | — | Q-2 (4.72) | EL (2,000) DAA (500) | 95 | 33 | 2.4 |
| | 6 | P-6 (100) | — | Q-2 (4.72) | EL (2,000) DAA (500) | 95 | 31 | 2.2 |

TABLE 1-continued

| | | Base polymer (pbw) | Acid generator (pbw) | Quencher (pbw) | Organic solvent (pbw) | PEB temp. (° C.) | Sensitivity (mJ/cm²) | CDU (nm) |
|---|---|---|---|---|---|---|---|---|
| | 7 | P-7<br>(100) | — | Q-2<br>(4.72) | EL (2,000)<br>DAA (500) | 95 | 29 | 2.2 |
| | 8 | P-8<br>(100) | — | Q-2<br>(4.72) | PGMEA (500)<br>EL (1,500)<br>DAA (500) | 95 | 33 | 2.2 |
| | 9 | P-9<br>(100) | — | Q-3<br>(4.54) | PGMEA (2,000)<br>DAA (500) | 95 | 32 | 2.2 |
| | 10 | P-10<br>(100) | PAG-2<br>(25.0) | Q-2<br>(4.72) | PGMEA (2,000)<br>DAA (500) | 95 | 28 | 2.6 |
| | 11 | P-11<br>(100) | PAG-1<br>(25.0) | Q-1<br>(6.51) | PGMEA (2,000)<br>DAA (500) | 85 | 32 | 2.7 |
| | 12 | P-12<br>(100) | PAG-1<br>(25.0) | Q-1<br>(6.51) | PGMEA (2,000)<br>DAA (500) | 85 | 33 | 2.8 |
| | 13 | P-13<br>(100) | PAG-2<br>(25.0) | Q-2<br>(4.72) | PGMEA (2,000)<br>DAA (500) | 85 | 32 | 2.6 |
| | 14 | P-14<br>(100) | PAG-1<br>(25.0) | Q-1<br>(6.51) | PGMEA (2,000)<br>DAA (500) | 85 | 33 | 2.7 |
| | 15 | P-15<br>(100) | PAG-1<br>(25.0) | Q-1<br>(6.51) | PGMEA (2,000)<br>DAA (500) | 85 | 30 | 2.8 |
| | 16 | P-16<br>(100) | PAG-1<br>(25.0) | Q-1<br>(6.51) | PGMEA (2,000)<br>DAA (500) | 85 | 29 | 2.8 |
| | 17 | P-17<br>(100) | PAG-1<br>(25.0) | Q-1<br>(6.51) | PGMEA (2,000)<br>DAA (500) | 85 | 28 | 2.9 |
| | 18 | P-18<br>(100) | PAG-1<br>(25.0) | Q-1<br>(6.51) | PGMEA (2,000)<br>DAA (500) | 85 | 28 | 2.8 |
| | 19 | P-19<br>(100) | PAG-1<br>(25.0) | Q-1<br>(6.51) | PGMEA (2,000)<br>DAA (500) | 85 | 27 | 2.9 |
| Comparative Example | 1 | cP-1<br>(100) | PAG-1<br>(25.0) | Q-2<br>(4.72) | PGMEA (2,000)<br>DAA (500) | 90 | 33 | 4.6 |
| | 2 | cP-2<br>(100) | — | Q-2<br>(4.72) | PGMEA (2,000)<br>DAA (500) | 95 | 35 | 3.3 |

It is demonstrated in Table 1 that positive resist compositions comprising a base polymer comprising repeat units (a) having a carboxy group whose hydrogen is substituted by a nitrobenzene ring-containing tertiary hydrocarbyl group have a high sensitivity and form patterns with improved CDU.

Japanese Patent Application No. 2021-090241 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising a base polymer comprising repeat units represented by the formula (a):

(a)

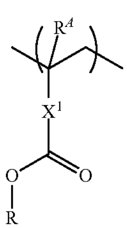

wherein $R^A$ is hydrogen or methyl, $X^1$ is a single bond, phenylene, naphthylene, or a $C_1$-$C_{12}$ linking group containing at least one moiety selected from an ester bond, ether bond and lactone ring, and R is a tertiary hydrocarbyl group consisting of $R^1$, $R^2$ and a nitrobenzene ring, which is represented by the formula (a1):

(a1)

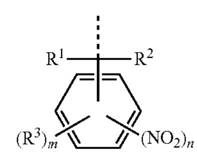

wherein $R^1$ and $R^2$ are each independently a $C_1$-$C_6$ aliphatic hydrocarbyl group which may contain a heteroatom, $R^1$ and $R^2$ may bond together to form a ring with the carbon atom to which they are attached in which the nitrobenzene ring in the formula (a1) is separate from the ring formed of $R^1$ and $R^2$, $R^3$ is hydrogen, halogen, a $C_1$-$C_6$ alkyl group, $C_1$-$C_6$ alkoxy group or $C_1$-$C_6$ acyloxy group, m is an integer of 1 to 4, n is 1 or 2, and the broken line designates a valence bond.

2. The resist composition of claim 1 wherein the repeat units have the formula (a):

(a)

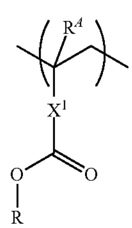

wherein $R^A$ is hydrogen or methyl, $X^1$ is a single bond, phenylene, naphthylene, or a $C_1$-$C_{12}$ linking group containing at least one moiety selected from an ester bond, ether bond and lactone ring, and R is a group having the formula (a1):

(a1)

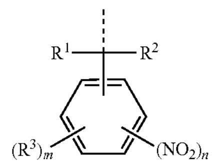

wherein $R^1$ and $R^2$ are each independently a $C_1$-$C_6$ aliphatic hydrocarbyl group which may contain a heteroatom, $R^1$ and $R^2$ may bond together to form a ring with the carbon atom to which they are attached, $R^3$ is hydrogen, halogen, a $C_1$-$C_6$ alkyl group, $C_1$-$C_6$ alkoxy group or $C_1$-$C_6$ acyloxy group, m is an integer of 1 to 4, n is 1 or 2, and the broken line designates a valence bond.

3. The resist composition of claim 1 wherein the base polymer further comprises repeat units of at least one type selected from repeat units having a carboxy group whose hydrogen is substituted by an acid labile group other than the nitrobenzene ring-containing tertiary hydrocarbyl group, and repeat units having a phenolic hydroxy group whose hydrogen is substituted by an acid labile group.

4. The resist composition of claim 3 wherein the repeat units having a carboxy group whose hydrogen is substituted by an acid labile group other than the nitrobenzene ring-containing tertiary hydrocarbyl group have the formula (b1), and the repeat units having a phenolic hydroxy group whose hydrogen is substituted by an acid labile group have the formula (b2):

(b1)

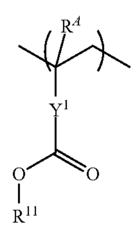

(b2)

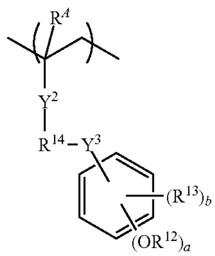

wherein $R^A$ is each independently hydrogen or methyl, $Y^1$ is a single bond, phenylene group, naphthylene group, or a $C_1$-$C_{12}$ linking group containing at least one moiety selected from an ester bond, ether bond and lactone ring, $Y^2$ is a single bond, ester bond or amide bond, $Y^3$ is a single bond, ether bond or ester bond, $R^{11}$ is an acid labile group other than the nitrobenzene ring-containing tertiary hydrocarbyl group, $R^{12}$ is an acid labile group, $R^{13}$ is fluorine, trifluoromethyl, cyano or a $C_1$-$C_6$ saturated hydrocarbyl group, $R^{14}$ is a single bond or a $C_1$-$C_6$ alkanediyl group in which some constituent —$CH_2$— may be replaced by an ether bond or ester bond, a is 1 or 2, b is an integer of 0 to 4, and the sum of a+b is from 1 to 5.

5. The resist composition of claim 1 wherein the base polymer further comprises repeat units having an adhesive group which is selected from among hydroxy, carboxy, lactone ring, carbonate bond, thiocarbonate bond, carbonyl, cyclic acetal, ether bond, ester bond, sulfonic ester bond, cyano, amide bond, —O—C(═O)—S—, and —O—C(═O)—NH—.

6. The resist composition of claim 1 wherein the base polymer further comprises repeat units of at least one type selected from repeat units having the formulae (d1) to (d3):

(d1)

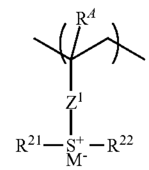

(d2)

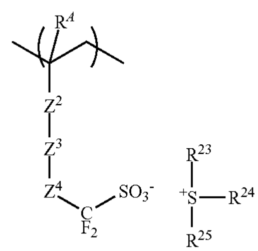

(d3)

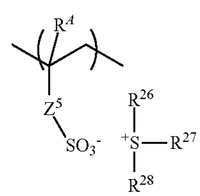

wherein $R^A$ is each independently hydrogen or methyl, $Z^1$ is a single bond, a $C_1$-$C_6$ aliphatic hydrocarbylene group, phenylene, naphthylene, or a $C_7$-$C_{18}$ group obtained by combining the foregoing, or —O—$Z^{11}$—, —C(═O)—O—$Z^{11}$— or —C(═O)—NH—$Z^{11}$—, $Z^{11}$ is a $C_1$-$C_6$ aliphatic hydrocarbylene group, phenylene, naphthylene, or a $C_7$-$C_{18}$ group obtained by combining the foregoing, which may contain a carbonyl moiety, ester bond, ether bond or hydroxy moiety, $Z^2$ is a single bond or ester bond, $Z^3$ is a single bond, —$Z^{31}$—C(═O)—O—, —$Z^{31}$—O— or —$Z^{31}$—O—C(═O)—, 731 is a $C_1$-$C_{12}$ aliphatic hydrocarbylene group, phenylene group, or a $C_7$-$C_{18}$ group obtained by combining the foregoing, which may contain a carbonyl moiety, ester bond, ether bond, iodine or bromine, $Z^4$ is a methylene, 2,2,2-trifluoro-1,1-ethanediyl or carbonyl group, $Z^5$ is a single bond, methylene, ethylene, phenylene, fluorinated phenylene, trifluoromethyl-substituted phenylene, —O—$Z^{51}$—, —C(—O)—O—$Z^{51}$— or —C(═O)—NH—$Z^{51}$—, $Z^{51}$ is a $C_1$-$C_6$ aliphatic hydrocarbylene group, phenylene, fluorinated phenylene, or trifluoromethyl-substituted phenylene group, which may contain a carbonyl moiety, ester bond, ether bond or hydroxy moiety, $R^{21}$ to $R^{28}$ are each independently halogen or a $C_1$-$C_{20}$ hydrocarbyl group which may contain a heteroatom, $R^{23}$ and $R^{24}$, or $R^{26}$ and $R^{27}$ may bond together to form a ring with the sulfur atom to which they are attached, and M is a non-nucleophilic counter ion.

7. The resist composition of claim 1, further comprising an acid generator.

8. The resist composition of claim 1, further comprising an organic solvent.

9. The resist composition of claim 1, further comprising a quencher.

10. The resist composition of claim 1, further comprising a surfactant.

11. A pattern forming process comprising the steps of applying the positive resist composition of claim 1 onto a substrate to form a resist film thereon, exposing the resist film to high-energy radiation, and developing the exposed resist film in a developer.

12. The pattern forming process of claim 11 wherein the high-energy radiation is i-line, ArF excimer laser, KrF excimer laser, EB, or EUV of wavelength 3 to 15 nm.

* * * * *